US006819011B2

(12) United States Patent
Kernahan et al.

(10) Patent No.: US 6,819,011 B2
(45) Date of Patent: Nov. 16, 2004

(54) SWITCHING POWER CONVERTER CONTROLLER WITH WATCHDOG TIMER

(75) Inventors: Kent Kernahan, Cupertino, CA (US); Mark J. Nohr, Belmont, CA (US)

(73) Assignee: Fyre Storm, Inc., Sunnyvale, CA (US)

( * ) Notice: Subject to any disclaimer, the term of this patent is extended or adjusted under 35 U.S.C. 154(b) by 18 days.

(21) Appl. No.: 10/295,633

(22) Filed: Nov. 14, 2002

(65) Prior Publication Data

US 2004/0095020 A1 May 20, 2004

(51) Int. Cl.[7] .......................... H02J 1/00; H02M 1/12

(52) U.S. Cl. .......................... 307/35; 307/151; 307/39; 700/286; 700/295

(58) Field of Search .......................... 307/31, 35, 39, 307/125, 127, 40, 151, 51, 87; 323/222, 225, 267, 258; 363/41, 98.95; 361/683; 700/286, 295, 22, 296

(56) References Cited

U.S. PATENT DOCUMENTS

| | | | | | |
|---|---|---|---|---|---|
| 4,349,703 | A | | 9/1982 | Chea, Jr. | 179/18 HB |
| 4,833,708 | A | * | 5/1989 | Goodrich | 379/327 |
| 5,502,339 | A | * | 3/1996 | Hartig | 307/31 |
| 5,706,514 | A | * | 1/1998 | Bonola | 718/104 |
| 5,801,518 | A | | 9/1998 | Ozaki et al. | 323/222 |
| 5,821,826 | A | * | 10/1998 | Newlin | 331/74 |
| 5,841,641 | A | * | 11/1998 | Faulk | 363/21.14 |
| 5,864,663 | A | * | 1/1999 | Stolan | 714/55 |
| 5,945,820 | A | | 8/1999 | Namgoong et al. | 323/282 |
| 6,154,015 | A | | 11/2000 | Ichiba | 323/225 |

OTHER PUBLICATIONS

Endoh, T., et al., "An On–Chip 96.5% Current Efficiency CMOS Linear Regulator Using a Flexible Control Technique of Output Current," *IEEE Journal of Solid–State Circuits*, vol. 36, No. 1, Jan. 2001, pp. 34–39.

Mathews, T., "Switching regulators demystified," Dec. 7, 2000, 8 pp.

Peterchev, A.V. and Sanders, S.R., "Quantization Resolution and Limit Cycling in Digitally Controlled PWM Converters," *IEEE Power Electronics Specialists Conference*, 2001, 7 pp.

Wu, A.M., et al., "Digital PWM Control: Application in Voltage Regulation Modules," *IEEE Power Electronics Specialists Conference*, 1999, vol. 1, pp. 77–83, no date.

Wu, A.M. and Sanders, S.R., "An Active Clamp Circuit for Voltage Regulation Module (VRM) Applications," *IEEE Transactions on Power Electronics*, vol. 16, No. 5, Sep. 2001, pp. 623–634.

(List continued on next page.)

*Primary Examiner*—Rajnikant B. Patel
(74) *Attorney, Agent, or Firm*—MacPherson Kwok Chen & Held LLP

(57) ABSTRACT

A switching power converter controller controls a plurality of switching power converters which provide power to a host microprocessor. A watchdog timer in the switching power converter controller counts down a timer unless it receives reset signals from the host microprocessor and the watchdog timer issues an interrupt to the microprocessor if the watchdog timer expires. The microprocessor in the switching power converter controller provides a reset command to the host microprocessor in response to receipt of the interrupt. If the host microprocessor does not respond to the reset command, the microprocessor causes the switching power supply controller to power down the power converters.

5 Claims, 94 Drawing Sheets

OTHER PUBLICATIONS

Xiao, J., et al., "Architecture and IC Implementation of a Digital VRM Controller," *IEEE Power Electronics Specialists Conference*, 2001, 10 pp, no date.
Sharp, LCD Application Note, Flat Panel Displays, 1999, 5 pp, no date.
Hantronix, Inc., Application Note, Crystal Clear and Visibly Superior LCD Modules, 2001, 5 pp, no date.
Intersil Corporation, intersil™, ISL6523, Data Sheet, Jan. 2002, FN9024.1, pp. 1–16.
International Rectifier, IRU3037/IRU3037A, Data Sheet No. PD94173, pp. 1–11, Mar. 6, 2002.
Applications, Touchscreens 101, http://www.pcioh.com/apps–touch–102.html, Nov. 5, 2002, 2 pp. no date.
3M Touch Systems, MicroTouch™, 2002, 6 pp., no date.

* cited by examiner

| | | Pulse width | | | Pulse width |
|---|---|---|---|---|---|
| A | G | 10 | A | $\overline{G}$ | 1 |
| | H | 8 | | $\overline{H}$ | 3 |
| | I | 6 | | $\overline{I}$ | 5 |
| | J | 4 | | $\overline{J}$ | 7 |
| | K | 2 | | $\overline{K}$ | 9 |
| B | G | 10 | B | $\overline{G}$ | 1 |
| | H | 10 | | $\overline{H}$ | 1 |
| | I | 8 | | $\overline{I}$ | 3 |
| | J | 6 | | $\overline{J}$ | 5 |
| | K | 4 | | $\overline{K}$ | 7 |
| C | G | 8 | C | $\overline{G}$ | 3 |
| | H | 10 | | $\overline{H}$ | 1 |
| | I | 10 | | $\overline{I}$ | 1 |
| | J | 8 | | $\overline{J}$ | 3 |
| | K | 6 | | $\overline{K}$ | 5 |
| D | G | 6 | D | $\overline{G}$ | 5 |
| | H | 8 | | $\overline{H}$ | 3 |
| | I | 10 | | $\overline{I}$ | 1 |
| | J | 10 | | $\overline{J}$ | 1 |
| | K | 8 | | $\overline{K}$ | 3 |
| E | G | 4 | E | $\overline{G}$ | 7 |
| | H | 6 | | $\overline{H}$ | 5 |
| | I | 8 | | $\overline{I}$ | 3 |
| | J | 10 | | $\overline{J}$ | 1 |
| | K | 10 | | $\overline{K}$ | 1 |
| F | G | 2 | F | $\overline{G}$ | 9 |
| | H | 4 | | $\overline{H}$ | 7 |
| | I | 6 | | $\overline{I}$ | 5 |
| | J | 8 | | $\overline{J}$ | 3 |
| | K | 10 | | $\overline{K}$ | 1 |

*FIG. 9*

Key To $\Delta V_{BE} = V_{BE2} - V_{BE1} = V_T \ln(J_2/J) = kT \ln(8)/q$ $VOUT = R2\ \Delta V_{BE}/R1 = GT$, T is temperature in degrees Kelvin $G = \partial V/\partial T = k \ln(8)\ R2/(qR1)$, is constant

| Port Name | Type | Description | Source | Destination |
|---|---|---|---|---|
| PLLCK | Input | DPLL Clock | DPC | |
| PLOCK | Input | Phase Lock Port | DPC | |
| CST[9:0] | Input | DPC Grey Count Bus | DPC | |
| PD_OUT[9:0] | Input | Power Mode Select Bus | REG | |
| ADC_CLK | Output | ADC Clock | | ADC |
| QSADC_CLK | Output | QSADC Clock | | QSADC |
| REG_CLK | Output | Regulation Engine Clock | | REG |
| SYS_CLK | Output | System Controller Clock | | SYS, REG |
| LED_CLK | Output | LED Controller Clock | | SYS |
| SHM_CLK | Output | Sample, Hold Multiplexer Clock | | SHM, REG |
| IVS_CLK | Output | IVS Clock | | IVS |
| VDD | Power | Digital Power | IVS | |
| VSS | Power | Digital Ground | IVS | |
| 262K_CLK | Output | 262K Clock | | SYS |
| 1.8MHz_CLK | Output | 1.8 MHz Clock | | SYS |
| 16MHz_CLK | Output | 16MHz Clock | | SYS |
| SYS_CLK_SEL | Input | Selection of clock to SYS | SYS | |
| REG_CLK_SEL | Input | Selection of clock to REG | SYS | |
| SYS_CLK_EN | Input | Clock Gating enable for SYS_CLK | SYS | |
| SPI_CLK_EN | Input | Clock enable to SPI | SYS | |
| UART_CLK_EN | Input | Clock enable to UART | SYS | |
| LED_CLK_EN | Input | Clock enable to LED | SYS | |

FIG. 35

| Signal | Asserted |
|---|---|
| A0 | |
| A1 | |
| A2 | |
| A3 | |
| B0 | |
| B1 | |
| B2 | |
| B3 | |
| SEL | |
| MEAS | |
| CONV | YES |
| EOC | YES |
| SLP | |

| Signal | Asserted |
|---|---|
| A0 | |
| A1 | YES |
| A2 | |
| A3 | YES |
| B0 | YES |
| B1 | |
| B2 | |
| B3 | |
| SEL | YES |
| MEAS | YES |
| CONV | |
| EOC | |
| SLP | |

| Signal | Asserted |
|---|---|
| A0 | |
| A1 | |
| A2 | |
| A3 | |
| B0 | |
| B1 | YES |
| B2 | |
| B3 | YES |
| SEL | YES |
| MEAS | YES |
| CONV | |
| EOC | |
| SLP | |

| Signal | Asserted |
|---|---|
| A0 | YES |
| A1 | |
| A2 | YES |
| A3 | |
| B0 | |
| B1 | YES |
| B2 | YES |
| B3 | |
| SEL | |
| MEAS | YES |
| CONV | |
| EOC | |
| SLP | YES |

| Signal | Asserted |
|---|---|
| A0 | |
| A1 | |
| A2 | |
| A3 | |
| B0 | |
| B1 | YES |
| B2 | YES |
| B3 | |
| SEL | YES |
| MEAS | YES |
| CONV | |
| EOC | |
| SLP | YES |

SWITCHING POWER CONVERTER CONTROLLER WITH WATCHDOG TIMER

FIELD OF THE INVENTION

This invention relates to switching power supplies or converters. In particular, this invention relates to a simple, robust switching power supply which is capable of providing power to a number of different regulated power sources within a given circuit

BACKGROUND OF THE INVENTION

Switching power supplies are used to provide power in numerous products such as cell phones, camera, PDAs (Personal Digital Assistants), calculators, portable computers and similar types of electronic equipment. Such switching power supplies are quite complex and use numerous components to provide a number of precisely regulated output voltages to power the various integrated circuits and other components contained within the product being powered. Relative to the cost and the quality of the products in which they are used, such power supplies are expensive, bulky and inefficient. Efficiency is important to provide the equipment a long battery life. FIG. 1 shows a typical prior art power supply used in portable equipment powered by a battery 10. The signal from battery 10 is transmitted on lead 10*a* to a level translation circuit 12, which is controlled by a control signal from analog pulse width modulated controller 11. The control signal from analog pulse width modulator is responsive to the voltage drop across resistor 16 as detected by signals on conductive leads 17*a* and 17*b* connecting, respectively, the two terminals of resistor 16 into analog PWM controller 11. N-channel MOS transistors 13*a* and 13*b* are connected to operate in a complementary fashion. Level translation circuit 12 provides a high level voltage to the gate of N-channel transistor 13*a* to apply a pulse from battery 10 to one input terminal of coil 15. The other input terminal of coil 15 is connected to one terminal of resistor 16. The other terminal of resistor 16 is connected to load capacitor 18, which contains a charge at the voltage necessary to supply the particular circuitry being powered by this portion of the power supply. The analog PWM controller 11 measures the current through resistor 16 and controls the ON time of N-channel MOS transistor 13*a*. N-channel MOS transistor 13*b* is driven by the complement of the signal driving the gate of N-channel MOS transistor 13*a* and turns on to pull the input lead of coil 15 to ground and to shut off the current required to be supplied through resistor 16 to the power supply. Internal circuitry of analog pulse width controller 11 is shown schematically in FIG. 2.

As shown in FIG. 2, current source 20 provides a charging current to capacitor 21 to generate a ramp voltage across this capacitor. This ramp voltage is provided to the positive input lead of differential amplifier 22*a*, the negative input lead of which receives the output signal from differential amplifier 22*b*. The positive input lead of amplifier 22*b* is connected to the load capacitor 18 and carries a signal representing the voltage across the load capacitor 18. The negative input lead of differential amplifier 22*b* is connected to the node between resistors 23*a* and 23*b* making up a voltage divider (one terminal of which is connected to a reference voltage VRef and the other terminal of which is connected to the output lead of differential amplifier 22*b* ). Thus when the output voltage across capacitor 18 is less than the voltage at node A between resistor 23*a* and resistor 23*b*, the output voltage from differential amplifier 22*b* goes to a low level. This low level output voltage is provided to the negative input lead of amplifier 22*a*, causing amplifier 22*a* to produce a positive output pulse. This positive output pulse is transferred to coil 15 to provide a charging current to capacitor 18. With time, the charge on capacitor 18 increases until the voltage across capacitor 18 exceeds the voltage on node A. At this point the output voltage from differential amplifier 22*b* goes to a high level, so that the voltage at the negative input lead of differential amplifier 22*a* exceeds the voltage on the positive input lead of differential amplifier 22*a*, causing the output voltage from amplifier 22*a* to go a low level, and thus preventing further charging of capacitor 18. The voltage across coil 15 is negative, reflecting the negative rate of change in current in response to the trailing edge of the pulse from amplifier 22*a* going from a high level to a low level. The current through coil 15 does not change instantaneously due to the magnetic field of the coil but rather gradually changes with time. This type of power supply, which is characterized by a current source driving a capacitor, is known as an analog buck converter. Each MOSFET modulation cycle is formed by the precision comparator and the error amplifier. Such a power supply is difficult to scale and integrate into an integrated circuit and is typically fabricated using dedicated analog process technologies at captive semiconductor foundries.

Accordingly, what is needed is a power supply which provides different level precision voltages and at the same time and is simple to implement with a smaller number of components than in the prior art. Such a power supply must also be relatively inexpensive, robust and reliable.

SUMMARY OF THE INVENTION

In one embodiment of the present invention a switching power converter controller is provided which controls a plurality of switching power converters providing power to a host microprocessor. The switching power converter controller includes a watchdog timer configured to countdown a timer unless it receives reset signals from the host microprocessor, and a microprocessor. The watchdog timer is further configured to issue an interrupt to the microprocessor if the watchdog timer expires, and the microprocessor is configured to provide a reset command to the host microprocessor in response to the interrupt received from the watchdog timer. The microprocessor is configured to cause the switching power supply controller to power down the switching power converters if the host microprocessor does not respond to the reset command.

In a further embodiment of the present invention the microprocessor further includes a timer for determining that the host microprocessor does not respond to the reset command.

In another embodiment of the present invention, the microprocessor is configured to cause the power down of the plurality of switching power converters in a predetermined sequence. In yet another embodiment, the microprocessor may be further configured to cause the power up of the plurality of switching power converters subsequent to the power down sequence.

In another embodiment, the microprocessor is configured to cause the power up of the plurality of switching power converters in a predetermined sequence.

This invention will be more fully understood in conjunction with the drawings taken together with the following detailed description.

BRIEF DESCRIPTION OF THE DRAWINGS

FIG. 9 shows the relative delay times obtained when signals are selected from different combinations of pairs of inverters in the ring oscillator of FIG. 6.

FIG. 35 shows the port table for the clock generator block shown in FIG. 34 and FIG. 12.

FIG. 54C is an exemplary flowchart for a power-up sequence for IVS 1209 in accordance with another implementation.

FIG. 55 is an exemplary functional diagram of NFET driver module 1202 in accordance with one implementation.

FIG. 55A illustrates exemplary interface signals of NFET driver module 1202 in accordance with another implementation.

FIG. 55B illustrates exemplary interface signals of NFET driver module 1202 in accordance with another implementation.

FIG. 55C shows an exemplary functional diagram for the implementation of FIG. 55B.

FIG. 55D illustrates an application employing internal buffers to directly drive an external coil for the implementation of FIG. 55B.

FIG. 55E illustrates an application employing internal buffers to drive external FETs for the implementation of FIG. 55B.

FIG. 55F shows an exemplary on-chip configuration block diagram for the implementation of FIG. 55B.

FIG. 56 is a block diagram of central processing module (SYS) 1205 of FIG. 12 according to one embodiment of the invention.

FIG. 57 shows a circuit model of converter 2570 of FIG. 25.

FIG. 58 is a flow chart illustrating the steps of control algorithm 5800, in accordance to with one embodiment of the present invention.

FIG. 59 illustrates the operation of control algorithm 5800 of FIG. 58.

DETAILED DESCRIPTION OF THE EMBODIMENT(S)

The following detailed description is intended to illustrate the embodiments discussed herein and is not intended to be limiting of the scope of the present invention. Other embodiments of this invention will be apparent to those skilled in the art in view of this disclosure.

Section 1.0

Overview of the Architecture of a Converter (Digitally Trimmed Multi-stage SPS) having a Synchronous Sampling Multiple-output Controller, Functional Description of each Block The present invention is applicable to a power converter and power management peripheral that integrates a set of power-management related functions. Switching power supply controller 1200, shown in FIG. 12 in block diagram form, illustrates an implementation of a switching power converter controller product, according to one embodiment of the present invention. The system implements substantially all of a power converter's expected functions, such as maintaining a steady output voltage (constant voltage power supply) that is substantially independent of the current drawn from the power supply or maintaining a steady output current (constant current power supply) that is substantially independent on the load applied to the power supply, deciding when to shed loads, and measuring the state of charge in a battery, charging the battery, and performing battery sequencing. In addition, the system performs a number of other peripheral management functions, such as digitizing a touch panel, scanning a keyboard, and conditioning reset signals received from the rest of the system. In one embodiment, watch dog timer functions are provided to allow power-cycling and to provide reset signals to different subsystems of the product, in response to an exception condition, such as a software lock up or even a hardware lock up (e.g., an SCR latch up or a disruption due to an IO transient). The system of the present invention also controls LEDs that indicates the statuses of various subsystems. Thus, a system according to the present invention can handle a large number of functions that a portable electronic device (e.g., a PDA) performs when the processor of that PDA is powered down, such as between pen strokes (while the user is writing a note on the PDA), or when the PDA is displaying information, but no input or output is expected. In this implementation, the product includes a digital control subsystem that controls various digital interfaces, including reset signals, watch dog timers, enable signals, status signals for indicating individual status of internal power supplies. Communication among elements of the system is provided through a communication interface. In one embodiment, the present invention includes a time base generation circuit and a digitizer interface to a keyboard.

Figure 12A:
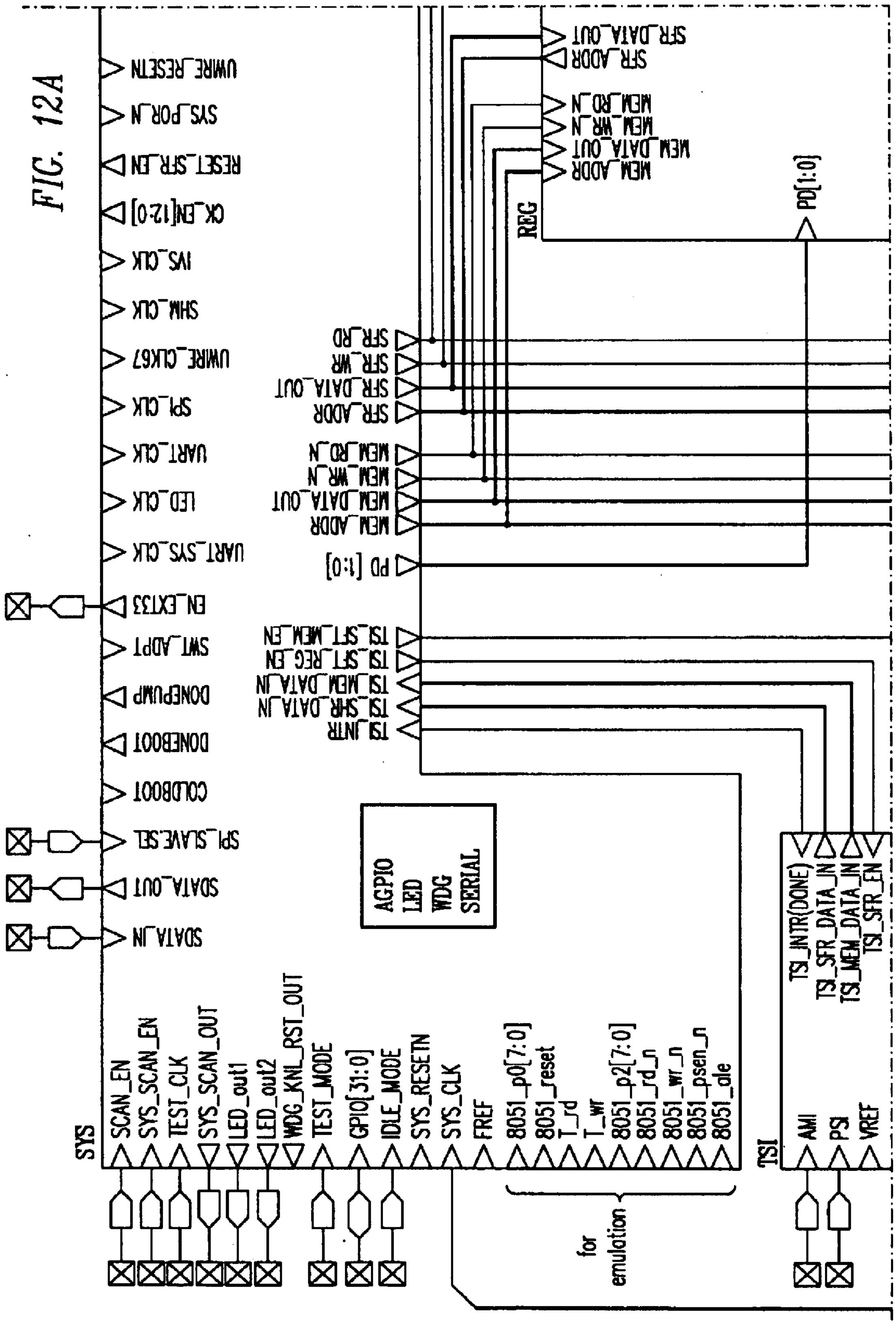
FIG. 12 is a block diagram of switching power supply controller 1200, in accordance with one embodiment of the present invention.
Figures 12, 12B:
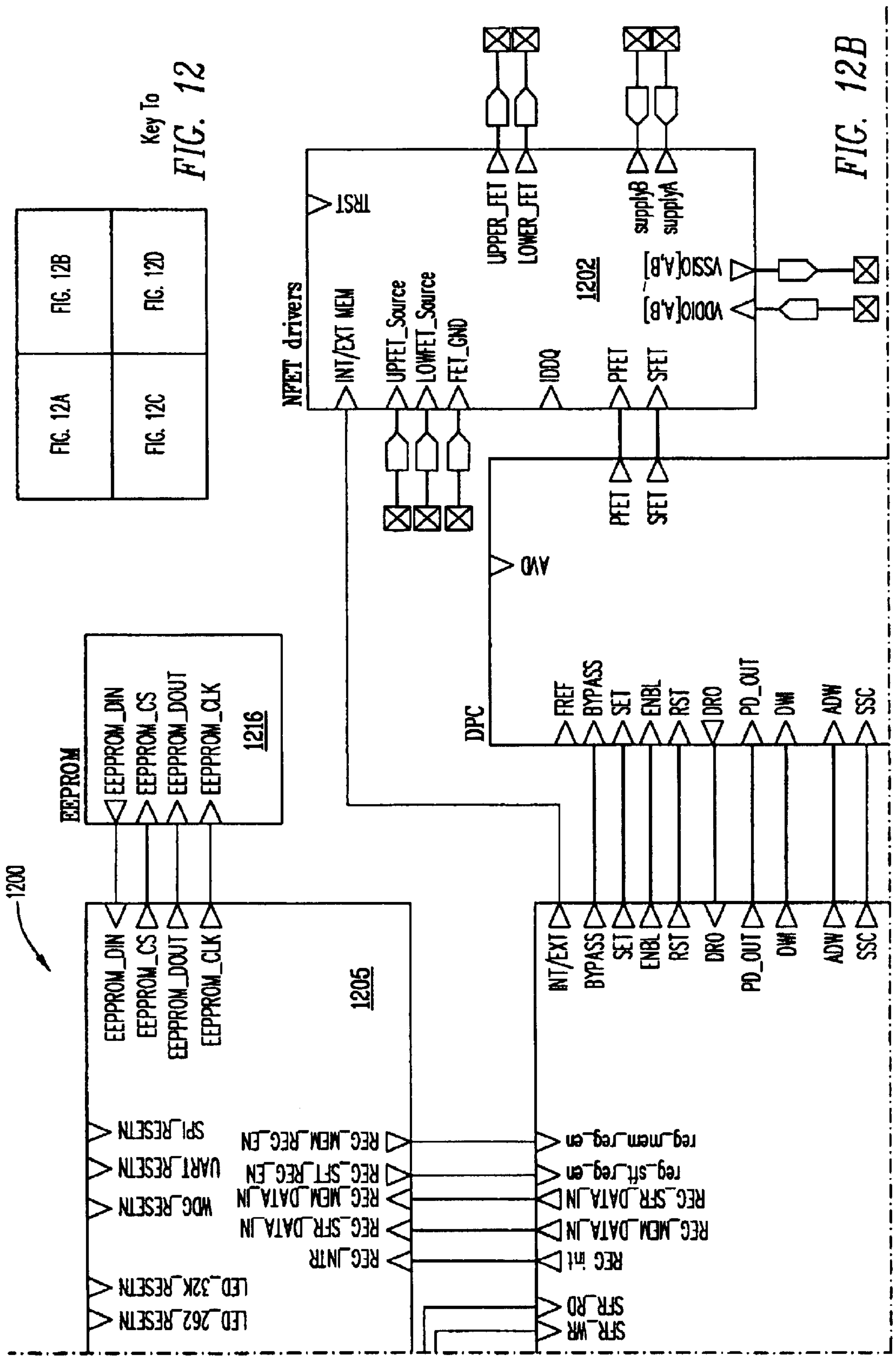
Figure 12C:
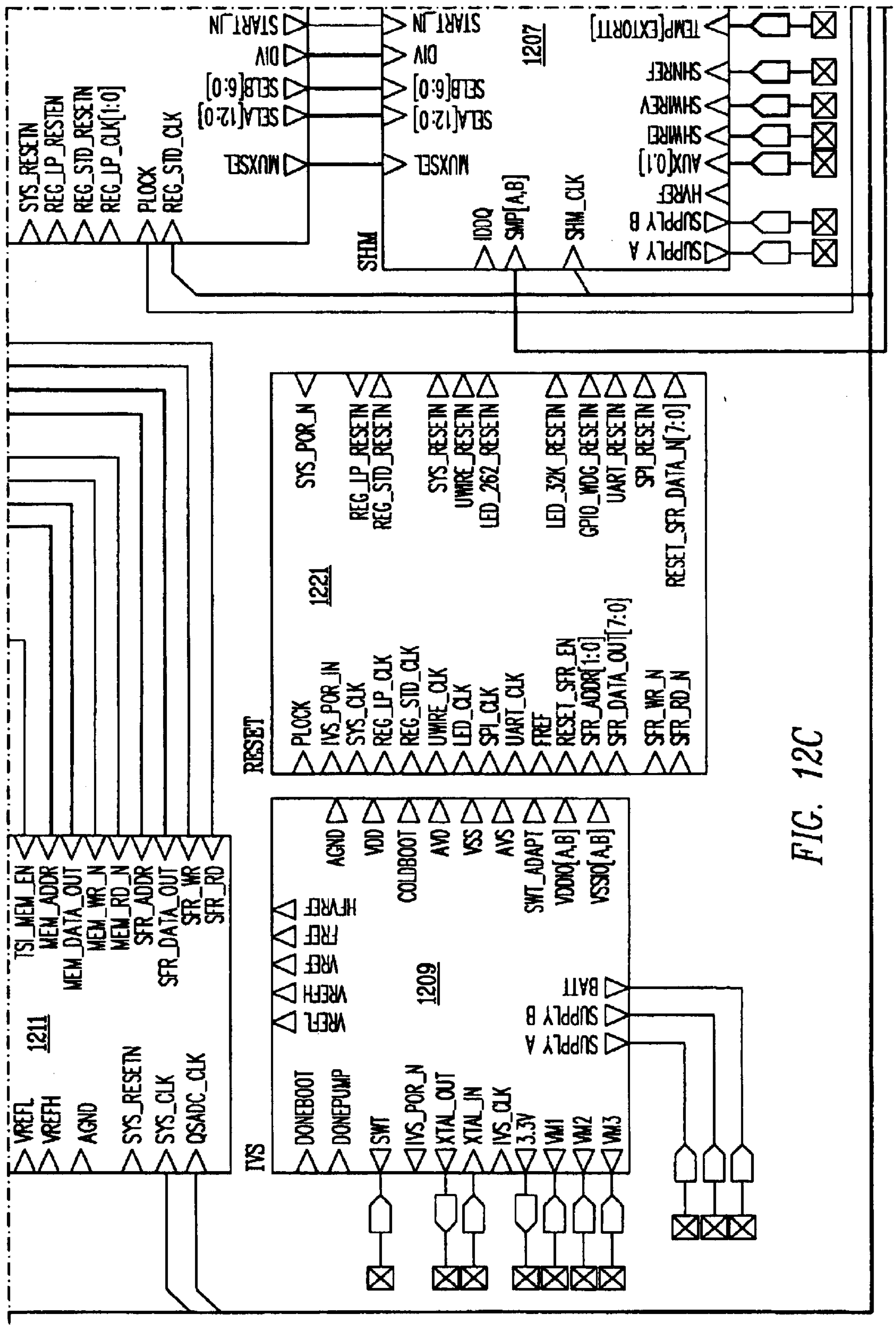
Figure 12D:
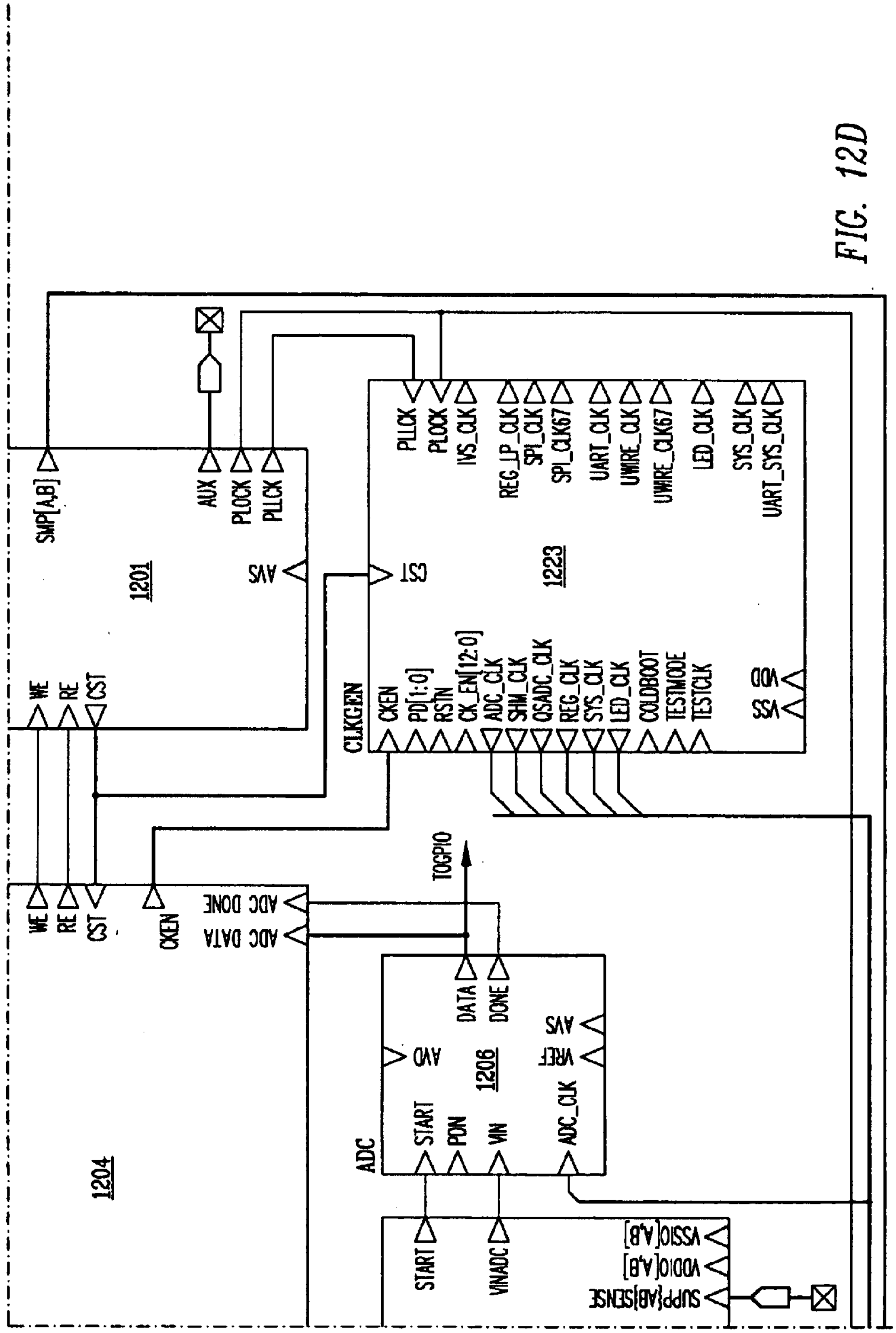

Referring to FIG. 12, substantially all of the digital interface functions are performed by an internal 8051 or a comparable microprocessor which is included in central processing module (SYS) 1205 and which communicates with the outside system with a number of interfaces through a number of general purpose input/output (GPIO) signals that can be defined in software in the microprocessor and mapped flexibly to individual input or output pins or terminals of the integrated circuit. For example, each pin can be defined to carry a high true or a low true signal, and can be defined to be an input signal or an output signal. In addition, each pin can be assigned to any of the individual power supply elements and can be shared so that more than one power supply can receive the same control signal from a single pin. In this manner, for example, a single enable signal may be shared amongst multiple power supplies. The GPIO signals can be used to implement input and output signals of some of the peripheral devices. For example, the keyboard scanner functions interact with an external keyboard through the GPIO signal interface. The watch-dog timer may receive input signals and status information from circuits external to the integrated circuit. Also, interrupt signals can share pins with the GPIO signals. This implementation thus provides a rich set of functionality to allow the product to be capable of being made "plug-compatible" with prior art solutions that were based on separate discrete devices. Central processing module (SYS) 1205 handles serial communication on and off the chip. Every signal which can be implemented as a GPIO signal, except an interrupt signal, can also be implemented as a serial communication signal. In an application designed for prior art devices, serial communication can be used to access a keyboard and coulomb metric measurement capabilities. The GPIO signals can be used to turn on and off individual power supplies and to monitor their statuses.

A computation circuit, which may be provided as a very long instruction word processor ("VLIW engine") to simplify decoding logic, is included in regulation control module (REG) 1204 (labelled in FIG. 12 as "REG"). The VLIW engine executes low level commands from central processing module (SYS) 1205 (labeled in FIG. 12 as "SYS"). Regulation control module (REG) 1204 receives and interprets the measurements of voltages and currents from the various circuits supplied by the regulated power supply pins. Using a number of different types of control loops, regulation control module (REG) 1204 provides to digital pulse converter (DPC) 1201 commands in the form of precisely modulated signals, which then are used to operate external components through NFET driver module 1202. Together with the external components, switching power supply controller 1200 forms one or more power converters of various designated topologies.

One unique feature of the system according to the present invention is that the system is programmable. In addition to allowing every function, mode and regulation parameters to be preset, the specifications of external components can be stored internally in the integrated circuit and used to perform the regulator functions. Thus, regulation control module (REG) 1204 operates with a large amount of information about the characteristics of the power converter components external to switching power supply controller 1200. Unlike a prior art switching power supply controller circuit implemented in analog technology, a power supply controller circuit of the present invention "knows" the output voltage it's trying to attain ("target voltage") and the error(i.e., the difference between the current output voltage and the target voltage). Typically, prior art analog converters correct the error using algorithms that are independent of the current switching duty cycle or the value of the input voltage. Such prior art converters also do not internally store information about the external components. An engineer attempting to design with such a prior art power supply controller circuit can only provide "hints" to the power supply controller circuit in the form of compensation networks. In contrast, a power supply controller circuit according to the present invention has many advantages and benefits over the prior. For example, having information regarding the current output voltage and duty cycle, the target voltage and the internally stored parameter values of the external circuit allows the power supply controller to calculate the potential duty cycles that would result in the correct output voltage to high precision and to select a realistic response that observes the constraints of the external circuit (e.g., the saturation current of an inductor). Proper response to external circuit anomaly limits the amount of noise that's reflected to the power supply controller circuit. For example, by controlling the transient noise currents through the power controller circuit, a battery or a long wire that provide the supply voltage to the power controller circuit could experience and possibly radiate less electromagnetic interference (EMI).

A programmable keyboard scan function is implemented in central processing module (SYS) 1205, and allows individual keys to be scanned or detected after a key has been pressed to awake the keyboard scanning circuit from a stand-by state. A watch dog function is performed with software in central processing module (SYS) 1205, and provides full-featured watch-dog timer functions. Watch dog timer functions may be used to handle software faults in a system. For example an external processor running a complex operating system (e.g., Win CE) may periodically briefly assert ("toggle") a signal on a specified pin. The watch dog timer resets its timer whenever the signal on the specified pin is toggled. When a malfunction occurs in the software of the host microprocessor, such that the signal on the specified pin is not-toggled within the scheduled time, then a set of pre-programmed actions are taken to recover operation of the external system processor. These actions range from simply resetting the processor or another circuit element, or cycling the processor's power off and on. Power-cycling removes current from parasitic SCRs that may be present in the processor or other integrated circuits, thereby affecting a recovery from a semiconductor latch-up state. Other anomalies that would normally not be recoverable using logic or reset signals may also be corrected through power cycling.

Central processing module (SYS) 1205 controls external status LEDs, or a single multi-color LED. Internal reset logic which is included in internal voltage supply 1209, provides a power-on reset to allow internal clocks and internally generated voltages to stabilize prior to operation. This is a different and distinct concept from the host reset conditioning feature described below, which is implemented in software and runs on the internal microcontroller. The host reset conditioning software conditions the external system's reset signal with the status signals of the power supplies, and external signals at the product's input pins.

Touch screen interface 1211 uses a dual-slope technique to read the X and Y coordinates of a resistive touch panel display. In a PDA, this digitization operation, because of the large area of the display, is quite subject to noise induced by the back light. In the prior art, a typical back light is implemented by cold cathode fluorescent light (CCFL), which is essentially a fluorescent light bulb that does not have a cathode heater to raise the energy of the internal gas for ionization at a low voltage. In CCFL, for a typical device, initial ionization ("ignition") is brought about using an AC voltage of 700 volts or more, and an AC voltage of over 300 volts is used thereafter to maintain the ignition. The high voltage AC waveform that is driving the CCFL is a potentially serious source of noise to the touch panel, which is made up of panels of resistive material and is located only a few millimeters away directly in front of the display. Touch screen interface 1211 uses a quad-slope analog-to-digital converter circuit which operates synchronously with the back light voltages generated by the power supply controller. By operating synchronously with the back light, the noise from the back light is integrated over an even number of cycles, thereby effectively removing it without a of complex filtering or an algorithmic approach.

Internal voltage supply 1209 is the power supply for switching power supply controller 1200, deriving from either one of two external supply pins, or one of two external battery pins the internal voltages required for the operations of the various blocks, including central processing module (SYS) 1205 and regulation control module (REG) 1204. In addition to providing the various voltages required for the various subsystems, internal voltage supply 1209 also provides the crystal oscillator function (other than the crystal, which is off-chip) various charge pumps for creating internal supplies, and comparators to indicate when the supplies are stable for use by internal processing elements.

Sample and hold module 1207 includes an array of sample and hold circuits and scaling circuits. Sample and hold module 1207 monitors the various points within the output sections of the power supplies, measuring voltages and currents, input voltages, and temperatures at various points. Sample and hold module 1207 provides its data, one sample at a time, to analog to digital converter 1206 (a system shared resource), which converts the external analog samples into digital samples. The digital samples are used by regulation control module (REG) 1204, or passed upstream to central processing module (SYS) 1205. In this embodiment of the present invention, the analog to digital converter and the sample and hold structures are based on either ratios of capacitors or unity gain. Thus, calibration can be achieved using a single calibration.

NFET drivers module 1202 include a set of output drivers which operate in one of two modes. The first mode is to drive external power MOSFET devices. In this mode, each output voltage is associated with two sets of driver circuits; one for driving the control FET and the other one for driving the sync FET. For modest currents, the two driver circuits may be used in another mode of operation where they are driven together, and their output signals may be connected together, to drive an external coil directly in a power switching function.

A power supply utilizing the present invention can be completely programmable, i.e., no external discrete components have to be chosen to set voltages and currents and a single chip can perform many different functions across many different products. Such programmability has the benefit of reducing the component count on a circuit board. It also has the benefit of reducing the number of parts that an individual manufacturer of an end product would have to stock since this same device can be used across many different applications. All of these features can be preset, either at the time the chip is manufactured, at the time that it is delivered, i.e., through a distributor, using programming techniques similar to those used with programmable logic array devices. Alternatively, the system of the present invention can be programmed by a customer even on the circuit board during the in-circuit test phase or final test for their product. Further, even though all these functions can be programmed, the values programmed during manufacturing and test are used merely as initial conditions and may be changed dynamically (i.e., during operation) by the system containing the power supply controller. For example, the system can reprogram the internal voltages and currents dynamically, as is often required in complex microprocessors which require different voltages for different modes of operation. Reprogramming activity can also be done for the purposes of dimming displays and controlling motors. Digital-to-analog conversion functions can be implemented by rapidly changing the output voltages of the regulators. Switching power supply controller 1200 features a completely programmable start-up and shut-down sequence, so as to allow a system using power supply controller 1200 to be started in a sequence that would avoid a latch-up conditions. For example, the I/O structure of a microprocessor is often required be powered before the microprocessor core. To reverse the order could result in damage or destruction of the microprocessor or cause a malfunction. A specific power sequence is also required for powering down these devices. In prior art solutions, this timing is set rather crudely by resistors and capacitors or not at all.

The individual power supplies controlled by switching power supply controller 1200 can be programmed for a wide variety of topologies, so that if a voltage which is higher than the input source, lower than the input source, or sometimes the same as the input source can be accommodated. For example, a boost converter topology is used for a power supply having an output voltage that is higher than the input voltage, a buck converter topology is used for a power supply having an output voltage that is lower case than the input voltage, and a sepic topology is used for a power supply having the same input and output voltages. When very high voltages are required (i.e., a cold cathode fluorescent light bulb or even a photographic strobe in a digital camera), topologies such as half-bridge may be used. All of these can be programmed and any number of them can be present in the design at any time, and any combination of these topologies may be supported simultaneously.

Switching power supply controller 1200 of the present invention can also perform dimming using pulse width modulation. This ability is important for cold cathode fluorescent lights because, typically, a simple reduction of current provides insufficient energy to ionize the entire display, resulting in the so called "thermometer effect" where only part of the back light is actually illuminated. Another application where PWM dimming is desirable is in white LEDs. White LEDs suffer an esthetically unacceptable shift in hue or color, as a function of current. Using pulse-width modulation for dimming white LEDs maintains a constant current during "on" time, so that a constant color is maintained over a large dimming range. Switching power supply controller 1200 also has input pins for use in temperature compensation: an internal temperature sensor is included, as well as external pins for reading an external temperature sensor. Temperature compensation is used in battery-charging to tailor a rate of charge, to respond to unsafe environmental conditions, to detect fault conditions and to prevent the destruction of external batteries or damage due to excessive heat build-up. The internal battery charger algorithms accommodate a number of different chemistries (e.g., lithium ion). Any chemistry can be accommodated since battery charging algorithms are provided in software to be executed in central processing module (SYS) 1205.

Switching power supply controller 1200 also allows selection between different batteries as its power supply.

Central processing module (SYS) 1205 can be programmed to use an external battery first, thus preserving its internal battery for emergency situations or while the external battery is being changed. It can also automatically choose to charge the internal battery first, and then external accessory batteries second. Central processing module (SYS) 1205 computes how much energy is available and charge both batteries at the same time or use them in parallel. Another function provided by a product using the present invention is the ability to provide the voltage, current and coulomb metric data to the outside system. This permits independent direct control over the voltage regulator functions and intermediate readings of the amount of energy available in a battery before an individual threshold. A system encompassing the present invention also maintains a charge acceptance history. This is useful in determining whether the battery may be fully charged. It's also an early indicator of battery wear out and provides a basis for limiting overcharge events where the battery may be indefinitely charged because of some sort of malfunction.

In accordance with one aspect of the present invention, the individual switching waveforms of the product are carefully staggered so that the amount of energy that is derived from an external power source, for example, a battery, is made as uniform as possible around all of the different outputs that require power. This effectively raises the frequency of the current required from the external source and may reduce the peak current demanded from an external source, which reduces the amount of noise on that external source and also reduces the noise radiated from the interconnecting wires to the external source and makes the noise easier to filter. Additionally, a spread spectrum approach is applied to internal frequencies. This reduces the net energy at a given frequency from external switching power supply functions. That is to say that instead of always operating at a constant frequency, the spread spectrum feature allows the switching frequency to be varied rapidly and that frequency modulated using industry standard patterns so that the energy at any particular frequency is reduced. The spread spectrum feature effectively reduces noise that would be experienced by an associated radio either within a product using the present invention, within the end product that this chip is implemented within or other products that are nearby. The frequency of operation can also be determined by external sources. In one embodiment, a 32 kilohertz crystal oscillator generates all the internal clocks and provides a 32 kilohertz time based output for use by other elements within the system. According to another feature, the system provides an external clock which is guaranteed to be 20 nanoseconds away from the nearest switching edge. This unique feature allows the external system to conduct sampling synchronously with the switching power supply functions in the same way the system synchronously samples to reduce switching noise internally. Normal switching prior art switching power supplies, since they have no knowledge of what duty cycle they're going to provide in any given cycle, have no way to provide this information ahead of time. Since all of the pulse width modulators used in the present invention are digital, this is achieved by another control signal that is scheduled within the array of control signals that make up all the pulse width modulators.

Referring to FIG. 12, clock generator macro 1223 (CLKGEN) generates clock signals required by the modules illustrated in FIG. 12. The clock generator module 1223 is illustrated in greater detail in the high level block diagram of FIG. 34 which shows the interface signals. The clock generator generates the clocks based on a source clock signals provided by digital pulse control module 1201. These source clock pulses are received by clock generator module 1223 over CST[9:0] output bus 1223.2 and the output ports PLOCK and PLLCK from DPC 1201 which are provided on interfaces 1223.4 and 1223.1, respectively. In the table below, the frequencies of the signals on the CST bus 1223.2 are illustrated.

Figure 34:
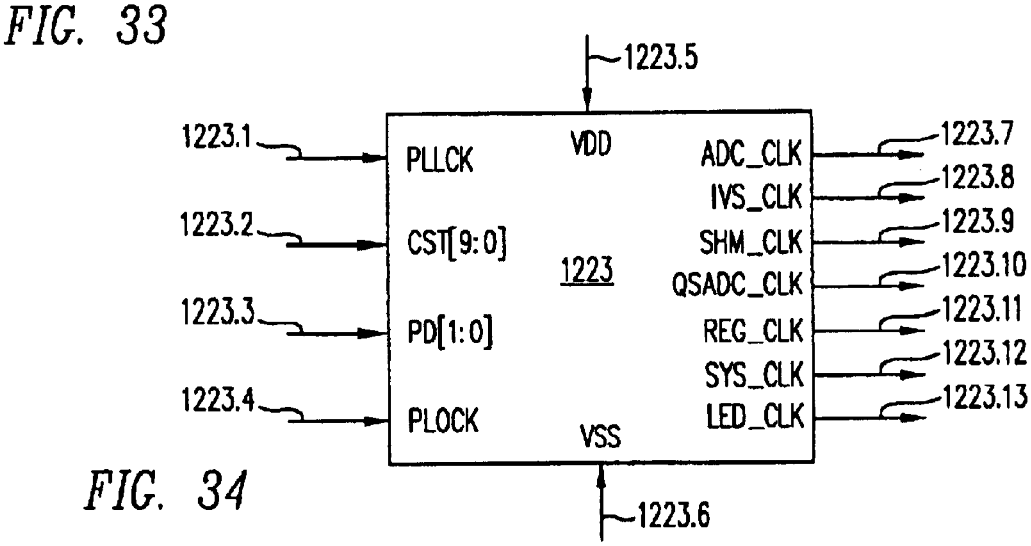
FIG. 34 is a block diagram showing the interface signals of clock generator 12223.

Referring to the various interfaces to clock generator 1223, the CST interface from DPC module 1201 is comprised of a 10-bit bus indicated by reference character 1223.2 and FIG. 34. The bus is connected to the output of the GREY counter in DPC 1201 and provides the majority of the source clocks for clock generator 1223. Table 102A shows the frequency of the signals on each of the bus lines CST[0] to CST[9].

TABLE 102A

| CST Bit | Frequency khz |
|---|---|
| CST[0] | 134,217.728 |
| CST[1] | 67,108.864 |
| CST[2] | 33,554.432 |
| CST[3] | 16,777.216 |
| CST[4] | 8,388.608 |
| CST[5] | 4,194.304 |
| CST[6] | 2,097.152 |
| CST[7] | 1,048.576 |
| CST[8] | 524.288 |
| CST[9] | 524.288 |

The 2-bit bus PD_OUT[1:0]indicated by reference character 1223.3 controls the mode of operation of the generated clock signals. Power modes of operation are designated as Standard, Low Power and Shut Down. Table 102B below shows the modes as function of the signals on the 2-bit bus.

TABLE 102B

| PD_OUT[1] | PD_OUT[0] | Mode |
|---|---|---|
| 0 | 0 | Shut Down |
| 0 | 1 | TBD |
| 1 | 0 | Low Power |
| 1 | 1 | Standard |

The clock signal to analog to digital converter 1206 is 15 provided over line 1223.7 and the frequencies at the various modes are indicated as set forth below in Table 102C. The Low Power and Standard mode frequencies are derived from the 538,870.921 khz DPLL clock through a division by 5.

TABLE 102C

| Mode | Frequency (khz) |
|---|---|
| Shut Down | 0 |
| Low Power | 107,374.1824 |
| Standard | 107,374.1824 |

The clock signal to the sample and hold block 1207 is provided over line 1223.9. The frequency which is needed for the various modes of operation is shown in Table 102D below. The Standard mode frequency is derived from bit CST[4] bit, and the Low Power mode frequency is derived from a division of the CST[8] bit by 2.

TABLE 102D

| Mode | Frequency (khz) |
|---|---|
| Shut Down | 0 |
| Low Power | 262.144 |
| Standard | 8,388.608 |

The clock signal to the internal voltage supply 1209 is provided over line 1223.8 and the frequencies needed for the various modes of operation are illustrated in Table 102E below.

The Standard mode frequency is derived from the CST[4] that, in the Low Power mode frequency is derived by the division of the CST[8] bit by 2.

TABLE 102E

| Mode | Frequency (khz) |
|---|---|
| Shut Down | 0 |
| Low Power | 1,048.576 |
| Standard | 0 |

The clock signals for touch screen interface 1211 are provided by the QSADC_CLK. The frequencies for the various modes of operations are shown in Table 102F below. The Low Power and Standard mode frequencies are derived from the CST[8] bit through a division by 2.

TABLE 102F

| Mode | Frequency (khz) |
|---|---|
| Shut Down | 0 |
| Low Power | 262,144 |
| Standard | 262,144 |

Regulation control module (REG) 1204 is provided clock signals for the Standard, Low Power and Shut Down modes by the clock generator 1223, and the frequency for each is indicated in Table 102G below. The frequencies for the various modes are derived, for example the Standard mode by using CST[0] bit and the low power operating frequency is derived from bit CST[8] through a division by 4. In addition, CLKGEN 1223 provides the SHM CLK and SYS CLK clock signals to regulation control module (REG) 1204.

TABLE 102G

| Mode | Frequency (khz) |
|---|---|
| Shut Down | 0 |
| Low Power | 131.072 |
| Standard | 134,217.728 |

Table 102H illustrates the modes and frequencies for those modes for the clock signal provided to central processing module (SYS) 1205. As illustrated in Table 102H, in the Shut Down mode the frequency is 0. For the Low Power and Standard modes, the frequencies are identical and they are derived from CST[2].

TABLE 102H

| Mode | Frequency (khz) |
|---|---|
| Shut Down | 0 |
| Low Power | 33,554.432 |
| Standard | 33,554.432 |

The LED_CLK is a clock used for the LED block which is associated with central processing module (SYS) 1205. The frequencies for the various modes of operation are indicated in Table 102I below. The Standard Mode frequency is derived from the CST[8] through a division by 2.

TABLE 102I

| Mode | Frequency (khz) |
|---|---|
| Shut Down | 0 |
| Low Power | 0 |
| Standard | 262.144 |

A digital supply voltage of 3.3 V±300 mV is provided to clock generator block 1223 via VDD which is connected to the core digital power supply. Similarly, VSS is provided over line 1223.6 and is the core digital ground.

Turning to FIG. 35, the port table is illustrated showing the port names, whether it is an input or an output, the description as well as the source and destination of the signals for those ports.

Referring to FIG. 12, reset circuit 1221 generates the resets for switching power supply controller 1200. The signals received by this circuit and produced by the circuit are indicated within 'the block. As with the other circuits shown in FIG. 12, the arrow adjacent to the signal name indicates whether the signal is generated by or received by reset circuit 1221.

Section 1.1 Detailed Descriptions of the DPC and Operation, Alternative Implementations Digital Pulse Converter wrapper 1201 can be implemented as a combination of a custom mixed-signal circuit (DPC) and an interface wrapper of digital glue logic synthesized from a logic circuit description expressed in a hardware description language (HDL). In this implementation, digital pulse converter wrapper 1201 converts 10-bit digital values to pulses with edges resolved to about 2 ns. As explained in further detail below, dual-port memory block with a single write port and a single read port is provided to store 10-bit values that express pulse start and width control, cycle skipping and bypass circuitry control (for direct output control).

Figure 13:
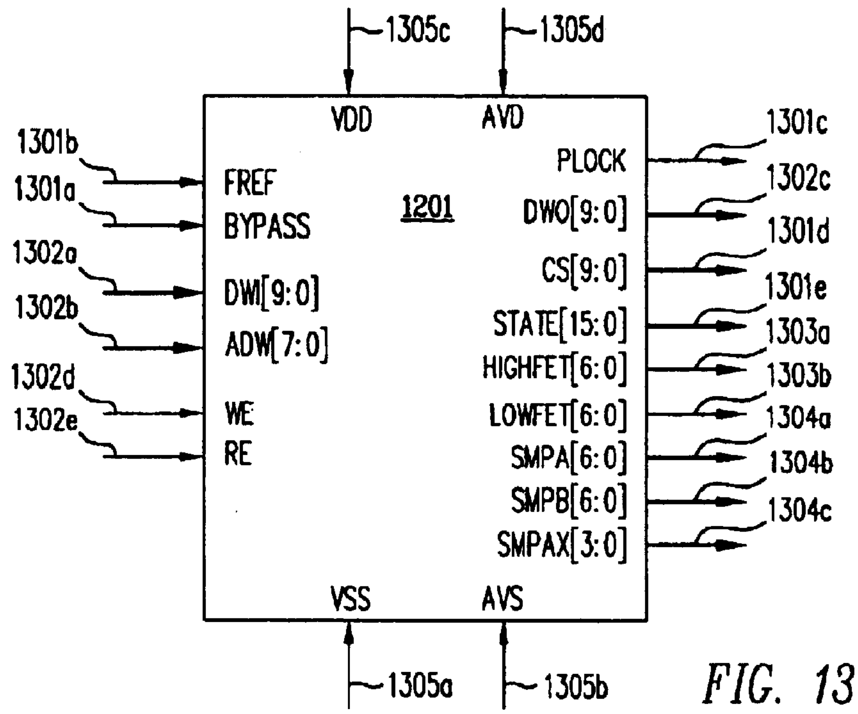
FIG. 13 is a block diagram showing interface signals of digital pulse converter wrapper 1201, according to one implementation.

FIG. 13 is a block diagram showing interface signals of digital pulse converter wrapper 1201, according to one implementation. As shown in FIG. 13, digital pulse converter wrapper 1201 has five interfaces: (a) timing control interface 1301, (b) regulation control interface 1302, (c) power regulation interface 1303, (d) sample and hold control interface 1304, and (e) power supply interface 1305.

Timing control interface 1301 includes 32 KHz, 50% duty cycle reference clock signal 1302*a* (FREF), reference clock bypass control signal 1302*b* (BYPASS), digital phase-locked status signal 1301*c* (PLOCK), count time state bus 1301*d* (CS[9:0]), and output state bus 1301*e* (STATE[15:0]), which are used to provide clocks and control states for the circuitry external digital pulse converter wrapper 1201. In this implementation, reference clock signal 1302*a* (i.e., signal FREF) is a reference clock provided to a digital phase-locked loop (DPLL) in digital pulse converter wrapper 1201 for frequency synthesis, and bypass controls signal 1302*b* (i.e., the BYPASS signal) is a test control signal used for bypassing the DPLL. PLOCK is a status signal indicating a phase-locked condition of reference clock signal 1302*a* in the DPLL. Count time state bus 1301*d* (i.e., bus CS[9:0]) is a 10-bit clock state bus which provides the clocks and control states to synchronize the DPC, the interface and other core circuits of switching power supply controller 1200. While count time state bus 1301*d* collectively displays the time state of the DPC, individual bits of count time state bus 1301*d* can be used as 50% duty cycle clocks. For example, if a 31.25 KHz reference clock is used, bit CS[9] corresponds to a 256 KHz clock with a 50% duty cycle, bit CS[8] corresponds to a 512 KHz clock with a 50% duty cycle. In general CS[n] corresponds to a 50% duty cycle clock with frequency $f(n,m)=2^{-(n+m)} f_0$, where $n \in \{0, 1, \ldots, 9\}$ and $m \in \{0, 1, \ldots, 6\}$. Output state bus 1301*e* (i.e., bus STATE[15:0]) is a 16-bit state bus which displays the internal state of switch control buses 1303*a* and 1303*b* (described below) prior to passing through the direct control logic used by regulation control interface 1303 to force the output signals of switch control bus 1303*a* (i.e., HIGHFET) and switch control bus (i.e., LOWFET) to specific states. Bus 1301*e* signals when write operations can occur to the DPC core circuit.

Regulation control interface 1302, which provides access to the dual-port memory in digital pulse converter wrapper 1201, includes memory write data bus 1302*a* (DWI[9:0]), memory address bus 1302*b* (ADW[7:0]), memory read data bus 1302*c* (DWO[9:0]), write-enable signal 1302*d* (WE) and read-enable signal 1302*e* (RE). Regulation control interface 1302 controls the offsets and pulse widths for the various pulses in power regulation interface 1303.

Power regulation interface 1303 includes switch control bus 1303*a* (HIGHFET[6:0]) and switch control bus 1303*b* (LOWFET[6:0]). Sample and hold control interface 1304, which controls the sampling and holding of analog voltages for digital conversion by the ADC used in the system control loop, includes a first sample control bus 1304*a* (SMPA[6:0]), a second sample control bus 1304*b* (SMPB[6:0]), and an auxiliary control bus 1304*c* (SMPAX[3:0]). The timing for each bit in the sample buses 1304*a* and 1304*b* is associated with each bit of the corresponding switch bus 1303*a* or switch bus 1303*b*. Each of sample buses 1304*a* and 1034*b* controls the sampling and holding of analog voltages associated with either the HIGHFET or LOWFET control buses for digital conversion. Sampling control bus 1304*c* (i.e., auxiliary sample SMPAX[3:0]) controls the sampling of other analog signals needed for system monitoring and control.

Power supply interface 1305 includes digital power reference 1305*c* (VDD), analog power reference 1305*d* (AVD), digital ground reference 1305*a* (VSS) and analog ground reference 1305*b* (AVS). Digital power and ground reference signals (i.e., VDD and VSS references) are global signals. In this implementation, VDD is the digital high voltage supply (3.3V±10%) connected to the core digital power supply. AVD is the analog high voltage supply (3.3V+10%) connected to the core analog power supply. VSS and AVS are, respectively, the digital ground and analog ground references (0V) connected to the core digital ground reference.

Section 1.1.1 First Embodiment of PWM Timing Generator

Figure 3:
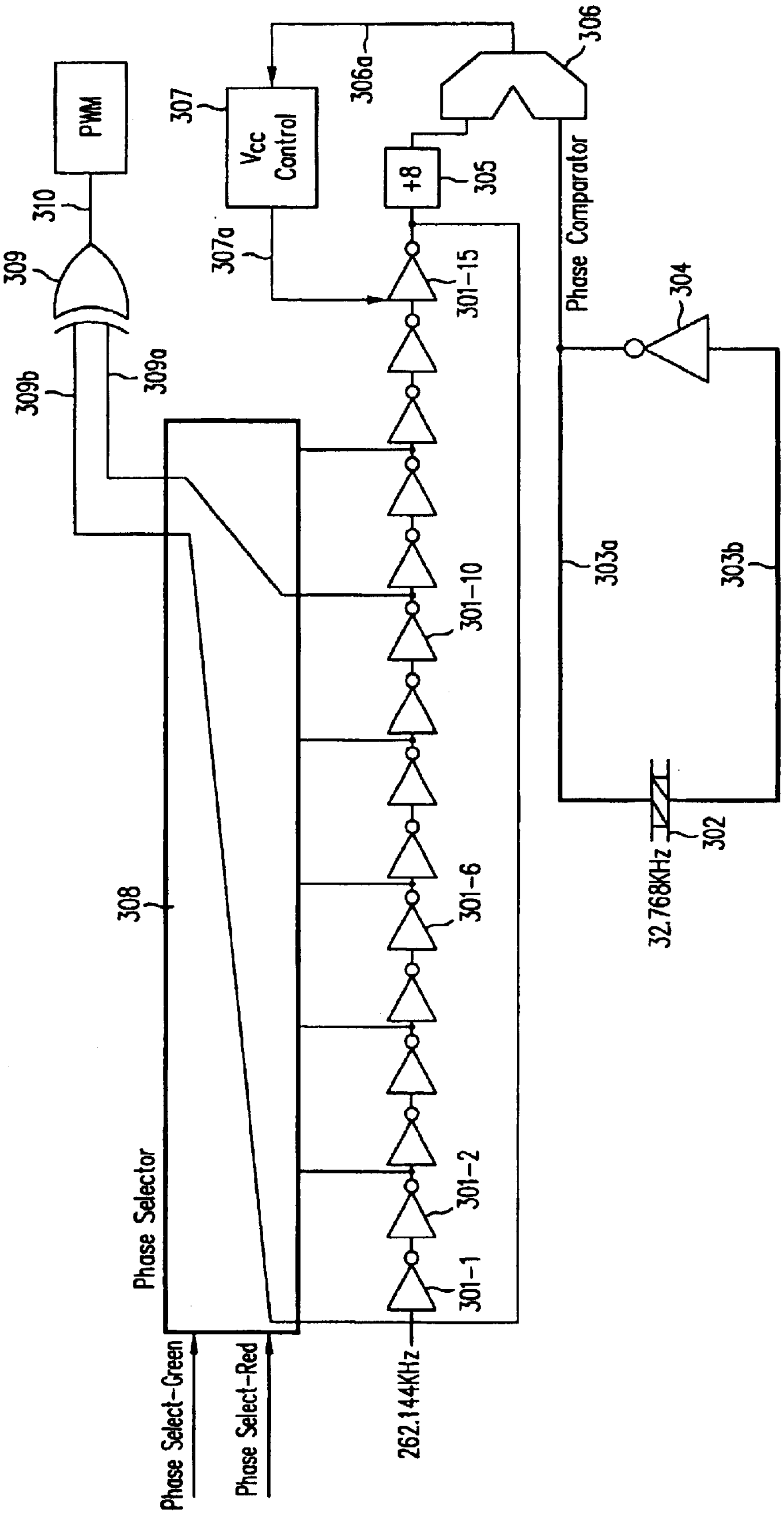
FIG. 3 shows the basic structure of a pulse width modulation controller utilizing a ring oscillator in accordance with this invention.

FIG. 3 shows a supply management controller of a type in accordance with this invention. As shown in FIG. 3, a ring oscillator includes inverters 301-1 through 301-15 connected in series. In an actual embodiment of this invention, the ring oscillator may include a larger number of series-connected inverters. For example, a thousand inverters can be connected in series, with the result that the duty cycle achieved by the controller of this invention can be almost 100%. However, to simplify explanation, only 15 inverters will be illustrated in this detailed description. The inverters each have inherently a delay "Δ," which is the elapsed time between the time a signal is applied to the input lead to the inverter and the time the resulting output signal is obtained on the output lead of each inverter. This time "Δ" is a function of the voltage applied to the components contained within the inverter. By varying the voltage applied to the inverter's components, the actual delay time Δ associated with an inverter can be varied. A typical inverter in CMOS technology will contain a P-channel MOS device series connected with an N-channel MOS device between a voltage source and a reference voltage, typically system ground. Should buffers be used with an inverter an additional four transistors may be used giving each inverter six transistors. The delay associated with the transmission of a signal through the inverter is a function of the voltage applied to the inverter. The higher the supply voltage applied to the inverter, the slower the transmission of the signal from the input to the output lead and the larger the delay Δ. In the structure of FIG. 3 a crystal 302 capable of oscillating at 32.768 KHz is connected by leads 303*a* and 303*b* to an inverting amplifier 304. Amplifier 304 provides a voltage across the crystal to cause the crystal to oscillate at 32.768 KHz, thereby causing the output signal from inverting amplifier 304 to oscillate at the frequency of crystal 302. The output signal of the ring oscillator is divided by eight in divided-by-eight circuit 305 and then sent to phase comparator 306, which receives also the output signal from oscillator 302. Thus the control frequency of the ring oscillator is 262.144 KHz, eight times the normal frequency of crystal 302.

The normal operating frequency of the ring oscillator is generally selected to be approximately the 262 Khz. The phase comparator 306 senses the phase difference between the phase of the divided-by-eight output signal from the ring oscillator and the phase of the signal from crystal oscillator 302. Phase comparator 306 provides this phase difference in an output signal on lead 306*a* to Vcc control circuit 307 to correct any deviation in the frequency of the ring oscillator's divided-by-eight output signal from the control frequency 32.768 Khz associated with crystal oscillator 302. Should the ring oscillator be at too low a frequency, then Vcc control circuit 307 is driven to provide a higher voltage on lead 307*a* to the inverter 301-15, thereby decreasing the delay time associated with this inverter and thus increasing the oscillating frequency of the ring oscillator. Alternatively, if the operating frequency of the ring oscillator is too high, then Vcc control circuit 307 provides a lower output voltage on output lead 307*a*, thereby increasing the delay time through inverter 301-15 and thus lowering the voltage associated with this inverter.

Phase selector 308 controls the width of a pulse width modulated (PWM) output signal on output lead 310 from exclusive OR gate 309. Each of the two input leads to exclusive OR gate 309 is coupled by phase selector 308 to a tap associated with one output lead from an inverter 301-i in the ring oscillator. The output leads from the even-numbered inverters 301 are connectable one at a time to input lead 309*a* of exclusive OR gate 309. The output leads from the odd-numbered inverters 301 are connectable one at a time to input lead 309*b* of exclusive OR gate 309. The particular output leads from inverters 301-1 through 301-15 to be connected to input leads 309*a* and 309*b* of inverter 309 are selected depending upon the requirements of the power supply being driven by the PWM signal on output lead 310 from exclusive OR gate 309.

Exclusive OR gate 309 will have a high output whenever its inputs are different. This happens each time a high edge or a low edge propagates through the ring oscillator past the inverters that the exclusive OR gate is attached to. Since one cycle of the ring oscillator contains both a rising edge and a falling edge, the PWM signal observed at output lead 310 of exclusive OR gate 309 will be twice the frequency of the ring oscillator.

The normal frequency "f" of the ring oscillator (made-up of inverters 301-1 through 301-15) is given by the delay time "Δ" associated with each of the inverters. Thus if all inverters have equal delays, then the normal frequency $f=1/(2n\Delta)$ where n is the number of inverters and Δ is the delay time associated with each inverter. Thus the frequency is inversely proportional to the number of inverters. The period of the ring oscillator is given by 1/f. Thus if the number of inverters equals 1,000 and the delay associated with each inverter is $10^{-9}$ seconds, then the frequency is 500 Khz and the period is 2 microseconds.

The various pulse widths which the system is capable of achieving are determined by the taps on the output leads of the inverters which are connected to the input leads 309*a* and 309*b* of exclusive OR gate 309.

Section 1.1.2 Second Embodiment of the PWM Timing Generator

Figure 4:
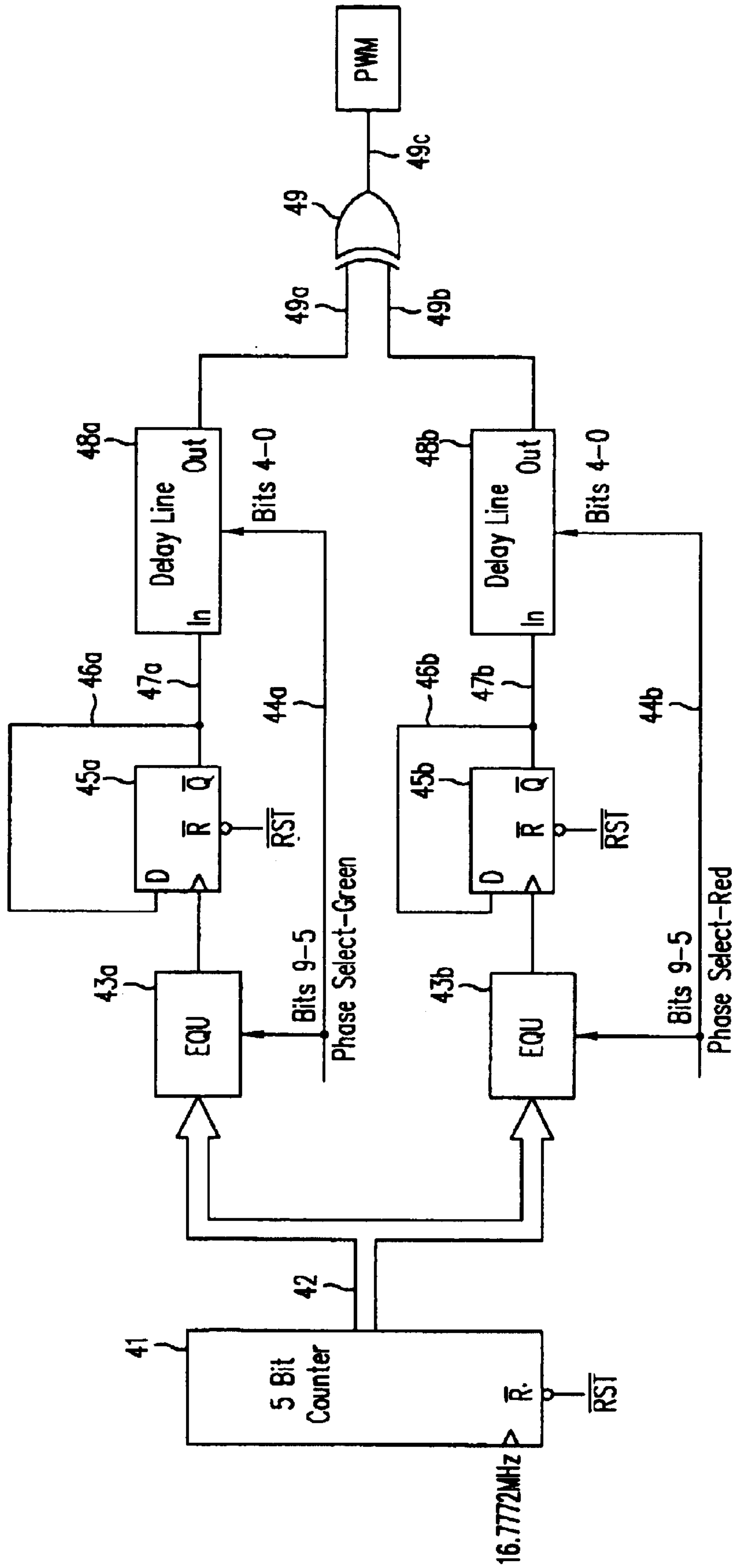
FIG. 4 shows an alternative implementation of a pulse width modulated controller in accordance with this invention.

FIG. 4 shows an alternative embodiment of the invention employing counters and comparators to generate a pulse width modulated signal. A five bit counter 41 (although a different number of bits can be used if desired) counts from 0 to 31 driven by a 16.7772 MHz signal. The instantaneous count from 5 bit counter 41 is sent on 5-bit bus 42 to comparators 43*a* and 43*b*, each of which compares the count to a reference count stored in it. Digital comparator 43*a* will store one count determined by the signals on phase select bus 44*a* and digital comparator 43*b* will store a second count determined by the signals on phase select bus 44*b*. The signals on phase select bus 44*a* and phase select bus 44*b* are determined by external circuitry which measures the voltage on the load capacitor and the current into the load capacitor and compares the voltage and current to reference values to determine the extent to which the charge on the load capacitor must be replenished. This is accomplished by switching power supply controller 1200, using in particular sample and hold circuit 1207, analog to digital converter 1206 and regulation control module (REG) 1204. These circuits, as well as their operation and the operation of the system are described in detail below. The output signal from digital comparator 43*a* toggles a D flip-flop 45*a* and the output signal from digital comparator 43*b* toggles a D flip-flop 45*b*. The inverting output signal from D flip-flop 45*a* is transferred on lead 47*a* to the input lead of a delay line 48*a*. The delay line has a length determined by bits 4-0 so as to correspond to the time taken to drive the 5-bit counter to the particular value which causes digital comparator 43*a* to toggle flip-flop 45*a*. The output signal from the delay line is transferred on lead 49*a* to one input lead of exclusive OR gate 49. 5-bit counter 41 continues counting after finding a match in digital comparator 43*a* until another match is found in digital comparator 43*b*. The particular value of the count in digital comparator 43*b* is set by bits 9–5 derived from phase select-red bus 44*b* as described below. The match results in input signal being sent from digital comparator 43*b* to D flip-flop 45*b*. D flip-flop 45*b* then produces an output signal on lead 47*b*, which is transmitted to the input lead of delay line 48*b*. Delay line 48*b* then produces a high level output signal on lead 49*b* to exclusive OR gate 49. During the time that the output signal from delay line 48*a* is high and the output signal from delay line 48*b* is low, a pulse width modulated signal will be produced by exclusive OR gate 49 on output lead 49*c*. When however, the output signals on output leads 49*a* and 49*b* are the same level, exclusive OR gate 49 will produce a low level output signal on output lead 49*c*. Thus the output signal from exclusive OR gate 49 is phase-modulated in response to the signals on phase select-green and phase select-red buses 44*a* and 44*b*, respectively.

Figure 5:
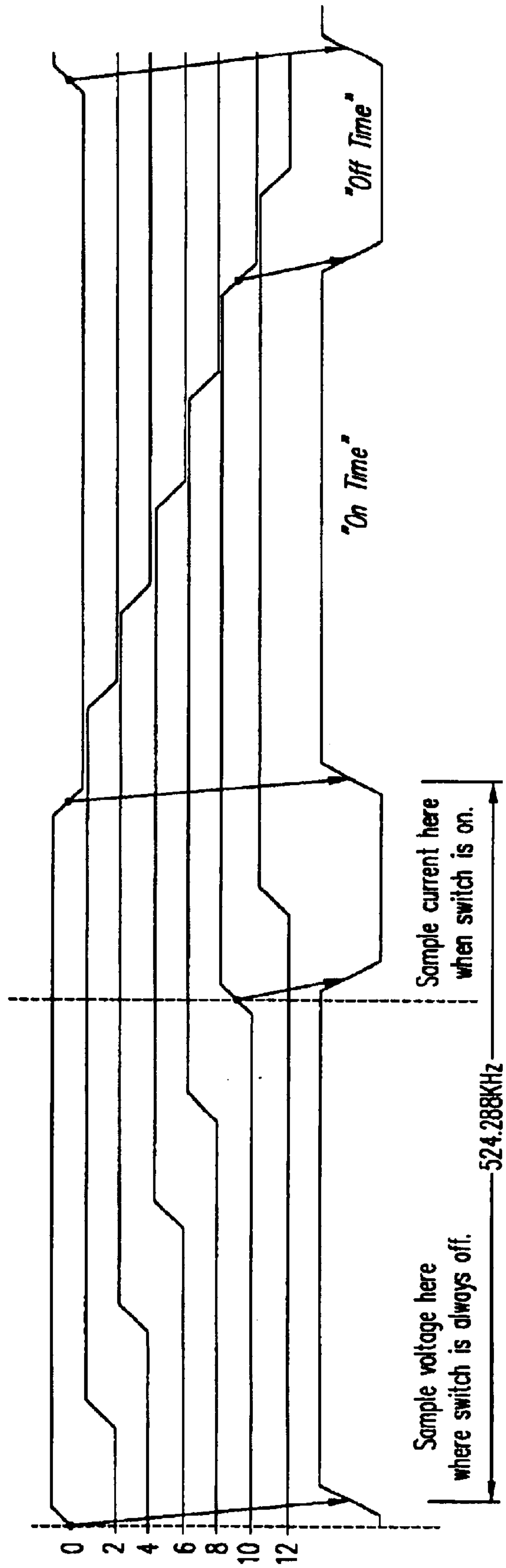
FIG. 5 shows an example of waveforms of the type generated using the structure of FIG. 3.

Selecting 16.7772 MHz to drive 5-bit counter 41 causes it to cycle through its complete count 524,287 ½ times per second. In other words, the output frequency of the signal on lead 49*c* from circuitry FIG. 4 is 262,144 KHz. FIG. 5 illustrates waveforms of a string of 13-series connected inverters. The top curve represents the input signal to the first inverter. The second curve represents the output signal from the second inverter. The third curve represents the output signal from the fourth inverter and the fifth, sixth, seventh and eighth curves represent the output signals from the sixth, eighth, tenth and twelfth inverters, respectively. The bottom curve represents the pulse width modulated output signal from the circuit as shown in FIG. 3 or FIG. 4. Note that, in this example, the output signal is controlled by the signals input to the series-connected inverters and the signal output from the tenth inverter. Note that the output signal is off when the signal input to the series-connected inverters and the signal output from the tenth inverter are the same amplitude and is on when these two signals are of complementary amplitudes. In one embodiment, discussed below, where the PWM signal drives a main switch of a DC/DC converter, the output current is sampled when the switch is on as shown by the dashed line and the output voltage is sampled when the switch is off as shown by the dashed line at the left hand portion of the curves. The output frequency of the pulse width modulated signal is 524,288 Hz while the frequency of change of the signals from the series-connected inverters is half this frequency over 262,144 Hz.

Section 1.1.3 Discussion of Counter+Comparators Approach—Without Delay Lines—Optimization Techniques in the Implementation Digital Pulse Converter wrapper 1201 may have various implementations and include various types of interfaces to perform its functions (e.g., pulse width modulation), as described herein. For example, pulse width modulation may be performed utilizing 1) a low frequency digital phase locked loop (DPLL) voltage controlled oscillator (VCO) with inverter stages and taps (e.g., as described in reference to FIG. 3), 2) a high frequency DPLL with a counter combined with a digital comparator, or 3) a DPLL combined with a content addressable memory (CAM) to generate the required pulse width modulated signals.

Figure 36:
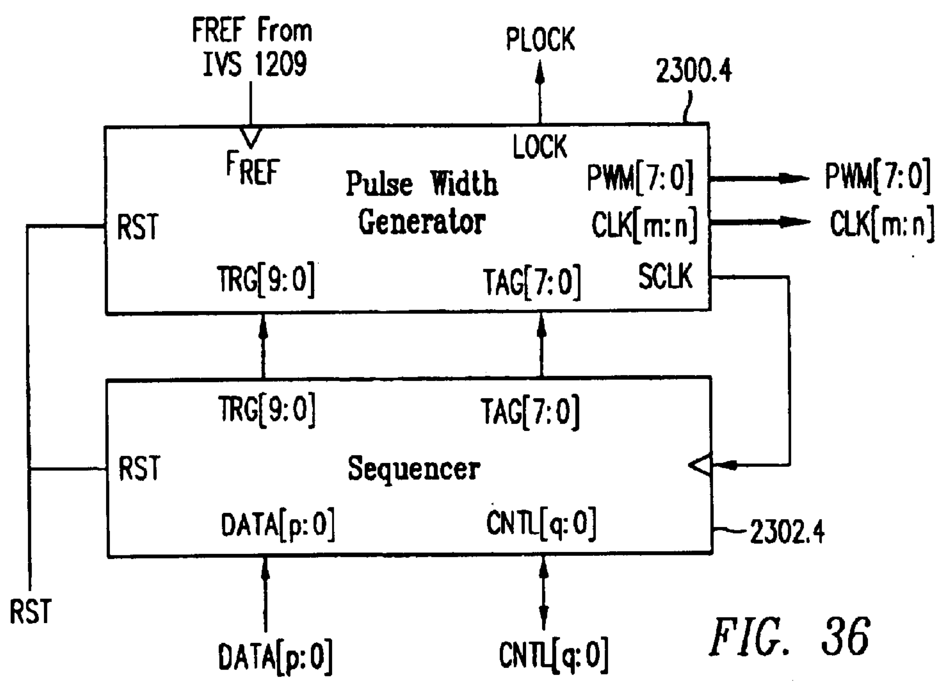
FIG. 36 shows an exemplary pulse width modulation implementation, which includes a pulse width generator and a sequencer, for digital pulse converter 1201.

FIG. 36 shows an exemplary pulse width modulation implementation, which includes a pulse width generator (PWG) 2300.4 and a sequencer 2302.4, for digital pulse converter 1201. As illustrated herein, this exemplary pulse width modulation implementation is directed to a high frequency DPLL with a counter combined with a digital comparator (i.e., example 2 as listed above), with one DPLL/counter/comparator combination for each power supply to be regulated.

PWG 2300.4 receives a 10-bit trigger (TRG[9:0]) signal and an 8-bit tag (TAG[7:0]) signal from sequencer 2302.4, along with a reference clock (FREF) and a reset (RST) signal. PWG 2300.4 generates a lock (PLOCK) signal, a sequencer clock (SCLK) signal, a pulse width modulation (PWM[7:0]) signal, and a clock (CLK[m:n]) signal. Sequencer 2302.4 generates the trigger (TRG[9:0]) signal and the tag (TAG[7:0]) signal and receives the global reset RST signal and a data (DATA[p:0]) signals from a control logic block such as regulation control module (REG) 1204. Sequencer 2302.4 also receives or provides control (CNTL [q:0]) signals.

The tag signal allows the start and stop times of different PWM signal outputs to occur at the same trigger value (i.e., time). This allows the PWN start and stop times to slide through each other (i.e., vary independently in time relative to each other) during normal operation. As an example of a sequence control, the trigger signal values (n0, n1, n2, . . . , n15) correspond to the tag signal values (t0, t1, t2, . . . , t15), where 1023≦n15> . . . >n2>n1>n0≦0 (where 1023 represents a time duration from 0 to 1023 from a counter). If t1 corresponds to the start of the PWM[3] signal and t8 corresponds to the stop of the PWM[3] signal, then the pulse width of the PWM[3] signal is PWM[3]=(n8−n1)τ, where τ≅2 ns.

Figure 36A:
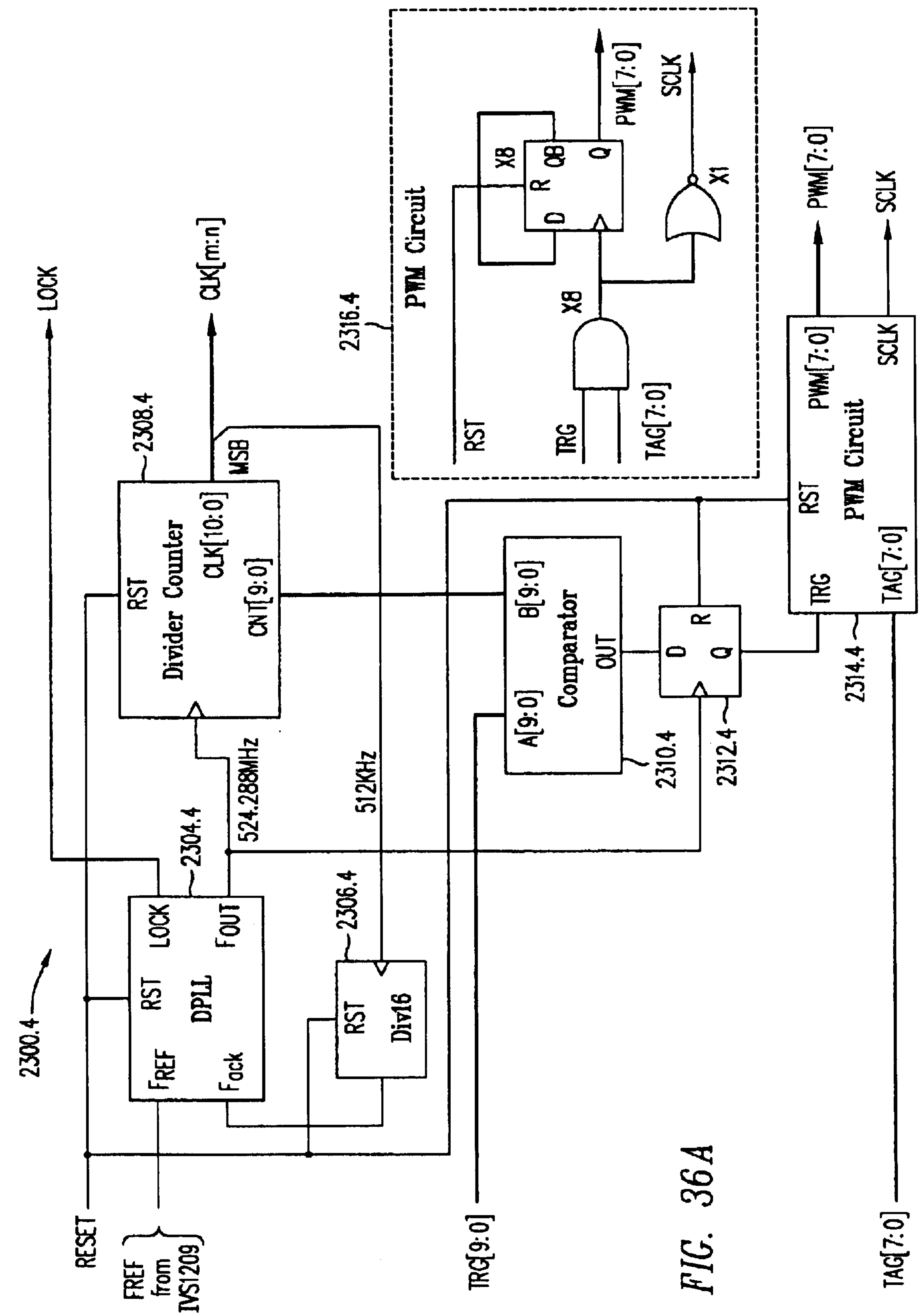
FIG. 36A is an exemplary implementation of the pulse width generator of FIG. 36.

FIG. 36A is an exemplary implementation of pulse width generator 2300.4 of FIG. 36. FIG. 36A includes a DPLL 2304.4 that generates the lock signal and an output frequency ($F_{OUT}$) signal that is provided to a divider counter 2308.4 that generates the clock signal. The most significant bit of the clock signal is divided by 16 (by divider 2306.4) to provide a feedback signal for comparison to the reference clock. Divider counter 2308.4 also generates a 10-bit count (CNT[9:0]) signal that is compared to the trigger signal by a comparator 2310.4, whose output is clocked out to a PWM circuit 2314.4 via a flip flop 2312.4.

PWM circuit 2314.4 also receives the tag signal and generates the PWM signal and the sequencer clock signal. An exemplary circuit implementation for PWM circuit 2314.4 is illustrated by a circuit 2316.4.

Figure 36B:
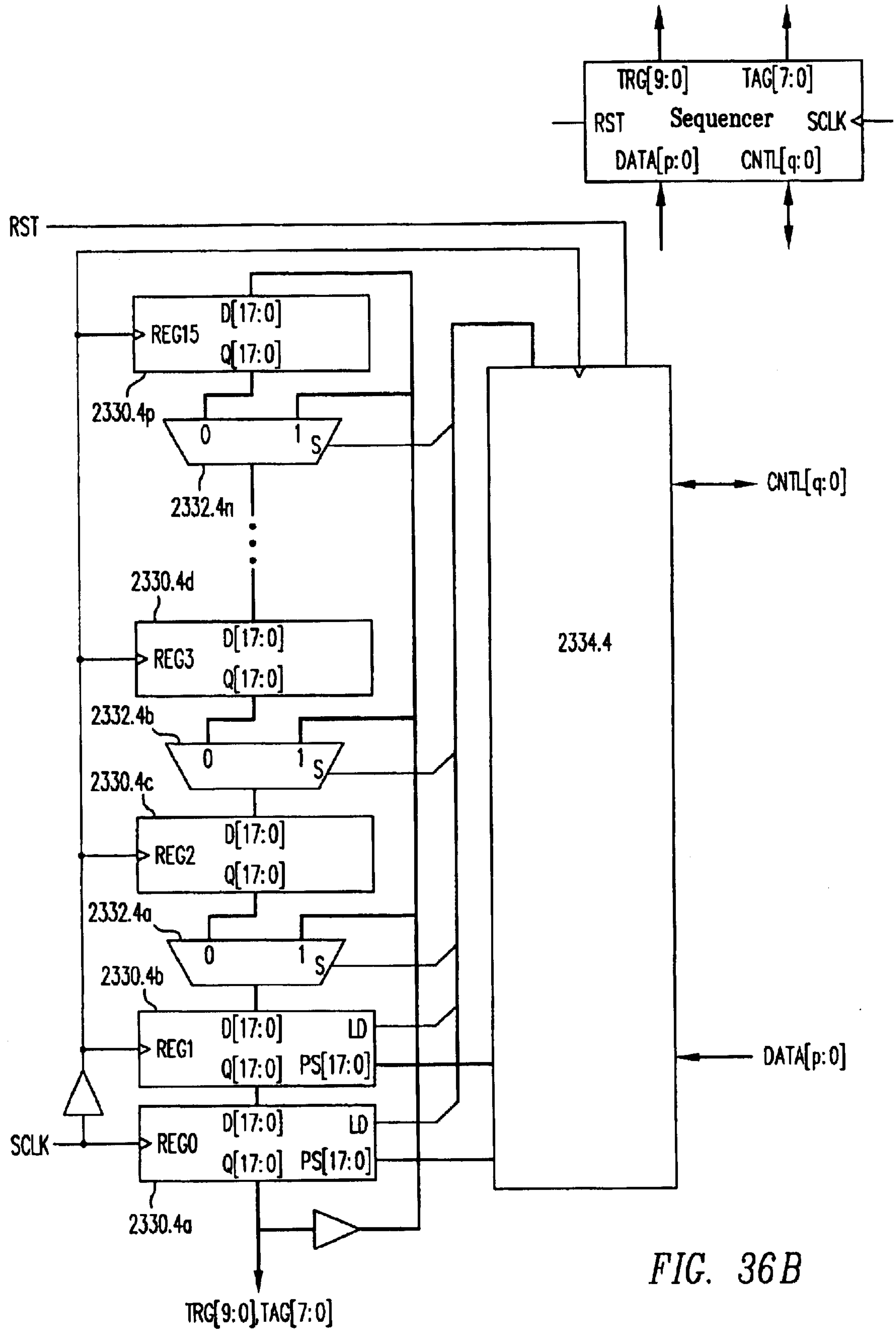
FIG. 36B is an exemplary implementation of the sequencer of FIG. 36.

FIG. 36B is an exemplary implementation of sequencer 2302.4 of FIG. 36. FIG. 36B includes a series of registers 2330.4 (which are separately referenced as 2330.4*a* through 2330.4*p*) and multiplexers 2332.4 (which are separately referenced as 2332.4*a* through 2332.4*n*) that are clocked by the sequencer clock (SCLK) signal and generate the trigger signal and the tag signal. Registers 2330.4 and multiplexers 2332.4 are controlled by a controller 2334.4, which receives the data signal and receives or provides the control signals. Controller 2334.4 operations may be performed by regulation control module (REG) 1204 or by a separate controller, such as a processor or a microcontroller, to provide the control and data sequencing logic.

Figure 36C:
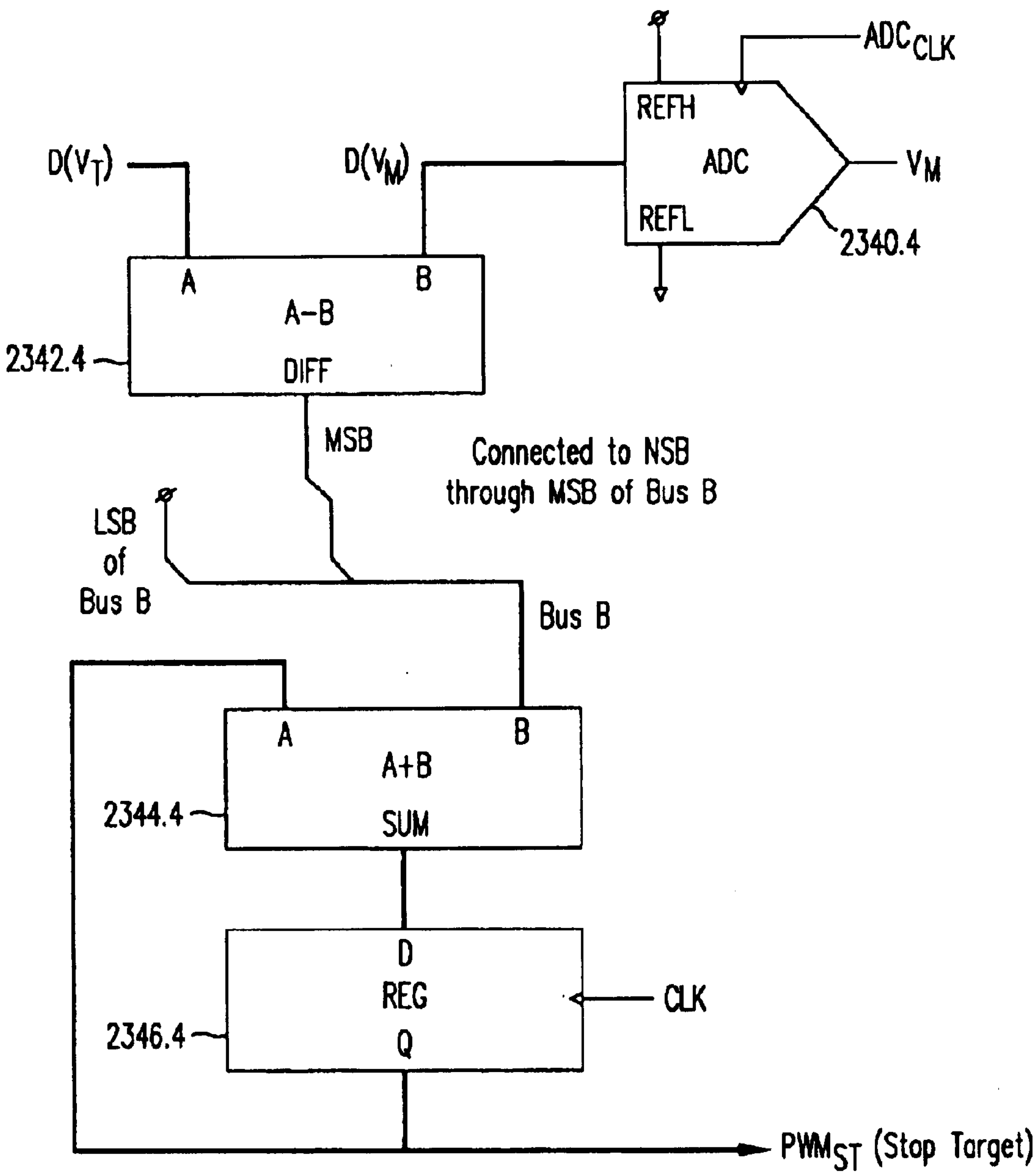
FIG. 36C shows an exemplary feedback control system.

FIG. 36C shows an exemplary feedback control system for a PWM switching voltage regulator without a dead zone. For example, the feedback control system monitors a voltage of interest ($V_M$) and compares it to a target voltage ($V_T$) to generate an estimated PWM stop target (i.e., stop time) for use by controller 2334.4. FIG. 36C includes an analog-to-digital converter (ADC) 2340.4, a subtractor 2342.4, a summer 2344.4, and a register 2346.4.

The voltage ($V_M$) is digitized by ADC 2340.4 and subtracted from the voltage ($V_T$ or digital $DV_T$) by subtractor 2342.4 and summed with an output of register 2346.4 by summer 2344.4. Register 2346.4 provides a PWM stop target ($PWM_{ST}$) signal.

If the voltage ($V_T$) is greater than the voltage ($V_M$), then the PWM stop target signal is incremented until the voltage ($V_T$) is less than the voltage ($V_M$), which results in the PWM stop target ($PWM_{ST}$) signal to decrement. Once steady state is achieved, the control loop will continue incrementing and decrementing the PWM stop target ($PWM_{ST}$) signal to minimize the difference between the voltage ($V_T$) and the voltage ($V_M$). This negative feedback control system relies on the fact that an increase in the PWM stop target ($PWM_{ST}$) signal will cause an increase in the voltage ($V_M$). The transient response of the control loop is small because the change in the PWM stop target ($PWM_{ST}$) signal will be, for example, only one unit (e.g., ±2 ns) from cycle to cycle.

Figure 36D:
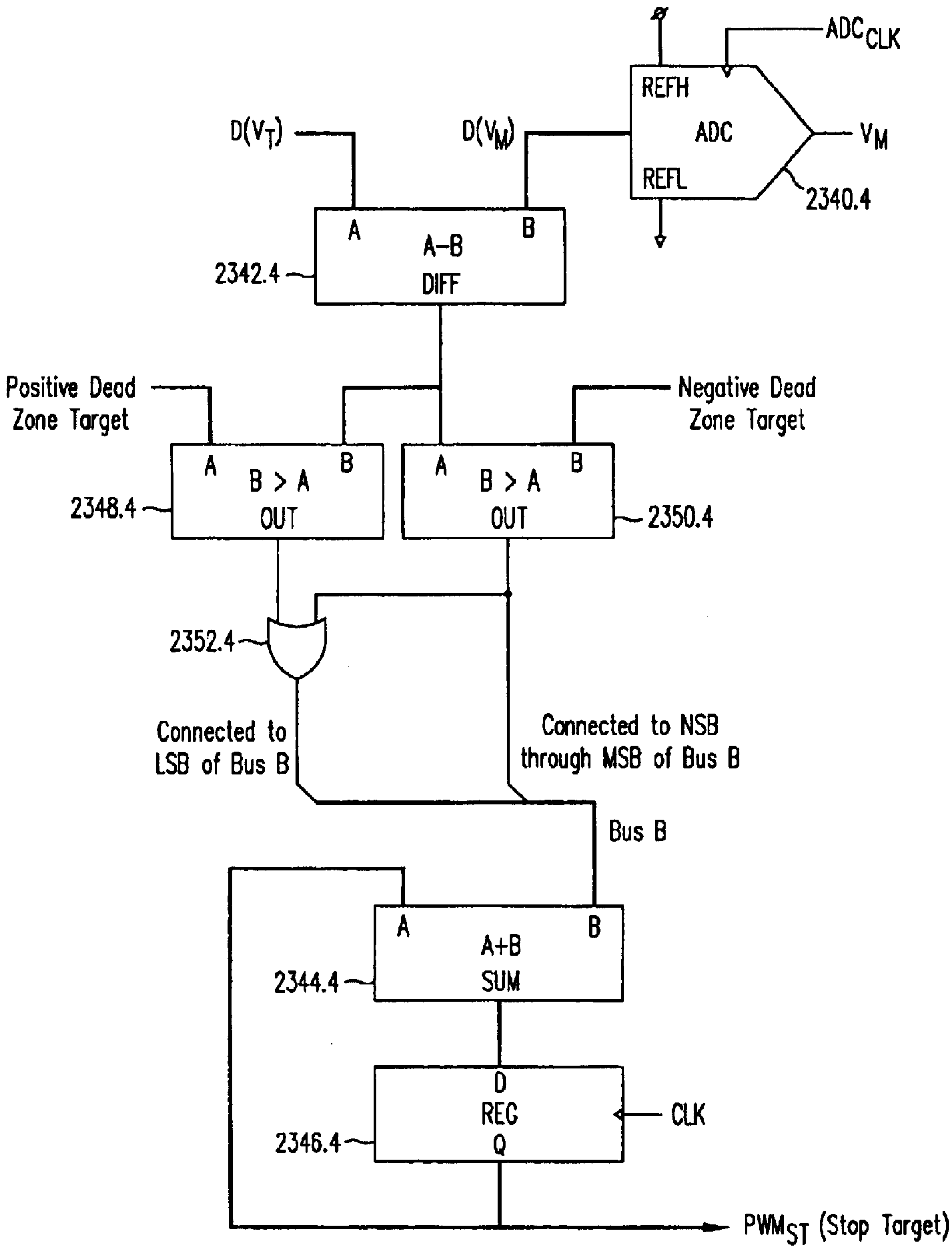
FIG. 36D shows another exemplary feedback control system.

FIG. 36D shows an exemplary feedback control system for a PWM switching voltage regulator with a dead zone. For example, the feedback control system monitors a voltage of interest ($V_M$) and compares it to a target voltage ($V_T$) to generate an estimated PWM stop target (i.e., stop time) for use by controller 2334.4. FIG. 36D includes converter (ADC) 2340.4, subtractor 2342.4, summer 2344.4, register 2346.4, comparators 2348.4, and a logic gate (OR) 2352.4.

The voltage ($V_M$) is digitized by ADC 2340.4 and subtracted from the voltage ($V_T$ or digital $DV_T$) by subtractor 2342.4, with the result compared to a positive and negative dead zone target by comparators 2348.4 and 2350.4. The output of comparators 2348.4 and 2350.4 is provided to logic gate 2352.4, whose output along with comparator 2350.4 is summed by summer 2344.4 with an output of register 2346.4. Register 2346.4 provides a PWM stop target ($PWM_{ST}$) signal.

If the difference (i.e., the voltage ($V_T$) minus the voltage ($V_M$)) is less than the positive dead zone target and greater than the negative dead zone target, the PWM stop target ($PWM_{ST}$) signal remains constant. Otherwise, the PWM stop target ($PWM_{ST}$) signal is incremented or decremented, as required.

Figure 6:
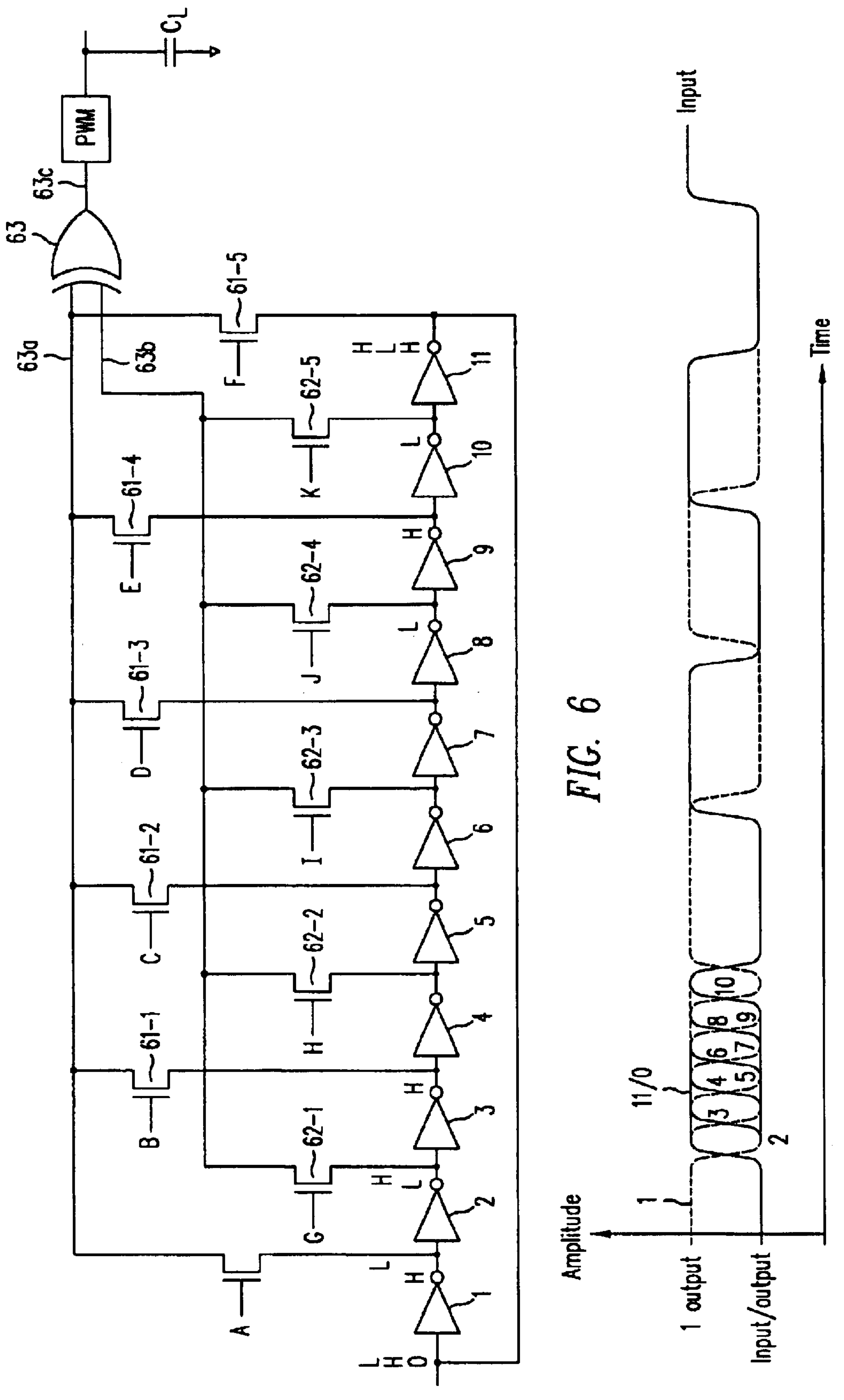
FIG. 6 shows a ring oscillator used in accordance with this invention together with a switching matrix used to select the particular output signals from the ring oscillator to be provided to the two input leads of an exclusive OR gate 63 to generate a pulse width modulated signal.
Figure 7:
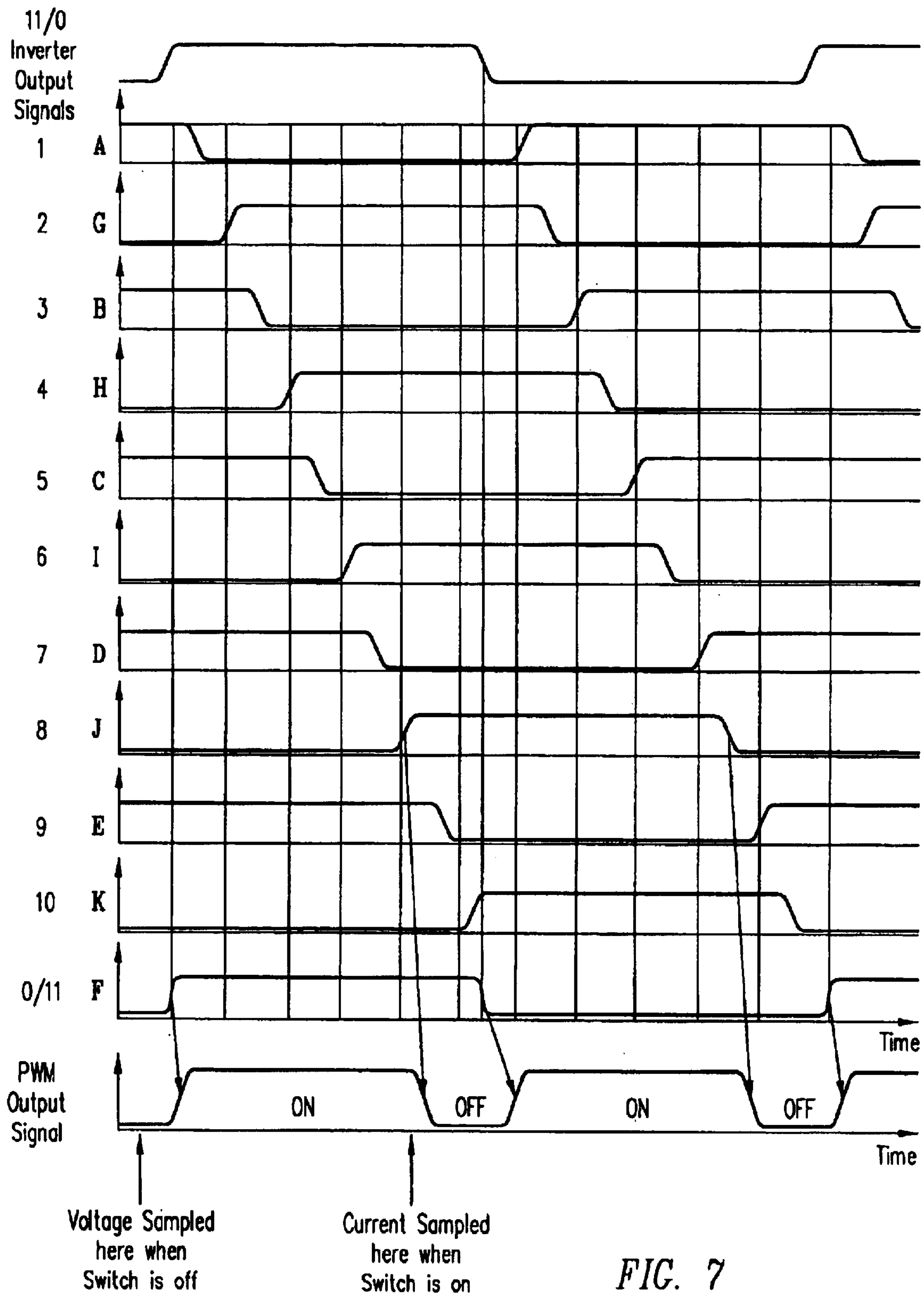
FIG. 7 shows the waveform of signals generated using the structure of FIG. 6.

Section 1.1.4 Discussion of PLL/RO using CAM, Optimization Techniques in CAM Implementation FIG. 7 shows the output waveforms from the eleventh series-connected inverters shown in FIG. 6. In FIG. 6 the series-connected inverters are shown having pass transistors connected from the output of each of the inverters. For the pass transistors connecting the output signals from the odd numbered inverters to input lead 63*a* of exclusive OR-gate 63, each pass transistor is driven by a signal labeled as A, B, C, D, E, or F. Similarly, for pass transistors connecting the output signals from the even-numbered inverters to leads 63*b* to exclusive OR gate 63, each pass transistor is driven by a signal labeled G, H, I, J, or K. The pulse width modulated output signal from exclusive OR gate 63 is transmitted on output lead 63*c* to the load capacitor of the particular circuit being powered by the structure shown in FIG. 6. The particular combination of pass transistors to be turned on determines the width of the pulse width modulated signal output on lead 53*c* from exclusive OR gate 63. Turning to FIG. 7, one can see the waveform from the inverters 1 through 11. The waveform from inverter 11 is, of course, fed back in FIG. 6 to the input lead of inverter 1.

Figure 8:
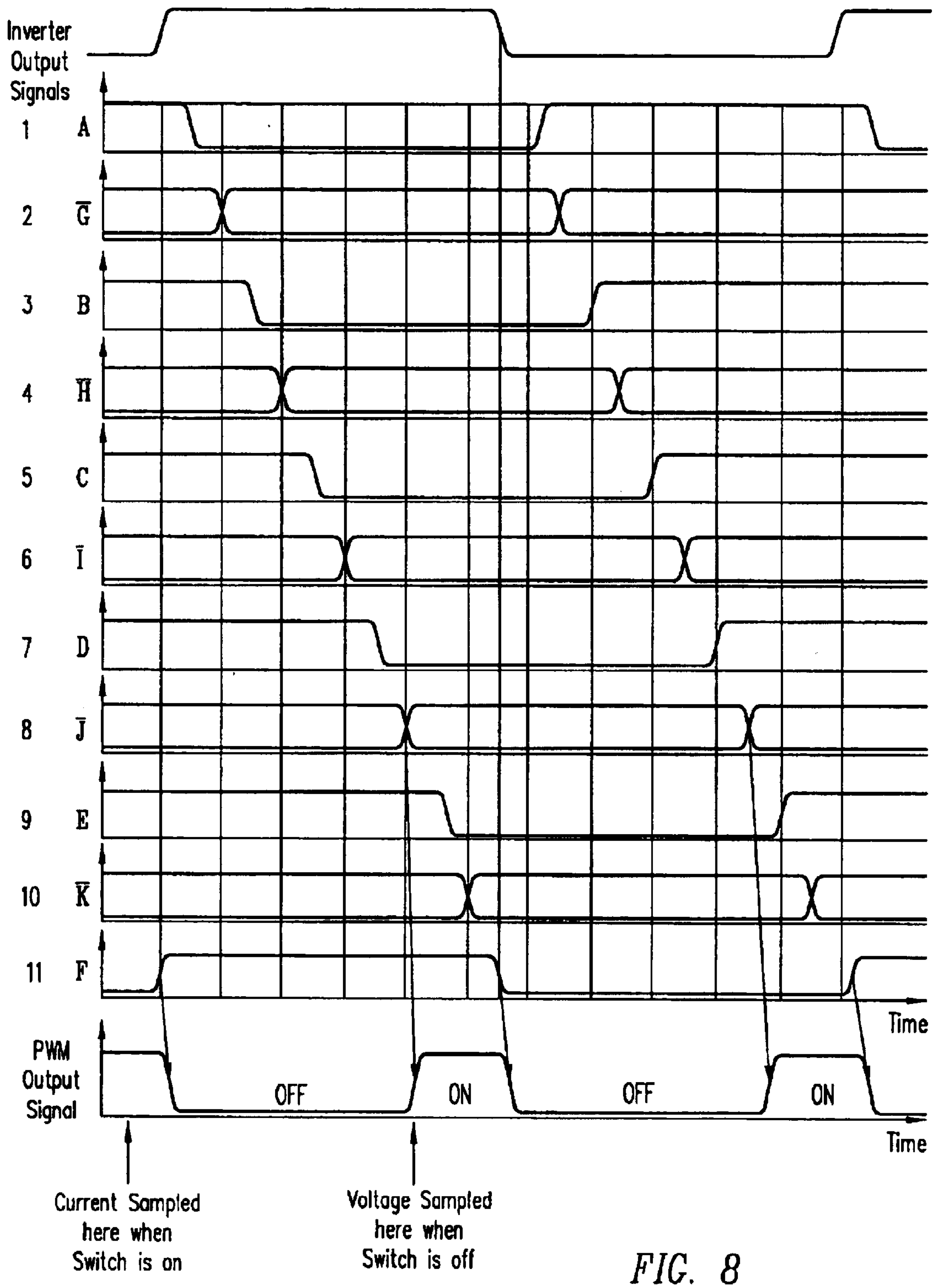
FIG. 8 shows the waveforms generated using the structure of FIG. 6 with an inverter connected between the output lead from each even-numbered inverter in the ring oscillator and the pass-transistors driven by the signals G, H, I, J and K.

FIG. 7 and FIG. 8 show waveforms for the output signals from each of the inverters 1 through 11 in FIG. 6. FIG. 7 shows the output signals for these inverters as taken straight from each inverter. FIG. 8 shows the output signals from inverters 1, 3, 5, 7, 9 and 11 taken straight from the output lead of each inverter while curves 2, 4, 6, 8 and 10 show the complement of the output signal taken from inverters 2, 4, 6, 8 and 10. FIG. 9 shows the pulse width for the various combinations of signals applied to input leads 63*a* and 63*b* of exclusive OR gate 63, respectively, throughout the pulse width of the pulse on output lead 63*c* from exclusive OR gate 63 is shown in the columns labeled pulse width. As can be seen from FIG. 9, only one combination of output signals from the various inverters is required to yield the five possible different pulse widths obtainable using the signals directly from the inverters. Thus the pulse widths 10, 8, 6, 4 and 2 are obtained from using on input lead 63*a* of exclusive OR gate 63 the output signal from inverter 1 activated by pass transistor A together with one of the output signals from inverters 2, 4, 6, 8 and 10 activated by pass transistors G, H, I, J or K. Thus pulse widths of 10 delays, 8 delays, 6 delays, 4 delays and 2 delays are obtained using these combinations. The only other combination of output signals is that which uses the output signal for inverter 11 together with the output signals from inverters 2, 4, 6, 8 and 10, which again yields pulse widths of 2, 4, 6, 8 and 10 delays.

If output signals from the even-numbered inverters are inverted, then pulse widths of 1, 3, 5, 7, and 9 delays can be obtained by combining an exclusive OR gate 63 the output signal from inverter 1 with the output signal from inverters 2, 4, 6, 8 and 10, each inverted. Again, this set of pulse widths represent all possible pulse widths obtainable using inverted output signals from the even-numbered inverters together with the output signal from any one of the odd-numbered inverters.

An alternative implementation for performing pulse width modulation by digital pulse converter 1201 includes a DPLL combined with a content addressable memory (CAM) to generate the required pulse width modulated:signals (i.e., example 3 as listed above).

Digital Pulse Converter (DPC) 1201 is a low power custom mixed-signal macro. In general, the input and output signals of DPC 1201 are digital, however separate analog power and ground signals are provided to supply an internal digital phase lock loop (DPLL) circuit used for frequency synthesis.

Figure 37:
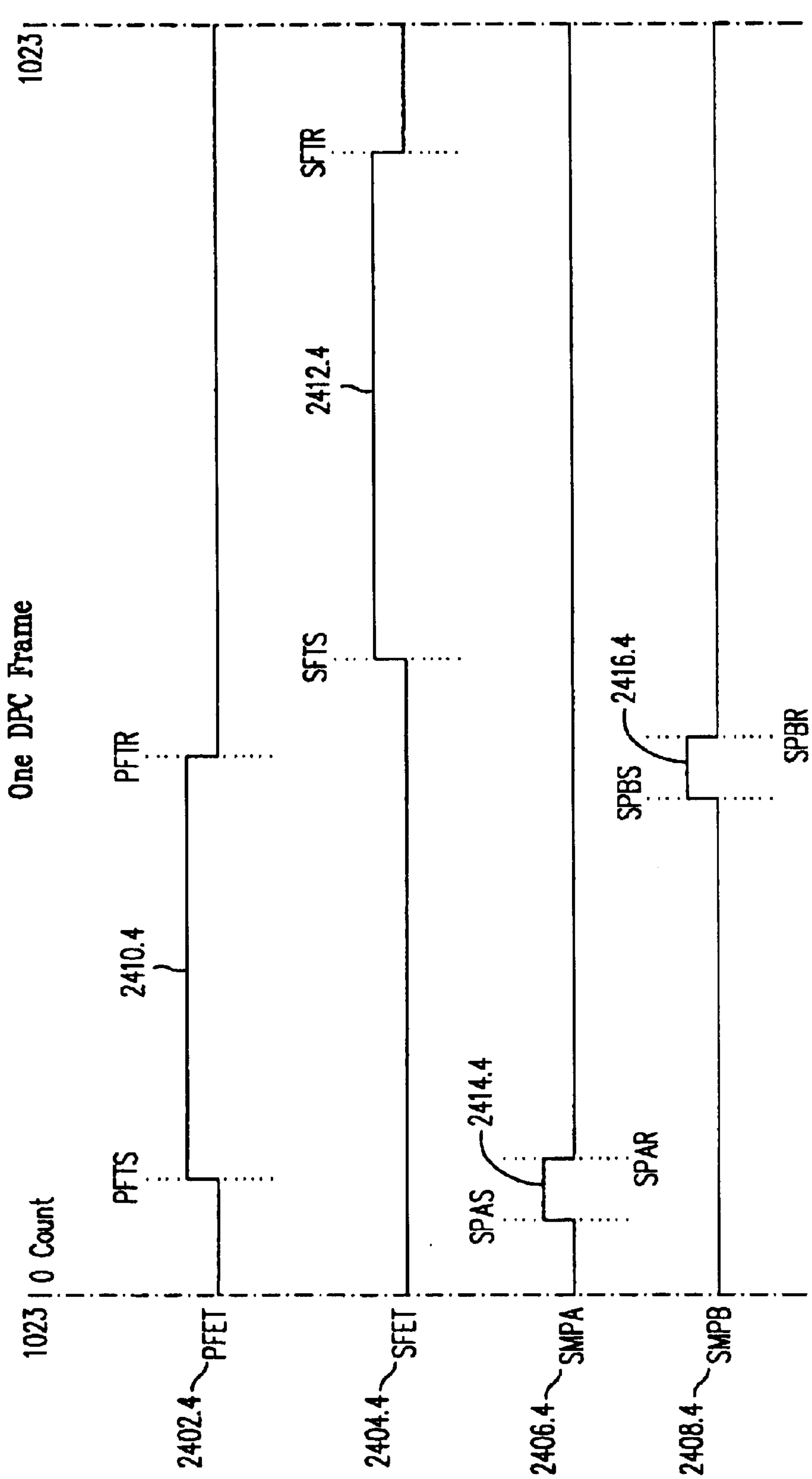
FIG. 37 shows a timing diagram for one digital to pulse converter frame for DPC 1201 in accordance with one implementation.

DPC 1201 synthesizes a reference clock (32.768 khz) to produce a variety of pulses with pulse widths based on a DPC frame which starts with a count of 0 and ends with a terminal count of 1023, as illustrated in the timing diagram shown in FIG. 37. In one implementation the DPLL generates a frame clock of 524.288 KHz, yielding a frame time of 1.907 $\mu$Sec. The minimum pulse width is represented by a count difference of 0 (i.e., 0% duty cycle) and the maximum pulse width by a count difference of 1024 (i.e., 100% duty cycle).

The rising and falling pulse edges have a minimum resolution of 1 count, which corresponds to a real time difference of ~1.863 ns. The pulses are used to control chip I/O output drivers within NFET driver module 1202 for external power regulation. The pulses are also used to control chip I/O input drivers within sample and hold module (SHM) 1207, with sample and hold circuits for analog to digital conversion using an on chip analog to digital converter (ADC) found within analog to digital converter 1206.

DPC 1201 also generates other output signals used by other chip circuitry, for example real time clock states and synchronization pulses for regulation control module (REG) 1204, and source clocks for a Clock Generation and Enable (CKGEN) macro 1223. DPC 1201 generates pulses as shown in FIG. 37, where one DPC frame corresponds to ~1.907 us in the timing diagram.

Each pulse (i.e., a PFET pulse 2410.4, a SFET pulse 2412.4, a SMPA pulse 2414.4, and a SMPB pulse 2416.4 associated respectively with a PFET signal 2402.4, a SFET signal 2404.4, a SMPA signal 2406.4, and a SMPB signal 2408.4) generated by DPC 1201 is represented as a pair of 10-bit Grey coded numbers, which are presented to DPC 1201 through the interface of Regulation control module (REG). The Grey coded numbers are designated as Primitive numbers or simply Primitives, with a pair of Primitives associated with each pulse.

The first Primitive number (i.e., a PFTS, a SFTS, a SPAS, and a SPBS in FIG. 37) in each pair indicates the offset of the leading edge of the pulse from a count of 0 and can be any integer from 0 to 1023. The second Primitive number (i.e., a PFTR, a SFTR, a SPAR, and a SPBR in FIG. 37) in each pair indicates the offset of the trailing edge of the pulse from a count of 0 and can also be any integer from 0 to 1023. The letter "S" on the end of signal parameters for the first Primitive numbers (PFTS, SFTS, SPAS, and SPBS) stands for SET and the letter "R" on the end of signal parameters for the second Primitive numbers (PFTR, SFTR, SPAR, and SPBR) stands for RESET.

PFET pulse 2410.4 and SFET pulse 2412.4, shown along the ordinate of the timing diagram in FIG. 37, control Primary and Secondary NFET drivers in NFET driver module 1202 and SMPA pulse 2406.4 and SMPB pulse 2416.4 control the input sample and hold circuits in SHM 1207. The pulses shown in the diagram can be represented by 8 independent 10-bit Primitives.

The eight independent Primitives are designated as follows: PFTS, PFTR, SFTS, SFTR, SPAS, SPAR, SPBS and SPBR.

These primitive numbers (i.e., PFTS, PFTR, SFTS, SFTR, SPAS, SPAR, SPBS and SPBR) are stored in a special purpose, dual port content addressable memory (CAM) device in DPC 1201 and the notation for these numbers are described in detail for port descriptions below. The timing diagram in FIG. 37 shows the Primitive number set for a single pulse channel controlled by DPC 1201, however DPC 1201 can provide a number of independent pulse channels (e.g., seven independent pulse channels for external PWM-switching power conversion and an eighth independent auxiliary pulse channel which can be used for synchronization of internal or external circuitry).

Figure 37A:
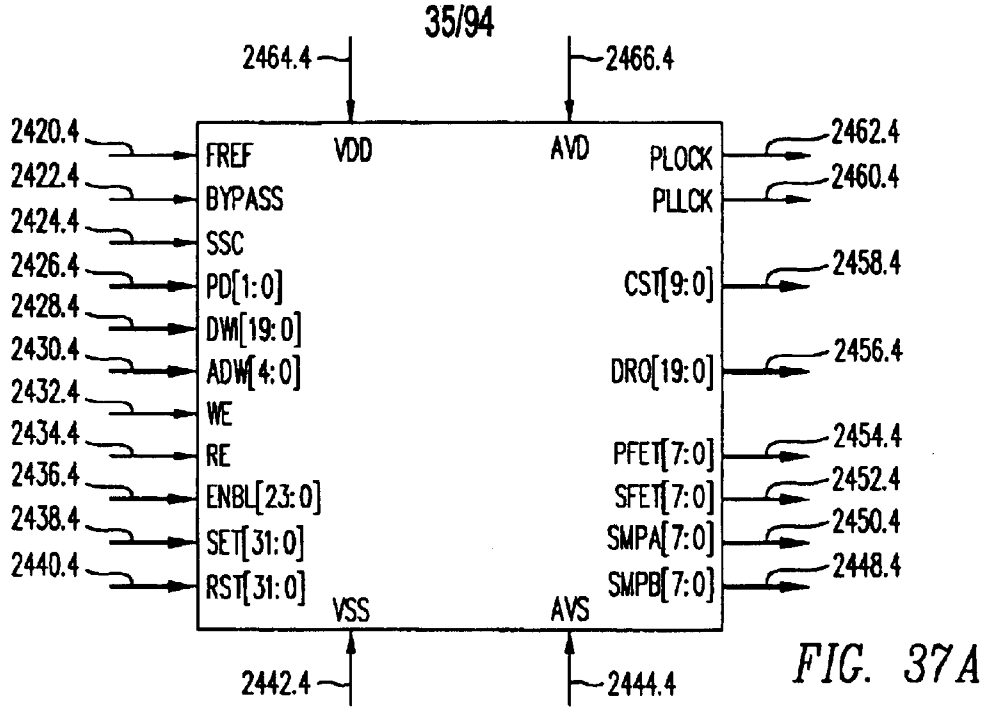
FIG. 37A shows exemplary interface signals for digital pulse converter 1201 for one implementation.

If DPC 1201 provides eight independent pulse channels, then a bus notation for PFET signal 2402.4, SFET signal 2404.4, SMPA signal 2406.4, and SMPB signal 2408.4 may be used to designate these independent channels as a PFET [7:0] signals 2454.4, a SFET[7:0] signals 2452.4, a SMPA [7:0] signals 2450.4, and a SMPB[7:0] signals 2448.4, respectively, as discussed below in reference to FIG. 37A. PFET[7], SFET[7], SMPA[7] and SMPB[7] refer to the auxiliary pulse channel, and the PFET[6:0] signals 2454.4 and SFET[6:0] signals 2452.4 refer to pulses which control drivers in NFET driver module 1202 to turn on and off external power FETs used for power regulation. The SMPA [6:0] signals 2450.4 and SMPB[6:0] signals 2448.4 refer to pulses which control the input sample and hold circuits in SHM 1207 for digitizing external analog voltages. It should be noted that the timing diagram shown in FIG. 37 illustrates a break before make switching algorithm between PFET signal 2402 and SFET signal 2404.4 (i.e., between the Primitive number PFTR and the Primitive number SFTS), which is generally needed for efficient power regulation.

DPC 1201 for this implementation has five interfaces to communicate with five corresponding portions of switching power supply controller 1200 (i.e., IVS 1209, CKGEN 1223, regulation control module (REG) 1204, NFET driver module 1202, and SHM 1207). FIG. 37A illustrates this exemplary interface implementation for DPC 1201. The interface with IVS 1209 includes the FREF signal 2420.4.

Additionally, the interface with IVS 1209 includes power and ground signals, including a VDD signal 2464.4, an AVD signal 2466.4, a VSS signal 2442.4, and an AVS signal 2444.4. The digital power and ground, VDD signal 2464.4 (e.g., 3.3 V) and VSS signal 2442.4, respectively, can be treated as global signals, whereas the analog power and ground, AVD signal 2466.4 (e.g., 3.3 V) and AVS signal 2444.4, respectively, are generally not treated as global signals.

FREF signal 2420.4 is a reference clock provided to the DPLL in DPC 1201 and has a frequency and a duty cycle of about 32.768 kHz and 50%, respectively. PLOCK signal 2462.4 is a signal which is asserted (i.e., transitions to a logical high or HIGH state) and remains asserted (i.e., remains at a logical high) after the DPLL achieves and remains in a phase lock condition. Otherwise PLOCK is not asserted (i.e., a logical low or LOW state). AUX signal 2446.4 is an auxiliary signal port that is used for synchronizing circuitry external to switching power supply controller 1200.

The interface with Clock Generator and Enable (CKGEN) 1223 includes various signals, including a CST[9:0] signal 2458.4, a PLLCK signal 2460.4, and a PLOCK signal 2462.4. CST[9:0] signal 2458.4 is a 10-bit Grey coded clock state bus which provides the clocks and control states to synchronize DPC 1201, regulation control module (REG) 1204, and the CKGEN macro 1223. In a standard operating mode, with SSC signal 2424.4 set LOW and FREF signal 2420.4 set to 32.768 kHz, exemplary frequencies for the CST[9:0] signals 2458.4 are given in Table 1. PLLCK signal 2460.4 is the DPLL output clock which has a frequency and a duty cycle of 524.288 kHz and 50% respectively, assuming a reference frequency for FREF signal 2420.4 of 32.768 kHz. The same frequency for the last two most significant bits of CST[9:0] signals 2458.4 is an artifact of a 10-bit Grey counter generating these frequencies. The MSB (most significant bit) and NMSB (next most significant bit), (CST[9] and CST[8], respectively, of CST[9:0] signal 2458.4) have a quadrature phase relationship to each other.

TABLE 1

| CST Bit | Frequency kHz |
|---|---|
| CST[0] | 134,217.728 |
| CST[1] | 67,108.864 |
| CST[2] | 33,554.432 |
| CST[3] | 16,777.216 |
| CST[4] | 8,388.608 |
| CST[5] | 4,194.304 |
| CST[6] | 2,097.152 |
| CST[7] | 1,048.576 |
| CST[0] | 524.288 |
| CST[9] | 524.288 |

The interface with regulation control module (REG) 1204 includes various signals, including PD_OUT[1:0] signals 2426.4, SET[28:0] signals 2438.4, RST[28:0] signals 2440.4, ENBL[21:0] signals 2436.4, DWI[19:0] signals 2428.4, DRO[19:0] signals 2456.4, and ADW[4:0] signals 2430.4, which are input buses, and the CST[9:0] signals 2458.4, which is an output bus. Additionally, the interface includes an input signal WE 2432.4, an input signal RE 2434.4, and an output signal PLOCK 2462.4.

The interface with the regulation control module (REG) 1204 is used to generate the various pulses, such as PFET pulse 2410.4 and SFET pulse 2412.4. The DWI[19:0] signals 2428.4, ADW[4:0] signals 2430.4, DRO[19:0] signals 2456.4, and input signal WE 2432.4 and input signal RE 2434.4 transfer data and control the read/write ports of the dual port CAM, discussed in further detail herein. The read port for the CAM is within DPC 1201.

More specifically, the PD_OUT[1:0] signals 2426.4 are a 2-bit bus which controls the mode of operation for DPC 1201. The modes of operation are designated as Standard mode, Low Power mode, and Shut Down mode, as summarized in Table 2.

When PD_OUT[1:0] signals 2426.4 are asserting the Shut Down mode, the DPLL is powered down, the CAM is in standby mode, and the rest of the digital blocks in DPC 1201 are in low power states. When PD_OUT[1:0] signals 2426.4 are asserting the Low Power mode, the DPLL is powered up and phase locked at its normal operating frequency (536,870.912 kHz), the DPLL output is divided by 16 to produce the LSB of CST[9:0] signal 2458.4 (i.e., the frequency of the CST LSB is 33,554.432 kHz), the CAM is in standby mode, and the remaining blocks of DPC 1201 are in low power states. When PD_OUT[1:0] signals 2426.4 are asserting the Standard mode, the DPLL is operating normally, the DPLL output is divided by 4 to produce the LSB of CST[9:0] signals 2458.4 (i.e., the frequency of the CST LSB is 134,217.728 kHz), the CAM is powered up and operating normally and the rest of the bPC blocks are also powered up and are operating normally.

TABLE 2

| Exemplary Modes | | |
|---|---|---|
| PD OUT[1] | PD OUT[0] | MODE |
| 0 | 0 | Shut Down |
| 0 | 1 | TBD/Spare |
| 1 | 0 | Low Power |
| 1 | 1 | Standard |

The SET[31:0] signals 2438.4 are a 32-bit control bus which is used to independently set each output bit of DPC 1201. For example, when SET[0] of the SET[31:0] signals 2438.4 is HIGH, SMPA[0] of the SMPA[7:0] signals 2450.4 is set HIGH, and when SET[1] of the SET[31:0] signals 2438.4 is HIGH, PFET[0] of the PFET[7:0] signals 2454.4 is set HIGH. Table 3 illustrates exemplary associations between SET[31:0] signal 2438.4, the Primitive numbers, and output :signals from DPC 1201.

TABLE 3

| Set Bits | Primitive Numbers | DPC Macro Outputs |
|---|---|---|
| SET[0]~SET[3] | SPAS[0],PFTS[0],SPBS [0],SFTS[0] | SMPA[0],PFET[0], SMPB[0],SFET[0] |
| SET[4]~SET[7] | SPAS[1],PFTS[1],SPBS [1],SFTS[1] | SMPA[1],PFET[1], SMPB[1],SFET[1] |
| SET[8]~SET[11] | SPAS[2],PFTS[2],SPBS [2],SFTS[2] | SMPA[2],PFET[2], SMPB[2],SFET[2] |
| SET[12]~SET[15] | SPAS[3],PFTS[3],SPBS [3],SFTS[3] | SMPA[3],PFET[3], SMPB[3],SFET[3] |
| SET[16]~SET[19] | SPAS[4],PFTS[4],SPBS [4],SFTS[4] | SMPA[4],PFET[4], SMPB[4],SFET[4] |
| SET[20]~SET[23] | SPAS[5],PFTS[5],SPBS [5],SFTS[5] | SMPA[5],PFET[5], SMPB[5],SFET[5] |
| SET[24]~SET[27] | SPAS[6],PFTS[6],SPBS [6],SFTS[6] | SMPA[6],PFET[6], SMPB[6],SFET[6] |
| SET[28]~SET[31] | SPAS[7],PFTS[7],SPBS [7],SFTS[7] | SMPA[7],PFET[7], SMPB[7],SFET[7] |

The RST[31:0] signals 2440.4 are a 32-bit control bus which is used to independently reset each output bit of DPC 1201. For example, when RST[0] of the RST[31:0] signals 2440.4 is HIGH, the SMPA[0] output of the SMPA[7:0] signals 2450.4 is reset LOW, and when RST[1] of the RST[31:0] signals 2440.4 is HIGH, the PFET[0] output of the PFET [6:0] signals 2454.4 is reset LOW. Table 4 illustrates exemplary associations between RST[31:0] signal 2440.4, the Primitive numbers, and output signals from DPC 1201.

TABLE 4

| Set Bits | Primitive Numbers | DPC Macro Outputs |
|---|---|---|
| SET[0]–SET[3] | SPAR[0],PFTR[0],SPBR [0],SFTR[0] | SMPA[0],PFET[0], SMPB[0],SFET[0] |
| SET[4]–SET[7] | SPAR[1],PFTR[1],SPBR [1],SFTR[1] | SMPA[1],PFET[1], SMPB[1],SFET[1] |
| SET[8]–SET[11] | SPAR[2],PFTR[2],SPBR [2],SFTR[2] | SMPA[2],PFET[2], SMPB[2],SFET[2] |
| SET[12]–SET[15] | SPAR[3],PFTR[3],SPBR [3],SFTR[3] | SMPA[3],PFET[3], SMPB[3],SFET[3] |
| SET[16]–SET[19] | SPAR[4],PFTR[4],SPBR [4],SFTR[4] | SMPA[4],PFET[4], SMPB[4],SFET[4] |
| SET[20]–SET[23] | SPAR[5],PFTR[5],SPBR [5],SFTR[5] | SMPA[5],PFET[5], SMPB[5],SFET[5] |
| SET[24]–SET[27] | SPAR[6],PFTR[6],SPBR [6],SFTR[6] | SMPA[6],PFET[6], SMPB[6],SFET[6] |
| SET[28]–SET[31] | SPAR[7],PFTR[7],SPBR [7],SFTR[7] | SMPA[7],PFET[7], SMPB[7],SFET[7] |

The ENBL[23:0] signals 2436.4 are a 24-bit CAM enable bus used to independently enable the CAM match ports. The ENBL[3n] bits of ENBL[23:0] signal 2436.4 enable the SMPA[n] bits of the SMPA[7:0] signals 2450.4 and the SMPB[n] bits of the SMPB([7:0] signals 2448.4 for CAM match outputs, where n∈{0, 1, 2, . . . , 7}. The ENBL[3n+1] bits of the ENBL[23:0] signals 2436.4 enable the PFET[n] bits of the PFET[7:0] signals 2454.4 for the CAM match outputs and the ENBL[3n+2] bits of the ENBL[23:0] signals 2436.4 enable the SFET[n] bits of the SFET[7:0] signals 2452.4 for the CAM match outputs, where n∈{0, 1, 2, . . . , 7}. The CAM ENBL bus (i.e., the ENBL[23:0] signals 2436.4) and output correspondence for an exemplary implementation is given in Table 5.

TABLE 5

| ENBL Bus Bits | DPC Macro Outputs |
|---|---|
| ENBL[0] | SMPA[0], SMPB[0] |
| ENBL[1] | PFET[0] |
| ENBL[2] | SFET[0] |
| ENBL[3] | SMPA[1], SMPB[1] |
| ENBL[4] | PFET[1] |
| ENBL[5] | SFET[1] |
| ENBL[6] | SMPA[2], SMPB[2] |
| ENBL[7] | PFET[2] |
| ENBL[8] | SFET[2] |
| ENBL[9] | SMPA[3], SMPB[3] |
| ENBL[10] | PFET[3] |
| ENBL[11] | SFET[3] |
| ENBL[12] | SMPA[4], SMPB[4] |
| ENBL[13] | PFET[4] |
| ENBL[14] | SFET[4] |
| ENBL[15] | SMPA[5], SMPB[5] |
| ENBL[16] | PFET[5] |
| ENBL[17] | SFET[5] |
| ENBL[18] | SMPA[6], SMPB[6] |
| ENBL[19] | PFET[6] |
| ENBL[20] | SFET[6] |
| ENBL[21] | SMPA[7], SMPB[7] |
| ENBL[22] | PFET[7] |
| ENBL[23] | SFET[7] |

The ENBL bits of the ENBL[23:0] signals 2436.4 are active HIGH. To enable specific CAM match ports, the corresponding enable bit is set HIGH. The ENBL[23:0] signals 2436.4 affects only the read port of the CAM and the Primitive numbers can be read from and written to the CAM through the read/write port, as described in further detail below. This feature allows the CAM to be safely updated without causing an inadvertent match during a CAM update. In addition, the ENBL[23:0] signals 2436.4 allow the capability for pulse skipping during the normal operation of the CAM.

The DWI[19:0] signals 2428.4 are a 20-bit write data bus for the read/write CAM port and it is used for writing Grey coded words to the CAM. The DWI[19:0] bus 2428.4 writes to the CAM are controlled by the ADW address bus (i.e., the ADW[4:0] signals 2430.4) and the WE signal 2432.4. The DWI[9:0] bits of DWI[19:0] signal 2428.4 are allocated for the bank zero of the CAM and the DWI[19:10] bits of DWI[19:0] signal 2428.4 are allocated for bank one of the CAM.

The ADW[4:0] signals 2430.4 are a 5-bit address bus used to address a single (20-bit) word in the CAM for reading or writing. For ease of implementation and in accordance with one embodiment, the CAM is split into two banks, as described in Table 6. The ADW[4:0] signals 2430.4 simultaneously addresses one 10-bit word out of 22 words in each CAM-bank. For example, ADW[0] of the ADW[4:0] signals 2430.4 corresponds to the Primitive SPBS[0] in the CAM bank zero and the Primitive SPBR[0] in the CAM bank one.

TABLE 6

| Read/Write Port ADW | CAM Bank Zero Primitive Numbers | CAM Bank One Primitive Numbers |
|---|---|---|
| ADW[0] | SPBS[0] | SPBR[0] |
| ADW[1] | PFTS[0] | PFTR[0] |
| ADW[2] | SFTS[0] | SFTR[0] |
| ADW[3] | SPAS[0] | SPAR[0] |
| ADW[4] | SPBS[1] | SPBR[1] |
| ADW[5] | PFTS[1] | PFTR[1] |
| ADW[6] | SFTS[1] | SFTR[1] |
| ADW[7] | SPAS[1] | SPAR[1] |
| ADW[8] | SPBS[2] | SPBR[2] |
| ADW[9] | PFTS[2] | PFTR[2] |
| ADW[10] | SFTS[2] | SFTR[2] |
| ADW[11] | SPAS[2] | SPAR[2] |
| ADW[12] | SPBS[3] | SPBR[3] |
| ADW[13] | PFTS[3] | PFTR[3] |
| ADW[14] | SFTS[3] | SFTR[3] |
| ADW[15] | SPAS[3] | SPAR[3] |
| ADW[16] | SPBS[4] | SPBR[4] |
| ADW[17] | PFTS[4] | PFTR[4] |
| ADW[18] | SFTS[4] | SFTR[4] |
| ADW[19] | SPAS[4] | SPAR[4] |
| ADW[20] | SPBS[5] | SPBR[5] |
| ADW[21] | PFTS[5] | PFTR[5] |
| ADW[22] | SFTS[5] | SFTR[5] |
| ADW[23] | SPAS[5] | SPAR[5] |
| ADW[24] | SPBS[6] | SPBR[6] |
| ADW[25] | PFTS[6] | PFTR[6] |
| ADW[26] | SFTS[6] | SFTR[6] |
| ADW[27] | SPAS[6] | SPAR[6] |
| ADW[28] | SPBS[7] | SPAR[7] |
| ADW[29] | PFTS[7] | PFTR[7] |
| ADW[30] | SFTS[7] | SFTR[7] |
| ADW[31] | SPAS[7] | SPAR[7] |

The DRO[19:0] signals 2456.4 are a 20-bit read data bus for the read/write CAM port and it is used for reading Grey coded words from the CAM. The DRO[19:0] bus 2456.4 reads from the CAM are controlled by the ADW address bus (i.e., the ADW[4:0] signals 2430.4) and the RE signal 2434.4. The DRO[9:0] bits of DRO[19.0] signal 2456.4 are allocated for the bank zero of the CAM and the DRO[19:10] bits of DRO[19:0] signal 2456.4 are allocated for bank one of the CAM.

The PFET[6:0] signals 2454.4 are a 7-bit bus which provides the primary power FET pulses (i.e., pulses, such as PFET pulse 2410.4) to NFET driver module 1202. The SFET[6:0] signals 2452.4 are a 7-bit bus which provides the secondary power FET pulses (i.e., pulses, such as SFET pulse 2412.4) to NFET driver module 1202.

The WE signal 2432.4 is the write enable control signal for the read/write CAM port. When WE signal 2432.4 toggles HIGH, a 10-bit word is written to each bank of the CAM at the address specified by the ADW[4:0] signals 2430.4. The RE signal 2434.4 is the read enable control signal for the read/write CAM port. When the RE signal 2434.4 toggles HIGH, a 10-bit word is read from each bank of the CAM at the address specified by the ADW[4:0] signals 2430.4.

The interface for NFET driver module 1202 includes various signals, including the PFET[6:0] signals 2454.4 and SFET[6:0] signals 2452.4. As discussed above, a single PFET (primary FET) and SFET (secondary FET) pulse channel is shown in the above timing diagram (FIG. 37).

The interface for SHM 1207 includes various signals, including the SMPA[6:0] signals 2450.4 and the SMPB[6:0] signals 2448.4. This interface is used to control the sampling and holding of analog voltages for digital conversion by analog to digital converter 1206. As described above in accordance with one embodiment, the sample pulses SMPA (e.g., SMPA pulse 2414.4) and SMPB (e.g., SMPB pulse 2416.4) are independent from the PFET (Primary FET) and SFET (Secondary FET) pulses. Either of the SMPA[6:0] signals 2450.4 or the SMPB[6:0] signals 2448.4 can be used to control the sampling (and holding) of analog voltages in SHM 1207 for analog to digital converter 1206. The remaining signals shown in FIG. 37A and described in Table 8 include a bypass signal 2422.4 and the SSC signal 2424.4. Bypass signal 2422.4 is a test control signal used for bypassing the DPLL. When bypass signal 2422.4.is held HIGH, FREF signal 2420.4 bypasses the DPLL, but when bypass signal 2422.4 is held LOW, FREF signal 2420.4 is used for frequency synthesis. SSC signal 2424.4 is a control signal that activates spread spectrum clocking. Spread spectrum clocking is activated when SSC signal 2424.4 is HIGH; otherwise spread spectrum clocking is disabled. The spread spectrum clocking scheme implemented in DPC 1201 can be either up or down frequency spreading where the DPC frame frequency (e.g., 524.288 kHz without spread spectrum clocking) deviates from its fundamental frequency by approximately 0.5% with a modulation period of approximately 22 us.

TABLE 8

Descriptive Summary of Exemplary Interface Signals

| Port Name | Type | Description | Source | Destination |
|---|---|---|---|---|
| FREF | Input | 32.768khz Reference Clock | IVS 1209 | |
| BYPASS | Input | Reference Clock Bypass Control | REG 1204 | |
| SSC | Input | Spread Spectrum Clock Control | REG 1204 | |
| PLOCK | Output | DPLL Lock, Active HIGH | | CKGEN 1223 |
| PD_OUT [1:0] | Input | Power Management Control Bus | REG 1204 | |
| PLLCK | Output | DPLL Output Clock | | CKGEN 1223 |
| CST[9:0] | Output | Count Time State Bus | | CKGEN 1223 REG 1204 |
| ENBL [21:0] | Input | CAM Section Enable Bus | REG 1204 | |
| DWI[19:0] | Input | CAM Read/Write Port Data Bus | REG 1204 | |

TABLE 8-continued

Descriptive Summary of Exemplary Interface Signals

| Port Name | Type | Description | Source | Destination |
|---|---|---|---|---|
| ADW [4:0] | Input | CAM Read/Write Port Address Bus | REG 1204 | |
| WE | Input | CAM Read/Write Port Write Enable | REG 1204 | |
| RE | Input | CAM Read/Write Port Read Enable | REG 1204 | |
| DRO[19:0] | Output | CAM Read/Write Port Data Bus | | REG 1204 |
| SET[28:0] | Input | Pulse Set Bus | REG 1204 | |
| RST[28:0] | Input | Pulse Reset Bus | REG 1204 | |
| PFET[6:0] | Output | Primary FET Control Bus | | NFET 1202 |
| SFET[6:0] | Output | Secondary FET Control Bus | | NFET 1202 |
| SMPA[6:0] | Output | Sample A Control Bus | | SHM 1207 |
| SMPB[6:0] | Output | Sample B Control Bus | | SHM 1207 |
| AUX | Output | Auxiliary Pulse Control Port | | IVS 1209 |
| VDD | Power | Digital Power | IVS 1209 | |
| AVD | Power | Analog Power | IVS 1209 | |
| VSS | Power | Digital Ground | IVS 1209 | |
| AVS | Power | Analog Ground | IVS 1209 | |

Figure 37B:
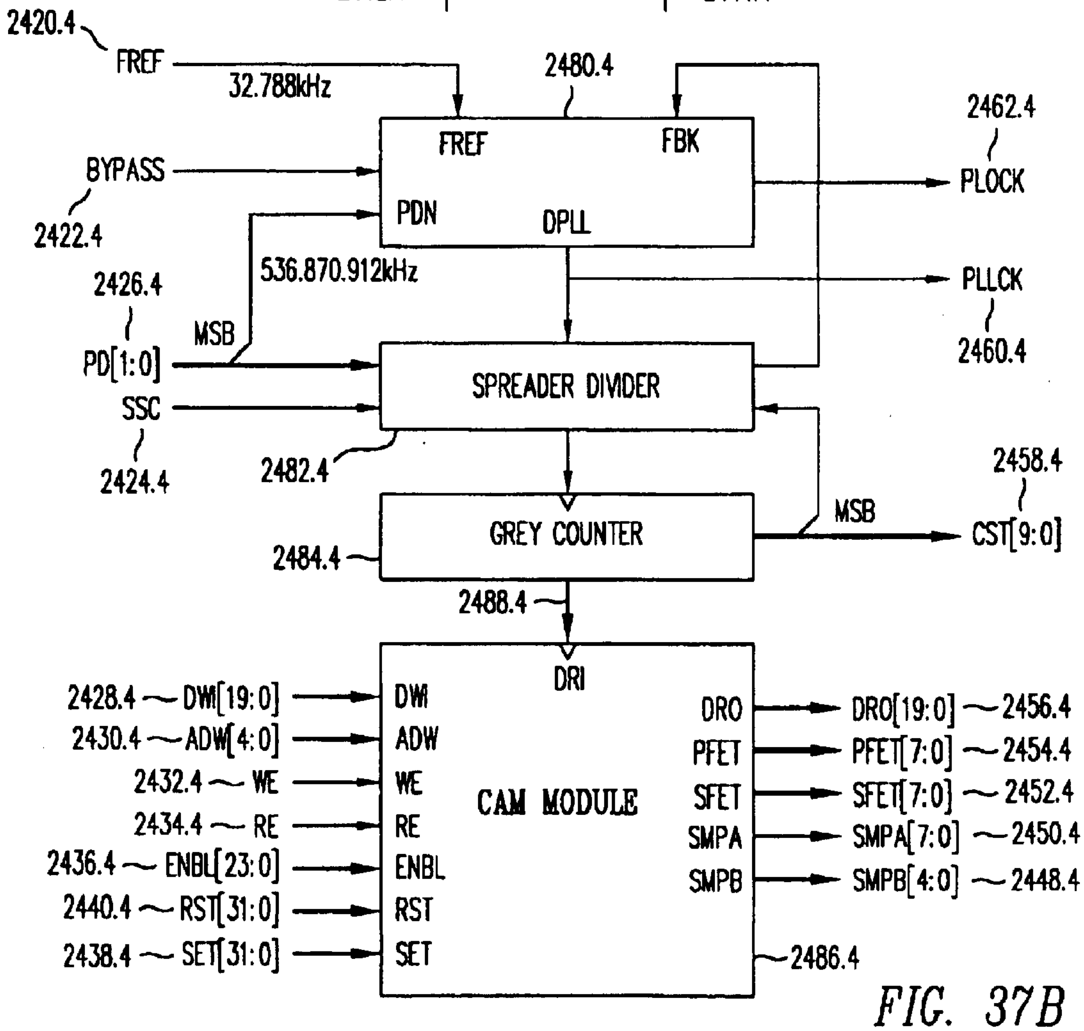
FIG. 37B illustrates an exemplary circuit implementation for DPC 1201, which includes a CAM.
Figure 37C:
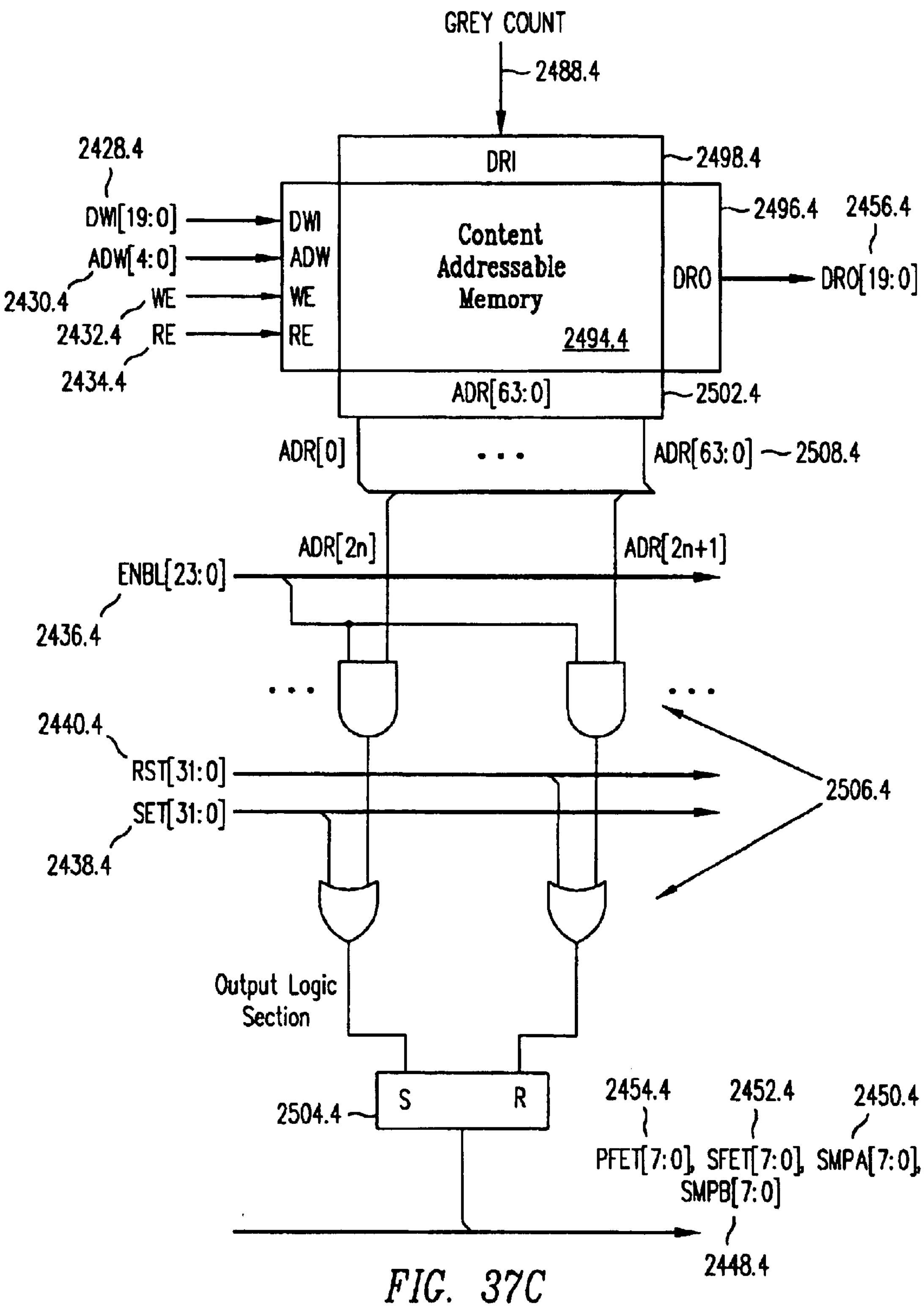
FIG. 37C illustrates one exemplary implementation for the CAM of FIG. 37B.

FIG. 37B illustrates one circuit implementation for DPC 1201 and includes a DPLL 2480.4, a spreader divider 2482.4, a Grey counter 2484.4, and a CAM module 2486.4. CAM module 2486.4 includes a modified CAM for generating PFET[6:0] signal 2454.4, SFET[6:0] signal 2452.4, SMPA[6:0] signal 2450.4, SMPB[6:0] signal 2448.4, and AUX signal 2446.4. FIG. 37C illustrates one exemplary implementation for CAM module 2486.4.

Figure 37D:
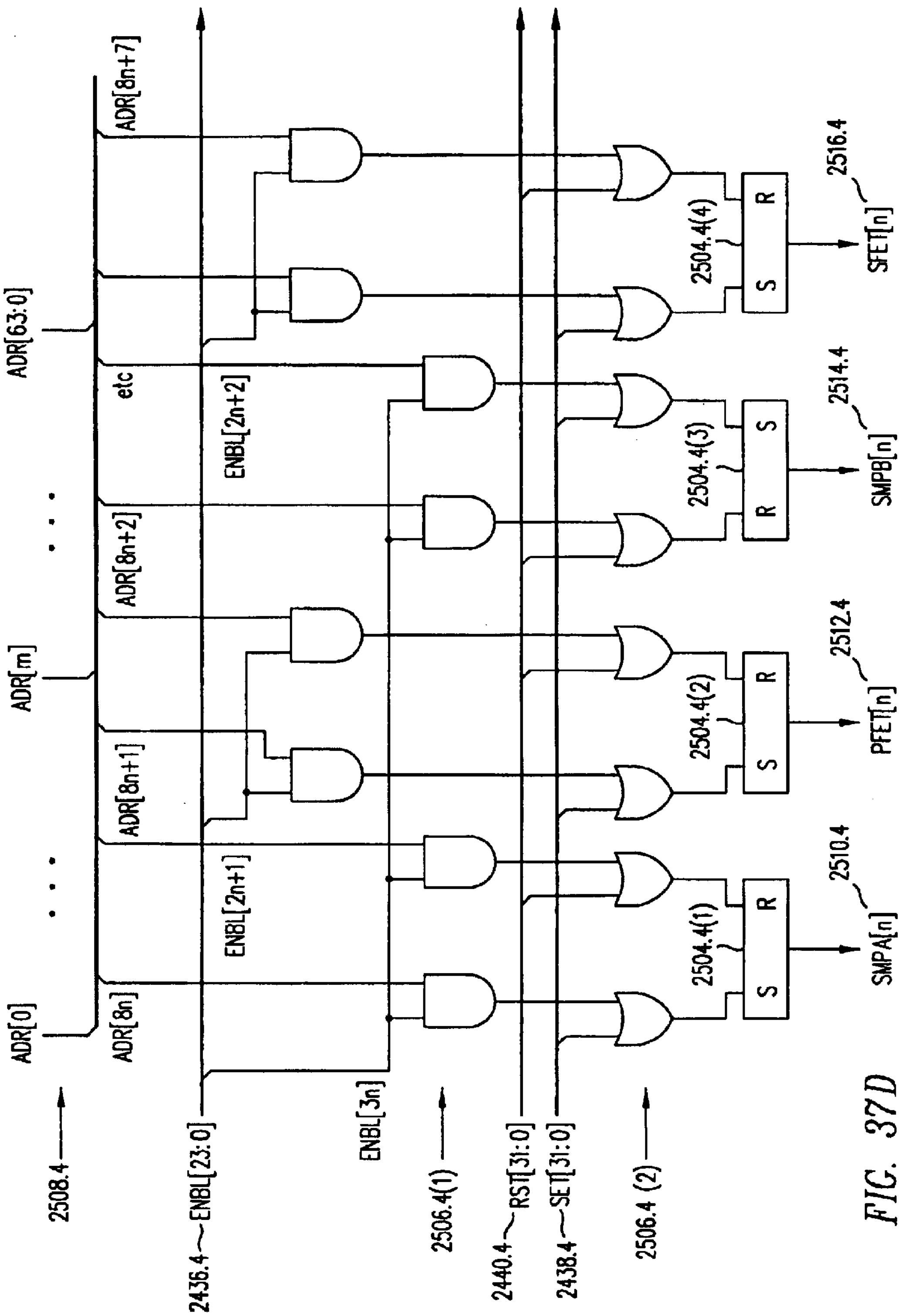
FIG. 37D illustrates an exemplary circuit implementation for output logic of the CAM of FIG. 37C.

CAM module 2486.4 stores, for example, 64 words (i.e., Primitives, which were discussed above), with 10-bits per word and with an address read port 2502.4 (labeled ADR [63:0]) of CAM module 2486.4 not encoded. Address read port 2502.4 provides 64 address signals, referenced collectively as ADR[63:0] signals 2508.4. The even ADR bits (ADR[0], ADR[2], . . . , ADR[62] ) of ADR[63:0] signals 2508.4 are associated with CAM bank zero and the odd ADR bits (ADR[1], ADR[3], . . . , ADR[63]) of ADR[63:0] signals 2508.4 are associated with the CAM bank one, as previously discussed (e.g., in reference to ADW[4:0] signal 2430.4). ADR[63:0] signals 2508.4 are connected to 32 RS latches, which are represented by an RS latch 2504.4 (FIG. 37C), through control logic 2506.4, shown in a representative fashion in FIG. 37C. A more detailed exemplary implementation for control logic 2506.4 and RS latch 2504.4, associated with a single pulse channel at the output of CAM module 2486.4, is shown in FIG. 37D and discussed below.

DPLL 2480.4 (FIG. 37B) is shown coupled to Grey counter 2484.4 (e.g., a free running 10-bit Grey Counter), with spreader divider 2482.4 situated between DPLL 2480.4 and Grey counter 2484.4. When SSC signal 2424.4 is enabled, spreader divider 2482.4 produces spread spectrum clocking, as described above, by employing a uniform pulse swallowing technique which varies in frequency. Spread spectrum mode of operation is described below.

Additionally, spreader divider 2482.4 provides the variable divide ratio for toggling between the standard and low power modes, described above for PD_OUT[1:0] signal 2426.4. The extra division provided by spreader divider 2482.4 reduces the current drawn by Grey counter 2484.4 in the low power mode. For example, as compared to a binary counter, Grey counter 2484.4 produces glitch free read operations for CAM module 2486.4.

An example of operation for the implementation shown in FIG. 37B for DPC 1201 starts with DPLL 2480.4, which increments Grey counter 2484.4 (i.e., through spreader divider 2482.4) to produce the read data, identified by a DRI signal 2488.4, for CAM Module 2486.4. If the read data of DRI signal 2488.4 generates a CAM match in CAM Module 2486.4, one or more of the CAM output read address lines (i.e., ADR[63:0] signals 2508.4) of CAM Module 2486.4 becomes active, which sets or resets one or more of the 32 RS latches (i.e., RS latch 2504.4) to produce the output pulses on the PFET[7:0] signals 2454.4, SFET[7:0] signals 2452.4, SMPA[7:0] signals 2450.4 and SMPB[7:0] signals The 32 RS latches (represented by RS latch 2504.4) are organized into eight pulse channels. The 4 pulses within a pulse channel are completely independent as described earlier And the eight independent Primitive numbers (one set of eight numbers for each pulse channel) are Grey coded and written to specific address locations in the CAM of CAM module 2486.4 regulation control module (REG) 1204. The address locations for the Primitive numbers are given above in reference to ADW[4:0] signal 2430.4.

CAM Module's 2486.4 logic that is associated with one pulse channel (e.g., given by a PFET[n] signal 2512.4, an SFET[n] signal 2516.4, an SMPA[n] signal 2510.–4, and an SMPB[n] signal 2514.4, where n∊{0, 1, 2, . . . , 7}) is shown in detail in FIG. 37D. Eight independent CAM ADR lines (e.g., ADR[8n], ADR[8n+1], ADR[8n+2], ADR[8n+3], ADR[8n+4], ADR[8n+5], ADR[8n+6], ADR[8n+7]) from the ADR[63:0] signals 2508.4 are shown controlling four RS latches (separately referenced as RS latches 2504.4(1) through 2504.4(4)) of RS latch 2504.4. The control circuitry for the ENBL[23:0] signals 2436.4.

Which are separately referenced as enable control logic 2506.4(1) of control logic 2506.4, is also shown in detail in FIG. 37D. The ENBL[3n+1] signals and ENBL[3n+2] signals, of the ENBL[23:0] signals 2436.4, control RS latches 2504.4(2) and 2504.4(4) for the PFET[n] signals 2512.4 and SFET[n] signals 2516.4, respectively, and the ENBL[3n] signals of the ENBL[23:0] signals 2436.4 controls RS latches 2504.4(1) and 2504.4(3) for the SMPA[n] signals 2510.4 and SMPB[n] signals 2514.4, respectively. Table 5, discussed above, provides additional details regarding the ENBL[23:0] signals 2436.4.

The control circuitry for the SET[31:0] signals 2438.4 and the RST[31:0] signals 2440.4, which are separately referenced as set/reset control logic 2506.4(2) of control logic 2506.4, is also shown in detail in FIG. 37D. The SET[31:0] signals 2438.4 and RST[31:0] signals 2440.4 allow direct control of RS latch 2504.4 (e.g., RS latches 2504.4(1) through 2504.4(4)) at the output of CAM Module 2486.4). In the low power mode, this interface is used in conjunction with the ENBL[23:0] signals 2436.4 by logic in regulation control module (REG) 1204 to generate the ADC samples and power regulation pulses needed for operation in this mode. Using these control signals, regulation control module (REG) 1204 can take direct control of RS latch 2504.4 to avoid hazard conditions (e.g., preventing the set (S) and reset (R) inputs to each latch from being active simultaneously).

As shown in FIG. 37C, a CAM 2494.4 is a dual-port memory device with one read/write port 2496.4 (associated with the DWI[19:0] signals 2428.4, ADW[4:0] signals 2430.4, WE signal 2432.4, RE signal 2434.4, and DRO [19:0] signals 2456.4) and one read port 2498.4 (associated with the DRI signals 2488.4 and ADR[63:0] signals 2508.4). The same Primitive number can be written to two or more address locations in CAM 2494.4, which will cause multiple matches on the ADR[63:0] signals 2508.4 (i.e., the CAM read address lines) when the matching data is presented to read port 2498.4 (through the DRI signals 2488.4) of CAM 2494.4 by Grey Counter 2484.4. The multiple matches allow two or more output edges to coincide.

Regulation control module (REG) 1204 synchronizes the writes to CAM 2494.4 to avoid the generation of inadvertent glitches on the various pulse channels. When key independent pulse edges (i.e., master edges) change from one DPC frame of DPC 1201 to the next, regulation control module (REG) 1204 re-computes the dependent pulse edges (i.e., slave edges) and updates CAM 2494.4 accordingly. The master edges correspond to the Primitives PFTS[n], PFTR [n], SFTS[n], and SFTR[n], where n∊{0, 1, . . . , 7}. All other edges are either slave edges or auxiliary edges.

If a master edge is moved from its position (Grey coded count) in the current DPC frame of DPC 1201 to a different position in the next frame, the slave edges related to the specific master edge are re-computed and written to CAM 2494.4 by regulation control module (REG) 1204 for use in the next frame. Regulation control module (REG) 1204 provides the computations, Grey coding, and CAM write coordination required to perform these tasks efficiently and without hazards.

The information necessary to compute the slave edges from the master edge information is contained within regulation control module (REG) 1204, and this information does not generally change from one DPC frame of DPC 1201 to the next. For example, the slave edge information necessary to calculate the Primitive data SPAS and SPBS edges for each channel can be provided as a single 10-bit binary constant (or pulse width), which is used by regulation control module (REG) 1204 to compute and Grey encode a new Primitive SPAS value if a Primitive PFTS value changes or (more likely) to compute and Grey encode a new Primitive SPBS value if a given Primitive PFTR value changes.

The master edge information provided by regulation control module (REG) 1204.can change from one DPC frame of DPC 1201 to the next. Regulation control module (REG) 1204 provides this information as pairs of 10-bit Grey coded numbers comprised of two offsets from a DPC 1201 frame initial count of zero. One offset corresponds to the SET input of one of the RS latches (i.e., RS latch 2504.4) at the output of CAM module 2486.4 and the other offset corresponds to the RESET input of the RS latch.

As mentioned above, read port 2498.4 of CAM 2494.4 (associated with DRI signal 2488.4) is buried within DPC 1201, as illustrated in FIG. 37B and FIG. 37C. The ENBL [23:0] signals 2436.4 affects only the read port of CAM 2494.4 and is used for the multiple functions described above. If a specific ENBL bus bit of the ENBL[23:0] signals 2436.4 is held LOW, for example ENRL[0] bit, the read address section corresponding to the ENBL[0] bit is disabled and any data match occurring in the corresponding disabled section (e.g., the Primitives SPAS[0], SPAR[0], SPBS[0] and SPBR[0]) will not produce a match. However, if the same data occurs in another read address section of CAM 2494.4, which is not disabled, the match will occur.

Because the ENBL[23:0] signals 2436.4 only affects the read port of CAM 2494.4, read/write port 2496.4 is not affected. Therefore, reads and writes to CAM 2494.4 through read/write port 2496.4 can take place unimpeded. This capability can be used in conjunction with the PFET [7:0] signals 2454.4 or SFET[7:0] signals 2452.4 to safely update the Primitive numbers in CAM 2494.4 and avoid the inadvertent generation of pulse glitches. One possible update sequence is shown in the timing diagram of FIG. 37E for updating the Primitive SFTR[0] in CAM 2494.4.

The Primitive SFTR[0] update to CAM 2494.4 starts with the rising edge of an SFET[0] bit of the SFET[7:0] signals 2452.4. At the rising edge of the SFET[0] bit, the SFTS[0] Primitive match has already occurred. Regulation control module (REG) 1204 detects the rising edge of the SFET[0] bit and disables the required CAM section of CAM 2494.4 one regulation control module (REG) 1204 clock cycle later by setting an ENBL[2] signal LOW. Note that this does not present a problem for a PFET[0] pulse of the PFET[7:0] signals 2454.4, because the rising and falling edges of that pulse have already occurred.

After the CAM section of CAM 2494.4 is disabled, regulation control module (REG) 1204 enables a CAM write by toggling WE signal 2432.4 HIGH. Because the ADW [4:0] signals 2430.4 (i.e., the read/write address port ADW) has been set to address location 2, which corresponds to the Primitive SFTR[0] as shown in Table 6, the new Primitive for SFTR[0] is written to the CAM address location 2 of CAM 2494.4. Regulation control module (REG) 1204 then re-activates the section by setting the ENBL[2] bit HIGH and the new falling edge of the SFET[0] pulse of the SFET[7:0] signals 2452.4 occurs at the new SFTR[0] Primitive value when the CAM match occurs as indicated by the falling edge of the SFET[0] pulse.

Figure 37E:
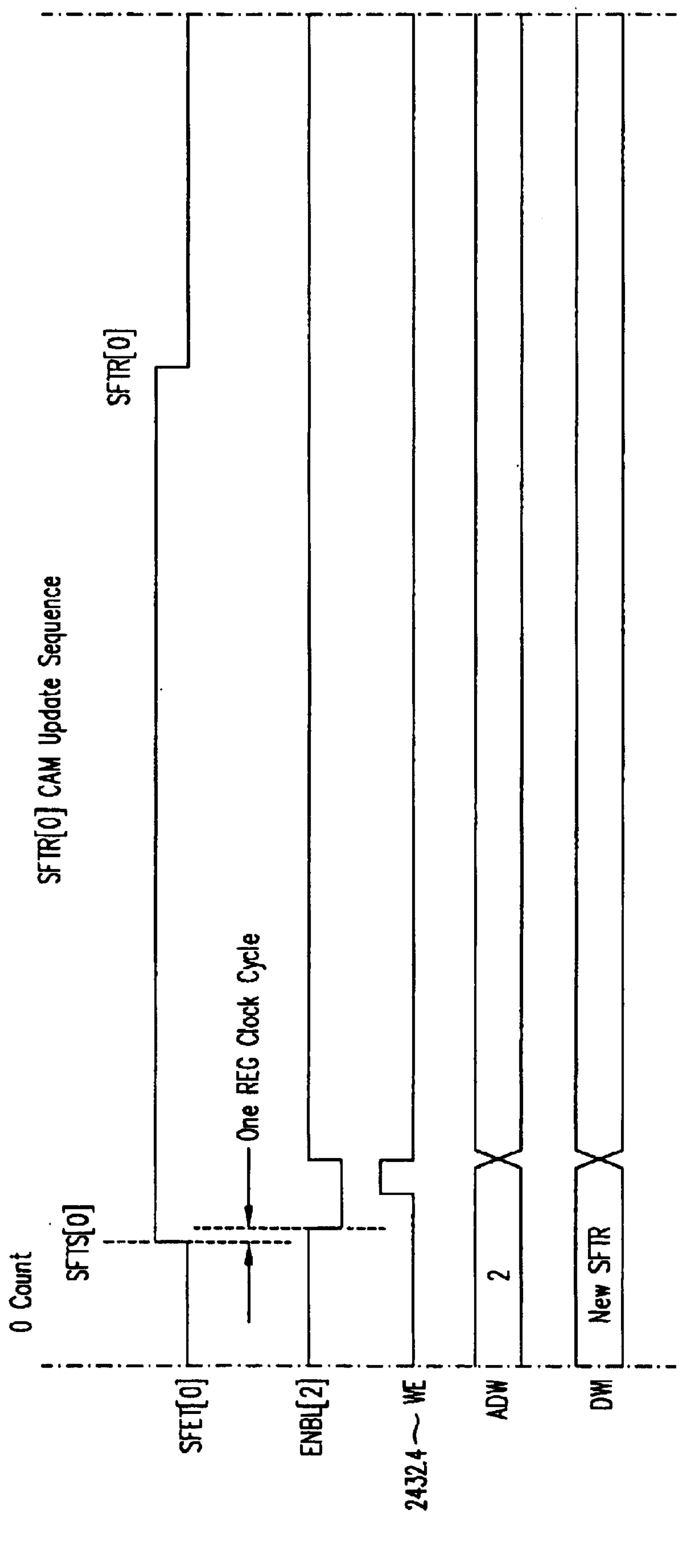
FIG. 37E illustrates an exemplary timing diagram for the CAM of FIG. 37C.

Changing some Primitives has more of an effect on other Primitives than the example given in reference to FIG. 37E. Because of the dependencies discussed herein, if the Primitive PFTR is changed, the Primitives SPBS, SFTS, and SFTR may need to be recomputed, Grey coded, and updated to CAM 2494.4 by regulation control module (REG) 1204. As another example, if the Primitive PFTS is changed all of the Primitives SPAS, SPBS, PFTR, SFTS, and SFTR may need to be recomputed, Grey coded, and updated to CAM 2494.4 by regulation control module (REG) 1204.

Because the worst case write cycle time for CAM 2494.4 is, for example, 7.5 ns, the updates described in the previous sentence can be completed in 22.5 ns (i.e., 3 times 7.5 ns). To update the entire 64 words in CAN 2494.4 would take approximately 240 ns. In FIG. 37, as an example, a break before make switching algorithm for PPET signal 2402.4 and SFET signal 2404.4 was presented. If the break time between PFET signal 2402.4 and SFET signal 2404.4 were always greater than 30 ns, all of the Primitives (eight numbers) necessary to update a pulse channel can be written to CAM 2494.4 during this period.

Section 1.1.5 Discussion of Combinations and Permutations of PLL/RQ, DLL and Counters for Optimization of Standby Power and Die Size.

Figure 38:
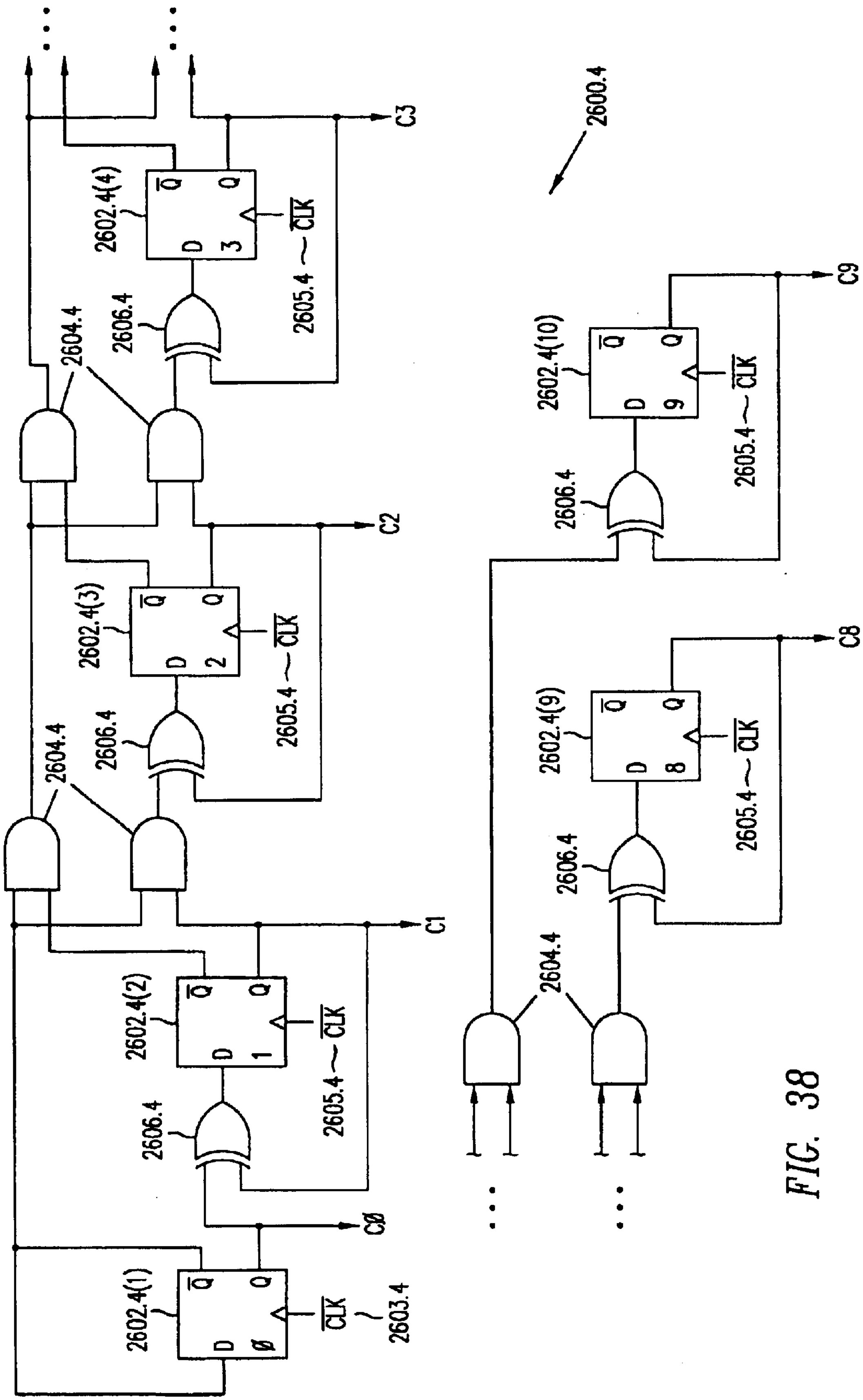
FIG. 38 shows an exemplary implementation of a Grey counter.

FIG. 38 shows a circuit 2600.4, which is an exemplary implementation for Grey counter 2484.4 (FIG. 37B). Circuit 2600.4 represents a 10-bit Grey counter, but could be implemented as any number of bits based upon the techniques discussed herein. Furthermore, circuit 2600.4 can be implemented as a low power circuit utilizing circuit techniques discussed below (e.g., in reference to FIG. 38B through FIG. 38F).

Circuit 2600.4 includes a number of flip flops 2602.4, which are separately referenced as flip flop 2602.4(1) through 2602.4(10), along with a number of AND gates 2604.4 and a number of exclusive OR (XOR) gates 2606.4. Circuit 2600.4 generates a 10-bit Grey count (i.e., bits Co through C9 in FIG. 38) that is provided to CAM module 2486.4 (FIG. 37B).

Figure 38A:
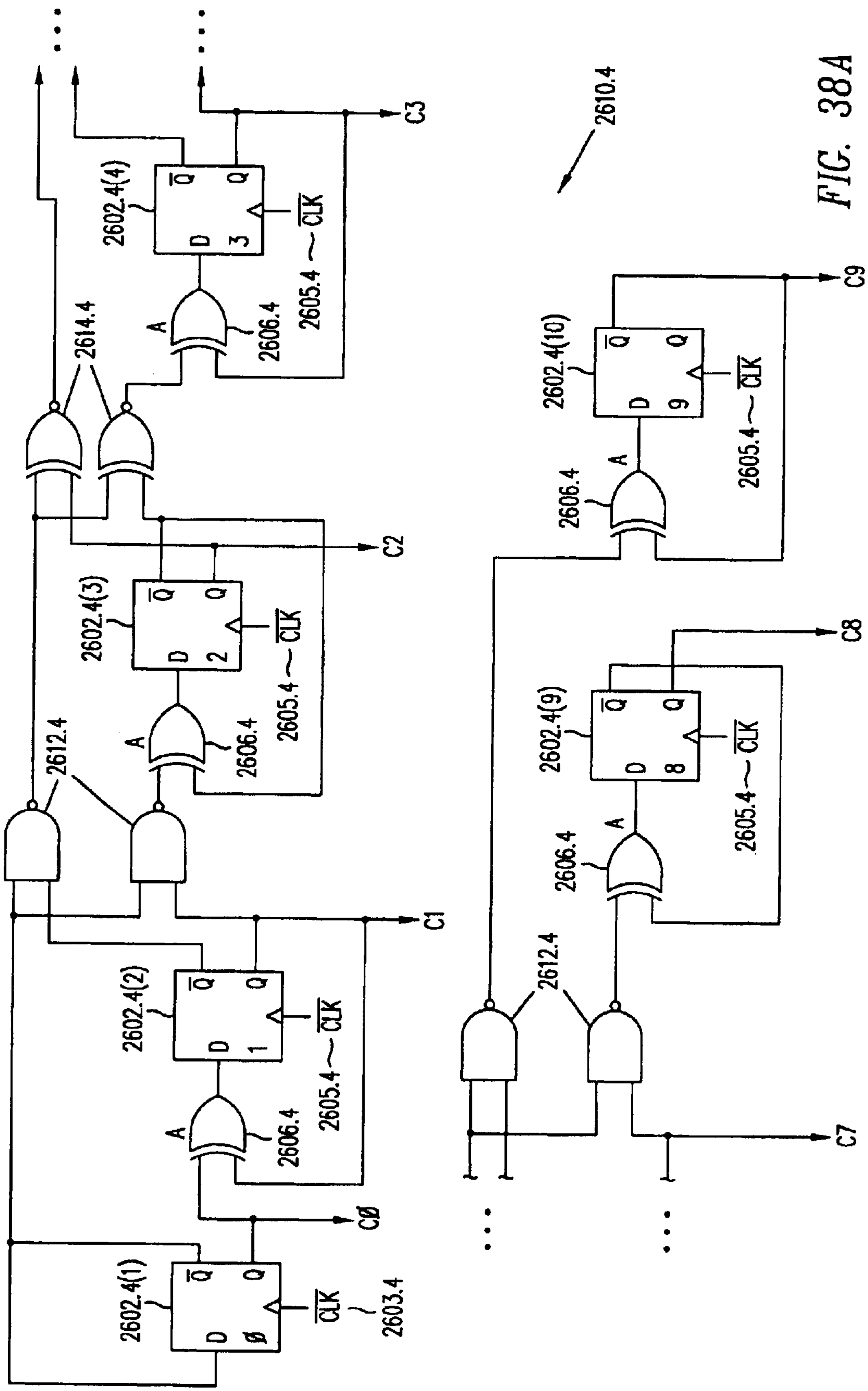
FIG. 38A shows another exemplary implementation of a Grey counter.

FIG. 38A shows a circuit 2610.4, which is another exemplary implementation for Grey counter 2484.4. Circuit 2610.4 is similar to Circuit 2600.4, but utilizes NAND gates 2612.4 and NOR gates 2614.4 rather than AND gates 2604.4. As shown in FIG. 38 and FIG. 38A, flip flop 2602.4(1) receives a clock (CLK) signal 2603.4 while flip flops 2602.4(2) through 2602.4(10) receive a clock signal (CLK bar) 2605.4, which is the complement of clock signal 2603.4. Circuits 2600.4 and 2610.4 may be implemented using low power circuit techniques discussed in the following figures.

Figure 38B:
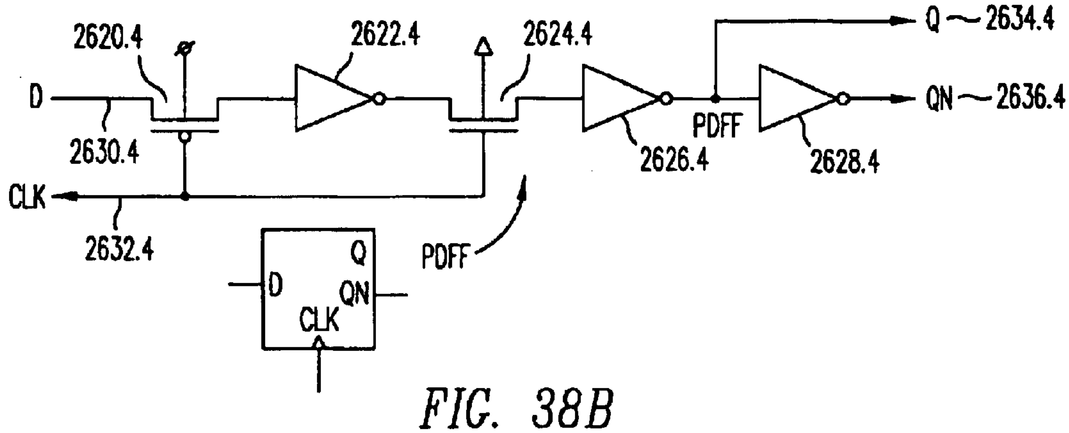
FIG. 38B shows an exemplary implementation for a flip flop of FIG. 38 or FIG. 38A.
Figure 38C:
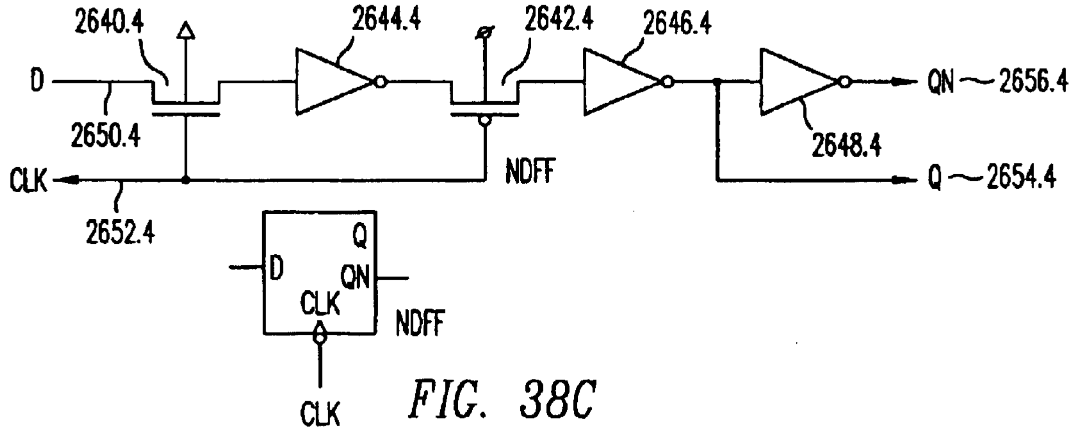
FIG. 38C shows an exemplary implementation for another flip flop of FIG. 38 or FIG. 38A.

FIG. 38B and FIG. 38C illustrate circuit implementations that may require less power than conventional flip flop circuits by utilizing fewer circuit elements. FIG. 38B shows an exemplary implementation for flip flop 2602.4(1) of FIG. 38 or FIG. 38A. FIG. 38B includes transistors 2620.4 and 2624.4 (i.e., a p-type and an n-type transistor, respectively) along with inverters 2622.4, 2626.4, and 262B.4. Transistor 2620.4 receives a D input signal 2630.4 and transistors 2620.4 and 2624.4 receive a clock (CLK) signal 2632.4, with inverters 2626.4 and 2628.4 providing a Q signal 2634.4 and a QN (Q NOT or Q bar) signal 2636.4, respectively.

Figure 38D:
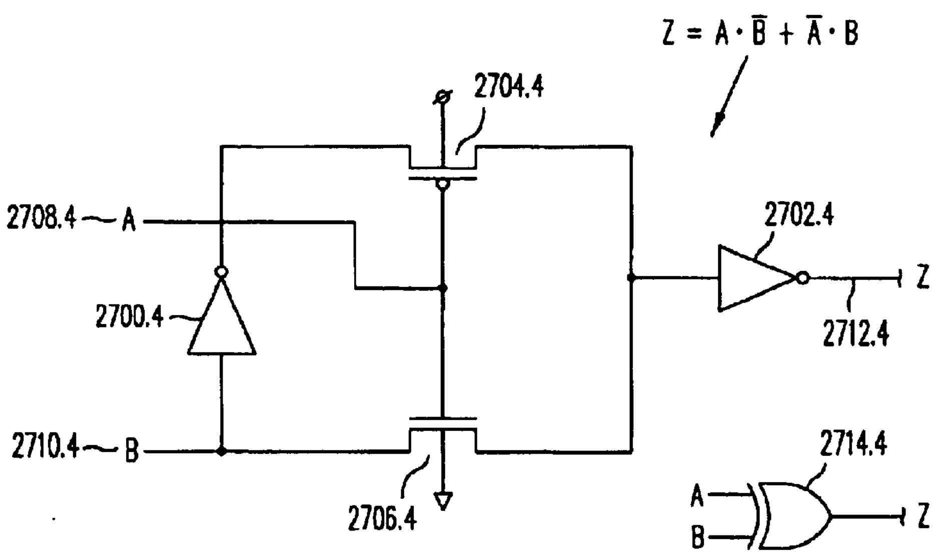
FIG. 38D shows an exemplary circuit implementation for a logic gate.

In a similar fashion, FIG. 38C shows an exemplary implementation for flip flops 2602.4(2) through 2602.4(10) of FIG. 38 or FIG. 38A. FIG. 38C includes transistors 2640.4 and 2642.4 (i.e., an n-type and a p-type transistor, respectively) along with inverters 2644.4, 2646.4, and 2648.4. Transistor 2640.4 receives a D input signal 2650.4 and transistors 2640.4 and 2642.4 receive a clock (CLK bar) signal 2652.4, with inverters 2646.4 and 2648.4 providing a Q signal 2654.4 and a QN (Q NOT) signal 2656.4, respectively. FIG. 38D shows an exemplary circuit implementation for an XOR logic gate (e.g., XOR gate 2606.4 of FIG. 38 and FIG. 38A or an XOR gate 2717.4 as shown in FIG. 38D), which requires less power than a conventional XOR gate. FIG. 38D includes inverters 2700.4 and 2702.4 and transistors 2704.4 and 2706.4. An input signal (A) 2708.4 and an input signal (B) 2710.4 are provided, as shown, to transistors 2704.4 and 2706.4, respectively, with inverter 2702.4 providing an output signal (Z) 2712.4 in accordance with the equation $Z=A\cdot\overline{B}+\overline{A}\cdot B$.

Figure 38E:
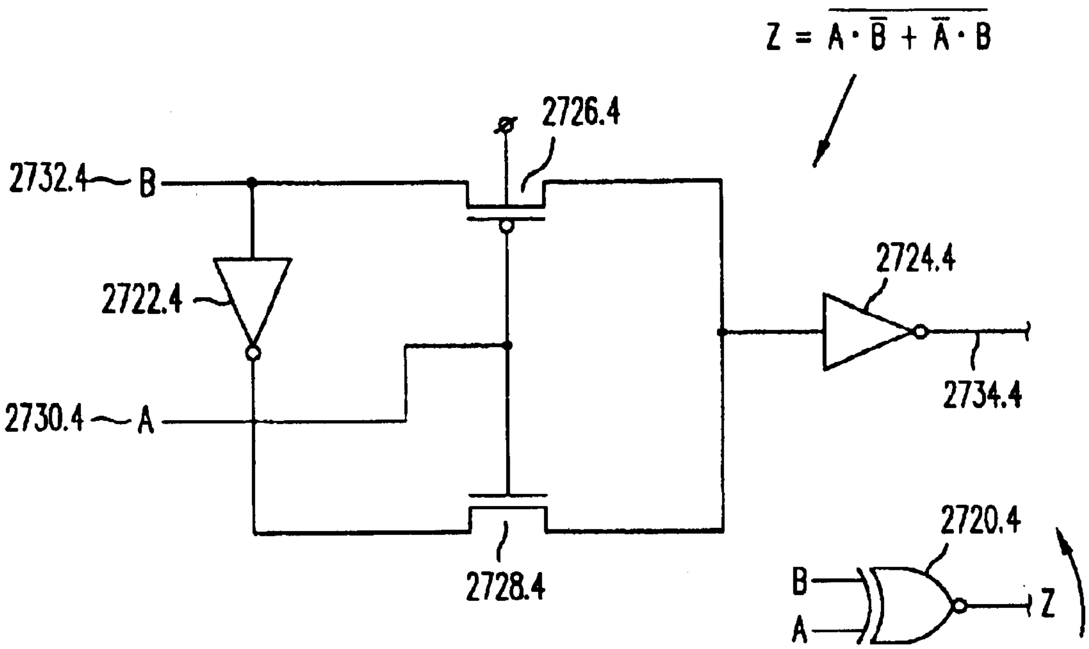
FIG. 38E shows an exemplary circuit implementation for another logic gate.

Likewise, FIG. 38E shows an exemplary circuit implementation for an exclusive NOR (XNOR) logic gate 2720.4, which may require less power than a conventional XNOR gate. FIG. 38E includes inverters 2722.4 and 2724.4 and transistors 2726.4 and 2728.4. An input signal (A) 2730.4 and an input signal (B) 2732.4 are provided, as shown, to transistors 2726.4 and 2728.4, respectively, with inverter 2724.4 providing an output signal (Z) 2734.4 in accordance with the equation $Z=\overline{A\cdot B}+\overline{A}\cdot B$.

Figure 38F:
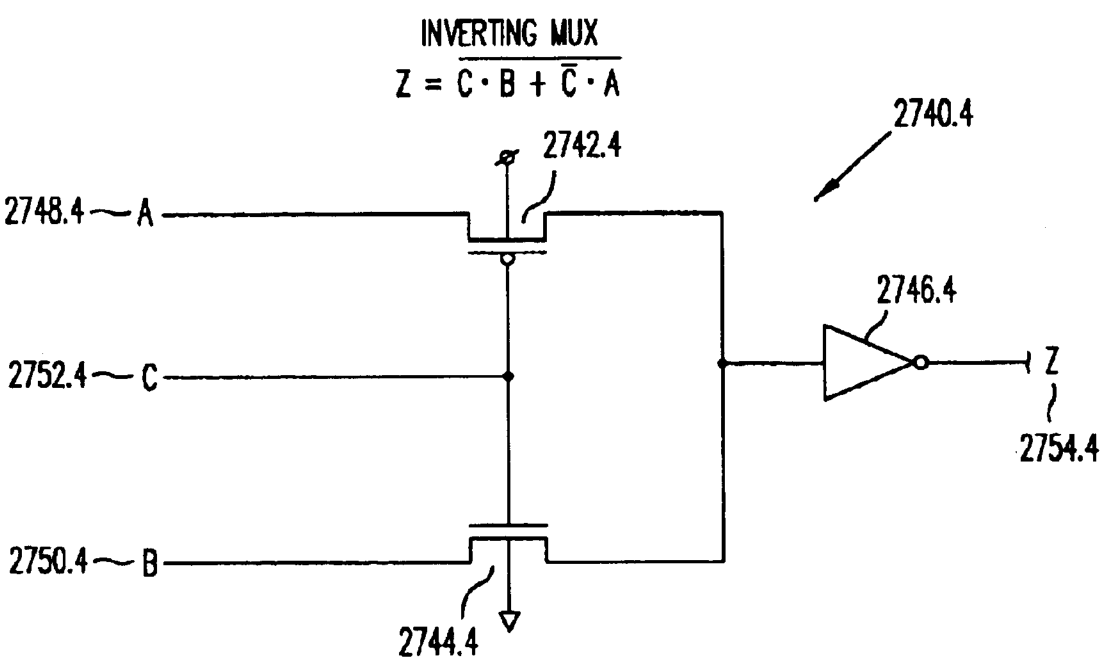
FIG. 38F shows an exemplary circuit implementation for a multiplexer.

Additionally, FIG. 38F shows an exemplary circuit implementation for an inverting multiplexer 2740.4, which includes transistors 2742.4 and 2744.4 and an inverter 2746.4. Inverting multiplexer 2740.4 receives input signals (A) 2748.4, (B) 2750.4, and (C) 2752.4 and provides an output signal (Z) 2754.4, in accordance with the equation $Z=\overline{C\cdot B+C}\cdot A$.

Figure 38G:
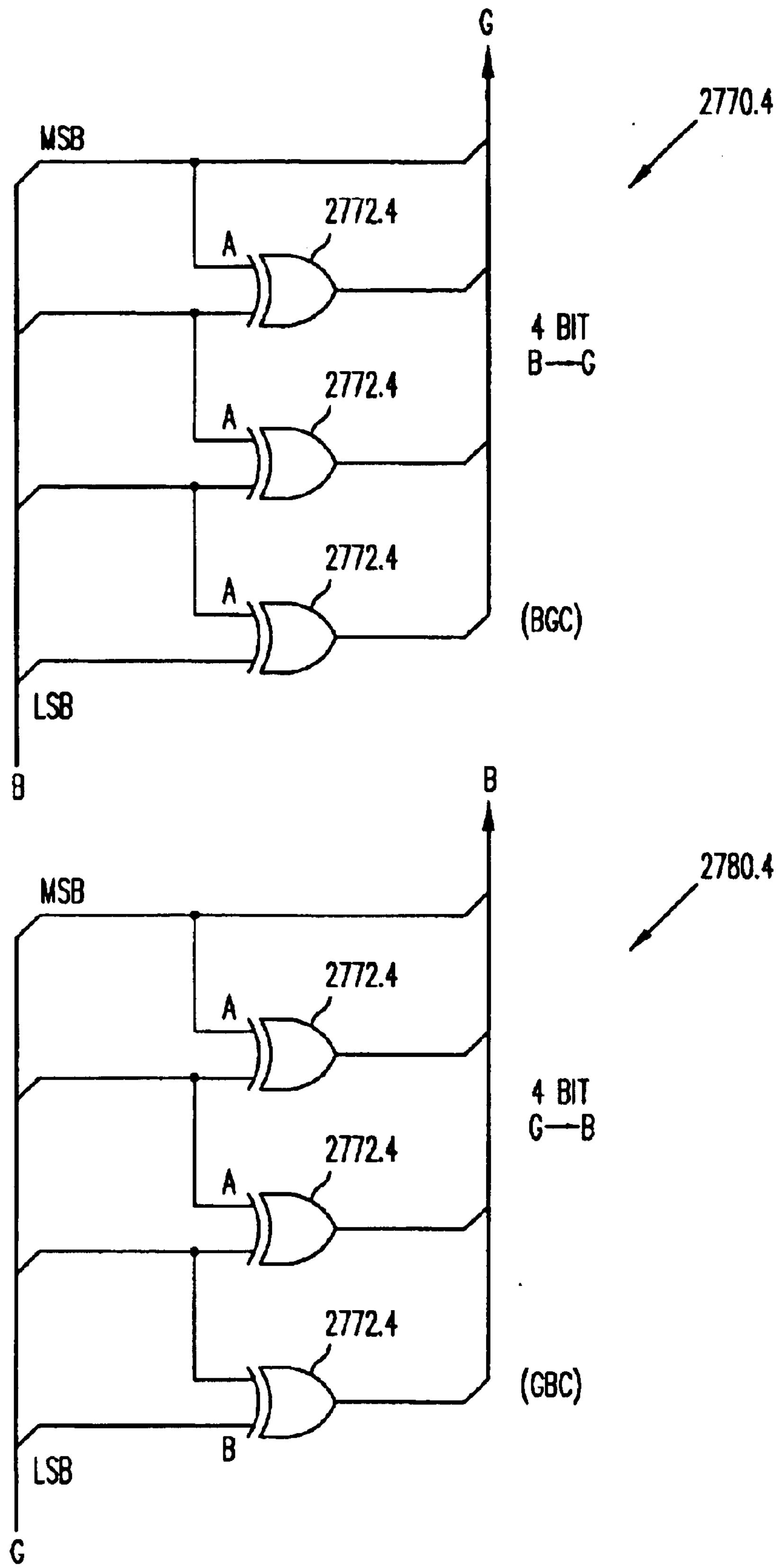
FIG. 38G shows an exemplary circuit implementation for binary to Grey and Grey to binary conversion.

FIG. 38G shows an exemplary circuit implementation for a binary to Grey conversion (BGC) 2770.4 and a Grey to binary conversion (GBC) 2780.4. BGC 2770.4 shows an exemplary 4-bit conversion from binary to Grey code utilizing XOR gates 2772.4, while GBC 2780.4 shows an exemplary 4-bit conversion from Grey to binary code utilizing XOR gates 2772.4. XOR gates 2772.4 may be implemented as discussed above in reference to FIG. 38D to minimize the amount of power utilized.

Figure 38H:
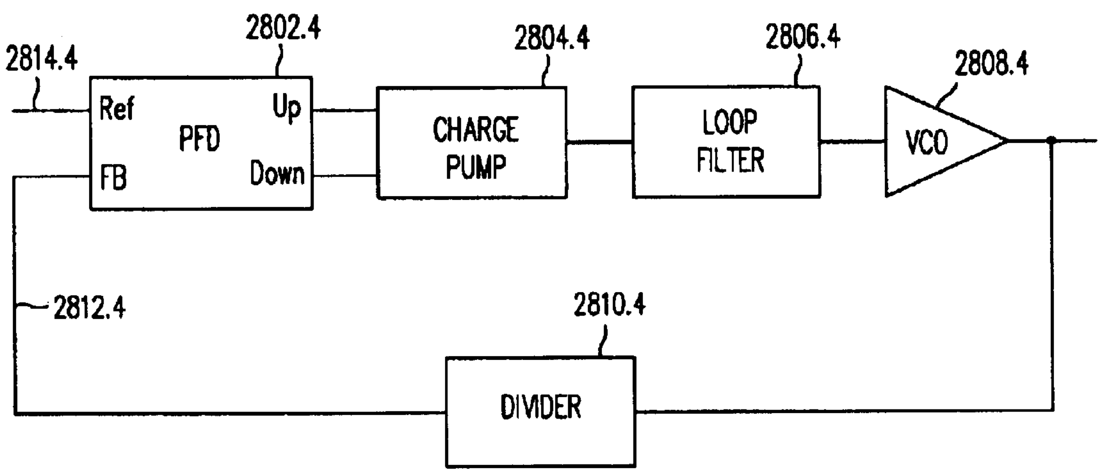
FIG. 38H illustrates an exemplary implementation for a digital pulse converter.

Another alternative implementation, in accordance with an embodiment of the present invention, for performing pulse width modulation includes a low frequency digital phase locked loop (DPLL) voltage controlled oscillator (VCO) with inverter stages and taps (i.e., example 1 as listed above). FIG. 38H illustrates an exemplary implementation in accordance with this embodiment, which includes a phase frequency detector (PFD or phase detector) 2802.4, a charge pump 2804.4, a loop filter 2806.4, a VCO 2808.4, and a frequency divider 2810.4.

PFD 2802.4 receives a reference frequency (e.g., 32 kHz) on a line 2814.4 and a feedback signal from frequency divider 2810.4 on a line 2812.4 and determines whether to provide a pump up or a pump down signal to charge pump 2804.4. Charge pump 2804.4 provides a signal, based on the pump up or the pump down signal to loop filter 2806.4 and VCO 2808.4. VCO 2808.4 is comprised of a ring oscillator having inverter stages and taps, as discussed similarly above in reference to FIG. 3, and therefore the description will not be repeated. An output signal from VCO 2808.4 is received by frequency divider 2810.4, which divides down a frequency of the output signal to a desired frequency to provide as the feedback signal.

Another alternative implementation for performing pulse width modulation may be viewed as a hybrid of a high frequency DPLL with a counter combined with a digital comparator (i.e., example 2 as listed above) and a DPLL combined with a content addressable memory (i.e., example 3 as listed above) to generate the required pulse width modulated signals.

Figure 38I:
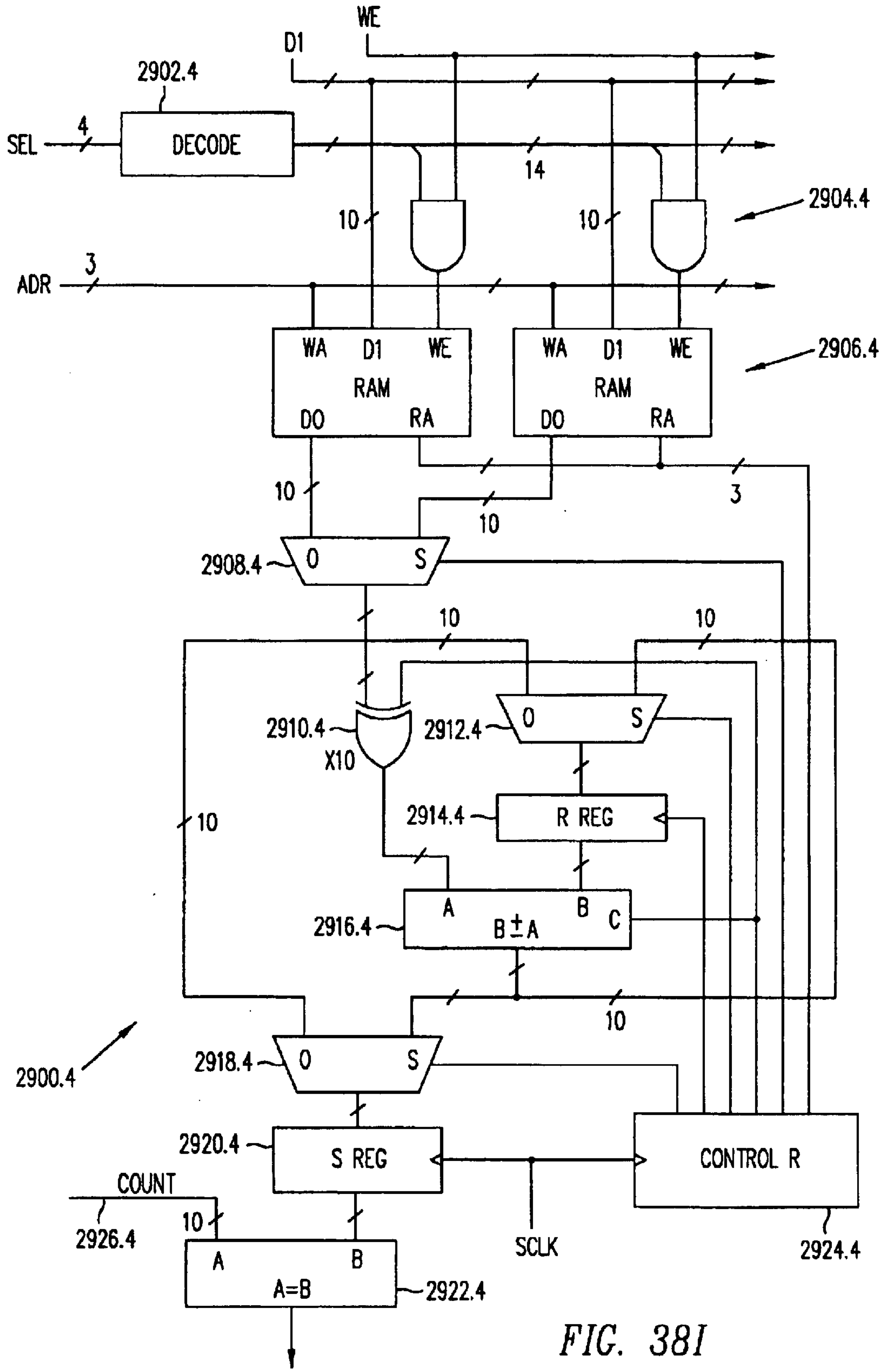
FIG. 38I illustrates another exemplary implementation for a digital pulse converter.

More specifically, FIG. 38I illustrates a circuit 2900.4 to assist in generating pulse width modulation signals. Circuit 2900.4 includes a decoder 2902.4 which controls logic gates 2904.4 for writing to memory 2906.4 (e.g., random access memory) having address lines (ADR) and data lines (D1). Memory 2906.4 stores data that determines start and stop times for desired pulse width modulated signals.

Memory 2906.4 provides data (at a DO terminal) under control of a controller 2924.4 (through a read address (RA)) to multiplexers 2912.4, exclusive OR (XOR) gates 2910.4, and multiplexers 2918.4 via multiplexers 2908.4. Under direction of controller 2924.4, XOR gates 2910.4, multiplexers 2912.4 and 2918.4, registers 2914.4 and 2920.4, and adder/subtractor 2916.4 determine the data to provide to a comparator 2922.4 to compare with a reference count 2926.4. Comparator 2922.4, which is similar to comparator 2310.4 of FIG. 36A, provides an output signal to a pulse width modulation circuit (i.e., PWM circuit 2314.4 as described in reference to FIG. 36A). Consequently, by using memory and a comparator, pulse width modulated signals can be generated.

Figure 46:
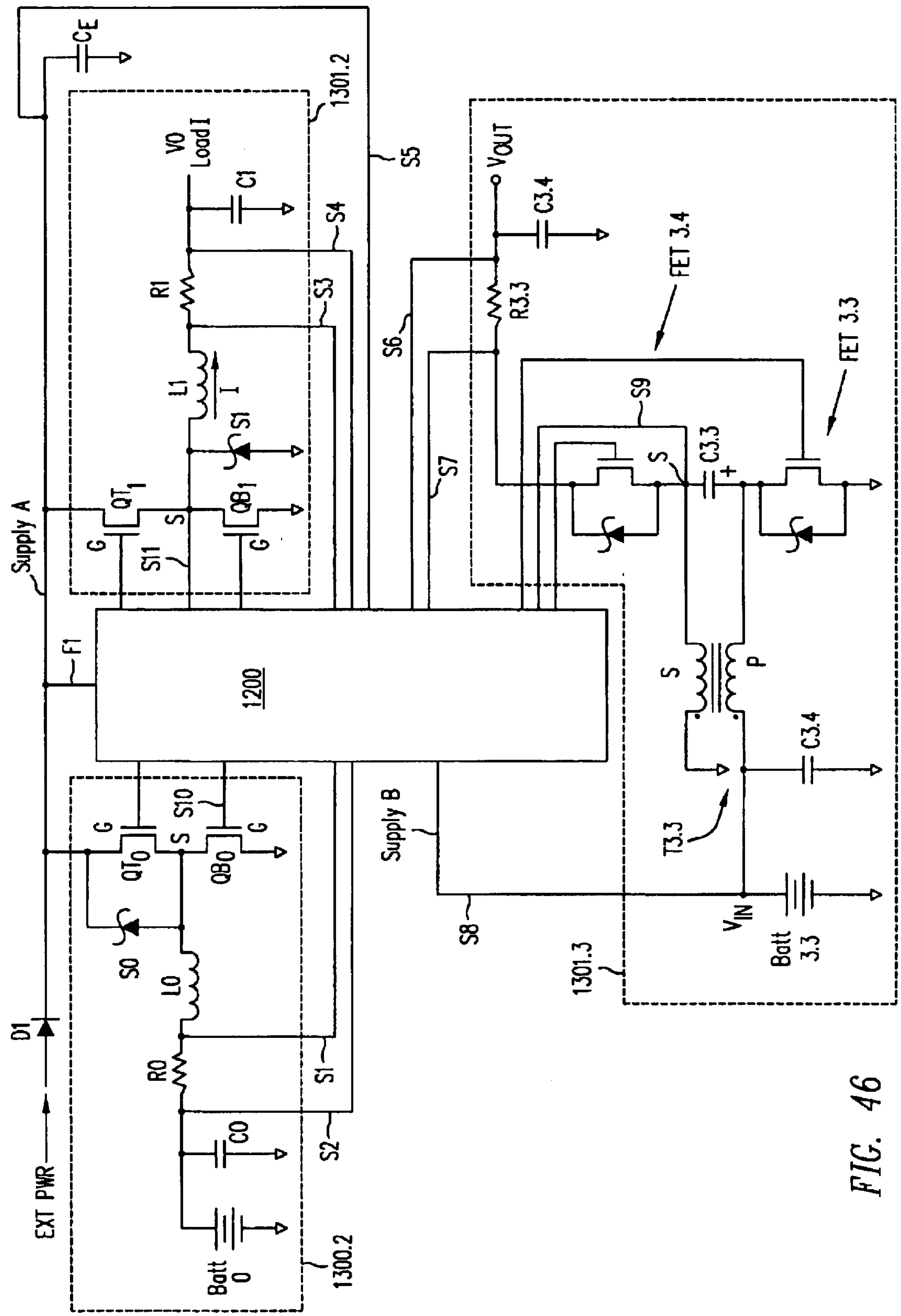
FIG. 46 shows switching power supply controller 1200 connected to regulate the operation of two switching power supplies.

Section 1.1.6 Discussion of Phase Offset Tuning of Synchronous Drive to Optimize Conduction Losses vs. Dead Time One of the efficiency optimizations in switching power supplies is to attempt to minimize the power dissipated by the Schottky diode that will typically either be inserted in the circuit across the lower transistor ($QB_1$ in circuit 1301.2 of FIG. 46), or as is well known is intrinsic to a FET. In FIG. 46, the Schottky diode is indicated by reference character S1. In order to minimize the voltage drop across diode S1, transistor $QB_1$ is inserted between terminal S and ground, and is turned on in some instances to reduce the voltage drop across diode S1, therefore substantially reducing the power dissipated by this diode. Of course, any of this power dissipated will not be delivered to the load and so is therefore a source of inefficiency. The challenge becomes minimizing the amount of time that diode S1 conducts. It is desirable that diode S1 conduct only a very small amount of time, however, if the switching signals to $QB_1$ and $QT_1$ become too close in time, because of the time delay required to switch on and off, it's possible that both transistors might be on simultaneously which would not only be a huge efficiency loss, but could potentially result in catastrophic circuit failure due to the unlimited currents flowing directly from the input supply through $QT_1$ to $QB_1$ to ground. So the optimization then, is to move the gate signal for $QB_1$ as close as possible to the gate signal of $QT_1$, but without causing an overlap in conduction.

Figure 39:
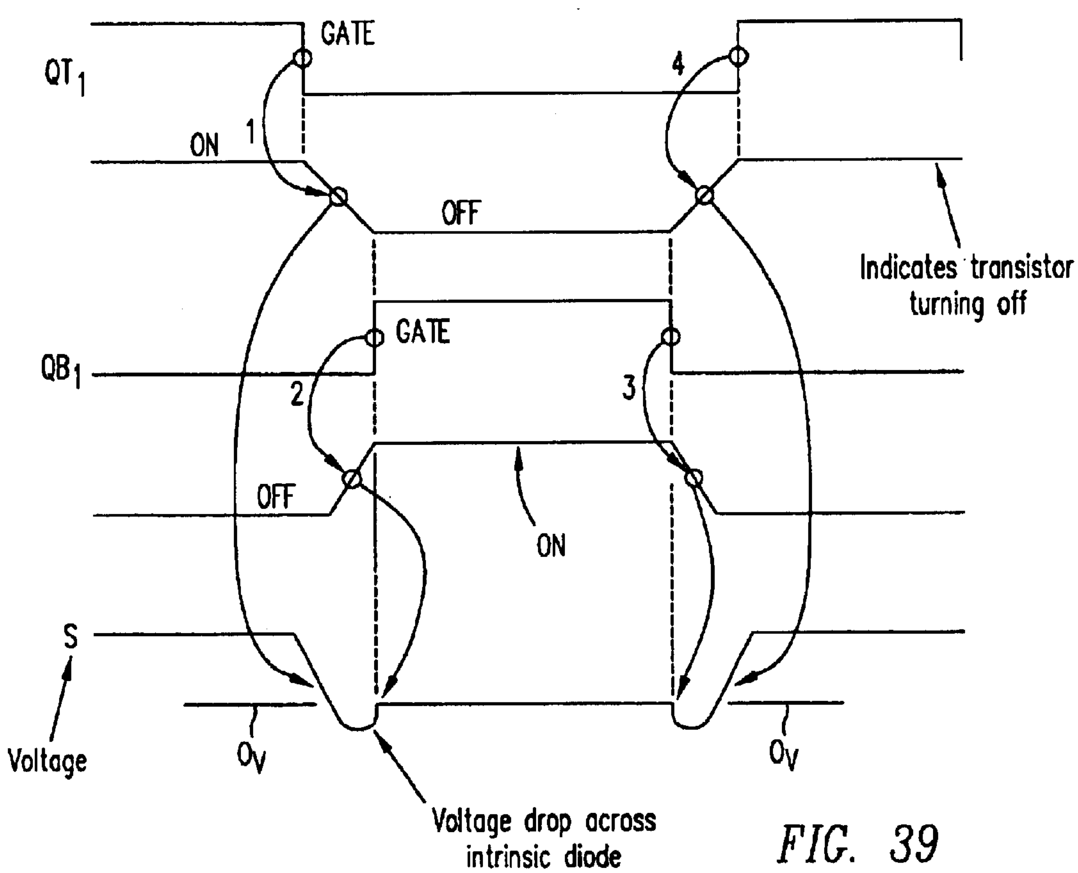
FIG. 39 shows a plot of typical gate drive waveforms which may be applied to for example, the gates of the transistors of circuit 49 and the resulting voltage at terminal S.

FIG. 39 illustrates the expected voltage at terminal S in FIG. 46 for the switching timing diagrams immediately above it in the figures. It will be appreciated that the voltage at terminal S falls as the gate drive to $QT_1$ is turned off and drops to the point where it is caught by the Schottky diode S1, then in the subsequent time $QB_1$ is turned on pulling the voltage back up to the supply rail. This process happens in reverse order at the other end of the pulse where the gate for $QB_1$ is turned off. Current is again allowed to flow into diode S1, and the voltage at terminal S falls below ground which results in wasted power dissipated until $QT_1$ is turned on and the voltage at terminal S switches up to the positive supply rail and the cycle repeats.

In prior art solutions, a guard band must be constructed between the timing of these two gate signals. This guard band has to be long enough to accommodate the slowest transistor that might be used in the application. In the present invention, in one embodiment we use data provided by the designer of the power supply being regulated by switching power supply controller 1200 and program that data into internal memory of switching power supply controller 1200, stating what the characteristics of the external transistors are. Accordingly, a fixed guard band and time are not required. In a first embodiment, we use the minimum number that could be used based on the published data for the individual devices, and store the phase offset values in REGhw. In another embodiment of the present invention, we dynamically optimize this further. This can be done by observing the efficiency of the given output stage. For example, we know that for a buck power supply, the output voltage is equal to the duty cycle multiplied by the input supply voltage. Any deviation of the actual output voltage from that calculated output voltage will be due to parasitic effects of inductors, resistors, capacitors, and the transistors themselves. It is therefore possible to carefully, and at a slow rate over many cycles, tune the timing between $QT_1$ and $QB_1$ until this efficiency peaks and begins to degrade. It will degrade rapidly as the transistors overlap, but this permits dynamic adaptation of the timing of the gate drive signals to the transistors to the actual devices in the circuit being regulated. Switching power supply controller 1200 can have a number of guard bands on a circuit to circuit basis because the switching times of these transistors are also somewhat dependent on the load current that they are supplying and the temperatures at which they are operating. The required amount of phase offset between the time $QT_1$ turns off and $QB_1$ turns on and the phase offset between when $QB_1$ turns off and $QT_1$ turns on may be different. Accordingly, fine tuning on both can be made. Temperature data is available to the controller from the Kelvin temperature sensor located in internal voltage supply 1209. In the first embodiment described above, providing the rise and fall time parameters for the transistors to the controller can achieve assignificant improvement over the prior art worst case tolerance scheme which does not take into account the specifications of the actual transistors being used. In the second embodiment, efficiency can be further improved by dynamically adapting to the devices that are used, and thus achieving the highest efficiency possible for the given set of transistors and discrete output components.

Section 1.1.7 Synchronous Sampling Multiple Output

Sample and Hold Module (SHM) 1207 samples various voltages and currents and holds them until analog to digital converter 1206 is ready to receive them. As noted herein, analog input signals used in the control loops are provided by Digital Pulse Converter 1201 via SHM 1207, and are converted to digital signals by analog to digital converter 1206. As an example, SHM 1207 samples and holds thirteen voltages and seven currents, with seven voltages associated with external power supplies being controlled or driven, two voltages associated with SUPPLYA and SUPPLYB and four auxiliary voltages: VOUT from Kelvin Temperature Sensor 3516.4, and three pads TEMPEXT, AUX0 and AUX1.

Figure 40:
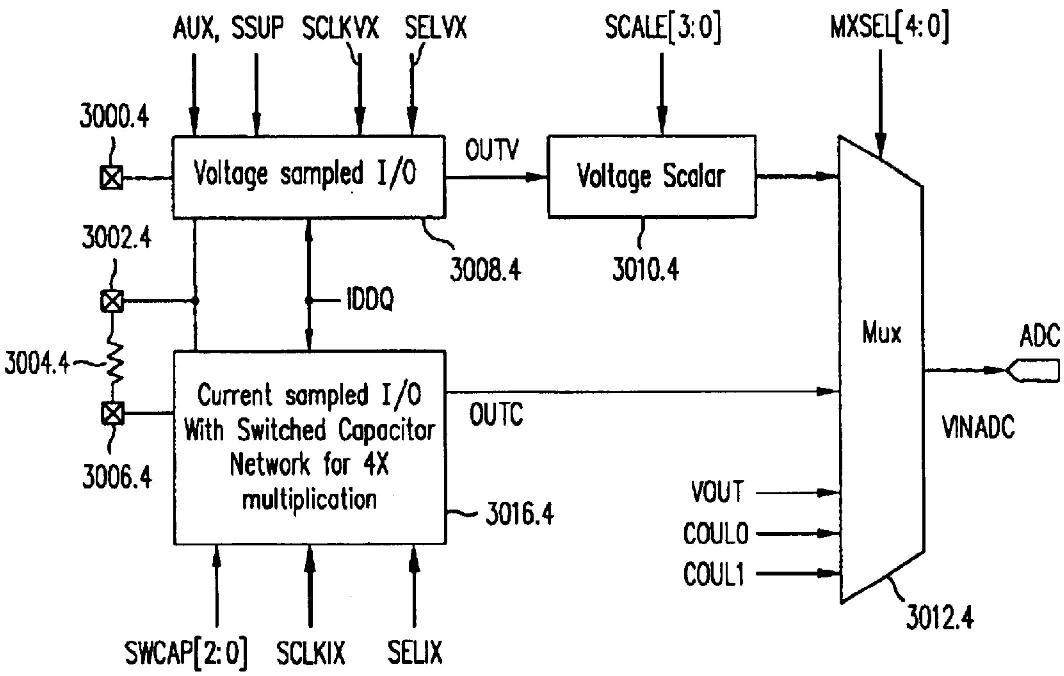
FIG. 40 is a block diagram of SHM 1207 in one implementation.

FIG. 40 is a functional block diagram of SHM 1207 in one implementation. The functional block diagram includes an input/output (I/O) circuit 3008.4, a voltage divider (scalar) 3010.4, a multiplexer 3012.4, and a multiplexer 3016.4. An external voltage is sampled by I/O circuit 3008.4 via a pad 3000.4, with an output signal (OUTV) provided to voltage divider 3010.4. Voltage divider 3010.4 divides down or scales the output signal (OUTV) to an acceptable level under control of a scale[3:0] signal received from regulation control module (REG) 1204. For example, an external voltage (e.g., 15 V or less) is scaled to an appropriate value for analog to digital converter 1206 (e.g., input range of 0 to 3.3. V).

I/O circuit 3008.4 receives a SSUP signal and a SELVX signal from regulation control module (REG) 1204 and an AUX signal and a SCLKVX signal from DPC 1201. The AUX signal provides a sample clock for sampling one or more external supply voltages. The SSUP signal provides a select clock for selecting which external supply voltage to sample. The SCLKVX signal corresponds to SMPA[6:0] signal 2450.4 and SMPB[6:0] signal 2448.4, which control the sampling (and holding) of analog voltages in SHM 1207 for analog to digital converter 1206. The SELVX signal provides a select clock for selecting which external voltage to sample. An IDDQ signal provided to I/O circuits 3008.4 and 3016.4 indicates a test control signal for these circuits.

An external current is sampled by I/O circuit 3016.4 via pads 3002.4 and 3006.4 and utilizing a resistor 3004.4 connected between pads 3002.4 and 3006.4, with an output signal (OUTC) provided. I/O circuit 3016.4 receives an SWCAP[2:0] signal and an SELIX signal from regulation control module (REG) 1204 and an SCLKIX signal from DPC 1201. The SWCAP[2:0] provides input control for a switched capacitive network, discussed further below. The SCLKIX signal corresponds to SMPA[6:0] signal 2450.4 and SMPB[6:0] signal 2448.4, which control the sampling (and holding) of analog voltages (and currents) in SHM 1207 for analog to digital converter 1206. The SELIX signal provides a select clock for selecting which external current to sample.

Multiplexer 3012.4, under control of a MXSEL[4:0] signal from regulation control module (REG) 1204, selects which input is presented to analog to digital converter 1206 as an output signal VINADC. Besides the input signals discussed above, multiplexer 3012.4 also receives a VOUT signal from a Kelvin temperature sensor and a COULO and a COULL signals, which are Coulombmetric measurements from available battery supplies (e.g., battery zero and battery one, discussed further herein).

Figure 40A:
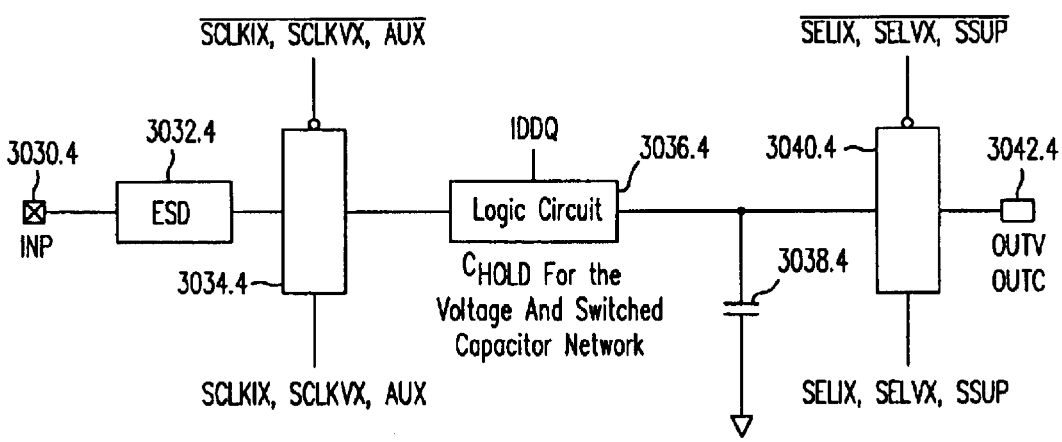
FIG. 40A is a functional schematic illustrating voltage and current sampling for one implementation.

FIG. 40A is a functional schematic illustrating an exemplary implementation for I/O circuits 3008.4 and 3016.4. An external voltage or current is sampled via a pad 3030.4 and electrostatic discharge protection (ESD) circuitry 3032.4, with the sampled signal passing through a pass gate 3034.4 to a logic circuit 3036.4. Logic circuit 3036.4 buffers or scales the sampled signal, for example, prior to providing it to a capacitor 3038.4, which acts as a holding capacitor until a pass gate 3040.4 is opened and the sampled signal is provided to analog to digital converter 1206 via a lead 3042.4 (labeled OUTV or OUTC for output voltage or output signal from switched capacitor network).

In terms of general operation, the select clocks (i.e., the SCLKIX, SCLKVX, and AUX signals from DPC 1201) control pass gate 3034.4 for allowing an input voltage to charge capacitor 3038.4. The select lines (i.e., the SELIX, SELVX, and SSUP signals from regulation control module (REG) 1204) present the value stored on capacitor 3038.4 to be scaled (e.g., by voltage divider 3010.4) and passed to analog to digital converter 1206. If current is being measured, capacitor 3038.4 becomes part of a switched capacitor network to multiply a sampled input voltage (i.e., across resistor 3004.4) to a desired value for conversion by analog to digital converter 1206.

Figure 40B:
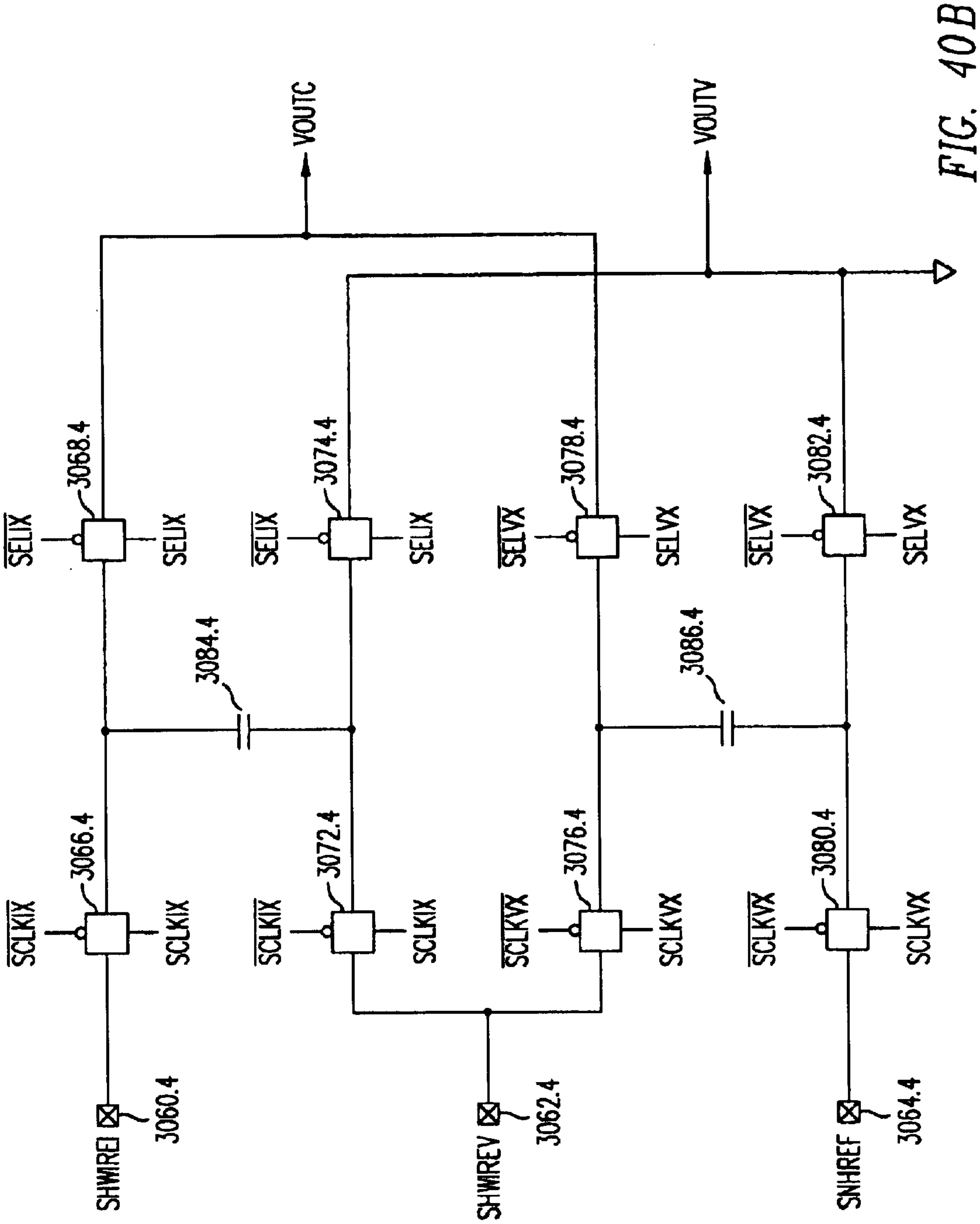
FIG. 40B is a circuit schematic illustrating voltage and current selection for one implementation.

FIG. 40B is a circuit schematic illustrating exemplary voltage and current selection. An SHWIREI signal, an SHWIREV signal, and an SNHREF signal is provided via pads 3060.4, 3062.4, and 3064.4 respectively. The SHWIREI signal, SHWIREV signal, and SNHREF signal represent signals to be measured by I/O circuits 3008.4 and 3016.4 (FIG. 40) for corresponding current, voltage, and ground reference. As illustrated, the SCLKIX and SCLKVX signals control corresponding pass gates 3066.4, 3072.4, 3076.4, and 3080.4 to allow an input voltage to charge a corresponding capacitor 3084.4 or 3086.4. The SELIX and SELVX signals control corresponding pass gates 3068.4, 3074.4, 3078.4, and 3082.4 to allow the charge on corresponding capacitors 3084.4 or 3086.4 to pass as an output signal (labeled VOUTV or VOUTC for sampled voltage or current, respectively).

Figure 40C:
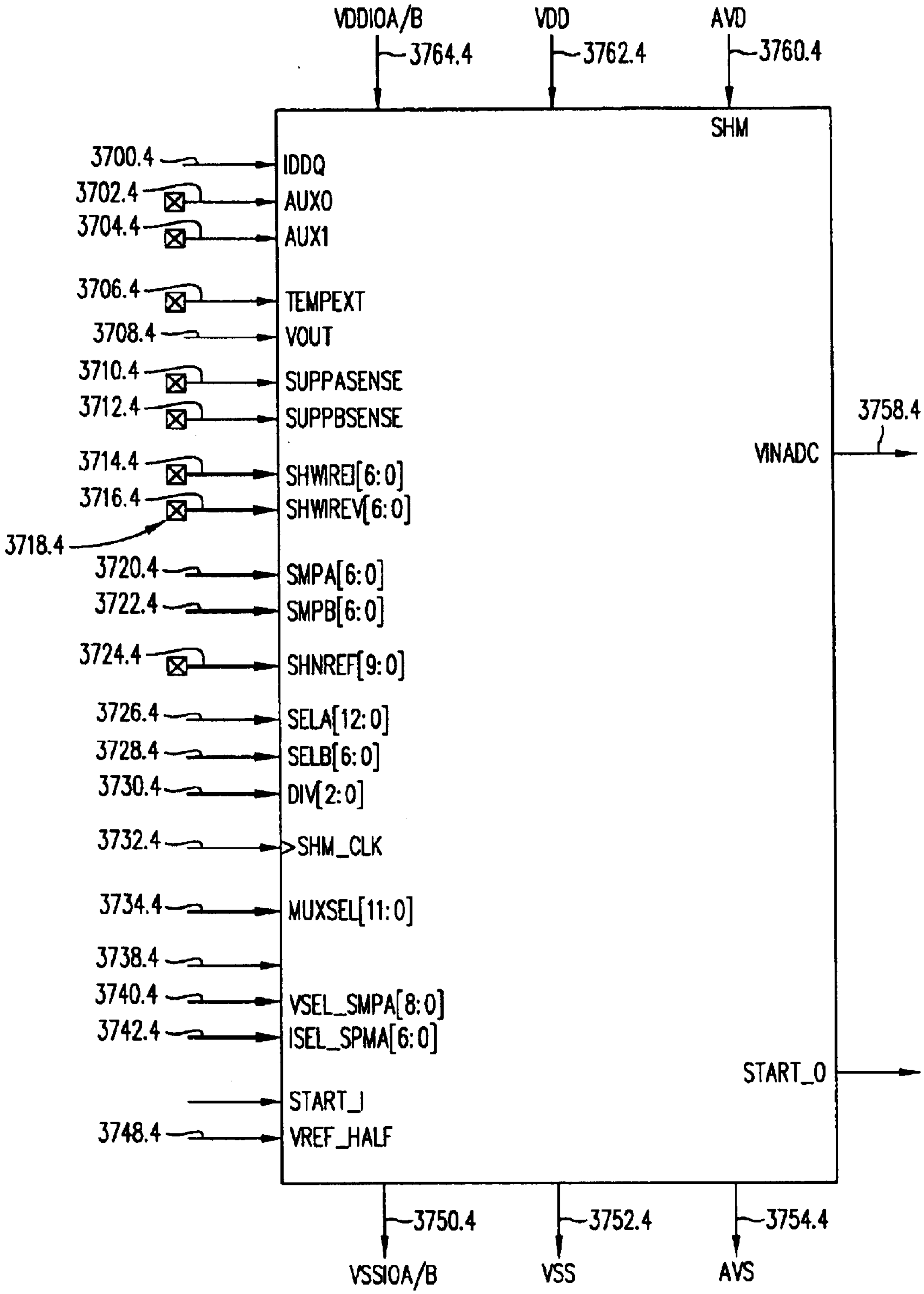
FIG. 40C is an exemplary interface signal block for SHM 1207 in accordance with another implementation.

FIG. 40C is an exemplary interface signal block diagram for SHM 1207 in accordance with another implementation. The interface signals include an IDDQ signal 3700.4, an AUX0 signal 3702.4, an AUX1 signal 3704.4, a TEMPEXT signal 3706.4, a VOUT signal 3708.4, a SUPPASENSE signal 3710.4, a SUPPBSENSE signal 3712.4, a SHWIREI [6:0] signal 3714.4, a SHWIREV[6:0] signal 3716.4, an SMPA[6:0] signal 3720.4, an SMPB[6:0] signal 3722.4, an SHNREF[9:0] signal 3724.4, a SELA[12:0] signal 3726.4, a SELB[6:0] signal 3728.4, a DIV[2:0] signal 3730.4, a SHM__CLK signal 3732.4, a MUXSEL[1:0] signal 3734.4, a DONE signal 3738.4, a VSEL__SMPA[8:0] signal 3740.4, a ISEL__SMPA[6:0] signal 3742.4, a VREF__HALF signal 3748.4, a VSSIOA/B signal 3750.4, a VSS signal 3752.4, an AVS signal 3754.4, a VINADC signal 3758.4, an AVD signal 3760.4, a VDD signal 3762.4, and a VDDIOA/B signal 3764.4. Pads 3718.4 indicate signals received external to switching power supply controller 1200.

IDDQ signal 3700.4 is a test signal, while AUX0 signal 3702.4 and AUX1 signal 3704.4 are external signals for auxiliary applications. TEMPEXT signal 3706.4 is received from a temperature sensor circuit attached to the external battery. VOUT signal 3708.4 represents the voltage from the Kelvin temperature sensor (e.g., Kelvin temperature sensor 2232.4 in FIG. 54) that will be sampled and held to isolate its ground from the ground of analog to digital converter 1206 when this voltage gets converted.

SUPPASENSE signal 3710.4 and SUPPBSENSE signal 3712.4 are used to sense the voltage on the external Supply A and Supply B power supplies. SHWIREI[6:0] signal 3714.4 is used for sensing-the voltage drop across a sense resistor for each of the 7 external power supplies. SHWIREV[6:0] signal 3716.4 is used for sensing the voltage for each of the 7 external power supplies. SHNREF[9:0] signals 3724.4 are ground references for both the voltage and the current of each external power supply, plus there are three additional references for Supply A, Supply B, AUX0 signal 3702.4, AUX1 signal 3704.4, and TEMPEXT signal 3706.4.

Figure 40D:
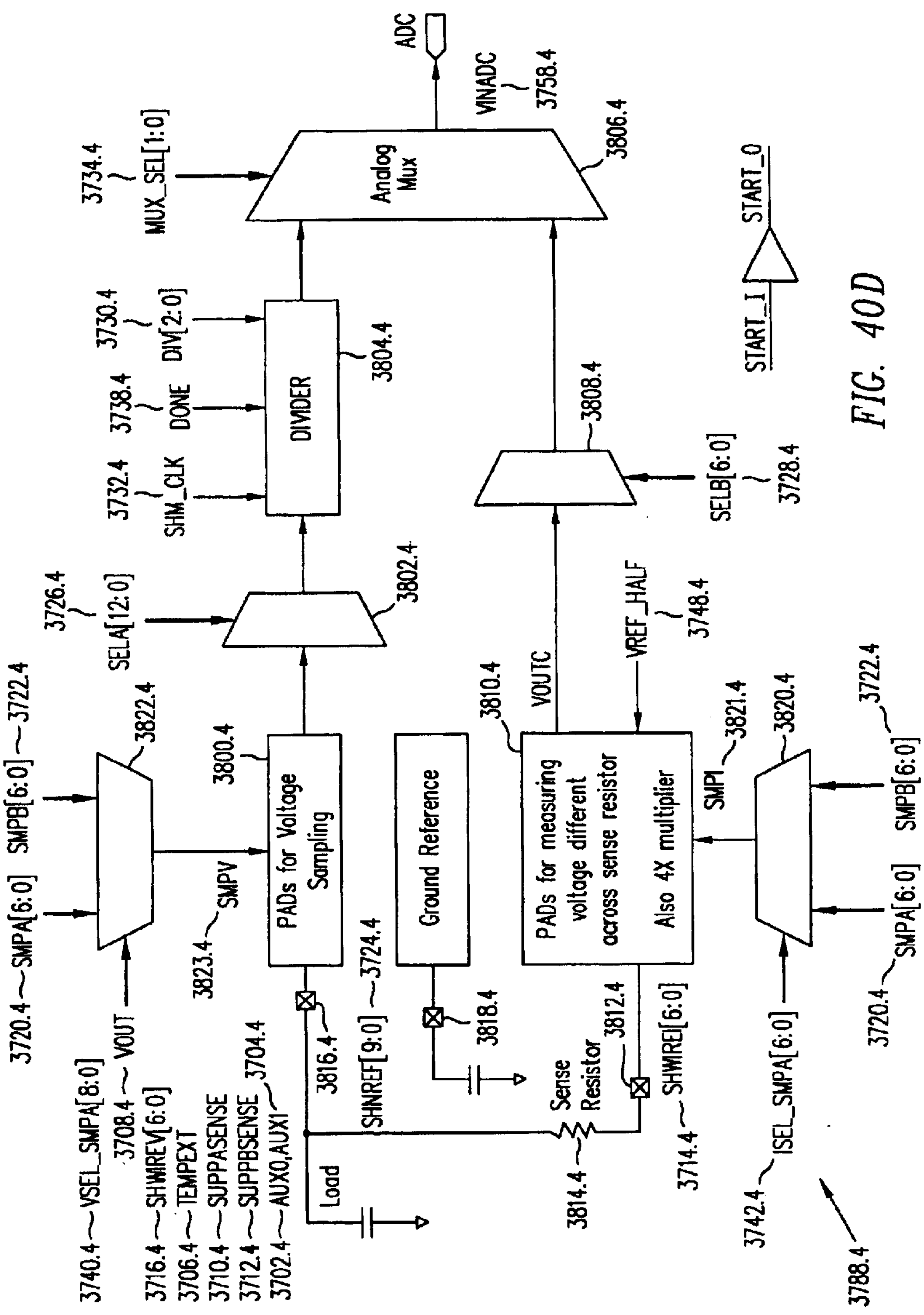
FIG. 40D is a block diagram of SHM 1207 in another implementation.

SMPA[6:0] signal 3720.4 is received from DPC 1201 and is used for sampling voltages at the load of the seven power supplies. SMPB [6:0] signal 3722.4 is received from DPC 1201 and is used for sampling the voltage drop across the sense resistor for the seven supplies (described in further detail below). SELA [12:0] signal 3726.4 is received from regulation control module (REG) 1204 and determines which channel voltage needs to be presented to a divider 3804.4 (FIG. 40D). SELB [6:0] signal 3728.4 is received from regulation control module (REG) 1204 and determines which channel current measurement.

VSEL_SMPA[8:0] signal 3740.4 is received from regulation control module (REG) 1204 and determines the swapping of the sample pulses for the leading edge. ISEL_SMPA[6:0] signal 3742.4 is received from regulation control module (REG) 1204 and determines the swapping of the sample pulses for the falling edge.

DONE signal 3738.4 is received from analog to digital converter 1206 when it is done with a conversion. DIV[2:0] signal 3730.4 is received from regulation control module (REG) 1204 and determines the divider value of divider 3804.4 for the voltage.

SHM_CLK signal 3732.4 is received from CLKGEN 1223, with a frequency that is 16 times the frame frequency and is the value generated in CTS[4] within DPC 1201 as explained elsewhere herein. MUX_SEL [1:0] signal 3734.4 is used for selecting an output signal for a multiplexer 3806.4 (FIG. 40D, e.g., an analog mux) that will be presented to analog to digital converter 1206. VDDIOA/B signals 3764.4 are the highest voltages needed for substrate connection when using high voltage switches. VSSIOA/B signals 3750.4 are the lowest voltages needed for substrate connection when using high voltage switches.

VDD signal 3762.4 (e.g., 3.3 V) is a digital voltage required for some control logic. VSS signal 3752.4 is a digital ground required for some control logic. AVD signal 3760.4 (e.g., 3.3 V) is an analog voltage required for some control logic. AVS signal 3754.4 is an analog ground to be tied to a ground of analog to digital converter 1206 when converting values into analog to digital converter 1206. VINADC signal 3758.4 is provided to analog to digital converter 1206, for example, with a range between 0 and 3.0 V. VREF_HALF signal 3748.4 is a voltage offset needed for a multiplier (discussed in detail below) to measure either positive or negative voltage differences across analog to digital converter 1206. The value of VREF_HALF signal 3748.4 is one-half that of VREF signal 3440.4 (FIG. 54A) and is received from IVS 1209. The interface signals are summarized in Table 1.1.7a.

TABLE 1.1.7a

| I/F Signal | Type | Description | Source | Destination |
|---|---|---|---|---|
| IDDQ | Input | Test input if needed | ITS [#] | |
| AUX0 | Input | I/O PAD auxiliary sample | Chip I/O | |
| AUX1 | Input | I/O PAD auxiliary sample | Chip I/O | |
| TEMPEXT | Input | I/O PAD external temp | Chip I/O | |
| VOUT | Input | I/O PAD internal temp | Chip I/O | |
| SUPPASENSE | Input | I/O PAD Supply A | Chip I/O | |
| SUPPBSENSE | Input | I/O PAD Supply B | Chip I/O | |
| SHWIREI [6:0] | Input | I/O PAD for current sample | Chip I/O | |
| SHWIREV [6:0] | Input | I/O PAD for voltage sample | Chip I/O | |
| SMPA [6:0] | Input | Sample pulse for leading edge | DPC 1201 | |
| SMPB [6:0] | Input | Sample pulse for falling edge | DPC 1201 | |
| SHNREF [9:0] | Input | I/O PAD ground reference | Chip I/O | |
| SELA [12:0] | Input | Select leading edge (voltages) | REG 1204 | |
| SELB [6:0] | Input | Select falling edge (current) | REG 1204 | |
| DIV [2:0] | Input | Select divider value | REG 1204 | |
| SHM_CLK | Input | CLK for sampling | CLKGEN [#] | |
| MUXSEL [1:0] | Input | Analog Mux Select | REG 1204 | |
| DONE | Input | ADC conversion finished | ADC 1206 | |
| VSEL_SMPA [8:0] | Input | Selects leading edge swap | REG 1204 | |
| ISEL_SMPA [6:0] | Input | Selects falling edge swap | REG 1204 | |
| VDDIOA | Input | I/O Power for HV transistors | IVS 1209 | |
| VDDIOB | Input | I/O Power for HV transistors | IVS 1209 | |
| VSSIOA | Input | I/O Ground for HV transistors | IVS 1209 | |
| VSSIOB | Input | I/O Ground for HV transistors | IVS 1209 | |
| AVS | Input | Analog Ground | IVS 1209 | |
| AVD | Input | 3.3V Analog Power | IVS 1209 | |
| VINADC | Output | Data for the ADC | | ADC 1206 |
| VDD | Input | Global Digital 3.3V | | |
| VSS | Input | Global Ground 3.3V | | |
| VREF_HALF | Input | 1/2 VREF for the Multiplier | IVS 1209 | |

FIG. 40D is a functional block diagram 3788.4 of SHM 1207 in another implementation. FIG. 40D is similar to FIG. 40 and therefore a discussion regarding general operation will not be repeated. Block diagram 3788.4 of FIG. 40D includes an I/O circuit 3800.4, a multiplexer 3802.4, a divider 3804.4, a multiplexer 3806.4, an I/O circuit 3810.4, and multiplexers 3808.4, 3820.4, and 3822.4.

The general function of block diagram 3788.4 is to sample nine voltages, seven of them being the external output voltage supplies and two of them being the Supply A and the Supply B, and also to sample the voltage difference across a sense resistor (represented by a sense resistor 3814.4 in FIG. 40D) for measuring current in each of the seven "regulated" output voltage supplies. Additionally, there are a few signals that are sampled on an as needed basis, for example, the voltage entering switching power supply controller 1200 as a result of a temperature sensor system that is connected to the battery (i.e., the voltage of VOUT SIGNAL 3708.4), an internal voltage coming from Kelvin temperature sensor 2232.4 (FIG. 54) and the voltages of TEMPEXT signal 3706.4, AUX0 signal 3702.4 and AUX1 signal 3704.4.

In general, block diagram 3788.4 interfaces with DPC 1201, regulation control module (REG) 1204, and analog to digital converter 1206 and receives from external sources three analog inputs (via pads 3818.4, 3816.4, and 3812.4) that can be up to 15 V (e.g., for PDAs) or 16 V (e.g., for digital cameras). As shown in FIG. 40D, I/O circuits 3800.4 and 3810.4 are coupled together to sample both voltage and current at the same time, and convert these measurements at different times as needed. Multiplexer 3820.4 under control of ISEL_SMPA[6:0] signal 3742.4 selects a signal from SMPA[6:0] signal 3720.4 and SMPB[6:0] signal 3722.4 and generates an SMPI signal 3821.4 for I/O circuit 3810.4. Multiplexer 3822.4 under control of VSEL_SMPA[8:0] signal 3740.4 selects a signal from SMPA[6:0] signal 3720.4 and SMPB[6:0] signal 3722.4 and generates an SMPV signal 3823.4 for I/O circuit 3800.4.

Figure 40E:
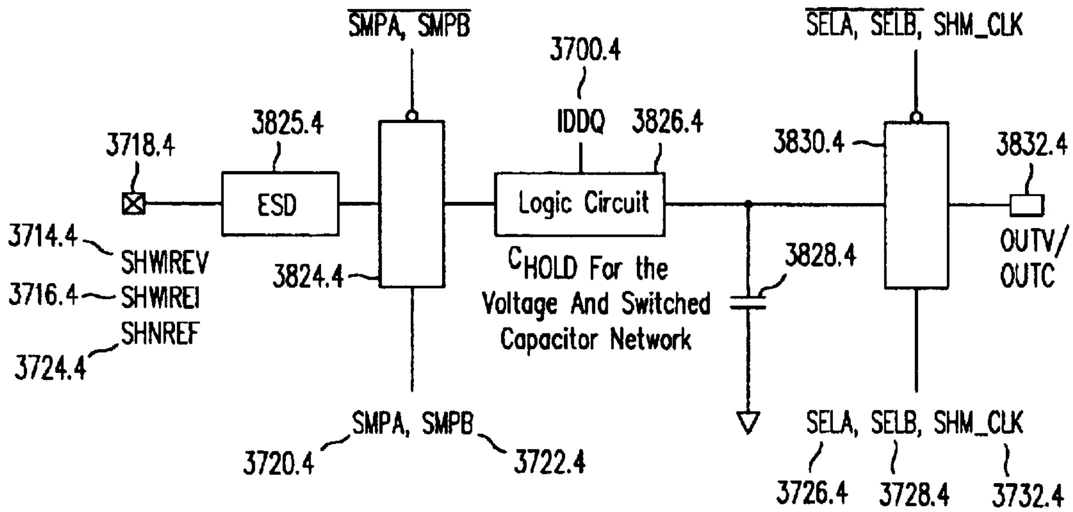
FIG. 40E is a functional schematic illustrating voltage and current sampling for another implementation.

FIG. 40E illustrates an exemplary block diagram for I/O circuits 3800.4 and 3810.4 in one implementation, which includes a number of transmission gates 3824.4 and 3830.4, ESD protection 3825.4.4, one or more capacitors 3828.4, along with a logic circuit 3826.4 having a test mechanism (via IDDQ signal 3700.4). FIG. 40E is similar to FIG. 40A and therefore the general operation will not be repeated.

As shown in FIG. 40E, SHWIREI signal 3716.4 represents a voltage signal to be measured across sense resistor 3814.4 (FIG. 40D). As an example for sampling a current, a switched capacitor network will be utilized for the multiplication to be done for each of the seven currents explicitly (discussed in further detail below). SHWIREV signal 3714.4 represents a voltage signal to be measured, and SHNREF signal 3724.4 represents a voltage signal for a ground reference. The Supply A and the Supply B, along with TEMPEXT signal 3706.4 and VOUT signal 3708.4, will be measured using a combination of SHWIREV signal 3714.4 and SHNREF signal 3724.4 to sample and measure the voltages.

Figure 40G:
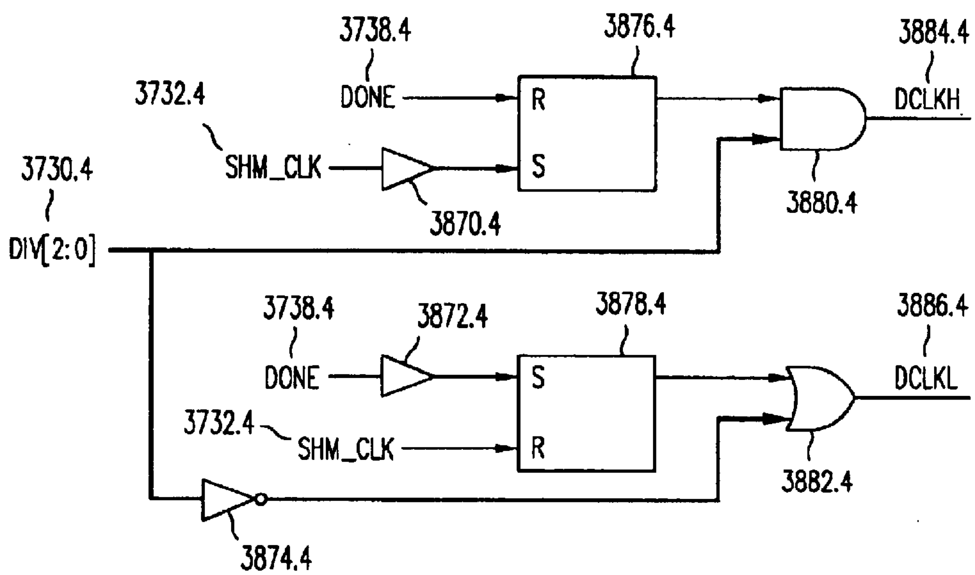
FIG. 40G is a clock generation circuit in accordance with another implementation.
Figure 40F:
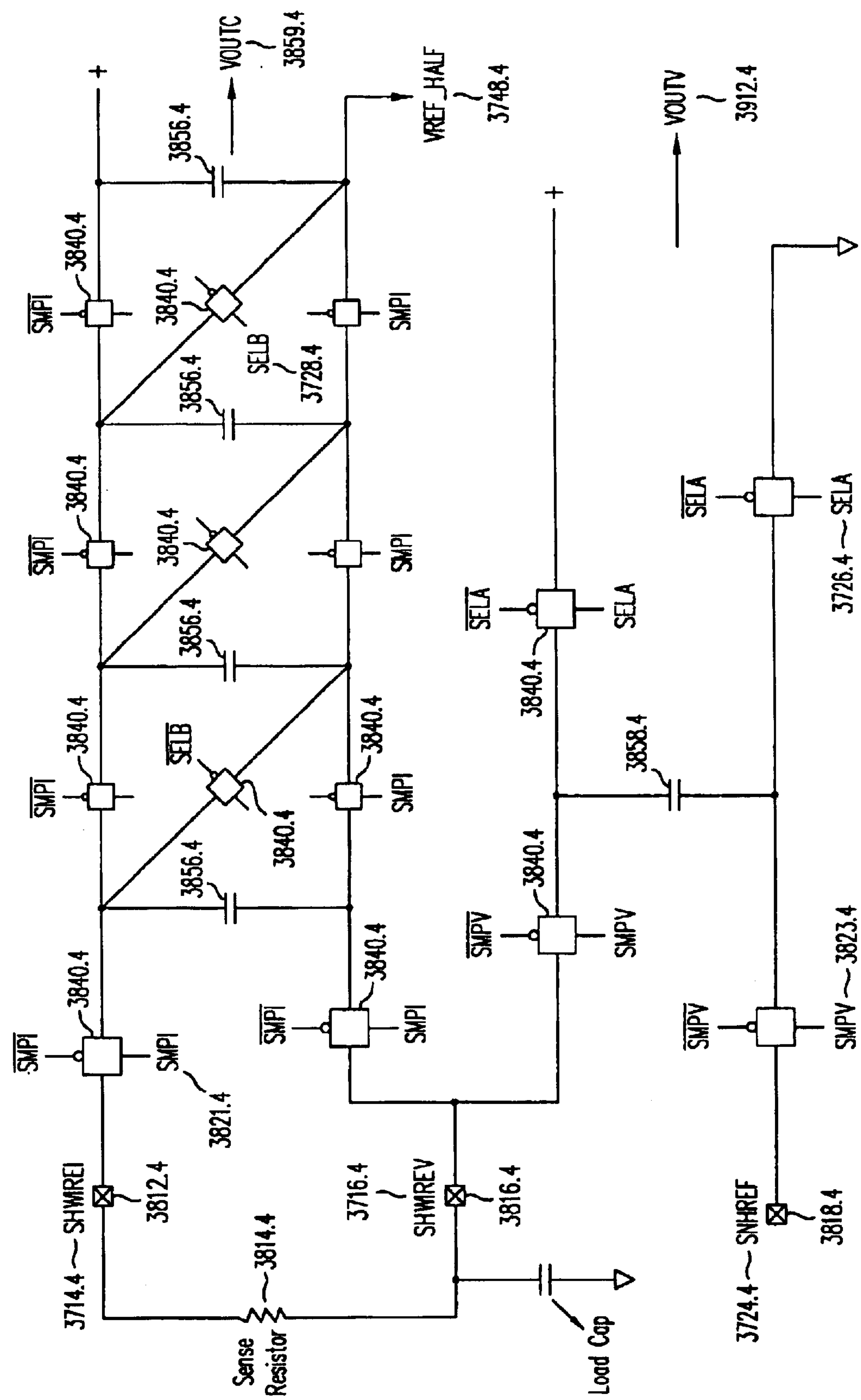
FIG. 40F is a circuit schematic illustrating voltage and current selection for another implementation.

FIG. 40F is an exemplary circuit schematic illustrating voltage and current selection for another implementation and may be viewed as an expanded view of a portion of FIG. 40E. In terms of general operation (in reference to FIG. 40D and 1.1.7*g*), the three basic analog input signals is as follows. When there is a sample pulse for SMPV signal 3823.4, a measured voltage between pads 3816.4 and 3818.4 is stored in a holding capacitor 3858.4 as the voltage measurement at the load.

When there is a sample pulse for SMPI signal 3821.4, a measured voltage between pads 3812.4 and 3816.4 is stored across capacitors 3856.4, arranged in a parallel fashion by appropriate switching of pass gates 3840.4, which represents the voltage measured across sense resistor 3814.4. Note that the voltage difference across sense resistor 3814.4 can be positive or negative depending on the external power supply topology.

When a SELA signal corresponding to SELA[12:0] signal 3726.4 is asserted, the voltage in holding capacitor 3858.4 gets transferred into voltage divider 3804.4 as a VOUTV signal 3912.4. When there is a SELB signal corresponding to SELB[6:0] signal 3728.4, capacitors 3856.4 are stacked serially, by appropriate switching of pass gates 3840.4, to perform voltage multiplication (e.g., multiplication of 4) and provide a VOUTC signal 3859.4. The reference for the voltage multiplication is done with respect to VREF_HALF signal 3748.4.

Divider 3804.4 divides the voltage down to a range of 0 to 3 V so that it is within desired limits and analog to digital converter 1206 can read the value. Divider circuitry for divider 3804.4 will be implemented, for example, using capacitor ratios with switches, two non-overlapping clocks, and control logic. The non-overlapping clocks discharge the capacitance of the divider network and prepare the divider network for the next voltage sample.

FIG. 40G is an exemplary clock generation circuit in accordance with another implementation. The two non-overlapping clocks, a DCLKH signal 3884.4 and a DCLKL signal 3886.4, will be implemented by employing two RS latches 3876.4 and 3878.4 and control logic, such as with an AND gate 3880.4 and an OR gate 3882.4. The clock generation circuit receives DONE signal 3738.4, SHM_CLK signal 3732.4, and DIV[2:0] signal 3730.4, as shown, to produce DCLKH signal 3884.4 and DCLKL signal 3886.4. Table 1.1.7b provides exemplary divide or scalar values for given input voltages to produce representative values from analog to digital converter 1206.

TABLE 1.1.7b

| Divide Values (Scaler integers) | Input Voltages (Voltage) | ADC Value |
|---|---|---|
| 1 | 0.498–2.502 | 166–834 |
| 2 | 2.508–5.502 | 418–917 |
| 4 | 5.508–11.508 | 459–959 |
| 6 | 8.520–17.91 | 640–995 |

As an example, the maximum input voltage stored in holding capacitor 3856.4 is 16 V. Depending upon the type of capacitor used (e.g., PiP capacitors can only withstand 13.5 V), two or more capacitors may be stacked in accordance with an implementation of divider 3804.4.

Figure 40H:
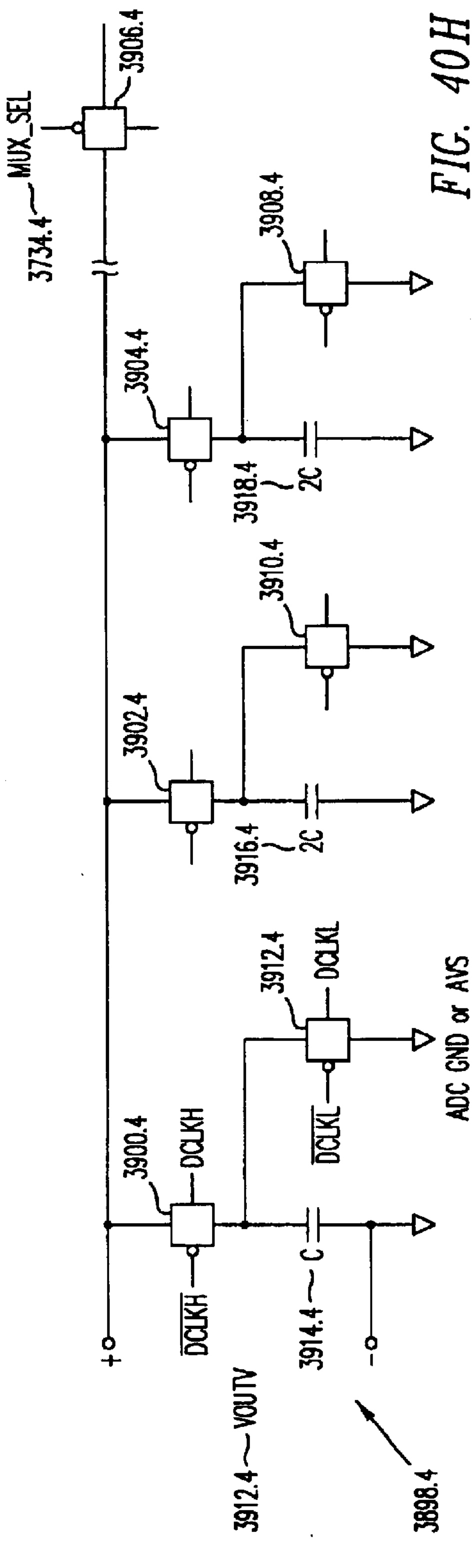
FIG. 40H is a voltage divider in accordance with another implementation.

FIG. 40H is an exemplary voltage divider 3898.4 in accordance with another implementation for voltage divider 3808.4. VOUTV signal 3912.4 is a selected channel voltage and switches 3900.4, 3902.4, 3904.4, 3908.4, 3910.4, and 3912.4 are controlled by the non-overlapping clocks (DCLKH signal 3884.4 and DCLKL signal 3886.4) as shown. For example, because there are four values for division (i.e., divide values in Table 1.1.7b), the default will be a divide by 1 which will allow VOUTV signal 3912.4 to pass through directly, with DIV[2:0] signal 3730.4 set to logic 0. Voltage division is accomplished by charge sharing across capacitors. Different effective capacitor values can be selected by transfer gates 3900.4,3902.4 and 3904.4 and their associated capacitors 3914.4,3916.4 and 3918.4. The DIV[2:0] determines which transfer gates are selected to achieve the divide ratios. Table 1.1.7c provides exemplary divide values based on DIV[2:0] signal 3730.4.

TABLE 1.1.7c

| DIV [2] | DIV [1] | DIV [0] | Divide Value |
|---|---|---|---|
| 0 | 0 | 0 | 1 |
| 0 | 0 | 1 | 2 |
| 0 | 1 | 0 | 3 |
| 0 | 1 | 1 | 4 |
| 1 | 0 | 0 | 3 |
| 1 | 0 | 1 | 4 |
| 1 | 1 | 0 | 5 |
| 1 | 1 | 1 | 6 (default) |

I/O circuit 3810.4 (FIG. 40D) includes a switched capacitor network to provide voltage multiplication for a measured voltage difference across sense resistor 3814.4 for a corresponding current measurement. For example, in a continuous mode of operation at 2A and using a 0.1 ohm resistor for sense resistor 3814.4, the voltage difference across sense resistor 3814.4 is 200 mV. Thus, voltage multiplication based on the desired voltage parameters is desirable. Furthermore, because the external battery may be charging itself from another power supply configuration, the current sense may be negative with respect to the ground of analog to digital converter 1206 and the multiplier circuit, illustrated below in reference to FIG. 40I, has the capability of reversing polarities to always present a positive voltage difference to the ADC.

Table 1.1.7d provides exemplary current measurements for a 2A power supply system with a 0.1 ohm resistance for sense resistor 3814.4 (where D.C.S. and C.S. stand for Deep Cycle Skipping and Cycle Skipping, respectively).

TABLE 1.1.7d

| Current | Mode | Method | Voltage | 4X |
|---|---|---|---|---|
| 300 uA | D.C.S. | Dv/Dt | 30uV | 120uV |
| 3 mA | C.S. | Dv/Dt | 300uV | 1.2mV |
| 30 mA | Discontinuous | Digital | 3mV | 12mV |
| 2 A | Continuous | Direct | 200mV | 800mV |

Figure 40I:
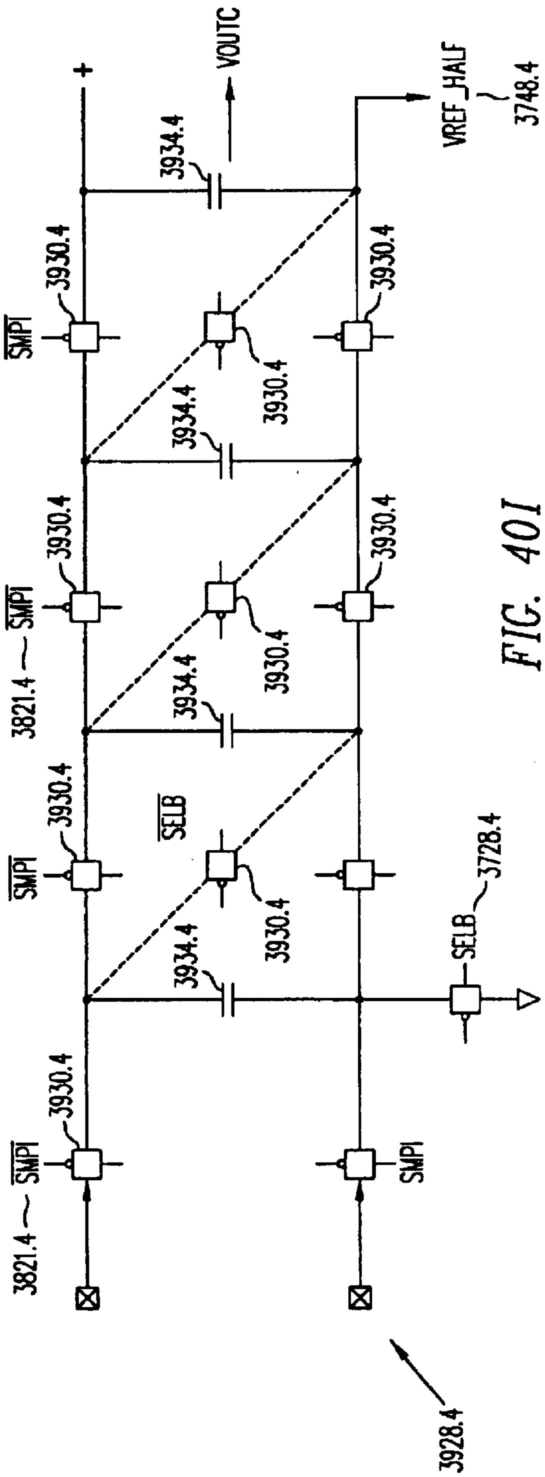
FIG. 40I is a voltage multiplier in accordance with another implementation.

FIG. 40I is an exemplary voltage multiplier 3928.4 in accordance with another implementation for I/O circuit 3810.4. Voltage multiplier 3928.4 includes pass gates 3930.4 and capacitors 3934.4. In terms of general operation, when a sampling pulse from SMPI signal 3821.4 is received, capacitors 3930.4 are arranged in parallel by pass gates 3930.4. When a SELB signal of SELB[6:0] signal 3728.4 is asserted, capacitors 3934.4 are stacked in series via pass gates 3930.4 and connected between either positive or negative with respect to VREF_HALF signal 3748.4. It should be noted that no matter what the polarity is for the voltage drop, it will not affect the measurements since the reference,is not ground but an offset voltage provided by VREF_HALF signal 3748.4.

Figure 40J:
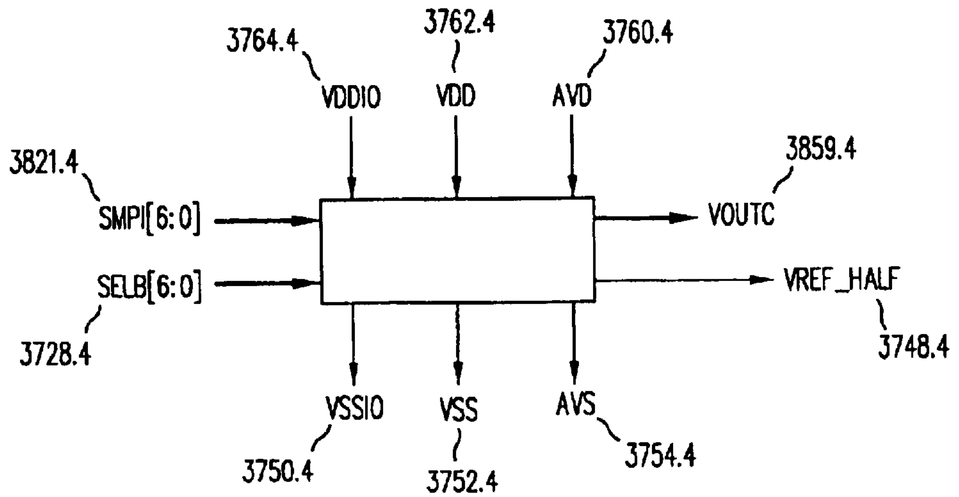
FIG. 40J is an exemplary interface signal block for an I/O circuit in accordance with another implementation.

Because there is a 4× multiplication done at once for each current measurement channel (i.e., for the different current measurements for each power supply), there will be 7 multipliers, with one for each external power supply. FIG. 40J illustrates an exemplary block diagram of I/O circuit 3810.4 with various interface signals shown.

Figure 40K:
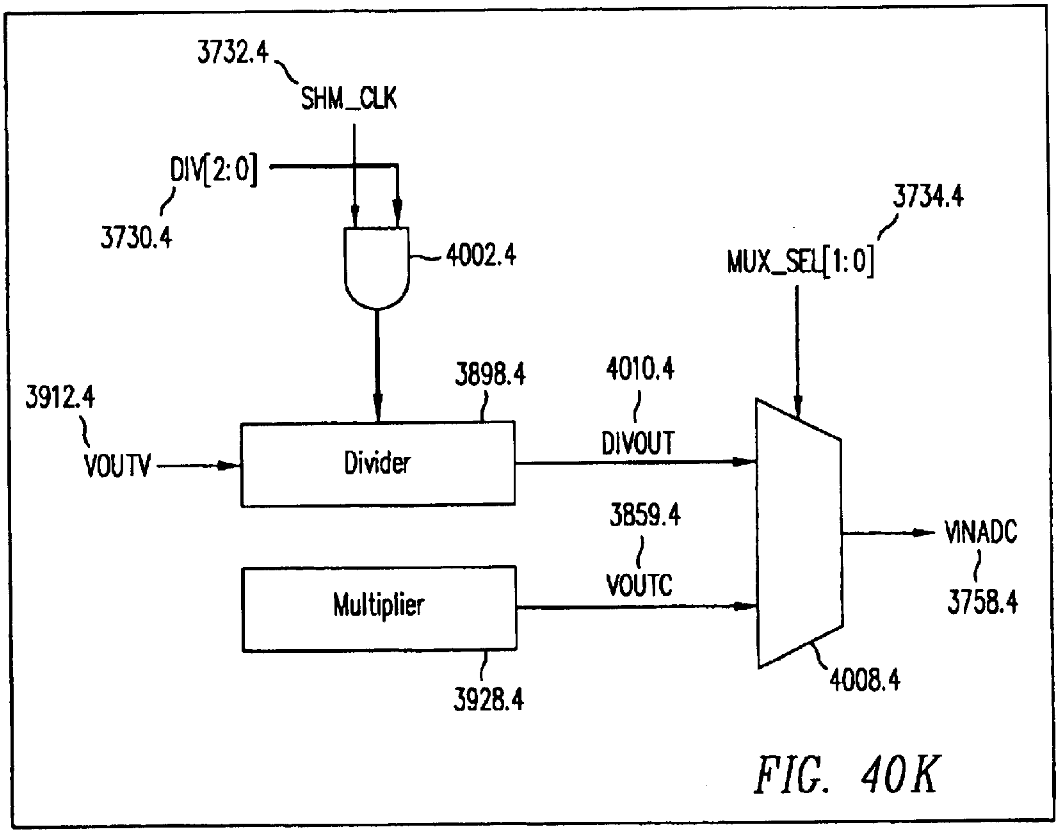
FIG. 40K is a multiplexer scheme in accordance with another implementation.

Multiplexer 3806.4 (FIG. 40D) employs high voltage switches and care needs to be taken so that divider 3804.4 does not present a high voltage via multiplexer 3806.4 to analog to digital converter 1206. FIG. 40K is a multiplexer scheme in accordance with another implementation that mitigates the threat of a high voltage being presented to analog to digital converter 1206. As shown, SHM_CLK signal 3732.4 is gated with DIV[2:0]signal 3730.4, by an AND gate 4002.4, to properly present a DIVOUT signal 4010.4 from divider 3898.4 or VOUTC signal 3859.4 to analog to digital converter 1206 (not shown) via a multiplexer 4008.4 and VINADC signal 3758.4.

Figure 10:
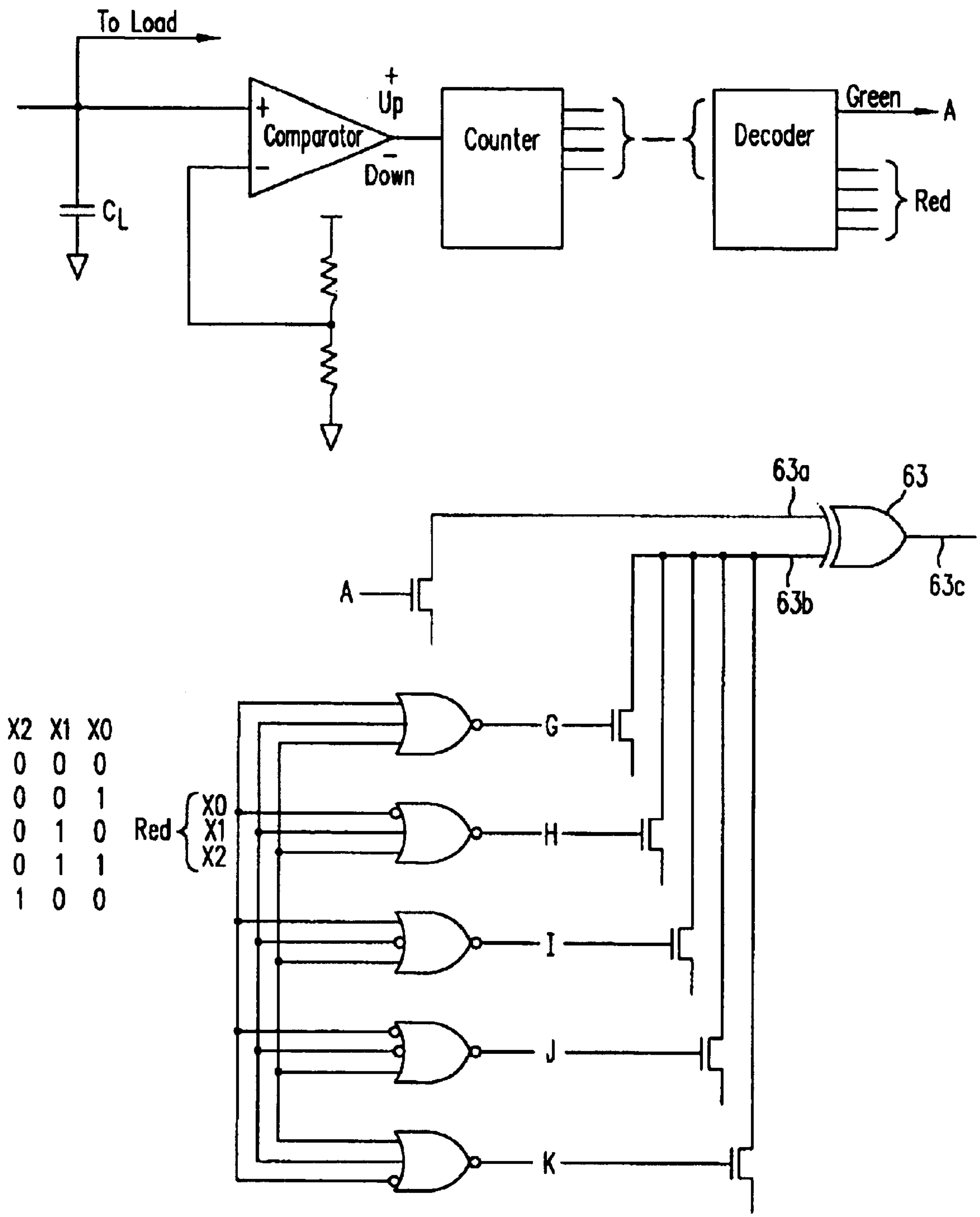
FIG. 10 shows one circuit for controlling the selection of the particular gates to transfer a selected pair of signals to the exclusive OR gate 63 in FIG. 6 to generate a pulse width modulated signal.
Figure 11:
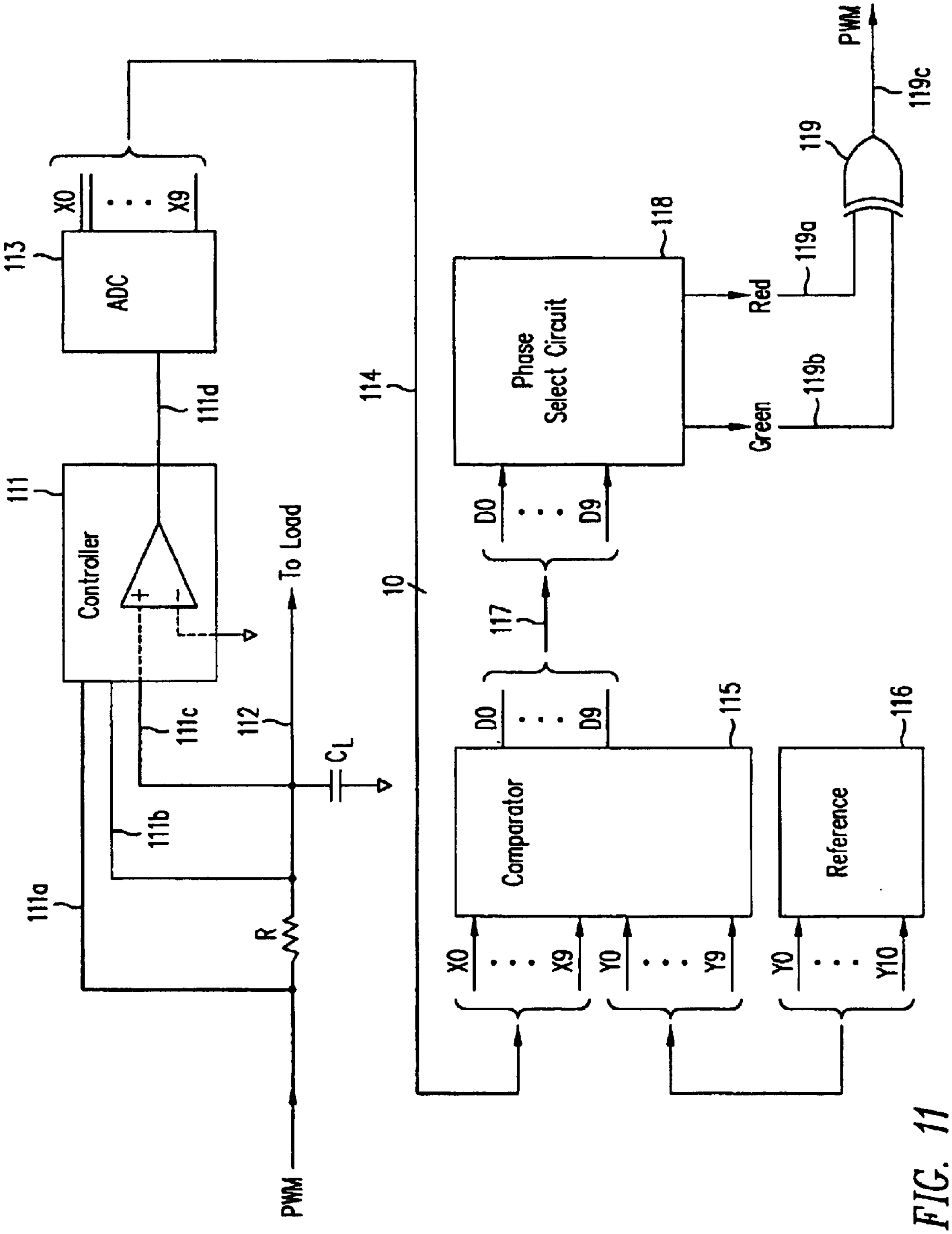
FIG. 11 shows another circuit used to generate the pulse width modulated signal from exclusive OR gate 63 in FIG. 6 in accordance with the principles of this invention.

Section 1.2 Discussion of the Voltage Regulator, Detailed Hardware, Operations and Optimizations FIG. 11 shows an alternative structure for implementing the principles of this invention. In FIG. 11, controller 111 detects the current through resistor R and the voltage across load capacitor CL. The charge on load capacitor CL is used to drive a load on lead 112. The controller 111 produces an error signal proportional to the voltage difference between the voltage across capacitor CL and a reference voltage, shown as system ground, but which could be any other desired reference voltage. The output signal from controller 111 is supplied to an A to D converter 113 having ten output bits. This allows 1,024 levels to be identified and quantized. The ten output bits from the A to D converter are sent on 10-bit bus 114 to comparator 115 where these bits are compared to a reference number driven from programmable reference 116. Reference 116 is programmed by the user to contain the desired reference voltage to be held by load capacitor CL. The output signal from comparator 115 is a binary difference signal DO through D9 which is transmitted on 10-bit bus 117 to phase select circuit 118. Phase select circuit 118 is of the type, for example, shown above in FIG. 6. The signals D0 through D9 from comparator 115 are decoded using a circuitry of a type shown, for example, in FIG. 10 and are used to generate a signal which controls a pass transistor which allows a selected output signal from an inverter in the ring oscillator to be applied to the red input lead 119*a* of exclusive OR gate 119. The green input lead 119*b*, as described above, will typically be the output signal pulled from the first inverter in the ring oscillator string. The result is a pulse width modulated output signal on lead 119*c* from exclusive OR gate 119, which is then used to charge capacitor CL through resistor R (FIG. 11). The current through resistor R is measured by a signal detected on leads 111*a* and 111*b* and used in controller 111 to provide a measure of the charge being provided to load capacitor CL.

Analog to digital converter 1206 (FIG. 12), which measures and digitizes the voltage of an analog signal to 10-bits of resolution, can be implemented by a combination of a custom low-power mixed-signal circuit (ADC) and a digital logic circuit for interfacing the ADC to external logic circuits. Inputs and output signals to analog to digital converter 1206 include both analog and digital signals. In one implementation, the analog to digital conversion can operate at 10 Msps (i.e., Mega-samples per second).

Figure 14:
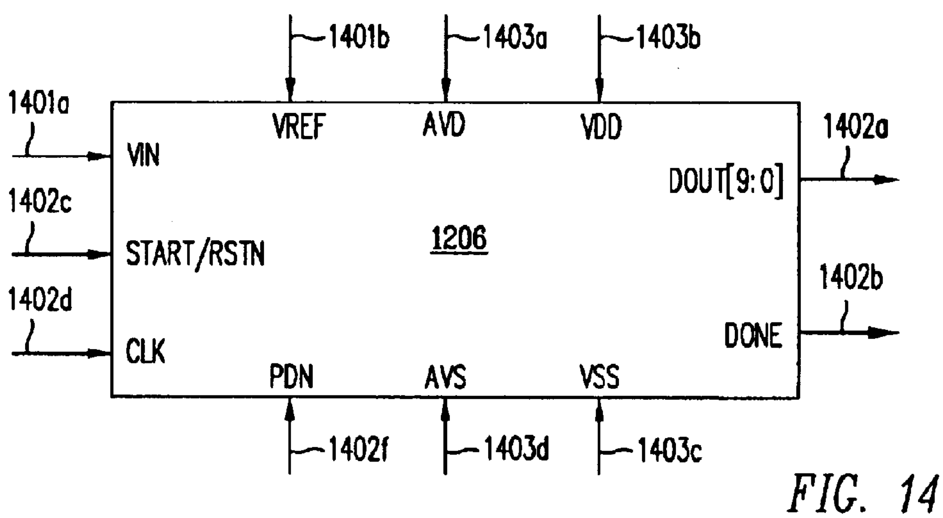
FIG. 14 is a block diagram showing interface signals of analog to digital converter 1206, according to one implementation.

FIG. 14 is a block diagram showing interface signals of analog to digital converter 1206, according to one implementation. As shown in FIG. 14, analog to digital converter 1206 includes: (a) analog measurement interface (AMI) 1401, digital interface (DI) 1402, and power supply interface 1403. Analog measurement interface 1401 includes analog input signal 1402*a* (VIN), which is sampled for analog to digital conversion, and an analog voltage reference input signal 1402*b* (VREF).

Digital interface 1402 comprises data output bus 1402*a* (DOUT[9:0] ), analog to digital conversion completion or "done" signal 1402*b* (DONE), analog to digital conversion initiation plus reset signal 1402*c* (START/RSTN), and clock signal 1402*d* (CLK). In this implementation, data output bus 1402*a* is a 10-bit bus which provides the result of the analog to digital conversion. In this implementation, clock signal 1402*d* has a frequency of about 128 MHz and a duty cycle of about 50%. When the asynchronous reset signal 1402*e* is held at a low logic value, circuits in analog to digital converter 1206 are held in a reset state. Similarly, when power down signal 1402*f* is held at a low logic value, the analog circuits in analog to digital converter 1206 are powered down, and the digital logic circuits are placed in a low-power state.

Power supply interface 1403 includes analog power and ground references 1403*a* and 1403*b* (AVD and AVS), and digital power and ground references 1403*c* and 1403*d* (VDD and VSS), respectively. In one implementation, both the analog and the digital power references (i.e., AVD and VDD) are provided at 3.3V±10%.

Figure 15:
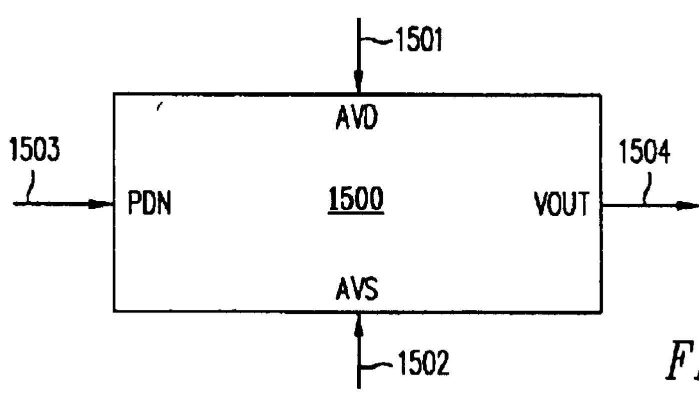
FIG. 15 is a block diagram showing the interface signals of Kelvin temperature sensor (KTS) 1500.

FIG. 15 is a block diagram showing the interface signals of kelvin temperature sensor (KTS) 1500, which is an absolute temperature sensor circuit that produces an output voltage linearly related to the CIRCUITS absolute temperature. As shown in FIG. 15, Kelvin temperature sensor 1500 receives analog power and ground reference voltages at terminals 1501 and 1502 and asynchronous power-down control signal (PDN) at terminal 1503, and provides output voltage VOUT at terminal 1504, which is linearly related to the temperature of the circuit between 0.0V and 3.0V.

Section 1.2.1 Hardware Description Regulation Control Module (REG) 1204

Figure 41:
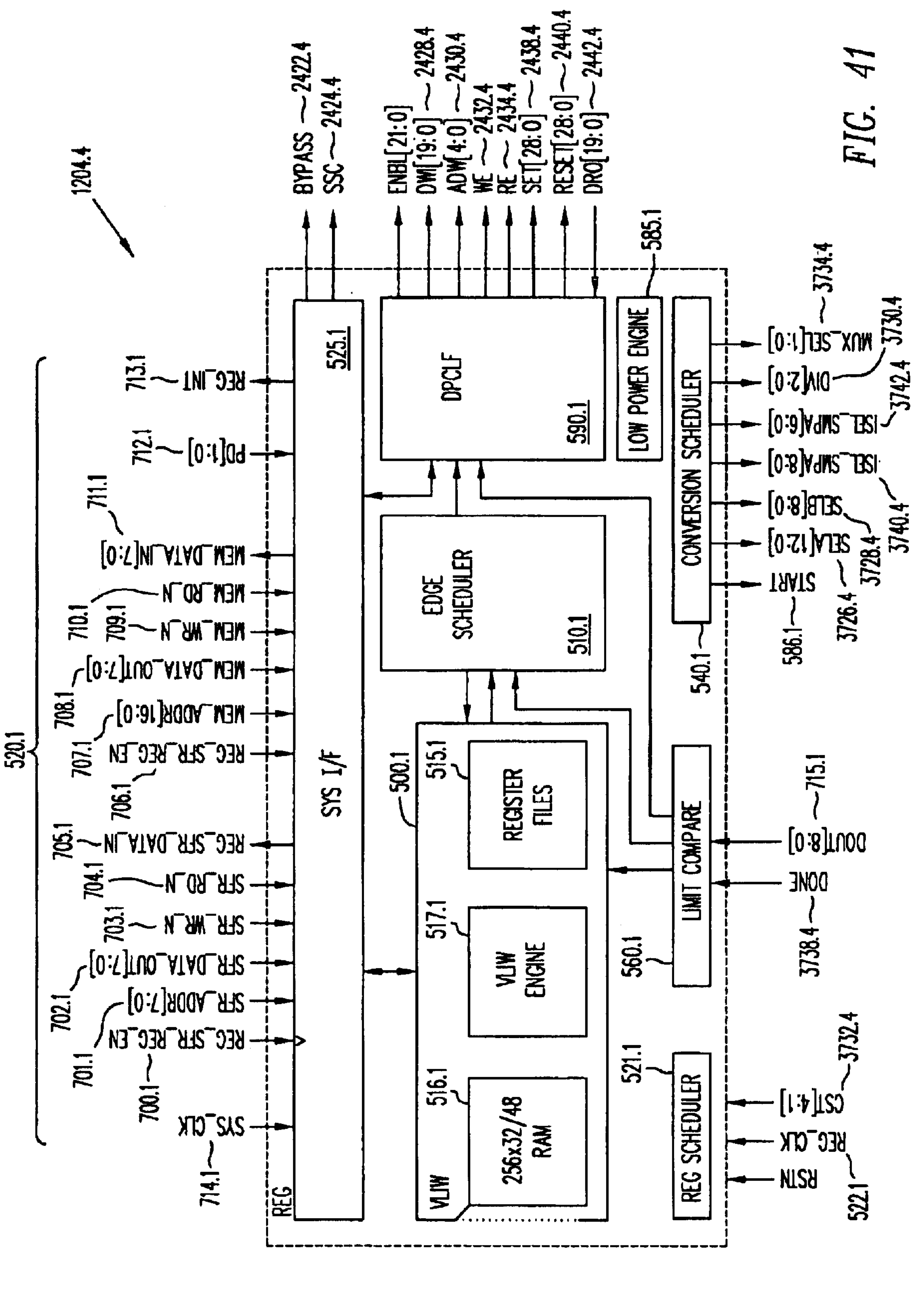
FIG. 41 is a block diagram of the regulation control module (REG) of FIG. 12 according to one embodiment of the invention.

Combined Section 1.2.1.1 Detailed Description of the REG Module and Section 1.2.1.2 Voltage/current Feedback SPS—Hardware Portion Referring now to FIG. 41 and FIG. 12, Regulation control module (REG) includes a microcontroller 500.1 configured to generate pulse width modulation (PWM) information for a plurality of switching power converters under the control of switching power supply controller 1200. This PWM information may include the switching times for power switches within the PWM switching power converters as well as voltage and current sampling times for each switching power converter. Regulation control module (REG) provides the PWM and sample information to Digital Signal to Pulse Converter (DPC) 1201, which in turn generates signals controlling pulse rising and falling edges to implement the PWM information, as well as generating the sample pulses for voltage and current sampling.

As described further herein, DPC 1201 may be implemented in a number of ways, e.g., it may be CAM-based, ring-oscillator-based, comparator-based, or RAM-based. The following description will assume that DPC 1201 is in the CAM-based embodiment. However, it will be appreciated that regulation control module (REG) 1204 would operate analogously should DPC 1201 have a non-CAM-based embodiment.

The frame rate implemented by DPC 1201 affects the required processing speed of microcontroller 500.1. A DPC frame is illustrated in FIG. 37. For example, if seven switching power supplies are being controlled by switching power supply controller 1200 and the DPC frame rate is 524 KHz, the PWM information for each switching power converter may be updated approximately every 2 microseconds, which is the corresponding DPC frame period. Accordingly, a regulation scheduler module 521.1 may divide each DPC frame period into calculation periods corresponding to the various switching power supplies being regulated so as to implement a pipelined timeslot-based approach to the calculations for the PWM updates and voltage and current feedback conversion scheduling for each switching power supply under control. In addition, another calculation period may be required for each DPC frame for related calculations with respect to "book-keeping" tasks, and the monitoring of the various power supplies for the switching power supplies being regulated. Thus, should there be seven switching power supplies under control at a DPC frame rate of 524 KHz, there would be eight 250 ns timeslots (7 power supplies+1slot for bookkeeping). Thus, the microcontroller 500.1 would have only 250 nanoseconds to calculate the PWM information (pulse width) for each of the seven switching power supplies. Regulation scheduler module 521.1 receives switching power supply controller 1200 clock signal 522.1 and CST signals 2458.4 and coordinates the timing of the various modules within regulation control module (REG) 1204 accordingly. If each calculation period may be completed in 32 arithmetic steps (corresponding to 32 cycles of internal clock 522.1), microcontroller 500.1 would require an instruction execution rate of 128 MHz. The arithmetic functions implemented in each instruction may include, for example, any of add, subtract, multiply, magnitude comparison, and absolute value. Microcontroller 500.1 may be implemented using any of a number of architectures to achieve the required operation speed, including a RISC-based or a VLIW-based architecture (i.e., "reduced instruction set computer"-based architecture or "very-long-instruction word"-based architecture). For example, in a VLIW-based embodiment, microcontroller 500.1 may include a VLIW computing engine 517.1 that interfaces with a decode ROM (i.e., read-only memory, not illustrated) for decoding the VLIW instructions. In addition, microcontroller 500.1 may include a RAM 516.1 for storing data and parameter values. Register files 518.1 store the regulation parameter values for the various switching power supplies under regulation and provides run-time register resources for calculations taking place in VLIW engine 517.1. In one embodiment, VLIW engine 517.1 includes a topology register which points to the beginning of a 32-instruction segment in memory (corresponding to the number of instructions that can be executed within a time slot). The topology register is so-named as the regulation algorithm for each topology (e.g., buck, boost, SEPIC) can be stored at different 32-instruction segments in memory. In addition, a 5-bit program counter can be provided for sequencing VLIW engine 517.1 through the 32-instruction segment in memory.

Referring again to FIG. 37, for a given switching power converter, regulation control module (REG) 1204 computes the timings for the rising and falling edges for a PFET pulse 2410.4 and an SFET pulse 2412.4. The rising edge and falling edge of PFET pulse 2410.4 control the on and off times, respectively, of a given switching power converter's primary FET switch as driven by NFET driver module 1202. Similarly, the rising edge and falling edge of SFET pulse 2412.4 control the on and off times, respectively, of the given switching power converter's secondary FET switch as driven by NFET driver module 1202. The rising edge and falling edge of SMPA pulse 2414.4 may control the voltage sampling period used by sample and hold module (SHM) 1207 to obtain voltage feedback information from the corresponding switching power converter. Similarly, the rising edge and falling edge of SMPB pulse 2416.4 may control the current sampling period used by SHM 1207 to obtain current feedback information from the corresponding switching power converter. However, either pulse SMPA 2414.4 or SMPB 2416.4 may be used for voltage or current feedback purposes.

The four pulses illustrated in FIG. 37 thus correspond to eight independent rising and falling edge times. For example, the falling edge of SMPA pulse 2414.4 may be programmed to coincide with the rising edge of PFET pulse 2410.4 (PFTS), because SMPA pulse 2414.4 can be required to be completed no less than 150 nano-seconds prior to the rising edge of PFET 2410.4. (This relationship allows sufficient time for microprocessor 500.1 to calculate the required duration of PFET pulse 2410.4 using the data sampled by SHM 1207 using SMPA pulse 2414.4 and converted by analog to digital converter 1206.) Similarly, the falling edge of SMPB pulse 2416.4 may be programmed to coincide with the falling edge of PFET pulse 2410.4 (PFTR), thereby allowing sampling of the peak current in external inductor that occurs immediately prior the falling edge of PFET pulse 2410.4. The widths of sampling pulses (i.e., SMPA pulse 2414.4 and 2416.4) can be programmed, for example, at 2 or 4 nanoseconds. Because at least 50 nanoseconds are to be provided between sampling a pulse and a transition in the PFET and SFET pulses, the effective duty cycle range computed by microprocessor 500.1 is 10% to 90%. Duty cycles of 0% or 100% can be achieved in the DPC by masking the edge transitions of the PFET or SFET pulses, as needed.

Regardless of the number of independent pulse edges regulation control module (REG) 1204 must control other objectives besides power regulation may affect the scheduling of the various pulse rising and falling edges for each controlled switching power converter within a DPC frame. For example, having two switching power supplies switch simultaneously may generate electromagnetic interference (EMI) or other undesirable effects. In addition, simultaneous switching output (SSO) requirements may limit the number of FETS that may be switched at any given time. Accordingly, regulation control module (REG) 1204 may schedule the various pulse rising and falling edges to satisfy such objectives using an edge scheduler 510.1. As described above, microcontroller 500.1 may implement a pipelined regulation approach such that each DPC frame is divided into calculation periods to calculate pulse width information 505.1 for each switching power supply controlled by switching power supply controller 1200. In a given DPC frame, the necessary calculations to update PWM and schedule the digitization of the related analog voltage and current feedback signals are performed with respect to the preceding DPC frame. If SHM clock signal 3732.4 has a frequency $1/16^{th}$ that of SPS clock 522.1, two feedback signal analog-to-digital conversions may be accomplished per calculation period. Thus, a given DPC frame may be divided as follows;

| Slot 0 | Slot 1 | Slot 2 | Slot 3 | Slot 4 | Slot 5 | Slot 6 | Slot 7 |
|---|---|---|---|---|---|---|---|
| IPC<br>CONV SUP0 | CALC SUP0<br>CONV SUP1 | CALC SUP1<br>CONV SUP2 | CALC SUP2<br>CONV SUP3 | CALC SUP3<br>CONV SUP4 | CALC SUP4<br>CONV SUP5 | CALC SUP5<br>CONV SUP6 | CALC SUP6<br>CONV SUPA<br>CONV SUPB |

Thus, during slot (or calculation period) 0, the conversions for the voltage and current feedback signals for the zeroth switching power supply occur. Then, VLIW engine 517.1 may perform the necessary PWM updates to a register file 518.1 using the converted feedback signals for the zeroth switching power supply during calculation period 1. Then, DPC I/F 590.1 may perform the necessary PWM update using the converted feedback signals from the zeroth slot of the previous DPC frame. In addition, the conversions for the first switching power supply feedback signals may occur in calculation period 1. Then, VLIW engine 517.1 may perform the necessary PWM updates to a register file 518.1 using the converted feedback signals in the second calculation period, the DPC I/F may perform the PWM updates using the converted feedback signals from the first time slot of the previous DPC frame, and so on for the remaining switching power supplies. Note that in calculation period 7, an analog-to-digital conversion is made for the voltages of powers supplies A and B. No corresponding calculation period need be scheduled (switching power supply controller 1200 does not regulate these supply voltages). Because these conversions occur in the seventh timeslot, the zeroth timeslot of the next DPC frame may be used by regulation scheduler 521.1 to schedule any required inter-process communication and bookkeeping. A separate state machine may be used to implement edge scheduler 510.1. Having received the pulse width information and sample commands from microcontroller 500.1, edge scheduler 510.1 may then schedule the various pulse rising and falling edges. For example, referring again to FIG. 37, each DPC frame may be divided into a plurality of counts, e.g., 1024 counts (from 0 to 1023). The time between these counts determines the maximum PWM resolution that may be implemented. The various pulse edges may be scheduled according to the counts a DPC frame is divided into. Thus, edge scheduling would comprise assigning each edge to a DPC frame count. A number of algorithms may be used to provide the appropriate edge scheduling. For example, should a pulse edge from two switching power converters be scheduled for the same count, edge scheduler 510.1 could delay one of the conflicting pulse edges by one or more counts. Sample pulses SPAS 2414.4 and SPBS 2416.4 may be scheduled to have a rising edge one or more counts before the rising edge and falling edges of PFET pulse 2410.4, respectively. A special cycle skipping mode is enabled by the edge scheduler through a programmable register. This provides the ability to skip the generation of a PFET pulse during a specified cycle. This is accomplished by writing the same value to DPC 1201 for rising and falling edges of PWM pulses thereby generating a 0% DC output for those pulses.

To minimize the need for edge scheduling, central processing module (SYS) 1205 initializes regulation control module (REG) 1204 with appropriate rising and falling edge schedules prior to normal operation. For example, central processing module (SYS) 1205 stores in memory the desired voltage levels provided by the various switching power converters, the expected power drawn by the loads, and the associated operating characteristics such as inductances and capacitances used in the switching power converters. From this information, central processing module (SYS) 1205 may calculate an expected pulse width for each switching power converter. In turn, central processing module (SYS) 1205 may then assign pulse edges corresponding to these pulse widths distributed across a DPC frame to help reduce the need for edge scheduling. For example, assuming a pipelined approach has been implemented, the rising edge of PFET pulse 2410.4 for each switching power supply has been calculated by central processing module (SYS) 1205. Central processing module (SYS) 1205 then provides these initial edge schedules and other information to regulation control module (REG) 1204 through an internal bus 520.1, which in turn may comprise buses for SFR-mapped data as well as buses for memory-mapped data. A bus interface 525.1 may be used to coordinate the flow of data between regulation control module (REG) 1204 and central processing module (SYS) 1205 on internal bus 520.1 and provide the coordinated data to microcontroller 500.1. For example, internal bus 520.1 may comprise an SFR enable signal REG_SFR_EN 700.1 to indicate an SFR transaction is set to occur; an SFR address signal SFR_ADDR[7:0] 701.1; an SFR data out signal SFR_DATA_OUT[7:0] 702.1 from central processing module (SYS) 1205; an SFR write enable SFR_WR 703.1; an SFR read enable SFR_RD 704.1; an SFR data out signal SFR_DATA_IN[7:0] 705.1 from central processing module (SYS) 1205; a memory-mapped enable signal REG_MEM_EN 706.1 to indicate a memory-mapped transaction is set to occur; a memory-mapped address signal MEM_ADDR[15:0] 707.1; a memory-mapped data out signal MEM_DATA_OUT[7:0] 708.1 from central processing module (SYS) 1205; a memory-mapped data write enable signal MEM_WR_N 709.1; a memory-mapped data read enable signal MEM_RD_N 710.1; a memory-mapped data out signal MEM_DATA_IN[7:0] 711.1 from regulation control module (REG) 1204; a mode signal PD[1:0 712.1, a REG-generated interrupt signal REG_INT 713.1; and the central processing module clock signal SYS_CLK 714.1. By coordinating the flow of these signals on internal bus 520.1, interface module 525.1 allows central processing module (SYS) 1205 to configure regulation control module (REG) 1204 and monitor its operation.

Referring again to FIG. 12, regulation control module (REG) 1204 receives digitized feedback information (representing voltage and current samples) from each switching power converter from analog to digital converter 1206 as signal DOUT[9:0]715. The analog voltage and current samples digitized by analog to digital converter 1206 are provided by SHM module 1207 based upon the rising and falling edge times corresponding to pulses SPAS 2414.4 and SPBS 2416.4. Referring now to FIG. 40D, a multiplexer 3806.4 within SHM 1207 may select between the sampled-and-held voltages and provide the selected voltage to analog to digital converter 120:6. To keep analog to digital converter 1206 operating efficiently, a conversion scheduler 540.1 receives the timing information from signals SMPA 2406.4 and SMPB 2408.4 and commands multiplexer 3806.4 accordingly using MUX_SEL[1:0] signal 3734.4. As discussed above, if a pipelined approach is implemented, two conversions may be accomplished for each calculation period in a DPC frame. Conversion scheduler 540.1 drives SHM module 1207 to perform the required scaling of the analog feedback signals and properly schedule the digitization of the converted values in analog to digital converter 1206.

Analog to digital converter 1206 may respond to a TART/RSTN signal 586.1 from conversion scheduler 540.1 toggling LOW to HIGH to begin the analog-to-digital conversion process for a given analog feedback signal. During times of no active ADC activity, REG may pull START/RSTN signal 586.1 LOW to put analog to digital converter 1206 into a low power mode. To keep the sampled voltages within the dynamic range of analog to digital converter 1206, conversion scheduler 540.1 provides a scalar variable, DIV[1:0] 3730.4, to SHM 1207 to provide the appropriate scaling. Conversion schedule 540.1 may drive SHM 1207 to select the appropriate voltage feedback signal for conversion through selection signal SELA[12:0] 3726.4. Similarly, selection signal SELB[8:0] 3728.4 drives the appropriate selection of current feedback signals. Because each pulse SMPA 2406.4 or SMPB 2408.4 may be used for either voltage or current feedback, conversion scheduler 540.1 indicates which pulse has been used for voltage: or current feedback by signals VSEL_SMPA[8:0] 3728.4 and ISEL_SMPA[6:0] 3742.2, respectively.

During a given DPC frame, multiplexer 3806.4 will begin to receive the various sampled-and-held voltage and current feedback signals. Conversion scheduler 540.1 may simply cause multiplexer 3806.4 to select the sampled-and-held feedback voltages as received in real time. Alternatively, conversion scheduler 540.1 may delay the scheduling according to whether or not all the feedback information has been received from a given switching power converter. For example, suppose the voltage feedback from a given switching power converter has been sampled-and-held and received by multiplexer 3734.4. Conversion scheduler 540.1 would not cause multiplexer 3734.4 to select this voltage feedback signal, however, until the corresponding current feedback signal has also been received at multiplexer 3734.4.

To allow sufficient setup time for SHM 1207 to properly latch data, conversion scheduler 540.1 may switch the various SHM 1207 control signals described above one SPS clock cycle 522.1 before calculation period boundaries within a given DPC frame. In addition, conversion scheduler 540.1 may switch MUX_SEL[1:0] signal 3734.4 one-half SPS clock cycle 522.1 after values for SHM 1207 control signals SELA[12:0]3726.4, SELB[6:0] 3728.4, and DIV [1:0] 3730.4 have been switched to protect analog to digital converter 1206 from receiving any dangerous voltage fluctuations. In response to START signal 586.1, SHM module 1207 will generate the actual START pulse 376B.4, as shown in FIG. 40C, to analog to digital converter 1206 to begin-the-conversion. Analog to digital converter 1206 signals the completion of the conversion to regulation control module (REG) 1204 using signal DONE 3738.4.

Figure 1:
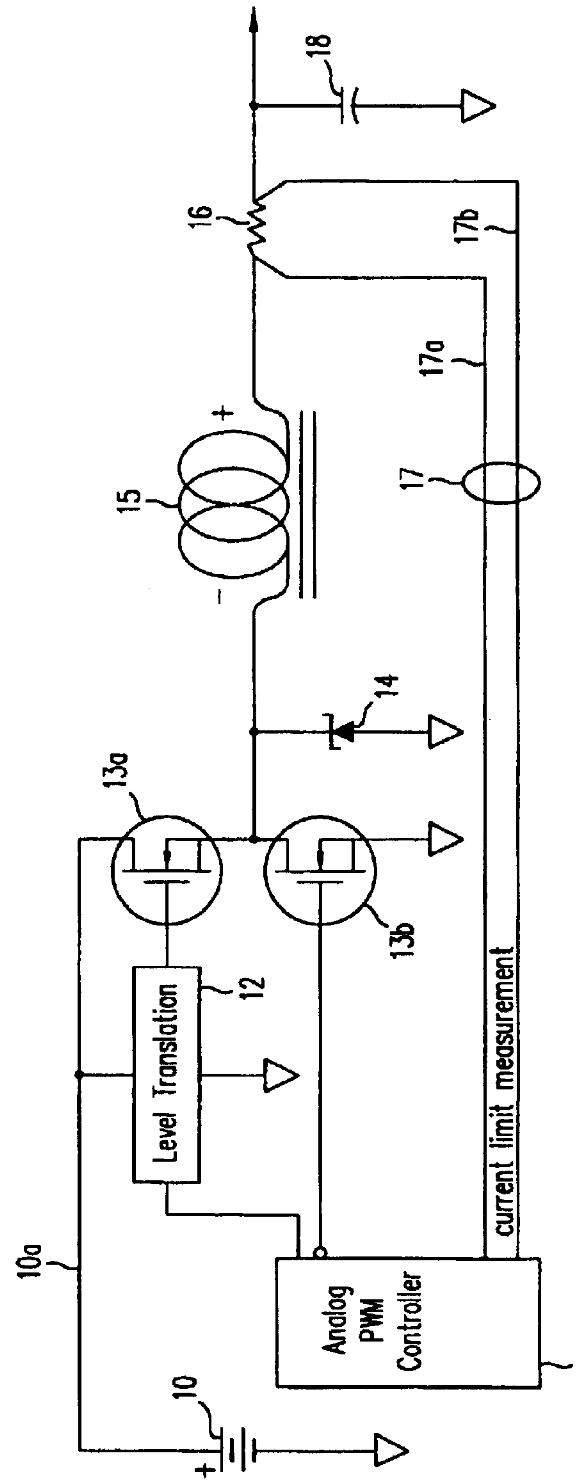
FIG. 1 shows the basic construction of a prior art analog buck converter.
Figure 2:
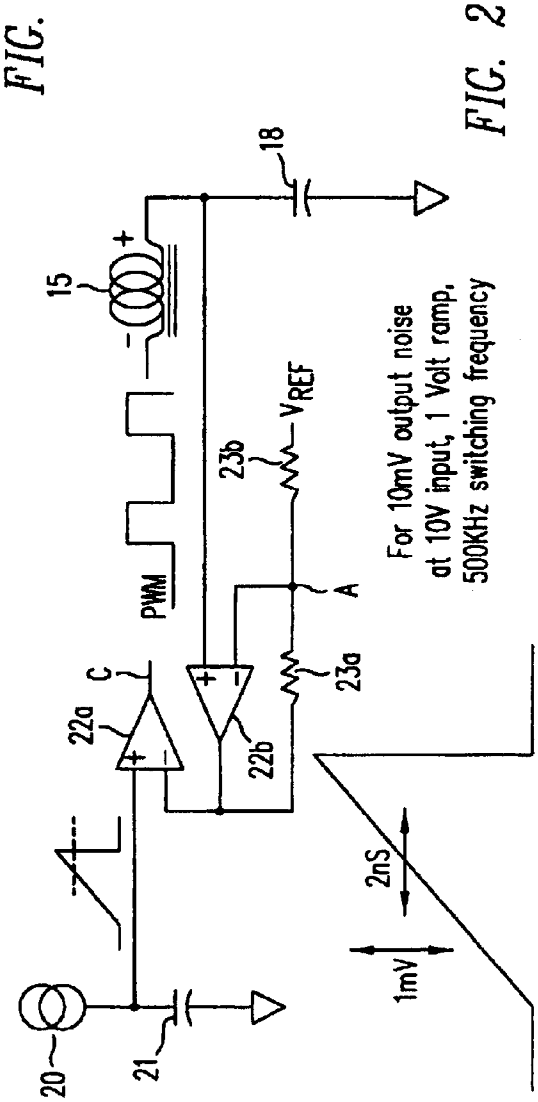
FIG. 2 shows the details of the analog PWM controller 11 in FIG. 1.

In addition to managing the scheduling of the feedback signals from the switching power supplies, conversion scheduler 540.1 may also manage the sampling and conversion of the external supply A and B voltages, and the voltages representing external and internal temperatures. Upon request from central processing module (SYS) 1205, regulation control module (REG) 1204: schedules a conversion of the external and internal temperature voltages (TEMPEXT signal 3706.4 and VOUT signal 3708.4, respectively, as illustrated in FIG. 1.1.7*d*). When the conversion is complete regulation control module (REG) 1204 writes the data to a status register which is read by central processing module (SYS) 1205 so that the converted temperature values may be used in couloumbmetric measurements.

Conversion scheduler 540.1 controls the conversion of feedback samples as well as source identification of the ADC data—i.e, whether or not it is a voltage or current sample and to which switching power supply it corresponds as sample data DOUT[9:0] 715.1. However, in one embodiment, pulse widths are not adjusted if the voltage and current samples for a given switching power supply are within a desired operating range. This condition does not require VLIW engine 517.1 to do computations, thus saving power. Thus, regulation control module (REG) 1204 may include limit comparison module 560.1 to test whether or not a given feedback signal is within the desired operating range (which may be denoted as the deadband limits). If DOUT[9:0] 715.1 is within limits, conversion scheduler 540.1 may indicate this condition to microcontroller 500.1 so that no PWM adjustment calculations need be performed for the associated switching power converter, and no DPC 1201 writes are required. In addition, limit comparison module 560.1 may also test whether DOUT[9:0] 715.1 is within acceptable high and low regulation limits. If DOUT [9:0] 715.1 is within these limits, limit comparison module 560.1 directs VLIW engine 517.1 to calculate new PWM values as described above, and values calculated for DOUT [9:0] 715.1 being within limits, are written to DPC 1201. If DOUT[9:0] 715.1 is outside these limits, limit comparison module 560.1 directs VLIW engine 517.1 to calculate new PWM values as described above, and values calculated for DOUT[9:0]715.1 being outside limits, are written to DPC 1201.

In response to assertion of DONE signal 3738.4, limit comparison module latches in DOUT[9:0] 715.1. Although conversion scheduler 540.1 and limit comparison module 560.1 are illustrated as functionally separate from microcontroller 500.1, these functions may be performed by microcontroller 500.1 or by separate state machines.

Having received sample data DOUT[9:0] 715.1 from limit conversion module 560.1, microcontroller 500.1 performs the pulse width calculations as described above. As explained in greater detail with respect to DPC 1201, sample scheduler 510.1 schedules the corresponding pulse edges through data words DWI[19:0] 2428.4, their addresses ADW[4:0] 2430.4, and control signal WE 2432.4 that will be written into memory in DPC 1201 through a DPC interface 590.1. DPC 1201 stored data may be read by regulation control module (REG) 1204 for testing or other purposes via DR0[19:0] 2442.4, address ADW[4:0] 2430.4, and control signal RE 2434.4 through DPC interface 590.1 As controlled by mode signal PD(1:0] 712.1 from central processing module (SYS) 1205, regulation control module (REG) 1204 may be configured to implement a low-power mode as well as the normal operation described herein. In this low-power mode, microcontroller 500.1 and edge scheduler 510.1 are powered down by, e.g., gating off the relevant clock signals such that regulation control module (REG) 1204 controls only a subset of the possible switching power converters. Regulation control module (REG) 1204 subsequently passes on the PD signal to DPC 1201 and CLKGEN 1223 as signal PD_OUT[9:0], which may be delayed from the time of receipt of PD[9:0] from central processing module (SYS) 1205 via bus 520.1. A low power engine 585.1 performs the necessary pulse width and sampling calculations. For example, low power engine 585.1 may issue a conversion request to conversion scheduler 540.1 to receive feedback data (voltage and/or current) for a given switching power converter. To calculate the required pulse widths based upon the received feedback information, low power engine 585.1 may perform a limit comparison as discussed with respect to limit comparison module 560.1. If the sample is within a desired operating range, low power engine 585.1 may skip a number of DPC frames, e.g., four frames before again sampling feedback from the particular switching power converter. If the sample is outside the desired operating range, sleep engine will command DPC 1201 to change the SFET 2404.4 and PFET 2402.4 pulse edges accordingly. To save power, the change may be based upon predetermined values stored in registers (not illustrated) associated with sleep engine 540.1 such that the implemented PWM adjustment algorithm is a table look-up function.

In this low-power mode, CAM function in DPC 1201 is also disabled as described further herein with respect to DPC 1201 operation. Thus, low power engine 585.1 directly causes the desired pulse edge times through SET[28:0]and RESET[28:0] signals 2438.4 and 2440.4. Low power engine 585.1 may be implemented through a configured state machine or other suitable means.

x.2 LED Controller

Figure 52:
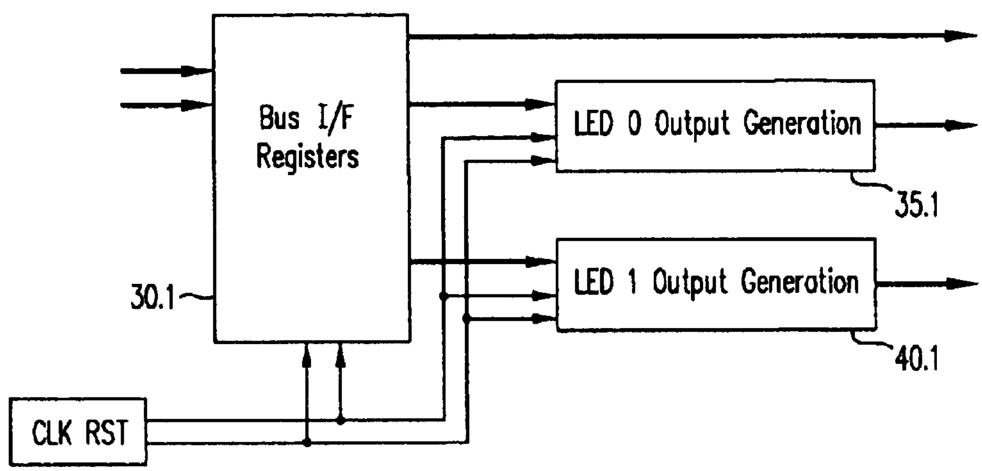
FIG. 52 illustrates a block diagram of LED control block 1214.

Because switching power supply controller 1200 may be used in LED-containing devices such as PDAs, it may include LED control block, contained in central processing module (SYS) 1205 as shown in FIG. 12. FIG. 52 is a block diagram of LED control block 1214.

An interface module 30.1 receives LED control commands from central processing module (SYS) 1205 (FIG. 12). In turn, interface module 30.1 controls one or more LEDs using, e.g., first LED driver module 35.1 and a second LED driver module 40.1. Each driver module 35.1 and 40.1 provides a PWM-modulated drive signal to its external LED (not illustrated).

The PWM modulation in each driver module 35.1 and 40.1 is under the control of values written into registers within interface module 30.1. The greater the pulse width specified in each PWM period, the greater the amount of brightness shown by the corresponding LED. In addition, other registers within interface module 30.1 may control LED blinking, or ramp modes wherein a selected driver module gradually changes its PWM so that its corresponding LED gradually changes from one brightness level to another.

X.4 Internal Power Supply Structure (GM)

Internal voltage supply (IVS) 1209 (FIG. 12) provides the operating voltages and power for internal operations in switching power supply controller 1200. IVS 1209 receives and provides various interface signals, including a reset (RSTn) signal, a power on reset (POR) signal, a clock output (CLK_OUT) signal, a clock input (CLK_IN) signal, a supply A signal, a supply B signal, a battery 0 (batt0) signal, a battery 1 (batt1) signal, and various supply or reference voltages (i.e., AVD, AVS, VDD, VSS, VDDIO[A,B], and VSSIO[A,B]).

The reset signal and the power on reset signal are received from reset module 1215 to reinitialize or reset operations of IVS 1209, in accordance with one embodiment, or the power on reset signal may be provided by IVS 1209 to other circuits within switching power supply controller 1200, in accordance with another embodiment. The clock input signal is received from external circuitry and a clock output signal is provided to external circuitry to synchronize and enable various clocking operations.

The supply signals (supplyA and supplyB) and the battery signals (batt0 and batt1) are various external power supplies that may be received by IVS 1209. These external power supply sources, such as the exemplary ones listed below in Table x.4a, are coupled to switching power supply controller 1200 (and consequently to IVS 1209) and are used to power up and generate internal voltages (e.g., 3.3 V) and are used as power supplies for various circuitry, such as the core logic and to supply or drive external power NFETs (e.g., with up to 15 V).

TABLE x.4a

Exemplary External Power Supplies

| EXTERNAL POWER SUPPLY | MIN V | MAX V |
|---|---|---|
| Battery 0 or 1 | | |
| 2 Cell NiMH | 1.8 | 3.8 |
| 4 Cell NiMH | 3.6 | 7.6 |
| Lion - 1 Cell | 2.7 | 4.2 |
| Lion - 2 Cell | 5.4 | 8.4 |
| Supply A or B | | |
| Car Adapter | 9.6 | 14.4 plus spikes |
| Wall Adapter | 4.5 | 15 |

IVS 1209 also includes a Kelvin temperature sensor (discussed below in reference to FIG. 54) to monitor the temperature of switching power supply controller 1200 or external ICs. IVS 1209 also provides a voltage reference (VREF) that is used for various circuits, such as analog to digital converter 1206, and may also generate a power on reset signal for distribution within switching power supply controller 1200, as explained in further detail below.

Figure 54:
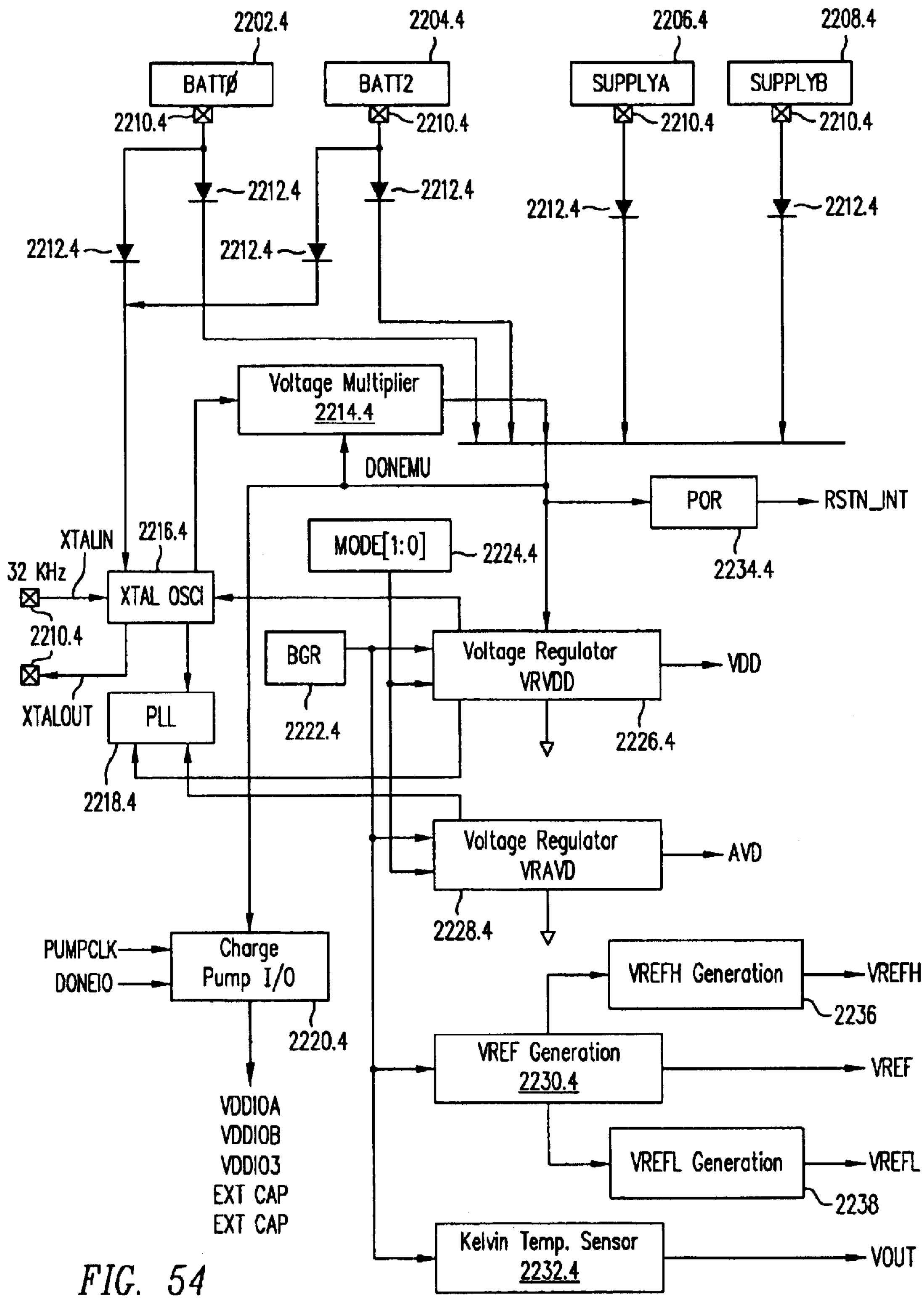
FIG. 54 is an exemplary functional diagram of Internal Voltage Supply (IVS) 1209 in accordance with one implementation.

FIG. 54 is an exemplary functional diagram of IVS 1209 in accordance with one implementation. FIG. 54 shows the four external power supplies 2202.4 through 2208.4 (i.e., BATT0, BATT1, SUPPLYA, and SUPPLYB, respectively) that are received via pads 2210.4 (with diodes 2212.4 serving as protection devices, such as to guard against a reverse polarity condition). The BATT0, BATT1, SUPPLYA, and SUPPLYB labels represent external battery source 0, external battery source 1, external car adapter or wall adapter source A, and external car adapter or wall adapter source B, respectively.

IVS 1209 determines which of power supplies 2202.4 through 2208.4 to use, if more than one is available, to generate the core voltage and the I/O voltages for switching power supply controller 1200. For example, there may be two core voltages required (e.g., digital 3.3 V and analog 3.3 V).

Switching power supply controller 1200 in accordance with one implementation has three modes of operation: 1) shut-down mode, 2) low-power mode, and 3) standard mode. In the shut-down mode, nothing on switching power supply controller 1200 is powered on except what monitors the external sources of energy (e.g., power supplies 2202.4 through 2208.4) and no current is flowing except leakage current in switching power supply controller 1200.

In the low-power mode, internal and I/O voltages are maintained, DPCw 1201 and two external loads (i.e., regulated power supplies) are operating, and switching power supply controller 1200 is performing cycle skipping (discussed further herein). The amount of current required is generally less than in the standard mode. The low-power mode is the default mode of operation once switching power supply controller 1200 is powered-up from any other mode or when neither the clocks nor the registers are running or set. In the standard mode, all of switching power supply controller 1200 is operating and all of the external loads (e.g., seven) are being supplied with regulated power. IVS 1209 receive commands from central processing module (SYS) 1205 which will command IVS 1209 to the appropriate mode.

As illustrated in FIG. 54, if power is being supplied by power supply 2202.4 or 2204.4, then this external voltage is routed to and supplies power to a crystal oscillator 2216.4, which generates a clock for a voltage multiplier 2214.4 (e.g., either a doubler or a tripler). Crystal oscillator 2216.4 has two pins, for input signals (XTALIN) and output signals (XTALOUT), via pads 2210.4.

An output of voltage multiplier 2214.4, which may be implemented using well known circuitry, is used as an input voltage for voltage regulators 2226.4, 2228.4, and 2230.4, which supply voltages VDD, AVD, and VREF which can be of conventional circuitry. Additionally, voltage VREFH and VREFL are generated by circuits 2236 and 2238, respectively, and provided to touch screen interface 1211. As will be appreciated from the figures, to simplify the illustration, line have not been included to show each connection. Instead, triangles are utilized within each block indicating the signal and the direction of travel of the signal. The supply voltage VDD provides an output digital core voltage (e.g., 3.3 V) and is treated as global within switching power supply controller 1200. The supply voltage AVD provides an output analog core voltage (e.g., 3.3 V) and is utilized by analog blocks that require a quieter power supply voltage than the supply voltage VDD. The supply voltage VREF shown on IVS 1209 and analog to digital converter 1206 in FIG. 12 also provides an output reference voltage for analog to digital converter 1206. Additionally, the supply voltages VDDIOA and VDDIOB are external I/O power (A and B) used by internal NFET I/O buffers to drive the external power NFET. An external capacitor (labeled generically as EXT CAP) will be generally connected to each of the corresponding bond pads (not shown). The supply voltage VDDIO3 is an external I/O power supply (e.g., of 3.3 V) required for the general purpose I/O digital pads.

Once the supply voltages VDD and AVD are generated, a phase locked loop (PLL) 2218.4 operates and the supply voltages VDD and AVD are distributed. A DONEMU signal is used to cause voltage multiplier 2214.4 to cease its operations. A MODE[1:0] block 2224.4 informs voltage regulators 2226.4 and 2228.4 of the proper mode of operation and is required for setting the appropriate current.

The input voltage to voltage regulators 2226.4 and 2228.4 is also provided to power on reset (POR) block 2234.4, for resetting or releasing switching power supply controller 1200 via a RSTN INT signal, and also to a charge pump block 2220.4 which may be implemented by any well known charge pump circuit. Charge pump block 2220.4 stores the amount of charge (e.g., in external capacitors) required for an instantaneous current needed to drive the external power NFET for setting one or two regulated power supplies. A PUMPCLK signal and a DONEIO signal are control signals that cause charge pump block 2220.4 when to start and when to stop operations, respectively.

If power is being received from power supply 2206.4 or 2208.4, crystal oscillator 2216.4 and voltage multiplier 2214.4 are bypassed and the supply voltage is routed directly to voltage regulators 2226.4 through 2230.4.

A band gap reference (BGR) block 2222.4 provides reference signals to voltage regulators 2226.4 through 2230.4 and to a Kelvin temperature sensor 2232.4. As noted above, voltage regulator 2230.4 generates the supply voltage VREF. Kelvin temperature sensor 2232.4 generates a VOUT signal.

FIG. 15 is a block diagram showing the interface signals of kelvin temperature sensor (KTS) 1500, which is an exemplary implementation of Kelvin temperature sensor 2232.4. Kelvin temperature sensor 1500 is an absolute temperature sensor circuit that produces an output voltage (VOUT) linearly related to the circuit's absolute temperature. As shown in FIG. 15, Kelvin temperature sensor 1500 receives analog power and ground reference voltages at terminals 1501 and 1502 and asynchronous power-down control signal (PDN) at terminal 1503, and provides output voltage VOUT at terminal 1504, which is linearly related to the temperature of the circuit between 0.0V and 3.0V.

Figure 15A:
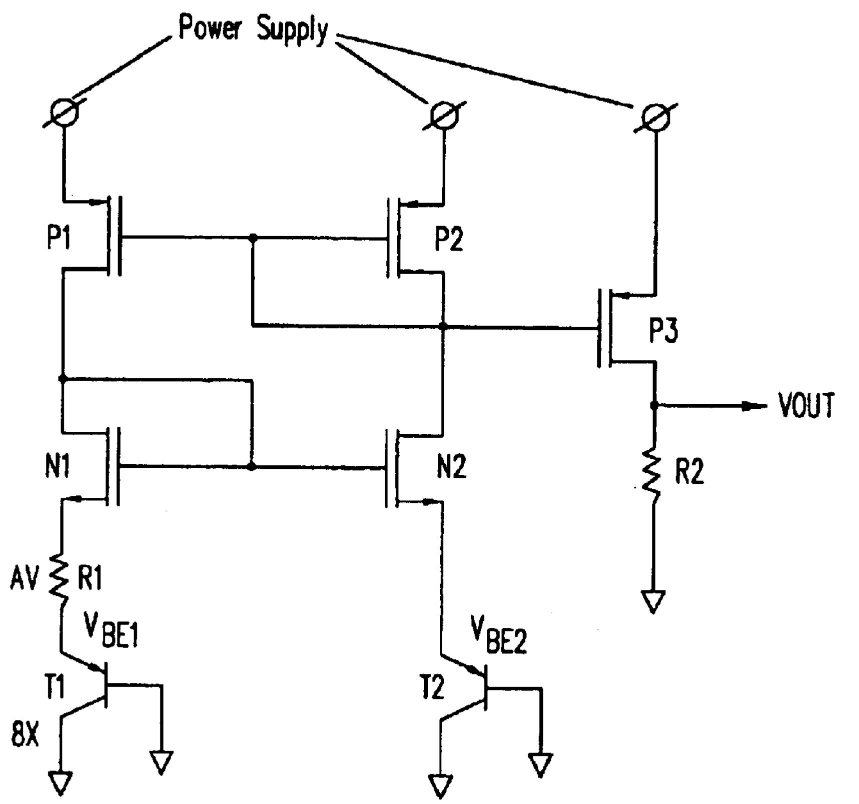
FIG. 15A is an exemplary circuit for KTS 1500 in accordance with one implementation.

FIG. 15A is an exemplary circuit for KTS 1500 in accordance with one implementation and highlights the basic equations that illustrate how the output voltage VOUT corresponds to temperature. For example, all of the components in FIG. 15A can be integrated on the same chip and, thus, the matching of the components can be better than 0.1%. Without calibration, approximately ±5% accuracy may be obtained over the temperature range 0° C. to 125° C. With calibration, by measuring the output voltage VOUT at a known temperature (e.g., 25° C.), greater than ±1% accuracy may be obtained.

Figure 54A:
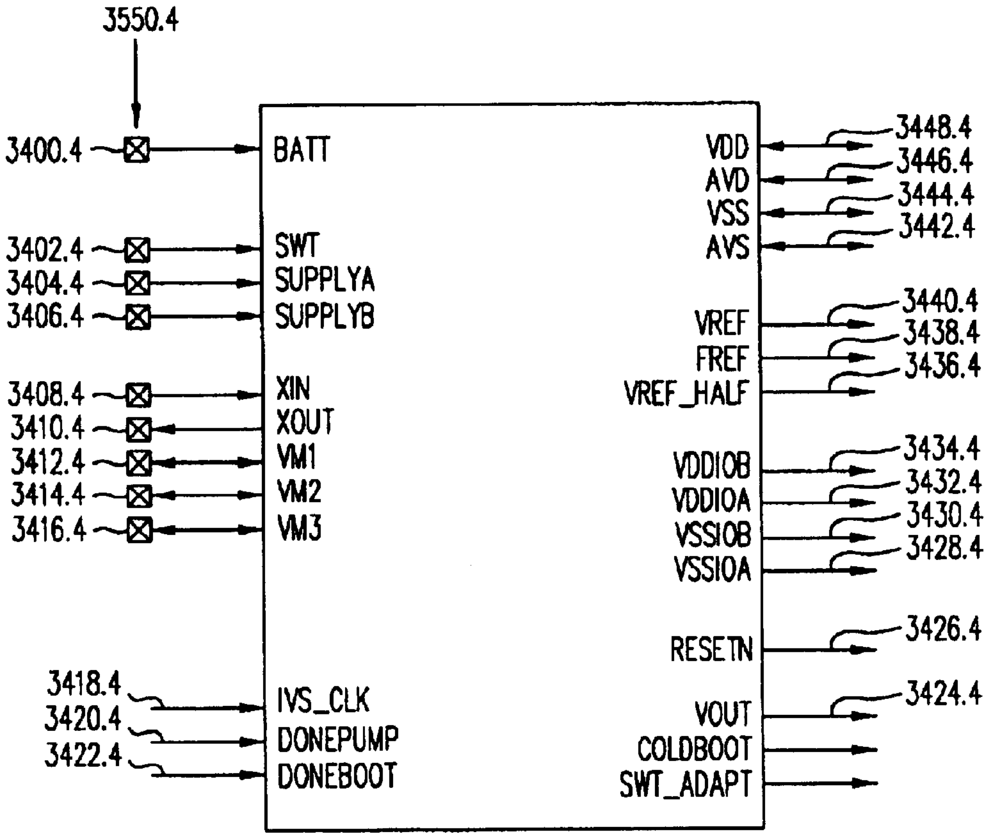
FIG. 54A is an exemplary interface block diagram for IVS 1209 in accordance with another implementation.
Figure 54B:
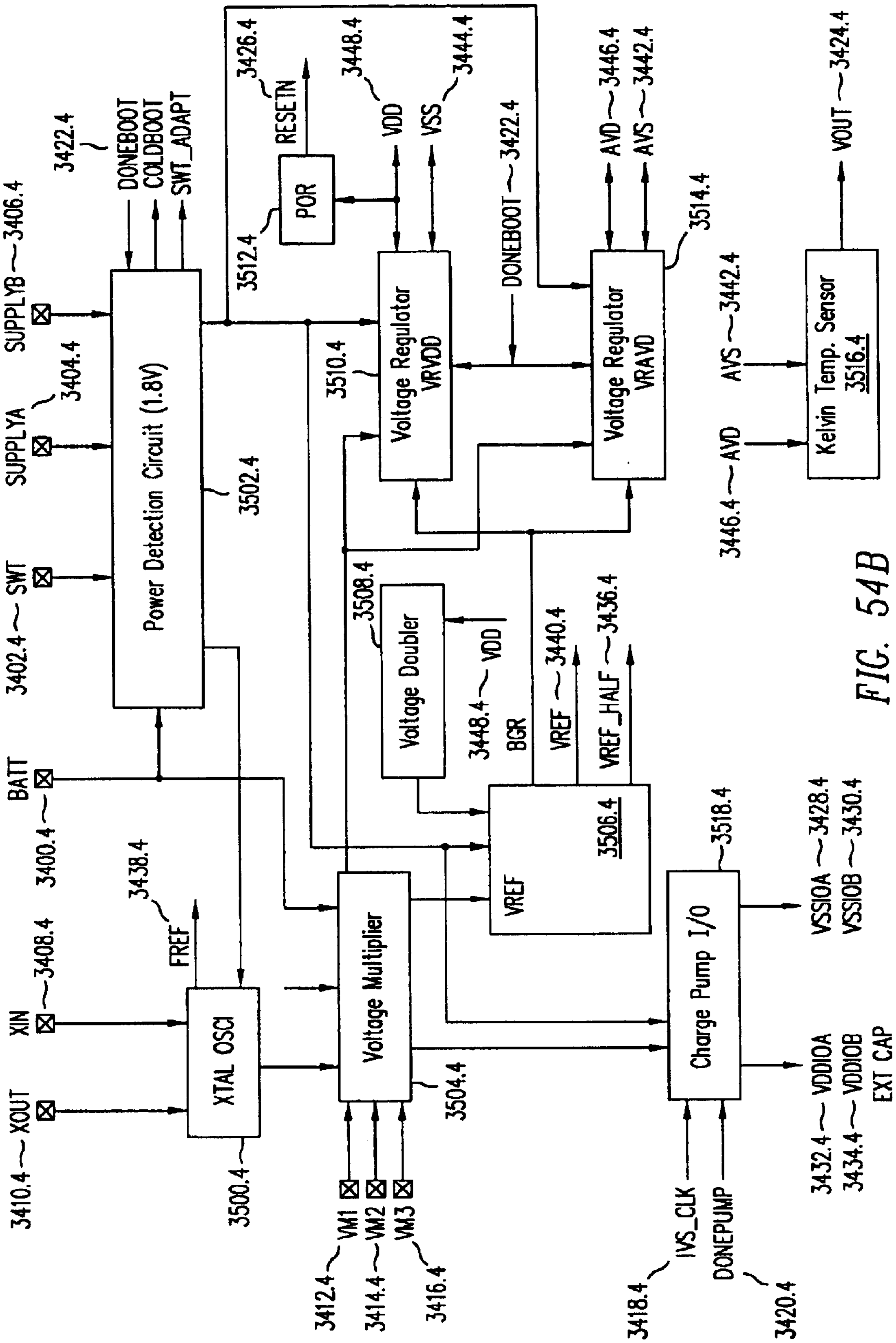
FIG. 54B is another exemplary functional diagram of IVS 1209 in accordance with another implementation.

FIG. 54A is an exemplary interface block diagram illustrating interface signals for IVS 1209 in accordance with another implementation and FIG. 54B is a corresponding functional block diagram. As shown in FIG. 54A and x.4c, the interface signals include a battery (BATT) signal 3400.4, a switch (SWT) signal 3402.4, power supplies A and B (SUPPLYA and SUPPLYB, respectively) 3404.4 and 3406.4, respectively, an XIN signal 3408.4, an XOUT signal 3410.4, a VM1 signal 3412.4, a VM2 signal 3414.4, a VM3 signal 3416.4, an IVS_CLK signal 3418.4, a DONEPUMP signal 3420.4, a DONEBOOT signal 3422.4, a VOUT signal 3424.4, a RESETN signal 3426.4, a VSSIOA signal 3428.4, a VSSIOB signal 3430.4, a VDDIOA signal 3432.4, a VDDIOB signal 3434.4, a VREF_HALF signal 3436.4, a COLDBOOT signal, a SWT_ADAPT a FREF signal 3438.4, a VREF signal 3440.4, an AVS signal 3442.4, a VSS signal 3444.4, an AVD signal 3446.4, and a VDD signal 3448.4. Some of the signals employ pads 3550.4, as shown in FIG. 54A.

Battery (BATT) signal 3400.4 is the signal provided if an external battery is available. Switch (SWT) signal 3402.4 is used to cause switching power supply controller 1200 to go from the shutdown mode into the low power mode, or the standard mode. Power supply A 3404.4 and power supply B 3406.4 are pads connected to the external power source (A or B, respectively). XIN signal 3408.4 is an input signal for a crystal oscillator 3500.4, while XOUT signal 3410.4 is an output signal from crystal oscillator 3500.4, both for communication with an external crystal oscillator (e.g., of 32.768 kHz).

VM1 signal 3412.4, VM2 signal 3414.4, and VM3 signal 3416.4 are signals provided to and from external capacitors (labeled EXT CAP in FIG. 54B) coupled to a voltage multiplier 3504.4. IVS CLK signal 3418.4 is a clock signal from CLKGEN 1223 that is used by a charge pump 3518.4, while DONEPUMP signal 3420.4 is a signal from central processing module (SYS) 1205 to cause charge pump 3518.4 to stop. DONEBOOT signal 3422.4 is a signal from central processing module (SYS) 1205 to cause a power detection circuit 3502.4 to stop voltage multipler 3504.4 and voltage regulators 3510.4 and 3514.4.

VOUT signal 3424.4 is an output signal from a Kelvin temperature sensor 3516.4, which is provided to SHM 1207. RESETN signal 3426.4 is a reset signal from a power on reset (POR) circuit 3512.4 and is provided to reset module 1215. VSSIOA signal 3428.4 and VSSIOB signal 3430.4 are two ground signals, while VDDIOA signal 3432.4 and VDDIOB signal 3434.4 are two power supply signals generated in charge pump IO 3518.4, all provided to various blocks in switching power supply controller 1200, including to NFET driver module 1202.

VREF signal 3440.4 is a reference voltage signal (e.g., 3.0 V) provided to analog to digital converter 1206, while VREF_HALF signal 3436.4 is one-half the voltage level of VREF signal 3440.4, which is provided to SHM 1207. FREF signal 3438.4 is a reference frequency provided by crystal oscillator 3500.4. AVS signal 3442.4 is an analog ground signal, VSS signal 3444.4 is a digital ground signal, AVD signal 3446.4 is an analog voltage signal (e.g., 3.3 V), and VDD signal 3448 4 is a digital voltage signal (e.g., 3.3 V).

As a functional example of operation (referring to FIG. 54B), if an external battery is supplying the power, battery signal 3400.4 will provide a voltage (e.g., at least 1.8 V) to run power detection circuit 3502.4 (which detects the voltage) and crystal Oscillator (XTAL OSCl) 3500.4 to generate a clock for voltage multiplier 3504.4. Power detection circuit 3502.4 provides a voltage (e.g., 1.8 V) to crystal oscillator 3500.4 and detects when to exit the shutdown mode. The output of voltage multiplier 3504.4 (e.g., twice the input voltage) is used as an input voltage for voltage regulators (VRAVD) 3514.4 and (VRVDD) 3510.4, which generate a VRAVD voltage and a VRVDD voltage, respectively. A separate internal voltage doubler 3508.4 provides a voltage (e.g., 6.6 V or twice VDD signal 3448.4) to a VREF block 3506.4, which provides a stable reference voltage (i.e., VREF signal 3440.4) by employing, for example, band gap reference circuits.

Once core logic VDD signal 3448.4 and AVD signal 3446.4 are generated, a phase-locked loop (PLL) circuit (not shown) along with other circuitry shown in FIG. 54B can begin operating using the voltage (e.g., 3.3 V) from VDD signal 3448.4 and/or AVD signal 3446.4. When the VRVDD voltage reaches a minimal level, a POR circuit 3512.4 exits a reset state (during reset, POR circuit 3512.4 functions to asynchronously set or reset registers used in switching power supply controller 1200). The 8051 contained within central processing module (SYS) 1205 will then bring up the rest of the system, which enables regulation control module (REG) 1204 to regulate an external supply (e.g., 3.3. V).

After regulation control module (REG) 1204 is regulating the external voltage supply (e.g., 3.3V), central processing module (SYS) 1205 will assert DONEBOOT signal 3422.4. Once DONEBOOT signal 3422.4 is asserted (e.g., logical high level), IVS 1209 will turn off voltage multiplier 3504.4 and internal voltage regulators 3510.4 and 3514.4. The voltage from voltage regulator 3510.4 should also go to POR block 3512.4 so that the asynchronous registers (not shown) can exit their reset condition.

Additionally, charge pump 3518.4 will receive the output of voltage multiplier 3504.4 and store in an external capacitor (EXT CAP) the charge needed in NFET driver module 1202 during the power-up sequence (e.g., 3 V above the power supply to drive a gate of the external NFET). Charge pump 3518.4 will start once IVS_CLK signal 3418.4 is generated and continue pumping until DONEPUMP signal 3420.4 from central processing module (SYS) 1205.

If no battery is available and an external power source is provided by power supply A 3404.4 or power supply B 3406.4 (e.g., either supply providing between 4.5 V and 14.4 V), this voltage will be detected by and run power detection circuit 3502.4 and also crystal oscillator 3500.4. VREF block 3506.4 and voltage regulators 3510.4 and 3514.4 will receive as their input voltage, either power supply A 3404.4 or power supply B 3406.4 to generate the analog and digital voltages (i.e., AVD signal 3446.4 and VDD signal 3448.4, respectively). Once AVD signal 3446.4 and VDD signal 3448.4 are generated, the same procedure as described above for a battery supply will take place to provide the external 3.3V connected back into the chip through AVD signal 3446.4 and VDD signal 3448.4.

If the chip has entered shutdown mode , and it still has power from either battery 3400.4, SUPPLYA 3404.4 or SUPPLYB 3406.4, it will remain in that state with just the Xtal Osc 3500.4 and Power Detection Circuit 3502.4 running. It will remain in this state until one of two conditions occur: Pad SWT is pulled low or a supply is provided. Upon either or these conditions will initiate the power up sequences described above and provide signal COLDBOOT and SWT_ADAPT to central processing module (SYS) 1205.

Figure 54C:
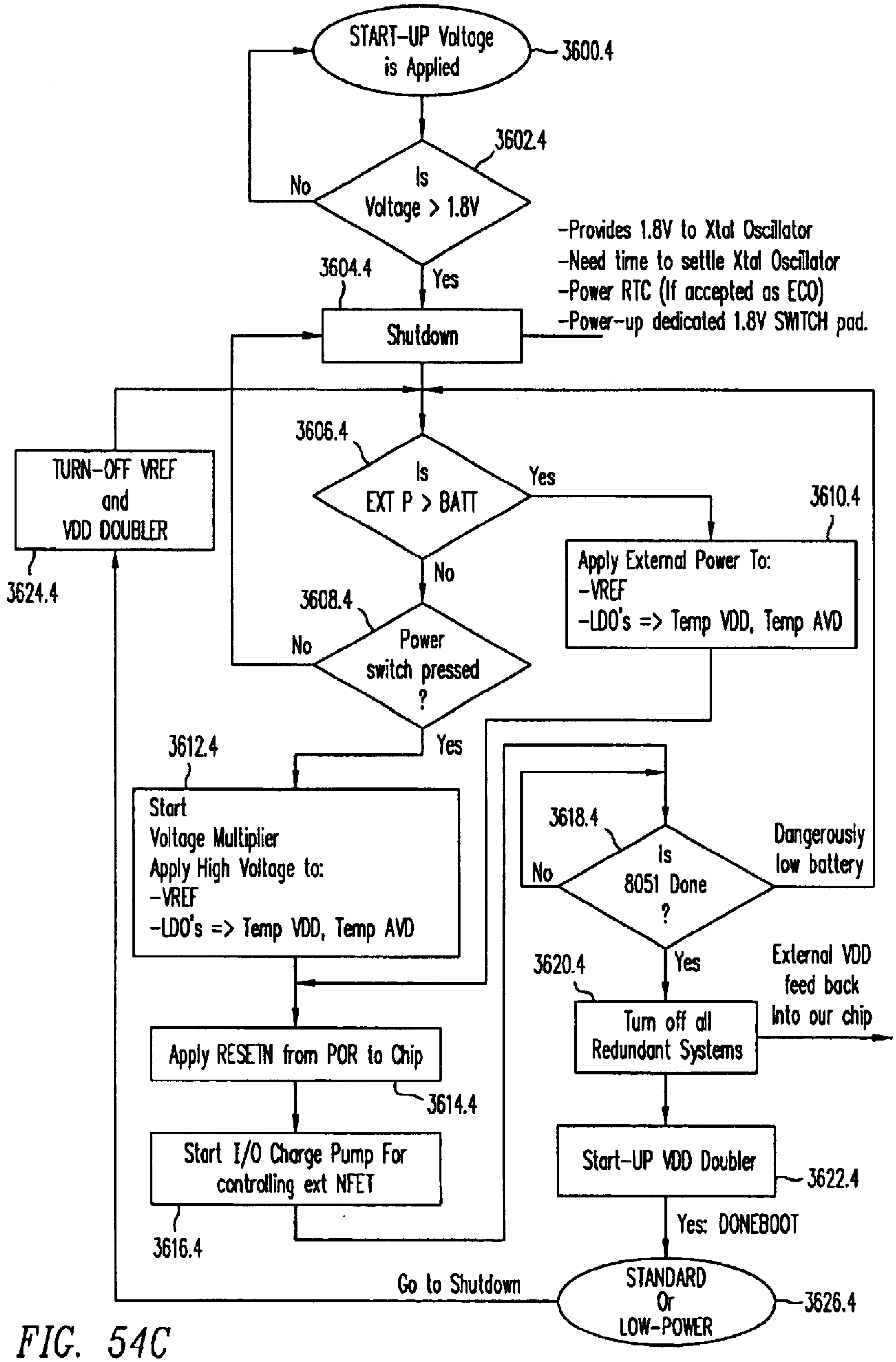

FIG. 54C is an exemplary flowchart for a power-up sequence for IVS 1209 in accordance with another implementation. Step 3600.4 begins the power-up sequence when an external voltage is applied. If the external voltage is greater than a required threshold (e.g., 1.8 V) at step 3602.4, then the shutdown mode is held to allow circuits to power up (step 3604.4). If the external voltage is greater than expected battery voltages, then the external voltage is routed to VREF block 3506.4 and voltage regulators (LDOs) 3510.4 and 3514.4 (as discussed in reference to FIG. 54B).

If the external voltage is around the expected battery voltages, step 3608.4 determines if a switch (SWT 3402.4) is pressed, if not then the shutdown mode (step 3604.4) is entered. If the power switch is pressed, step 3612.4 starts voltage multiplier 3504.4, VREF block 3506.4, and voltage regulators 3510.4 and 3514.4. RESETN signal 3426.4 is asserted (step 3614.4) and charge pump 3518.4 operation begins.

Step 3618.4 determines if a low battery condition exists if so IVS returns to step 3604.4. IVS remains in state 361.8.4 until central processing module (SYS) 1205 (referred to as 8051 in flowchart) has completed its coldboot operations.

Once central processing module (SYS) 1205 is done with these operations step 3620.4 switches off all redundant systems and the external voltage (i.e., VDD signal 3448.4) is fed back into switching power supply controller 1200. Step 3622.4 begins operation of voltage doubler 3508.4 and, when DONEBOOT signal 3422.4 is asserted, the standard mode or the low power mode (step 3626.4) is initiated. When the shutdown mode command is received, step 3624.4 switches off VREF block 3506.4 and voltage doubler 3508.4 and step 3606.4 is repeated.

Section x.5 Converter Structure (ADC)

Referring to FIG. 12, analog to digital converter 1206 may be constructed as a'successive approximation converter (SAR) or in other suitable architectures such a flash analog-to-digital converter. Due to the use of sample and holds in combination with capacitor ratio based voltage division and multiplication; several unusual simplifications may be made to the input of the analog-to-digital converter. A standard implementation of a SAR converter requires an input buffer amplifier to condition and scale the input voltage and a sample and hold circuit to prevent the input voltage from changing at the input to the SAR comparator as successive SAR DAC values are compared to the input voltage. In a SAR analog-to-digital converter, the conversion may be corrupted if the input voltage is allowed to change during the conversion process. The additional input stages normally required in a SAR analog-to-digital converter require that voltages to be measured be made available and settled a significant time before the conversion starts. This "set up time" is a particular issue in a multiplexed system such as the present invention since it reduces the rate at which new inputs can be presented or demands much higher speed from the analog-to-digital converter. Since the present invention utilizes sample and holds at its inputs and capacitor ratio based scaling, both the input amplifier and sample and hold sections may be eliminated from the SAR analog-to-digital converter implemented in an embodiment thus eliminating much of the set up time and several sources of error while reducing the speed requirements and power consumption of the SAR analog-to-digital converter. The required processing speed of analog to digital converter 1206 is driven by the DPC frame rate and the number of switching power supplies under control by switching power supply controller 1200 and the desired A/D resolution. For example, if switching power supply controller 1200 uses a cycle rate of 524 KHz and controls seven switching power supplies, analog to digital converter 1206 must convert 14 feedback signals plus two input signals in a DPC frame period of approximately 2 micro-seconds. If 10 bits of resolution are desired, the resulting A/D logic clock frequency is approximately 110 MHz.

x.7 Output Structure NFET (GM)

Figure 55:
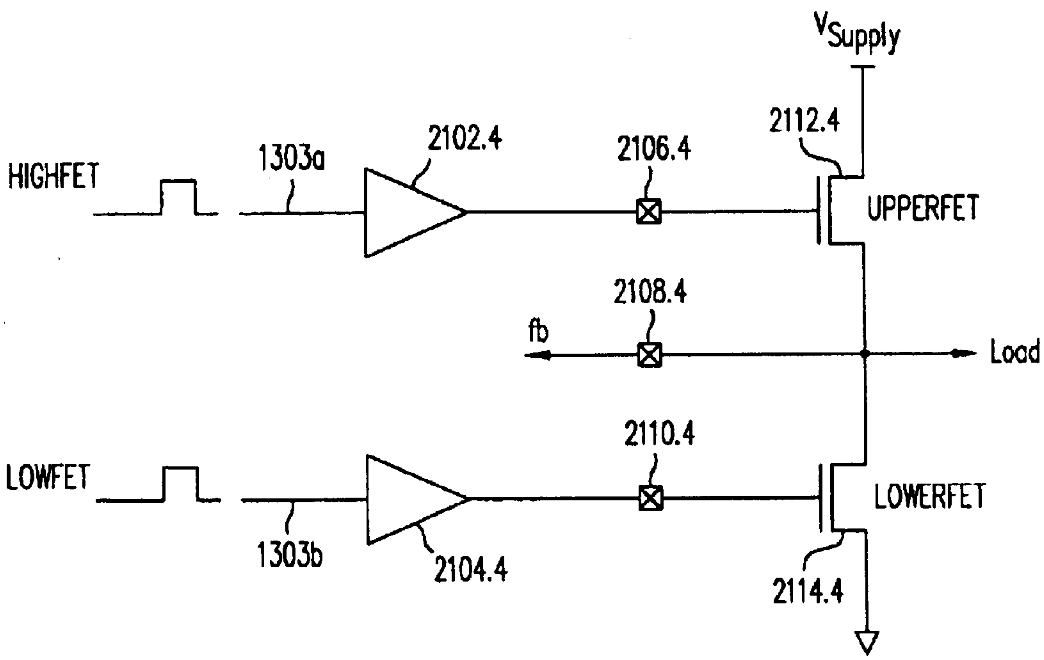

FIG. 55 is an exemplary functional diagram of NFET driver module 1202 in accordance with one implementation. FIG. 55 includes input/output (I/O) buffers 2102.4 and 2104.4, which drive corresponding external power MOSFETs 2112.4 and 2114.4 via pads 2106.4 and 2110.4 (corresponding to UPPER_FET and LOWER_FET terminals, respectively, on NFET driver module 1202 of FIG. 12).

As shown in FIG. 55, power MOSFET 2112.4 is referred to as an "UPPER FET" and power MOSFET 2114.4 is referred to as a "LOWER FET," with both employed to provide a regulated DC supply to a load. NFET driver module 1202 receives via switch control bus 1303*a* (i.e., HIGHFET) and switch control bus 1303*b* (i.e., LOWFET) signals shown adjacent to the bus, which contain information utilized by NFET driver module 1202 to control I/O buffers 2102.4 and 2104.4. A pad 2108.4 is coupled to power MOSFETs 2112.4 and 2114.4 to provide feedback (fb) to NFET driver module 1202 regarding external load parameters (e.g., voltage).

Figure 55A:
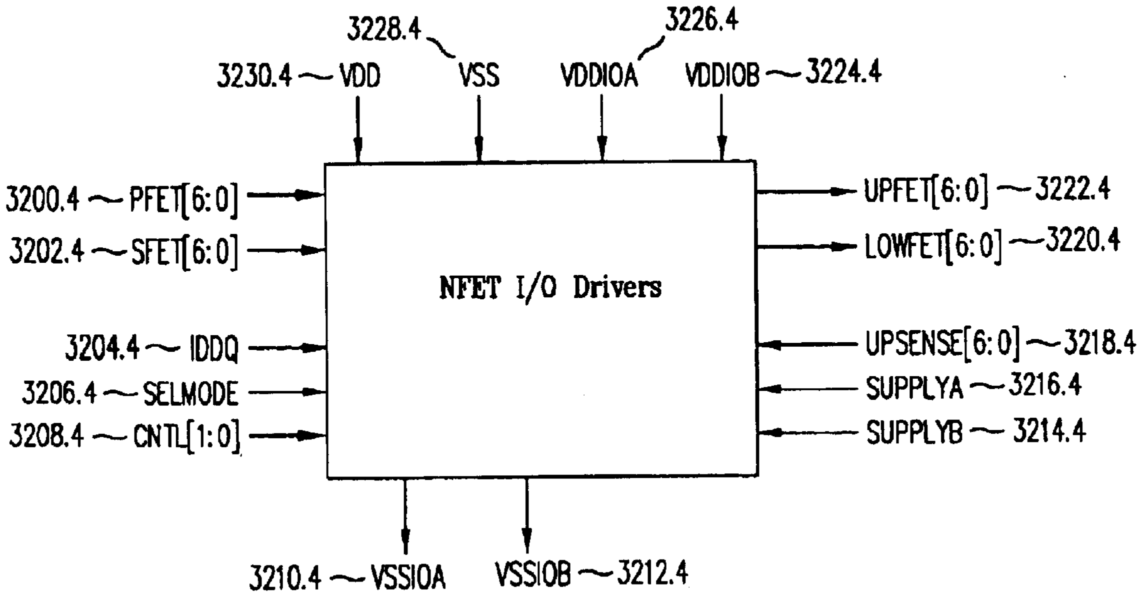

NFET driver module 1202 (FIG. 12) further includes interface signals VDDIO [A,B], VSSIO[A,B], UPFET_Source, LOWFET_Source, and IDDQ. The VDDIO[A,B] signals are supply voltages A and B, while the VSSIO[A,B] signals are corresponding A and B ground references. The UPFET_Source and LOWFET_Source signals monitor and provide feedback regarding power MOSFETs 2112.4 and 2114.4, respectively, and correspond symbolically to the feedback (fb) illustrated in FIG. 55. The IDDQ signal is provided for test purposes FIG. 55A illustrates exemplary interface signals of NFET driver module 1202 in accordance with another implementation. The interface signals include a PFET[6:0] signal 3200.4, an SFET[6:0] signal 3202.4, an IDDQ signal 3204.4, a SELMODE signal 3206.4, a CNTL[1:0] signal 3208.4, a VSSIOA signal 3210.4, a VSSIOB signal 3212.4, a SUPPLYB signal 3214.4, a SUPPLYA signal 3216.4, an UPSENSE[6:0] signal 3218.4, a LOWFET[6:0] signal 3220.4, an UPFET[6:0] signal 3222.4, a VDDIOB signal 3224.4, a VDDIOA signal 3226.4, a VSS signal 3228.4, and a VDD signal 3230.4.

PFET[6:0] signal 3200.4 and SFET[6:0] signal 3202.4 are the pulses received from DPC 1201 to drive the primary and secondary external NFETs, respectively. IDDQ signal 3204.4 is a test signal, while SELMODE signal 3206.4 selects a mode of operation and CNTL[1:03 signal 3208.4 provides control information.

VSSIOA signal 3210.4 and VSSIOB signal 3212.4 are return ground paths for the external power supplies (i.e., SUPPLYA signal 3216.4 and SUPPLYB signal 3214.4, respectively). VDDIOA signal 3226.4 and VDDIOB signal 3224.4 are high voltage sources derived from supply A 3216.4 or supply B 3214.4, which may be controlled by DPC 1201 to regulate the load voltage as needed. VSS signal 3228.4 and VDD signal 3230.4 are digital ground and digital supply voltage (e.g., 3.3 V), respectively.

UPFET[6:0] signal 3222.4 and LOWFET[6:0] signal 3220.4 are signals that drive the primary and secondary external NFETS, while UPSENSE[6:0] signal 3218.4 is a reference source voltage for the primary external NPETs of switching power converters being controlled by switching power supply controller 1200.

Figure 55B:
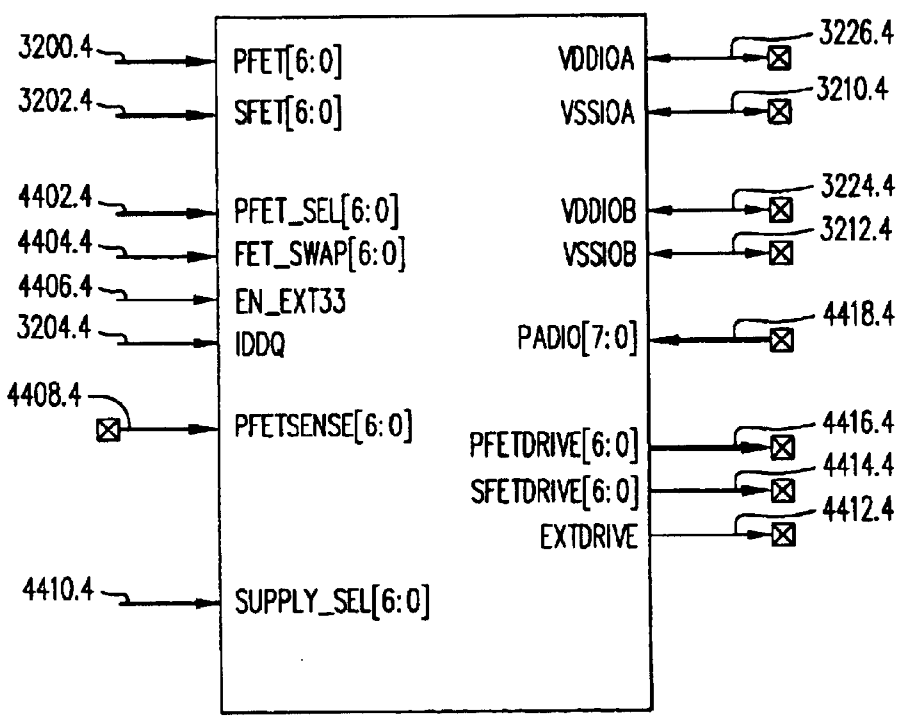

FIG. 55B illustrates exemplary interface signals of switch driver module also referred to as NFET driver module 1202 in accordance with another implementation. NFET driver module 1202 contains I/O drivers, as explained below, that can be used to drive external power FETs as well as an external coil (e.g., for digital camera applications). The interface signals include PFET[6:0] signal 3200.4, SFET [6:0] signal 3202.4, a PFET_SEL[6:0] signal 4402.4, a FET_SWAP[6:0] signal 4404.4, an EN_EXT33 signal 4406.4, IDDQ signal 3204 4, a PFETSENSE[6:0] signal 4408.4, a SUPPLY_SEL[6:0] signal 4410.4, VDDIOA signal 3226.4, VSSIOA signal 3210.4, VDDIOB signal 3224.4, VSSIOB signal 3212.4, a PADIO[6:0] signal 4418.4, a PFETDRIVE[6:0] signal 4416.4, an SFETDRIVE[6:0] signal 4414.4, and an EXTDRIVE signal 4412.4.

PFET[6:0] signal 3200.4 and SFET[6:0] signal 3202.4 are the pulses received from DPC 1201 used to drive the external primary NFETs and external secondary NFETs, respectively. PFET_SEL[6:0] signal 4402.4, received from regulation control module (REG) 1204, commands whether to drive external FETs or external coils. If driving external coils, VDDIOA signal 3226.4 or VDDIOB signal 3224.4 will be connected to the Supply A or the Supply B. If driving external FETs, VDDIOA signal 3226.4 or VDDIOB signal 3224.4 will be boosted to voltage levels equivalent to 3 V above the voltage level of the Supply A or the Supply B.

FET_SWAP[6:0] signal 4404.4, received from regulation control module (REG) 1204, signals NFET driver module 1202 to swap the pulses from PFET[6:0] signal 3200.4 and SFET[6:0] signal 3202.4, depending upon whether a boost or a buck is the external power topology. EN_EXT33 signal 4406.4 drives EXTDRIVE signal 4412.4, which drives the external switch to isolate the external voltage supply (e.g., 3.3 V) from the rest of the system. IDDQ signal 3204.4 is a test signal.

PFETSENSE[6:0] signal 4408.4 is the source of the primary external NFET and is connected back into switching power supply controller 1200 to monitor the source voltage of PFETDRIVE[6:0] signal 4416.4 SUPPLY_SEL[6:0] signal 4410.4 selects between the Supply A and the Supply B for generation of VDDIOA signal 3226.4 or VDDIOB signal 3224.4. VDDIOA signal 3226.4 is connected externally to PADIO[6:0] signal 4418.4 and provides a voltage level above the voltage of the Supply A (e.g., 3.0 V above) as a main power supply for PFETDRIVE[6:0] signal 4416.4 or SFETDRIVE[6:0] signal 4414.4 (if driving an external NFET) or as a pre-driver voltage (if driving an external coil). VSSIOA signal 3210.4 is a ground signal for VDDIOA signal 3226.4 or PADIO[6:0] signal 4418.4. Similarly, VDDIOB signal 3224.4 is connected externally to PADIO [6:0] signal 4418.4 and provides a voltage level above the voltage of the Supply B (e.g., 3.0 V above) as a main power supply for PFETDRIVE[6:0] signal 4416.4 or SFETDRIVE [6:0] signal 4414.4 (if driving an external NFET) or as a pre-driver voltage (if driving an external coil).

VSSIOB signal 3212.4 is a ground signal for VDDIOB signal 3224.4 or PADIO[6:0] signal 4418.4. PADIO[6:0] signal 4418.4 is a main source of input/output power for the final stage in PFETDRIVE[6:0] signal 4416.4 or SFETDRIVE[6:0] signal 4414.4 and may utilize VDDIOA signal 3226.4 or VDDIOB signal 3224.4 as well as the Supply A or the Supply B, depending upon the configuration (discussed further below). PFETDRIVE[6:0] signal 4416.4 drives the external primary FET. SFETDRIVE[6:0] signal 4414.4 drives the external secondary FET. EXTDRIVE signal 4412.4 switches on or off the external FET switch used for isolating the external power supply (e.g., 3.3 V) that will be connected back to switching power supply controller 1200.

Figure 55C:
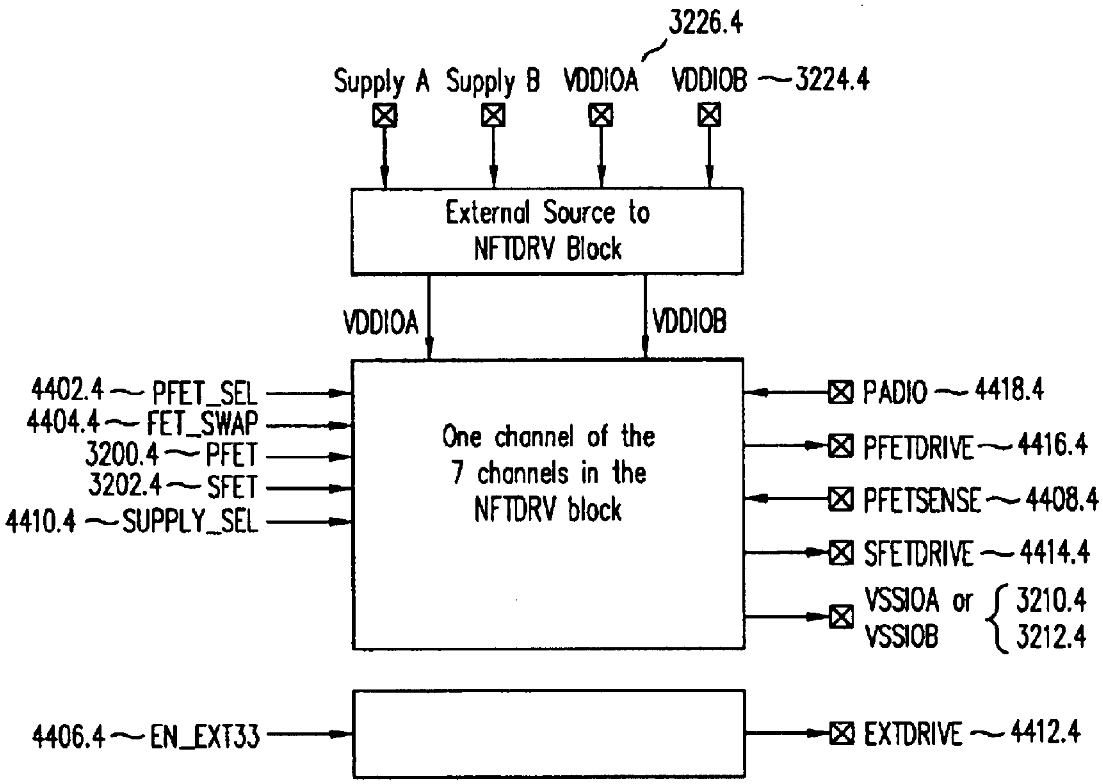

FIG. 55C shows an exemplary functional diagram for the implementation of FIG. 55B. In terms of general operation, two pulses, PFET signal 3200.4 and SFET signal 3202.4 are received from DPC 1201. If these pulses overlap, a fail safe mode logic 4430.4 (FIG. 55D) sets the output signal to LOW to PFETDRIVE signal 4416.4 and SFETDRIVE signal 4414.4 until the next frame. Pre-driver logic 4432.4 and 4434.4 (FIG. 55D) checks for swapping between external primary and secondary output terminals. PFET SEL signal 4402.4 will also configure the driver either as driving external FETs or driving directly the external coil. PFETDRIVE signal 4416.4 needs to be, for example, 3 V higher than PFETSENSE signal 4408.4 when driving external FETs. Hence, PFETSENSE signal 4408.4 is connected back into the pre-driver logic to monitor the source voltage for the external FET.

VDDIOA signal 3226.4 and VDDIOB signal 3224.4 (FIG. X.7*d*) are connected external to NFET driver module 1202 and each of the channels (e.g., seven) of NFET driver module 1202 will be connected to either VDDIOA signal 3226.4 or VDDIOB signal 3224.4, depending on the value of SUPPLY_SEL signal 3202 4. Each of the seven channels utilize PADIO signal 4418.4, PFETDRIVE signal 4416.4, PFETSENSE signal 4408.4, SFETDRIVE signal 4414.4, and its corresponding VSSIOA signal 3210.4 or VSSIOB signal 3212.4. During the power-up sequence an external NFET will be driven by EXTDRIVE signal 4412.4, which is an I/O buffer similar to the buffers used for PFETDRIVE signal 4416.4. EN_EXT33 signal 4406.4, received from central processing module (SYS) 1205, controls EXTDRIVE signal 4412.4.

Figure 55F:
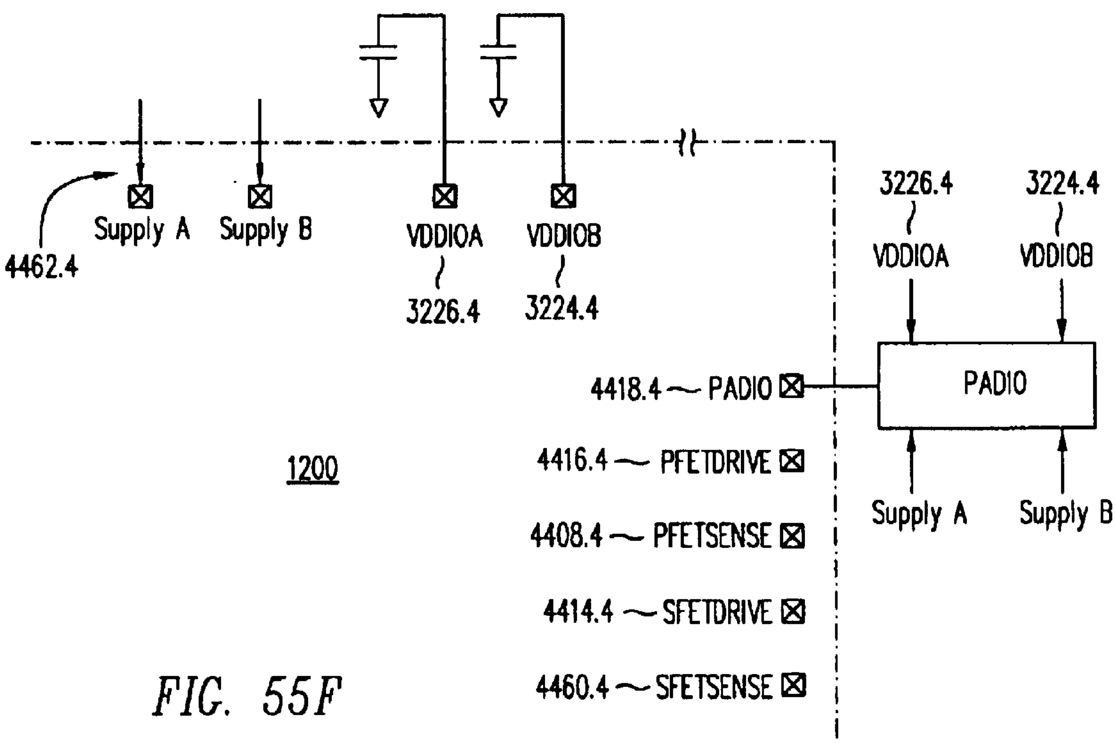
Figure 55D:
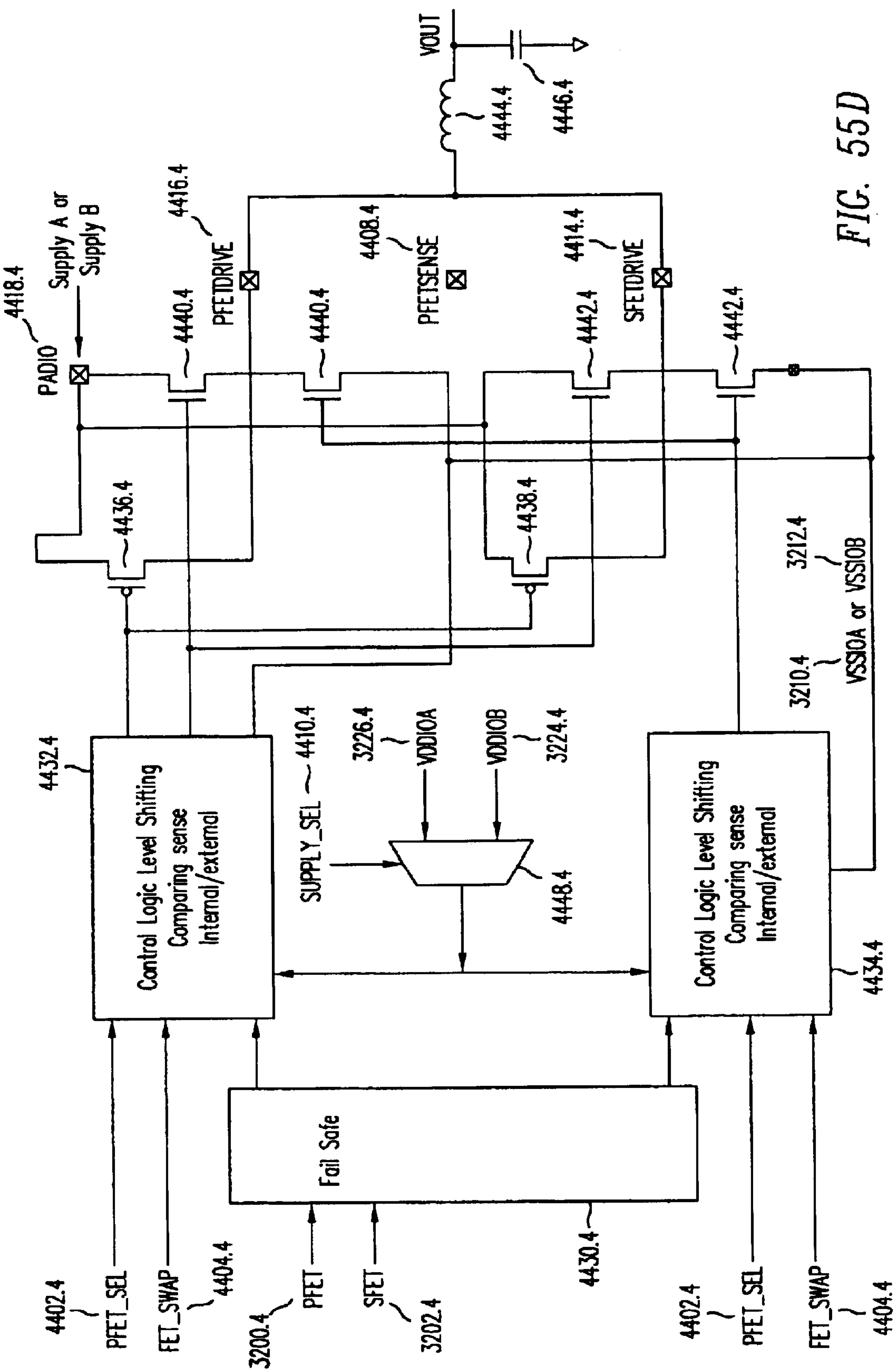

FIG. 55D illustrates an application employing internal buffers, represented by transistors 4440.4 and 4442.4, to directly drive an external coil 4444.4 for the implementation of FIG. 55B. As discussed above for this configuration, PADIO signal 4418.4 is connected externally (i.e., at the board level) to Supply A or the Supply B. As shown, PFETDRIVE signal 4416.4 and SFETDRIVE signal 4414.4 may be arranged to drive in parallel external coil 4444.4 and a capacitive load 4446.4, which may result in lower source impedance.

Fail safe mode logic 4430.4 verifies that PFET signal 3200.4 and SFET signal 3202.4 do not overlap. Supply_SEL 4410.4 selects VDDIOA signal 3226.4 or VDDIOB signal 3224.4 via a multiplexer 4448.4 to route to control logic 4432.4 and 4434.4, which control transistor pairs 4440.4 and 4442.4.

Figure 55E:
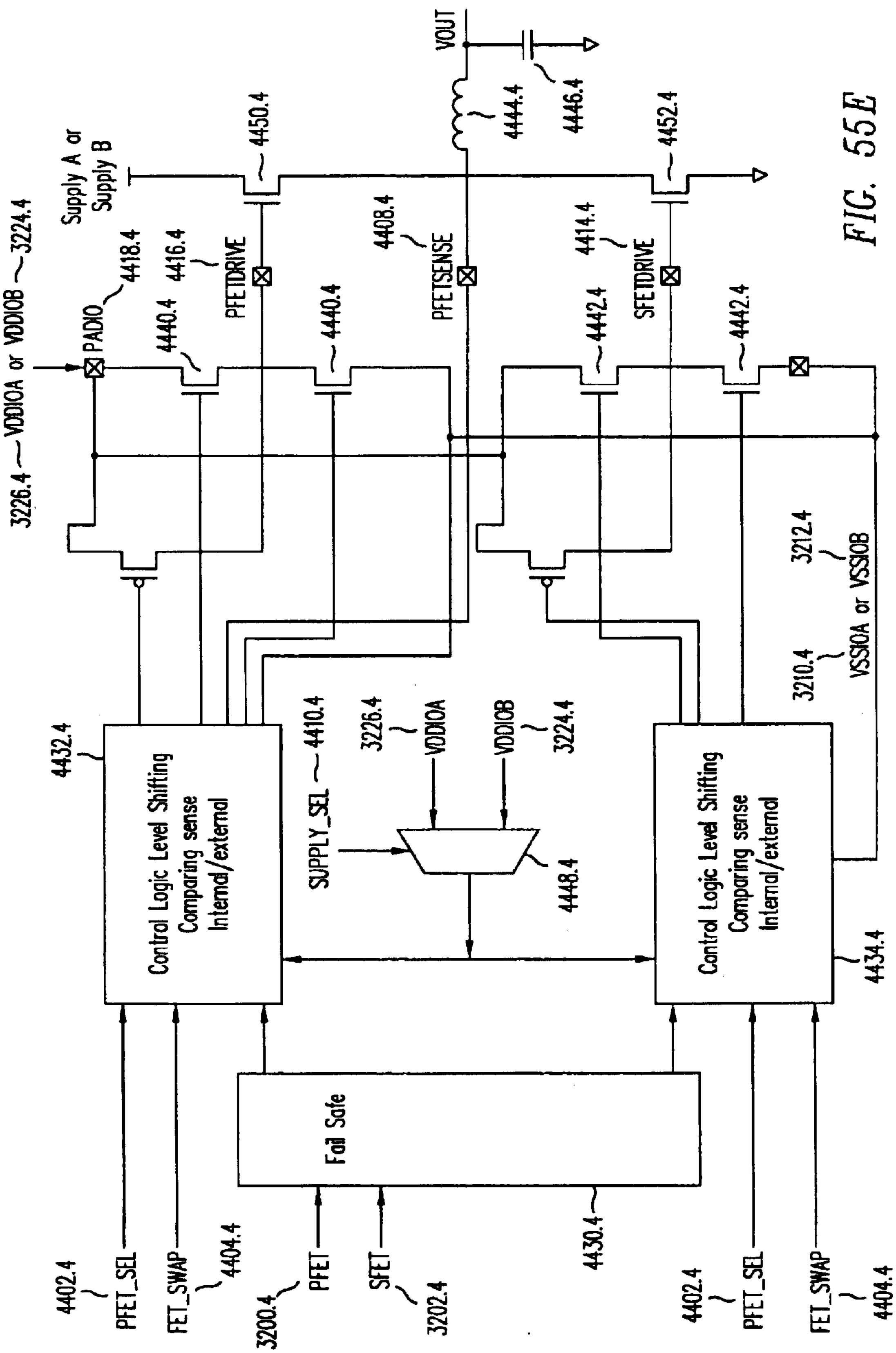

FIG. 55E illustrates an application employing internal buffers, represented by transistor pairs 4440.4 and 4442.4, to drive external FETs 4450.4 and 4452.4 for the implementation of FIG. 55B. As discussed above for this configuration, PADIO signal 4418.4 is connected externally (i.e., at the board level) with VDDIOA signal 3226.4 or VDDIOB signal 3224.4. The application shown in FIG. 55E is similar to FIG. 55D and therefore will not be repeated. However, as shown in FIG. 55E, external FETs 4450.4 and 4452.4 are driven by PFETDRIVE signal 4416.4 and SFETDRIVE signal 4414.4, respectively, to drive external coil 4444.4 and capacitive load 4446.4. When PFET 3200.4 is high, its control logic 4432.4 maintains PFETDRIVE at a constant 3V above PFETSENSE 4408.4

Table x.7a summarizes in a truth table format the state of various signals for the exemplary configurations. For PFET_SEL signal 4402.4, a zero and a one indicate internal and external, respectively. For FET_SWAP signal 4404.4, a zero and a one indicate no swap and swap, respectively.

TABLE x.7a

| PFET | SFET | PFET_SEL | FET_SWAP | PFETDRIVE | SFETDRIVE |
|---|---|---|---|---|---|
| 0 | 0 | 0 | 0 | 0 (internal) | 0 (internal) |
| 0 | 0 | 0 | 1 | 0 (internal) | 0 (internal) |
| 0 | 0 | 1 | 0 | 0 (external) | 0 (external) |
| 0 | 0 | 1 | 1 | 0 (external) | 0 (external) |
| 0 | 1 | 0 | 0 | 0 (internal) | 1 (internal) |
| 0 | 1 | 0 | 1 | 1 (internal) | 0 (internal) |
| 0 | 1 | 1 | 0 | 0 (external) | 1 (external) |
| 0 | 1 | 1 | 1 | 1 | 0 |

TABLE x.7a-continued

| PFET | SFET | PFET_SEL | FET_SWAP | PFETDRIVE | SFETDRIVE |
|---|---|---|---|---|---|
| | | | | (external) | (external) |
| 1 | 0 | 0 | 0 | 1 (internal) | 0 (internal) |
| 1 | 0 | 0 | 1 | 0 (internal) | 1 (internal) |
| 1 | 0 | 1 | 0 | 1 (external) | 0 (external) |
| 1 | 0 | 1 | 1 | 0 (external) | 1 (external) |
| 1 | 1 | 0 | 0 | 0 (fail safe) | 0 (fail safe) |
| 1 | 1 | 0 | 1 | 0 (fail safe) | 0 (fail safe) |
| 1 | 1 | 1 | 0 | 0 (fail safe) | 0 (fail safe) |
| 1 | 1 | 1 | 1 | 0 (fail safe) | 0 (fail safe) |

FIG. 55F shows an exemplary on-chip configuration block diagram for the implementation of FIG. 55B. As shown, switching power supply controller 1200 receives the Supply A or the Supply B signal via pads 4462.4 or through PADIO signal 4418.4, and generates VDDIOA signal 3226.4 and VDDIOB signal 3224.4. Switching power supply controller 1200, through NFET driver module 1202, generates PFETDRIVE signal 4416.4 and SFETDRTVE signal 4414.4 and receives PFETSENSE 4408.4 and optionally SFETSENSE 4460.4.

x.8 Microcontroller Structure

Figure 56:
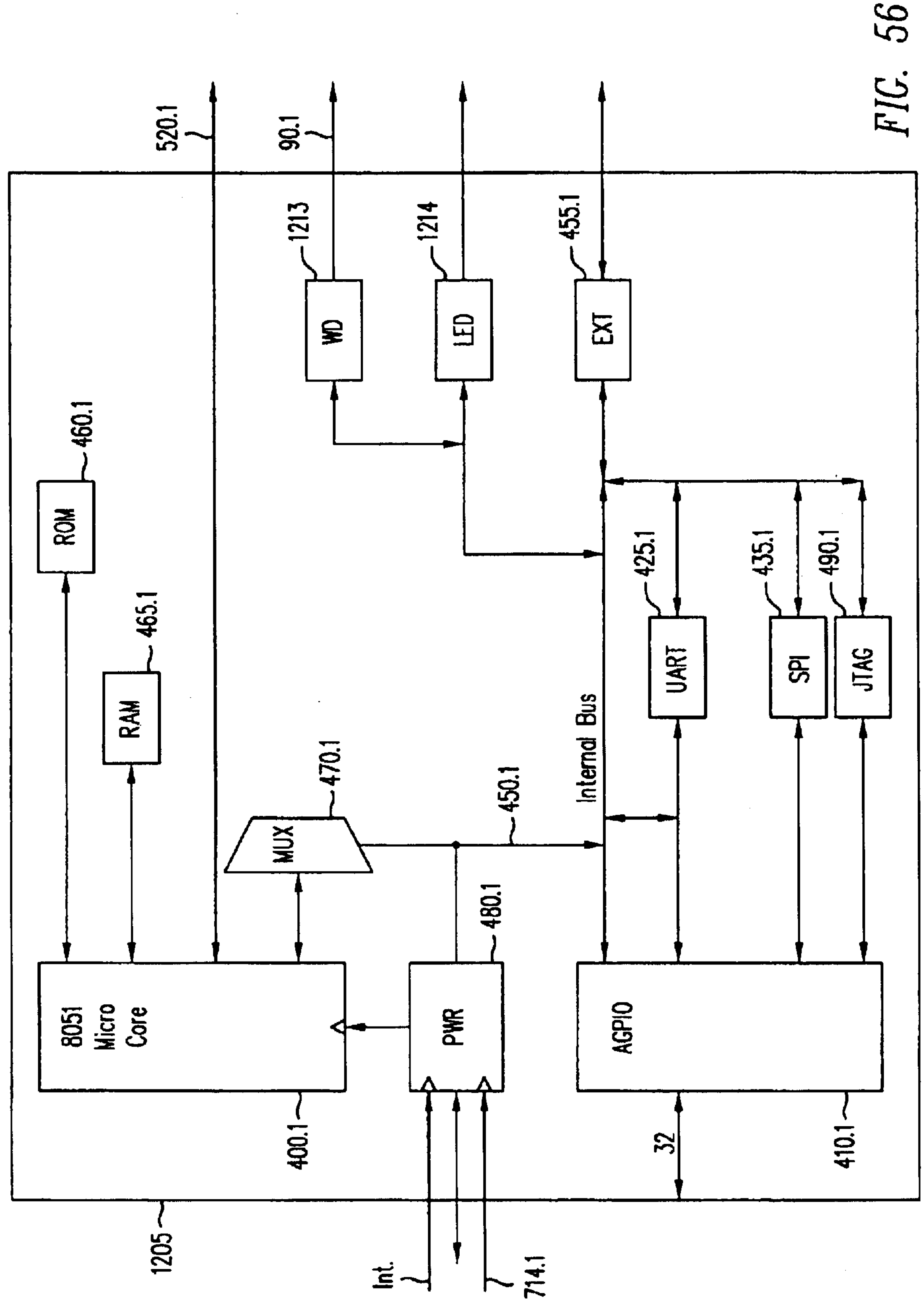

Referring to FIG. 56, an exemplary embodiment for central processing module (SYS) 1205 comprises a microprocessor core 400.1 such as an 8051 which interfaces with external hosts through an Advanced General Purpose I/O (AGPIO) module 410.1. ADGPIO module 410.1 provides 31 GPIO ports that may be individually configured to suit a host application's needs, such as the ability to determine power supply status, an 8×8 keyboard interface, and a serial communication bus for communication with a host device.

Such serial communication with a host device may occur using a number of signaling protocols as selected by a serial multiplexer 420.1. For example, serial data may be received from a universal asynchronous receiver/transmitter (UART) 425.1, an SPI receiver/transmitter 435.1, or a JTAG receiver/transmitter 440.1. Additional serial devices could also be used such as Microwire, I2C, or SSI2 devices. Microprocessor core 400.1 communicates with the serial device selected by serial multiplexer 420.1 on an internal bus 450.1.

A data-path multiplexer 470.1 multiplexes the data on a read data path in internal bus 450.1 to select data from different sources such as LED controller 1214 and watchdog controller 1213. In addition, microprocessor core 400.1 may receive data from and store data to the non-volatile memory module 1216 (FIG. 12) through an external interface 455.1 coupled to internal bus 450.1. As described further herein with respect to watchdog controller 1213 and LED controller 1214, microcontroller 400.1 also interfaces with these modules through internal bus 450.1.

Data necessary for program execution on microprocessor core 400.1 may be stored in a program memory device 460.1. Program memory device 460.1 may be any technology suitable for program storage and execution, such as masked ROM, Flash memory, EEPROM, or other suitable media. Microprocessor core 400.1 may also store data in a RAM 465.1 or in a non-volatile memory module 1216 (FIG. 12). Microprocessor core 400.1 communicates with other modules such as regulation control module (REG) 1204 in switching power supply controller 1200 through internal bus 520.1, which is also illustrated and discussed with respect to regulation control module (REG) 1204 in FIG. 12. A handshaking protocol or glue logic may be used to coordinate this communication. The outgoing data is addressed to a particular module in a memory-mapped fashion or by SFR-mapped addresses.

Microprocessor core 400.1 is clocked by clock signal 714.1 received from clock generation module 1223. However, because the regulation from DPC frame to DPC frame during normal operation is under the control of regulation control module (REG) 1204, it would be a waste of power to have microprocessor 400.1 clocked continuously by clock 714.1 during normal operation. Thus, clock 714 is gated off during normal operation y the microprocessor when the microprocessor has completed any processing that is needed. In response to interrupts from other modules such as watchdog controller 1213 or LED controller 1214, the power management module 480.1 allows microprocessor core 400.1 to receive clock 714.1. Once the interrupt has been serviced, clock 714.1 is once again gated off by the microprocessor core 400.1.

Section 1.2.2 Control Loops/algorithms

Figure 25:
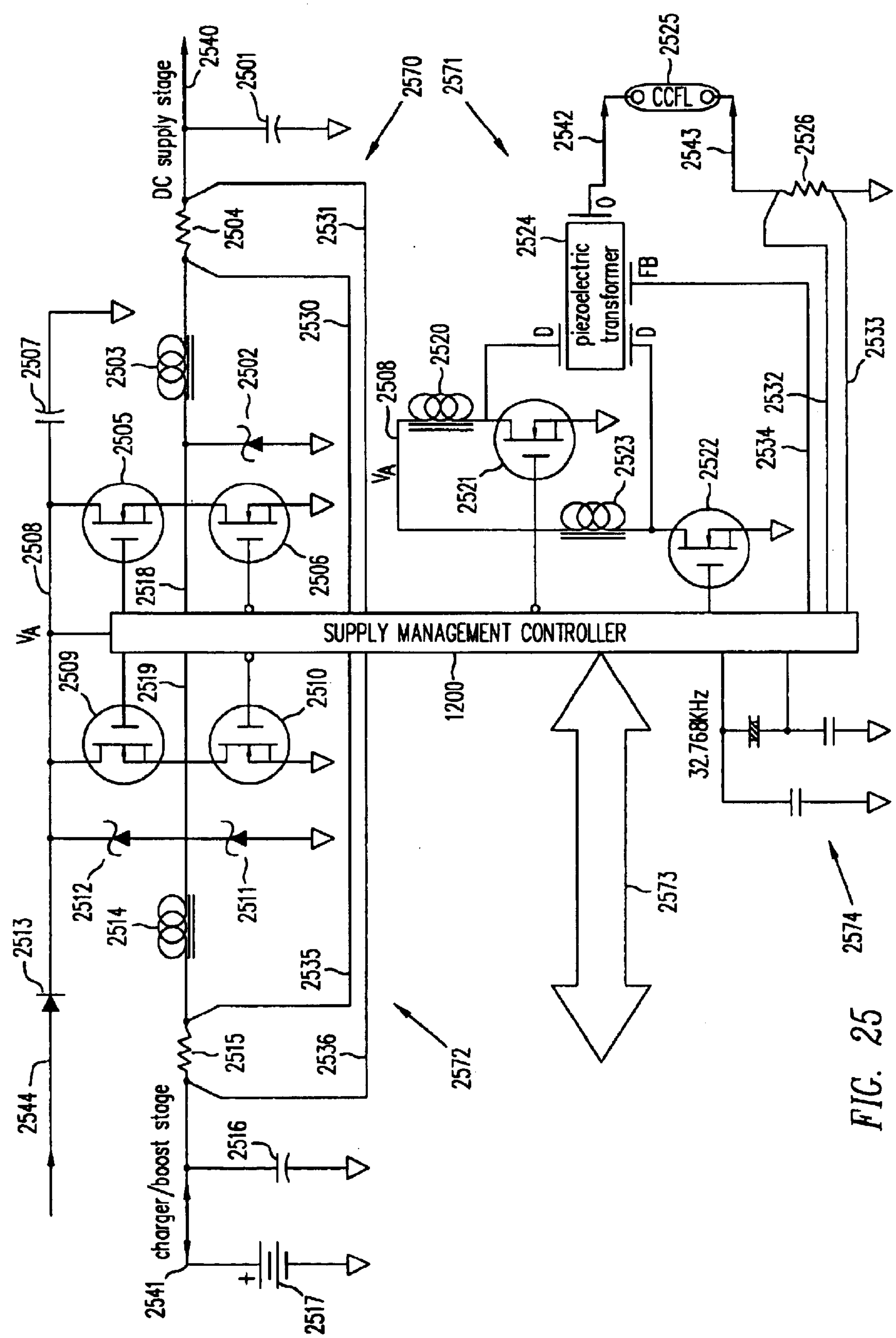
FIG. 25 is a diagram showing switching power supply controller 1200 being used in a battery and power supply management application in, for example, a personal digital assistant (PDA).

FIG. 25 is a diagram of switching power supply controller 1200 being used in a battery and power supply management application in, for example, a personal digital assistant (PDA). As shown in FIG. 25, switching power supply controller 1200 (a) regulates buck converter 2570 to provide a regulated DC power supply at terminal 2540, (b) regulates DC/AC converter 2571 to provide an AC power supply between terminals 2542 and 2543, (c) to charge battery 2517 through converter 2572, operating either in buck or boost mode, when an external DC supply voltage (e.g., 12–15 volts) is available at terminal 2544, and (d) to draw power from battery 2517, operating in boost mode, when the external DC supply voltage at terminal 2544 is not available. In a PDA application, for example, switching power supply controller 1200 may communicate with a host processor and peripheral devices over data interface 2573. Conventional reference oscillator circuit 2574 provides a 32.768 KHz reference clock signal for switching power supply controller 1200.

Even though specific converter configurations are shown in FIG. 25 to illustrate the exemplary embodiments described herein, one skilled in the art would appreciate that the present invention is not so limited. Other converter configurations can be implemented within the scope of the present invention based upon this detailed description. In FIG. 25, buck converter 2570 includes inductor 2503, current-sense resistor 2504, output capacitor 2501, and MOS switches 2505 and 2506 (which includes intrinsic diode 2502) receiving at their respective gate terminals the pulse-width modulated drive signals ("upper_FET gate" and "lower_FET_gate") from switching power supply controller 1200.

Figure 22:
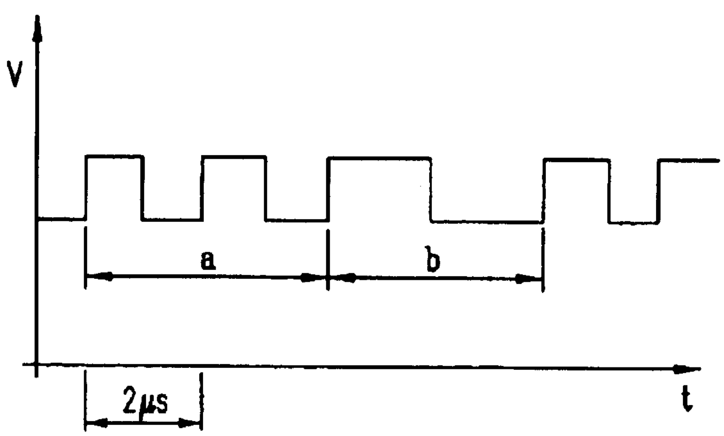
FIG. 22 illustrates a method under the present invention for estimating the parasitic resistance of an MOS switch.

Inductor 2503, current-sense resistor 2504 and output capacitor 2501 are connected in series between sense input terminal 2518 of switching power supply controller 1200 (one of the "upper_FET_source_sense" terminals), which is connected to the source terminal of MOS switch 2505, and a ground reference. Diode 2502 prevents the voltage at sense input terminal 2518 from dropping below a predetermined voltage (e.g., approximately 1 volt) less than the ground reference. The drain terminal of MOS switch 2505 is connected to one of two supply terminals ("Supply A" or "Supply B") of switching power supply controller 1200. The drain and source terminals of MOS switch 2506 are connected respectively to the sense input terminal 2518 and the ground reference. The regulated output voltage is taken from the ungrounded terminal 2540 of output capacitor 2501. This regulated output voltage is determined by the duty cycle of the pulse-width modulated signals received at the gate terminals of MOS switches 2505 and 2506. In one implementation, the period of the pulse-modulated signals (also referred to as a "cycle") is two microseconds, as shown in FIG. 22.

The terminals of current-sense resistor 2504 are connected to sense input terminals 2530 and 2531 (one terminal from each of the "sense_I" and "sense_VI" buses) of switching power supply controller 1200. The voltage ($V_{out}$–$V_{IL}$) across these sense input terminals is proportional to the current in inductor 2503.

External DC power can be provided to supply terminal 2508 of the system from terminal 2544. In converter 2572, diodes 2511, 2512 and 2513 are configured to ensure that power flows only from the external power source into the system, and to prevent the voltage at supply terminal 2508 from going below a predetermined voltage (i.e., the forward bias voltage of the diode) less than the ground reference. In converter 2572, conductor 2514, sense-resistor 2515 and capacitor 2516 are connected in series between sense terminal 2519 of switching power supply controller 1200 (one of the "upper_FET_source_sense" terminals) and a ground reference. The ungrounded terminal of capacitor 2516 is connected to the positive terminal of battery 2517. MOS switches 2509 and 2510 receive pulse-width modulated drive signals at their gate terminals. The drain and source terminals of MOS switch 2509 are connected respectively to power supply terminal 2508 and sense terminal 2519. The drain and source terminals of MOS switch 2510 are connected respectively to sense terminal 2519 and the ground reference. When an external power source is connected at terminal 2544, the pulse-width modulated drive signals at the gate terminals of MOS switches 2509 and 2510 regulate the voltage and current for charging battery 2517. Alternatively, i.e., when an external power source is not connected at terminal 2544 and the system runs from power supplied by battery 2517, the pulse-width modulated signals at the gate terminals of MOS switches 2509 and 2510 regulate the voltage at power supply terminal 2508. Depending on whether the voltage supplied by battery 2517 is higher than the desired voltage at terminal 2508, converter 2572 is operated as a buck or boost converter.

The terminals of current-sense resistor 2515 are connected to sense input terminals 2535 and 2536 (one terminal from each of the "sense_I" and "sense_VI" buses) of switching power supply controller 1200. The voltage ($V_{out}$–$V_{IL}$) across these sense input terminals is proportional to the current in inductor 2514.

DC/AC converter 2571 provides a high voltage AC power supply (e.g., 700 volts) for cold-cathode fluorescent lighting (CCFL) used as back-lighting in a PDA. In converter 2571, MOS switches 2521 and 2522 alternatively connect inductors 2520 and 2523 to the ground reference. Inductors 2520 and 2523 are each connected between power supply terminal 2508 and the drain terminal of one of MOS switches 2521 and 2522 respectively. The voltages at these drain terminals control piezoelectric transformer 2524 to provide the requisite AC signal across terminals 2542 and 2543 of CCFL 2525. Terminal 2543 is connected to the ground reference through sense-resistor 2526.

Section 1.2.2.1 Input Voltage/output Current Predictive Control Loop

The terminals of current-sense resistor 2526 are connected to sense input terminals 2532 and 2533 (one terminal from each of the "sense_I" and "sense_VI" buses) terminals of switching power supply controller 1200. The voltage across these sense input terminals is proportional to the current in CCFL 2525. The pulse-width modulated signals at the gate terminals of MOS switches 2521 and 2522 regulate the power supplied to CCFL 2525.

Figure 19:
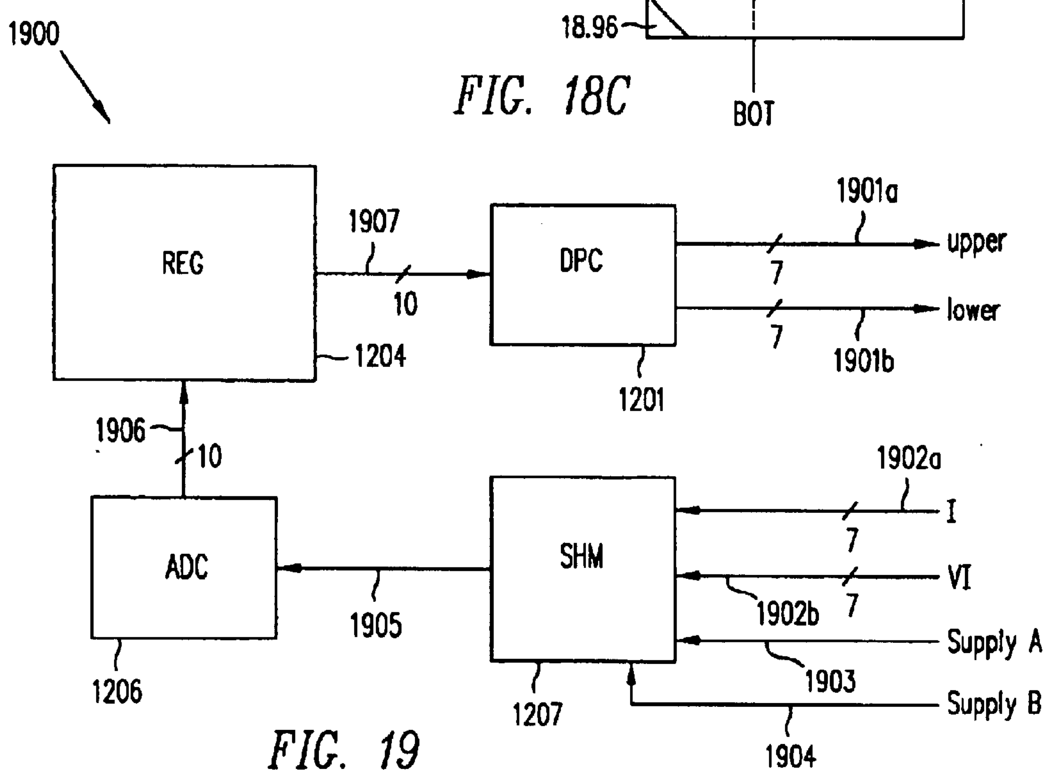
FIG. 19 is a block diagram summarizing the modules in switching power supply controller 1200, providing a control loop for a battery or power supply management application.

As can be seen from the above description, each of converters 2570, 2571 and 2572 is regulated by a pair of pulse-width modulated drive signals (one from each of "upper FET_gate" and "lower_FET_gate" groups of signals). These signals are preferably non-overlapping (i.e., these signals are not both at a high voltage at the same time). For each converter, regulation is based on a control loop receiving input signals representing the values of the controlled variables. FIG. 19 is a block diagram summarizing the modules in switching power supply controller 1200 providing a control loop for a battery or power supply management application. As shown in FIG. 19, digital to pulse converter module 1201 receives from regulation control module (REG) 1204 a 10-bit value, representing the duty cycle of a pulse-width modulated drive signal and accordingly provides one of seven pairs of pulse-width modulated drive signals 1902*a* and 1902*b*. Pulse-width modulated drive signals 1902*a* and 1902*b* are driven by NFET driver module 1202 (not shown in FIG. 19) as the upper_FET_gate and lower_FET_gate signals from switching power supply controller 1200. At the same time, seven pair of voltage signals 1902*a* and 1902*b* (i.e., I[0:6], VI[0:6]), each pair representing the voltages across the terminals of a sense-resistor, are received into sample and hold module 1207. In addition, the voltages at the two external power supply terminals 1903 and 1904 (i.e., Supply A and Supply B) are also received into sample and hold module 1207. In turn, each of these analog voltage signals is sampled and held for conversion by analog to digital converter 1206, which provides regulation control module (REG) 1204 a 10-bit digital value for each voltage converted. Regulation control module (REG) 1204, which implements a number of methods applicable to the control loop, provides digital to pulse conversion module 1201 the appropriate 10-bit value on bus 1907. Of course, the number of bits to be used for each voltage converted value is a matter of design choice depending upon, for example, the resolution required in the control loop. In fact, within regulation control module (REG) 1204, computation may be carried out at a higher resolution than 10-bits and residual values less than the 10-bit resolution may be kept for multiple cycles to implement specific, higher accuracy control methods.

Section 1.2.2.2 Stored External Component Parameters

For each battery or power supply management application, regulation control module (REG) 1204 receives the power supply voltage $V_A$ (e.g., voltage at terminal 2508), the regulated output voltage $V_{out}$ at one terminal of the current-sense resistor (e.g., voltage at terminal 2531), and the voltage $V_{IL}$ at the other terminal of the current-sense resistor (e.g., terminal 2530). A circuit model of converter 2570 is provided in FIG. 57.

Figure 57:
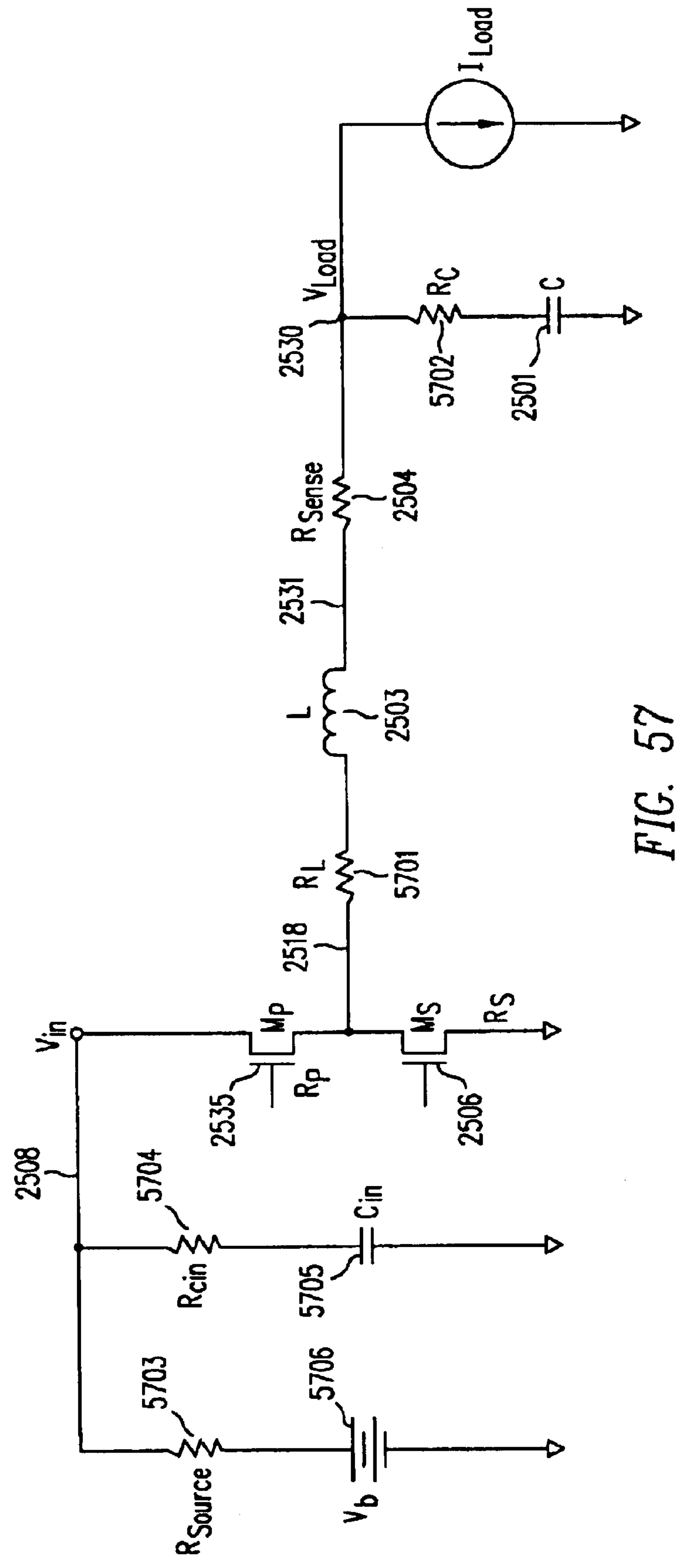

As shown in FIG. 57, the current $I_L$ in the inductor of a buck or boost converter can be determined by the voltage drop across the current-sense resistor 2504 (i.e., $V_{out}$–$V_{IL}$) divided by its resistance $R_{sense}$. Regulation is achieved based upon the measured voltage values received and quantities derivable from these received values. For example, the present invention allows regulation using an input voltage at terminal 2508 (e.g., the power supply voltage $V_A$) and an output current (e.g., current $I_L$ in resistor 2504) as control parameters.

Figure 26:
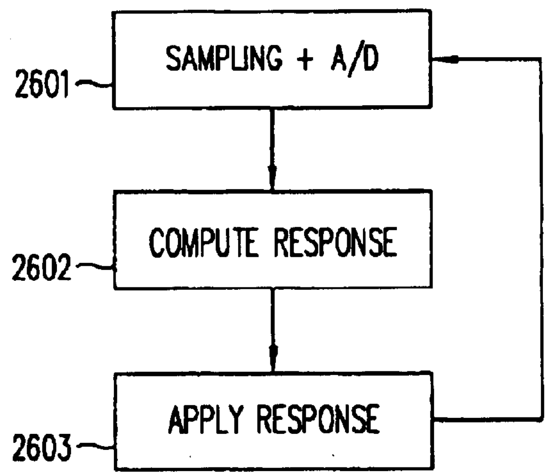
FIG. 26 illustrates the operation of a control loop in accordance of the present invention.

FIG. 26 illustrates the operation of a control loop in accordance with the present invention. As shown in FIG. 26, such a control loop includes three phases. At the beginning of a control cycle or cycle, which is a 2 microsecond time period in one implementation, the values of controlled variables (e.g., output voltages) are sampled and digitized in phase 2601. Based on these input values, parametric values and an appropriate response (e.g., an increase or a decrease in the value of a controlled variable) are computed at phase 2602. The response (e.g., an increase or a decrease in the duty cycle of the drive signals to the MOS switches) is then applied to effectuate the changes in the controlled variables.

Referring back to FIG. 57, if one takes the parasitic resistances or impedances of the converter into account, a voltage drop $V_p$ can be attributed, for example, to the parasitic resistances $R_{on}$ and $R_L$, where $R_{on}$ is the "on" resistance of one of the MOS switches (e.g., MOS switch 2505 or 2506) and $R_L$ is the parasitic series resistance in the inductor (e.g., inductor 2503). The parasitic resistor $R_{on}$ is not shown in FIG. 57, and the parasitic resistor $R_L$ is shown as resistor 5701 in FIG. 57.

As discussed above, the current $I_L$ in the inductor can be obtained by $(V_{out}-V_{IN})$ divided by $R_{ON}+R_L$.

Voltage $V_p$ can be approximated using a method discussed below. In addition, a parasitic resistance $R_c$ (represented by resistor 5702 in FIG. 57) can be attributed to the parasitic series resistance in the output capacitor (e.g., output capacitor 2501). Since the actual inductance L of a commercially available coil may be more than 10% different from its nominal inductance value, and may vary significantly over the life of the inductor, a method according to the present invention allows an accurate inductance value of the inductor to be calculated periodically or on power-up. The present invention also provides a method, described below, for calculating the output capacitance C of capacitor 2501.

Figure 20:
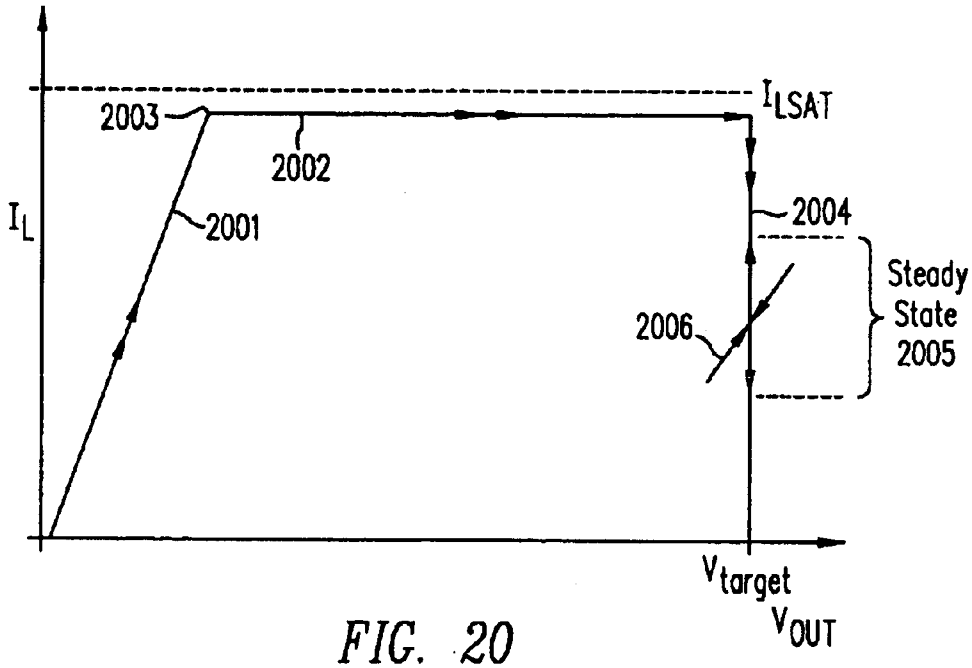
FIG. 20 illustrates regulation of output voltage Vout using inductor current IL and sensing output voltage Vout, according to one embodiment of the present invention.

According to one embodiment of the present invention, regulation of the output voltage $V_{out}$ may be carried out in the manner illustrated in FIG. 20. The regulation method illustrated in FIG. 20 recognizes that an inductor has a saturation current $I_{LSAT}$, beyond which the inductor becomes resistive (i.e., the additional current results in energy dissipated as heat and not additional energy being stored in the inductor). Initially, both output voltage $V_{out}$ and inductor current $I_L$ are zero. As shown in FIG. 20, the control method of the present invention initially provides a duty cycle in the pulse-width modulated drive signals to the MOS switches (e.g., close to 100%) that increases the current in the inductor at the highest rate until the inductor current reaches a predetermined value of the saturation current $I_{LSAT}$ (e.g., 95% of $I_{LSAT}$). During this time, the inductor current charges both the magnetic field in the inductor and the electric field of the output capacitor (e.g., capacitor 2501), so that the inductor current and output voltage increase along the current/voltage segment 2001. When the inductor current reaches the predetermined current value, as indicated by point 2003, the method of the present invention reduces the duty cycle of the pulse-width modulated drive signals to the MOS switches sufficiently to maintain the inductor current at that level, so that substantially all of the energy transferred by the inductor current is provided to charge the output capacitor. In this portion of the control method, the inductor current and the output voltage follows current/voltage segment 2002. When the output voltage reaches the control target voltage $V_{target}$, the control method further reduces the duty cycle such that the energy transferred by the inductor current is substantially dissipated in the load ($R_{load}$) and the parasitic impedances in the converter. Regulation controls the MOS switch drive signals such that the inductor current $I_L$ and output voltage $V_{out}$ follows current/voltage segment 2004 to an equilibrium value within zone 2005.

In some embodiments, when the load is operating in a very low power mode, the duty cycle of the MOS switch drive signals necessary to maintain output voltage $V_{out}$ within a selected range 2005 centered at $V_{target}$ ("controlled interval") may tall below a minimum value. In that instance, regulation proceeds to an "intermittent" or "cycle skipping" mode in which a pulse may not be sent in each 2 microsecond cycle. Instead, a pulse of fixed duration is sent in the MOS switch drive signals once every two or more cycles, such that the duty cycle averaged over the two or more cycles achieves the duty cycle necessary to maintain the output voltage within the controlled interval.

Subsequently, any power requirement change in a load operation (e.g., switching on backlighting), would result in a fluctuation in output voltage $V_{out}$. The control method adjusts the duty cycle of the MOS switch drive signals to restore the output voltage $V_{out}$ to the regulated voltage $V_{target}$ along current/voltage segment 2006.

Recalling that the voltage across inductor 2503 is given by:

$$L\frac{di}{dt} \cong L\frac{\Delta I}{\Delta t} \cong V_{IL} - V_{in},$$

and because along current/voltage segment 2001 the change in current ΔI in inductor 2503 can be approximated by the change in voltage drop $\Delta(V_{out}-V_{IL})$ across sense-resistor 2504 divided by its resistance $R_{sense}$ over a 2 microsecond cycle (Δt), a first order approximation of the inductance L of inductor 2503 can be thus calculated. Similarly, since the change in output voltage $\Delta V_{out}$ over a 2 microsecond frame (ΔI) is given by $$\frac{dV_{out}}{dt} \cong \frac{\Delta V_{out}}{\Delta t} = \frac{I}{C},$$

and because, along current/voltage segment 2002, the voltage drop $(V_{IL}-V_{in})$ across inductor 2503 is approximately zero $$\left(i.e,\ L\frac{di}{dt} \cong L\frac{\Delta I}{\Delta t} \cong 0\right)$$

and the current I is given by the voltage $(V_{out}-V_{IL})$ across sense-resistor 2504 divided by its resistance $R_{sense}$, capacitance C can also be calculated under no-load conditions, or the combined capacitance of C and $C_{LOAD}$. During the same time interval, the parasitic resistance $R_L$ of inductor 2503 can be approximated from the current $I_L$ and the small voltage drop $(V_{IL}-V_{in})$ across inductor 2503 by $(V_{IL}-V_{in})/I_L$.

Other control parameters can be similarly calculated. For example, in a buck converter, the efficiency E at any given time is given by $$E = \frac{V_{out}}{V_{in}D},$$

where D is the duty cycle of the MOS switch drive at the current time. Efficiency E can be updated at the beginning of each cycle.

Figure 21:
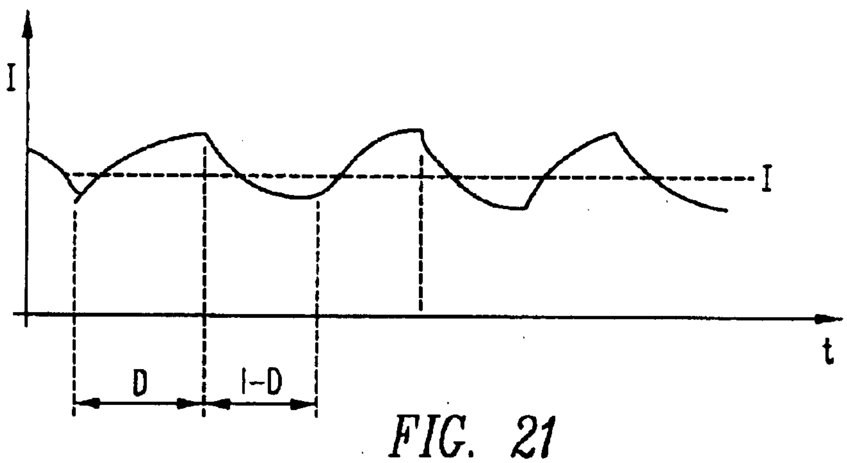
FIG. 21 illustrates the approximation of a weighted average inductor current by duty cycle.

At operating point 2005, before the load is applied, the ripple voltage at the output and the parasitic series resistance $R_C$ of the output capacitor can be approximated using the ratio of the ripple output voltage divided by the average inductor current, which is determined by calculating a weighted average of the maximum and minimum inductor currents over a 2 microsecond cycle. The maximum and minimum inductor currents are obtained by the difference in the maximum and minimum voltage drop ($V_{out}$–$V_{IL}$) across current-sense resistor 2504, sampled respectively immediately prior to MOS switch 2505 opening and closing, respectively. The weighted average of the maximum and minimum currents is calculated by weighting the maximum and minimum currents by the duty cycle D. In other words, as illustrated in FIG. 21;

$$\bar{I}_L = \frac{D(V_{out} - V_{IL})_{\max} + (1 - D)(V_{out} - V_{IL})_{\min}}{2}$$

The parasitic series resistance $R_C$ of the output capacitor can be approximated by the difference $\Delta V_{out}$ of the output voltage ripple, divided by the average current $\bar{I}_L$, or $$R_C = \frac{\Delta V_{out}}{\bar{I}_L},$$

where $\Delta V_{out}$–$V_{out\ min}$).

In the controlled interval 2005, while the inductor current is approximately constant, the voltage drop between the input voltage $V_{in}$ and the voltage $V_{IL}$ 2530 at the common terminal of the inductor and the current-sense resistor 2504 represents the voltage drop across the parasitic resistance of one of MOS switches 2505 and 2506 and the parasitic series resistance of inductor 2503.

The efficiency loss due to switching at an MOS switch can be approximated using data obtained from a temporary change in the pulse-modulated MOS switch drive signals. This temporary change is illustrated in FIG. 22. FIG. 22 shows a pulse-modulated MOS switch drive signal over two intervals A and B of equal durations and equal duty cycles. (Although FIG. 22 shows interval A to be only two cycles wide, in practice, the number of cycles in each interval should be a higher number to increase accuracy.) However, the on-portion of each cycle in interval A is is shorter than the on-portion of each cycle in interval B, so that the number of on-pulses in interval A is much higher than the corresponding number of on-pulses in interval B for the same duty cycle. Thus, any difference in efficiencies in the converter between these intervals can be attributed to switching losses in the MOS switches due to each switch's parasitic impedances. Any difference $\Delta V_{out}$ in the output voltage is dissipated across the parasitic resistance $R_p$, which is the sum of resistance $R_{on}$ and the resistance $R_L$ of inductor 2501. $R_p$ can therefore be estimated by $$R_p = \frac{\Delta V_{out}}{\bar{I}},$$

where $\bar{I}$ is the average current over intervals A and B.

FIG. 57 also shows input filter capacitor 5705 which has a parasitic resistance $R_{cin}$ (represented by resistor 5704), and an input power supply (represented by battery 5706) having a parasitic resistance $R_s$. (represented by resistor 5703).

Section 1.2.2.3 Absolute Value Power Supply Control Loop, Including Using Control Dead Band and Variable Gain The calculated parameter values, including the inductance, the output capacitance and the parasitic resistances, can be used to implement the control methods. In the prior art, power regulation is usually provided by an adaptive feedback mechanism in which the corrective change in pulse-width modulation is a linear function of the error. The error is the difference between the actual and target values of the controlled variable which, in this instance, is the regulated output voltage $V_{out}$. Under one method, called the "PID", method, the feedback correction is a "proportional feedback" represented by a linear sum of constant multiples of the error, a derivative of the error, and an integral of the error. In such a PID adaptive system, the system function H'(s) of an adaptive system is given by:

$$H'(s) = \frac{H(s)}{1 - \left(k_1 + k_2 s + \frac{k_3}{s}\right)H(s)},$$

where $k_1$, $k_2$, $k_3$ are constants and H(s) is the open-loop system function. In most systems, because the error is small, the feedback correction is dominated by the integral of the error, and it may take a large number of cycles to restore the regulated voltage to $V_{target}$. According to the present invention, however, a predictive technique is used. Under a predictive technique, the amount of correction is obtained by calculating an estimated restorative change in the control parameters (e.g., duty cycle input) that is needed to correct the error.

Figure 23:
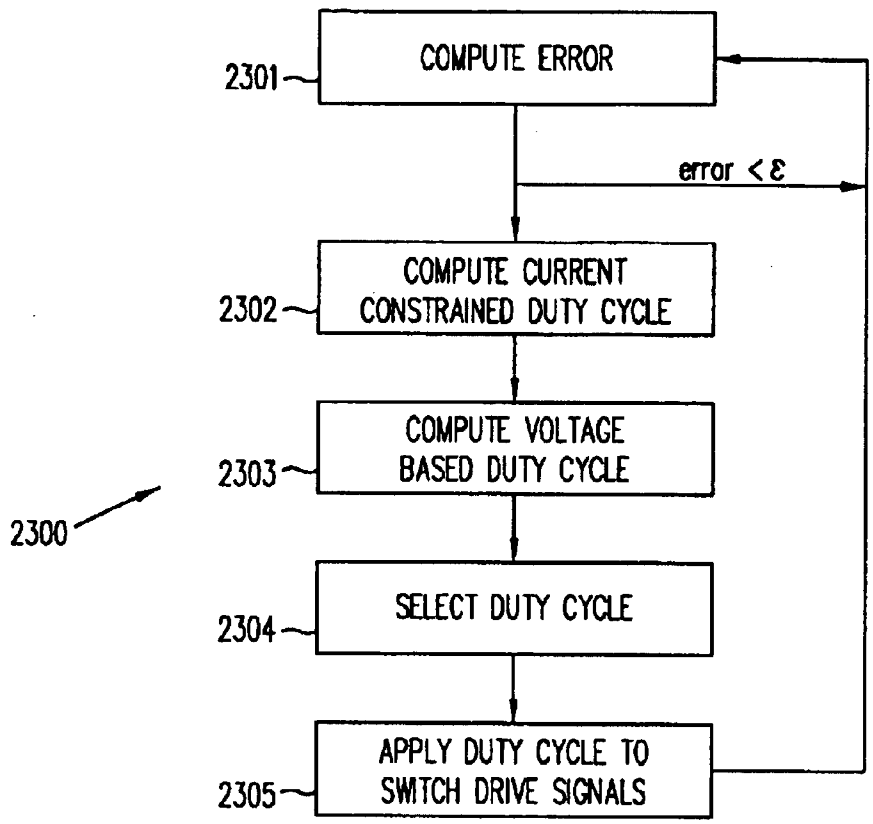
FIG. 23 shows flow diagram 2300, illustrating a control method according to one embodiment of the present invention.

A control method according to one embodiment of the present invention is illustrated by flow diagram 2300 of FIG. 23. As shown in FIG. 23, at step 2301, the control method examines an output voltage error value, which is given by error=$V_{out}$–$V_{target}$. If the error value is less than a predetermined threshold value ("dead band"), no adjustment is deemed necessary, and the method returns to step 2300. Otherwise, i.e., if the value of error exceeds the threshold, a current-constrained duty cycle $D_i$ is computed at step 2302. Current-constrained duty cycle $D_i$ represents the duty cycle that would bring the inductor current $I_L$ to within a predetermined offset (e.g., 0 amps) of its saturation value $I_{LSAT}$. As explained above, the control method should not drive MOS switches 2505 and 2506 beyond this duty cycle.

Current-constrained duty cycle $D_i$ satisfies the equation:

$$L\frac{dI_L}{dt} \cong L\frac{(I_{LSAT} - I_L)}{D_i T} \cong V_L = (V_{out} - V_{in} - V_p),$$

where $V_L$ is the voltage across inductor 2503, T is the cycle duration, and $V_p$ is the total voltage drop across the parasitic resistances of inductor 2503 and MOS switch 2505 and the resistance of current-sense resistor 2504. The expression $$\frac{(I_{LSAT} - I_L)}{D_i T}$$

represents the approximate rate of change of inductor current necessary to bring the inductor current $I_L$ to saturation current $I_{LSAT}$ over the time period $D_i$T (i.e., when the drive signal of MOS switch 2505 is "on". Solving this equation, we obtain the current-constrained duty cycle $D_i$:

$$D_i = \frac{L}{T(V_{out} - V_{in} - V_p)}(I_{LSAT} - I_L) \cong K(I_{LSAT} - I_L),$$

where we have defined K to be the value $$\frac{L}{T(V_{out}-V_{in}-V_p)}.$$

Observing that the product of K and inductor current $I_L$, provides the duty cycle, the value of K is temporary stored and reused without recomputation for calculating the voltage-based duty cycle $D_v$, which is calculated next in step 2303.

Voltage-based duty cycle $D_v$ is the duty cycle that is necessary to correct for the output voltage $V_{out}$ by the value of error (i.e., bringing the output voltage $V_{out}$ to the target voltage $V_{target}$), without regard for the increase in inductor current $I_L$. For a given efficiency B, the nominal duty cycle $D_{nom}$ necessary for providing an output voltage of $V_{target}$ is given by $$D_{nom}=\frac{V_{target}}{V_{in}*E}.$$

The voltage-based duty cycle $D_v$ is the sum of nominal duty cycle $D_v$ and an adjustment $\Delta D_v$ to this nominal duty cycle.

Using the equation derived above for the parasitic series resistance $R_C$ of the output capacitor, the additional current $\Delta I_L$ needed to correct for the value of error is given by:

$$\Delta I_L=-\frac{error}{R_C},$$

and the incremental change $\Delta D_v$ in duty cycle $D_v$ is given $$\Delta D_V=K\Delta I_L=-\frac{K*error}{R_C}.$$

Thus, voltage-based duty cycle $D_v$ is given $$D_V=D_{nom}+\Delta D_V=D_{nom}-\frac{K*error}{R_C}.$$

At step 2304, the lesser one of the current-constrained duty cycle $D_i$ and the voltage-based duty cycle $D_v$ is selected, so that the resulting duty cycle does not provide a current exceeding the inductor saturation current $I_{LSAT}$. In some embodiments, this selected duty cycle also cannot fall below a predetermined minimum. The selected duty cycle is then applied to the MOS switch drive signals. The drive signals for the primary MOS switch (i.e., MOS switch 2505 connecting the power supply voltage to the inductor) and the secondary MOS switch (e.g., MOS switch 2506) are made non-overlapping. Control method 2300 returns to step 2301.

According to another embodiment of the present invention, a control algorithm seeking to restore the converter back to equilibrium operation can be implemented. Equilibrium is achieved when the following conditions are met: (a) the output voltage $V_{out}$ of circuit target voltage equals the target voltage $V_{target}$, (b) the average current $\bar{I}_L$ in inductor 2503 equals the average current $\bar{I}_{load}$ drawn by the load, and (c) no change in inductor current between the DPC frames.

The algorithm uses a linear approximation of a change in inductor current over a time period that is much less than the periods of the fundamental frequencies of the converter. Within a DPC frame of duration T, the primary switch (e.g., switch 2505) is "on" (closed) for a duration $T_P$, and the secondary switch (e.g., switch 2506) is "on" (closed) for a duration $T_S$. Thus, an incremental current $\alpha_L$ results in a change in output voltage $V_{out}$. The incremental current $\Delta I_L$ can be approximated by time-weighting components incremental inductor currents $\Delta I_{L(P)}$ and $\Delta I_{L(S)}$, corresponding to the time periods in which the primary and the secondary switches are "on", respectively. $\Delta I_{L(P)}$ and $\Delta I_{L(S)}$ are given by:

$$\Delta I_{L(P)}=T_P\left(\frac{V_{in}-Vp-V_{out}}{L}\right)=T_P\left(\frac{V_{in}-I_LR_{pp}-V_{out}}{L}\right)$$

$$\Delta I_{L(S)}=T_S\left(\frac{0-V_S-V_{out}}{L}\right)=T_S\left(\frac{-I_LR_{ss}-V_{out}}{L}\right)$$

where $V_p$ and $V_s$ are the voltage drops across the resistances $R_{pp}$ and $R_{ss}$ in the current paths during durations $T_p$ and $T_s$, respectively. Referring to FIG. 57, $R_{pp}$ and $R_{ss}$ are given by:

$$R_{pp}=R_{sense}+R_L+R_p+\frac{R_{source}R_{cin}}{R_{source}+R_{cin}}$$

In one implementation, the sense resistor may be omitted (i.e., $R_{sense}=0$). In that implementation, inductor current $I_L$ is not measured but estimated. Because $$V_{out}=V_C+(I_C+\Delta I_C)R_C+\frac{\Delta V_C}{2},$$

and $$\Delta V_C=\frac{I_CT}{C},$$

is given by:

$$\Delta I_L=\frac{\frac{T_P}{T}(V_{in}-R_{pp}I_L)-\frac{T_S}{T}R_{SS}I_L-\left(V_C+I_C\left(\frac{T}{2C}+R_C\right)\right)}{\frac{L}{T}+R_C} \tag{1}$$

where $I_C=I_L-I_{load}$ Substituting $$DC=\frac{T_P}{T_P+T_s}=\frac{T_P}{T}$$

and $$(1-DC)=\frac{T_S}{T_P+T_s}=\frac{T_S}{T}$$

into equation (1) and solving for the duty cycle DC to obtain:

$$DC=\frac{\Delta I_L\left(\frac{L}{T}+R_C\right)+R_{SS}I_L+V_C+I_C\left(\frac{T}{2C}+R_C\right)}{V_{in}+I_L(R_{ss}-R_{pp})}=\frac{\Delta I_L\left(\frac{L}{T}+R_C\right)+R_{SS}I_L+V_{out}}{V_{in}+I_L(R_{ss}-R_{pp})} \tag{2}$$

Equation (2) can be used to predict a duty cycle DC that should be applied to provide a given incremental inductor current $\Delta I_L$. The incremental current to be used is selected from a number of applicable incremental inductor currents (i.e., $\Delta I_L$'s).

Figure 58:
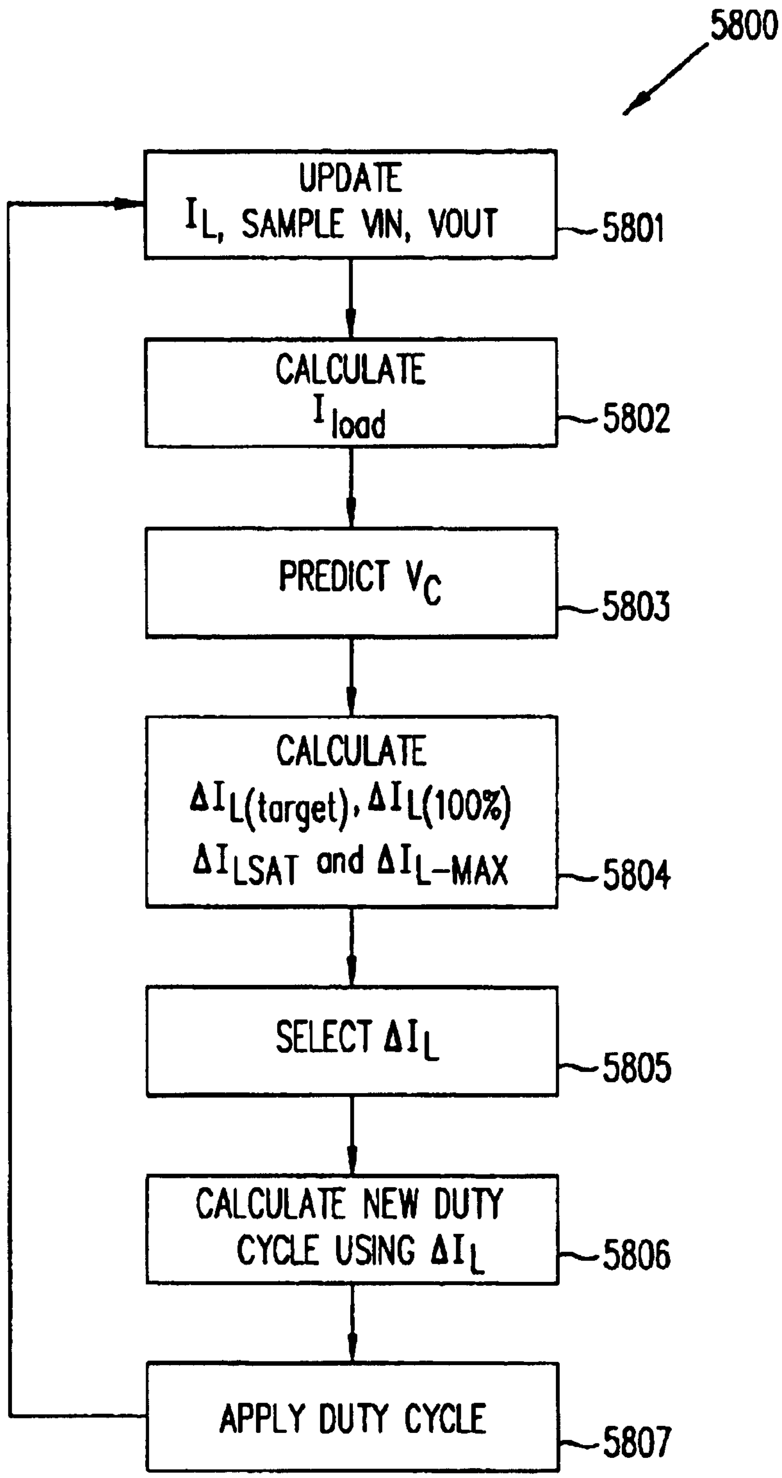

FIG. 58 is a flow chart illustrating the steps of control algorithm 5800, in accordance to with one embodiment of the present invention. As shown in FIG. 58, at step 5801, input voltage $V_{in}$ and output voltage $V_{out}$ of the power converter are sampled, and inductor current $I_L$ is estimated using equation (1):

$$I_L(t_n)=I_L(t_{n-1})+\Delta I(t_{n-1})$$

At step 5802, the load current $I_{load}$ in the current DPC frame is then calculated. The expected incremental current $\Delta I_L(t_n)$ in the present DPC frame charges capacitor 2501, raising its voltage $V_C$ by an amount $\Delta V_C$. The load current $I_{Load}$ can be estimated by:

$$I_{load}(t)_n = I_L(t_n)+\Delta I_L(t_n)-I_C(t_n)=I_L(t_n)+\Delta I_L(t_n)-\frac{C(\Delta V_{out}(t_n)-R_C\Delta I_L(t_n))}{T}$$

where $\Delta V_{out}(t_n)=V_{out}(t_n)-V_{out}(t_{n-1})$ (From this point forward, the parameter values are understood to be those of the current DPC frame, and the designation $t_n$ is dropped for clarity.)

At step 5803, the voltage on output capacitor 2501 can also be estimated, at the end of the current frame, to be:

$$V_C = V_{out} + I_C\left(\frac{T}{C} - R_C\right)$$

The change in capacitor voltage over the following DPC frame can also be estimated:

$$\Delta V_C = \frac{\Delta I_C T}{C}$$

At step 5804, a number of different incremental inductor current values can be calculated as candidates which corresponding duty cycles can be used to restore the converter towards equilibrium operation. To restore output voltage $V_{out}$ back to target voltage $V_{target}$ in the next DPC frame, assuming no further change in load current $I_{load}$, an inductor current change $\Delta I_{L(target)}$ is required $$\Delta I_{L(target)} = I_{load} - I_L + \frac{C(V_{target} - V_C - \Delta V_C)}{T}$$

However, $\Delta I_{L(target)}$ may be so large in magnitude that it requires a physically impossible duty cycle—i.e., a duty cycle that is greater than 100% or less than 0%. However, if a 100% duty cycle (i.e., $T=T_p$ and $T_s=0$) is to be applied in the next DPC frame, the incremental current $\Delta I_{L(100\%)}$ is:

$$\Delta I_{L(100\%)} = \frac{\frac{T_P}{T}(V_{in} - R_{pp}I_L) - \left(V_C + I_C\left(\frac{T}{2C} + R_C\right)\right)}{\frac{L}{T} + R_C}$$

Similarly, if a 0% duty cycle (i.e., $T=T_s$ and $T_p=0$) is to be applied in the next DPC frame, the incremental current $\Delta L_{(0\%)}$ is:

$$\Delta I_{L(0\%)} = \frac{-\frac{T_S}{T}R_{SS}I_L - \left(V_C + I_C\left(\frac{T}{2C} + R_C\right)\right)}{\frac{L}{T} + R_C}$$

Incremental current $\Delta I_{L(0\%)}$ is amount of inductor current that can be withdrawn from the converter in a DPC frame. In this instance, control algorithm 5800 computes a quantity "maximum current" $\Delta I_{L\text{-}MAX}$ that can be removed in one DPC frame to achieve $I_{load}=I_L$.

$$\Delta I_{L\text{-}MAX}=I_{load}-I_L-\Delta I_{L(0\%)})$$

Further, at any given time, the increase in inductor current is limited by the saturation current $I_{L\text{-}SAT}$ of the inductor:

$$\Delta I_{L\text{-}SAT}=I_{L\text{-}SAT}-I_L$$

Thus, at step 5805, the predictive control algorithm chooses as $\Delta I_L$ the minimum of $\Delta I_{L(target)}$, $\Delta I_{L(100\%)}$, $\Delta I_{L\text{-}MAX}$, and $\Delta I_{L\text{-}SAT}$. Plugging the chosen $\Delta I_L$ into equations 2 yields at step 5806 a duty cycle between 0% and 100%, inclusive, to correct the transient condition at the output. The duty cycle corresponding to the selected $\Delta I_L$ is the used at step 5807 to control the primary and secondary switches in the next DPC frame. The selection of $\Delta I_L$ discussed above is valid if the system is recovering from a transient caused by an increase in $I_{load}$. If $I_{load}$ is decreased a similar flow results with slight changes in 10 the equations. In this case $\Delta I_{L\text{-}MAX}=I_{load}-I_L-\Delta I_{L(100\%)})$ and $\Delta I_{L\text{-}SAT}=-I_L$.

The predictive control algorithm will now choose the maximum of $\Delta I_{L(target)}$, $\Delta I_{L(0\%)}$, $\Delta I_{L\text{-}MAX}$ and $\Delta I_{L\text{-}SAT}$.

Figure 59:
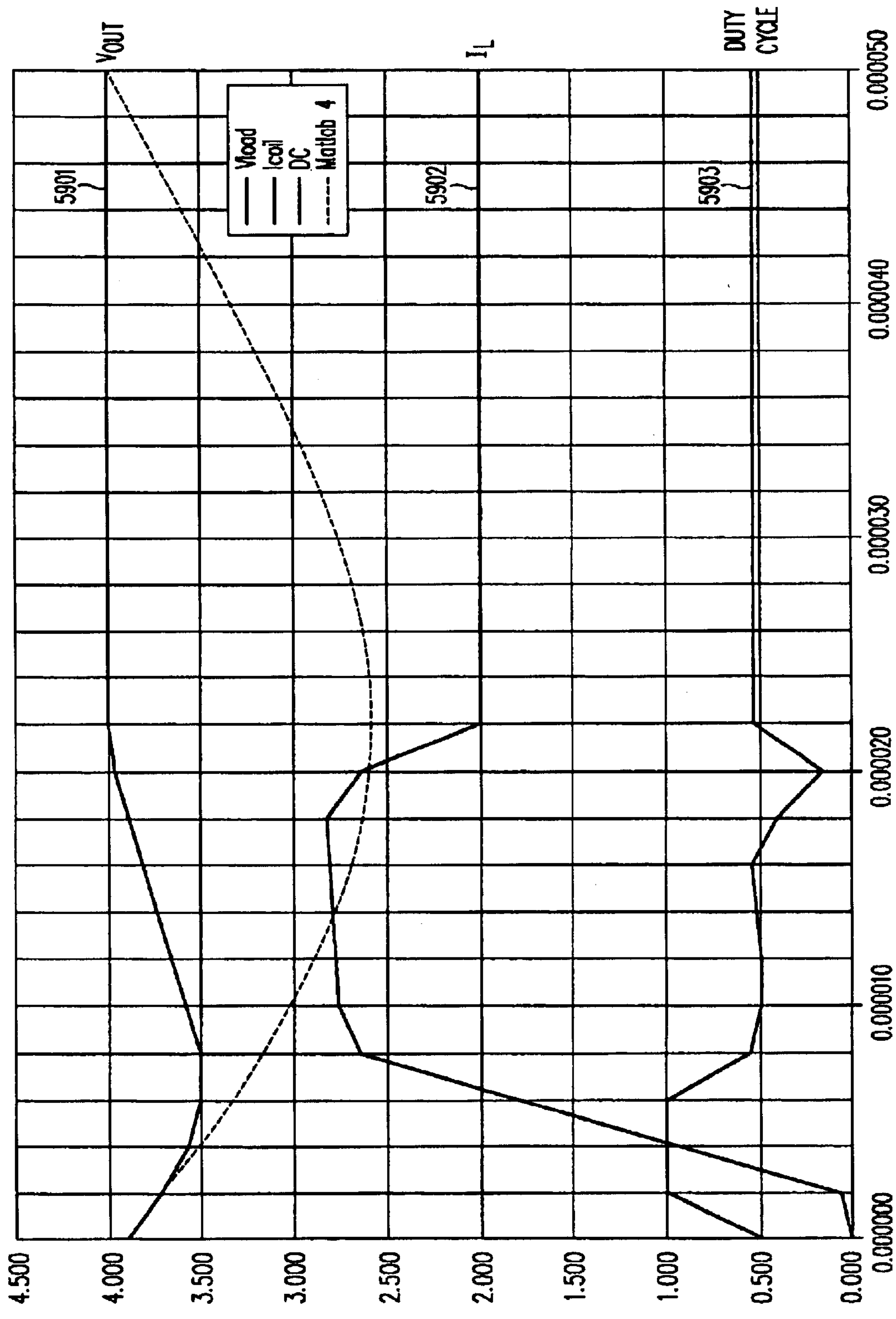

FIG. 59 illustrates the operation of control algorithm 5800 of FIG. 58. In FIG. 59, the output voltage $V_{out}$ of a power converter is shown as waveform 5901, the inductor current $I_L$ is shown as waveform 5902, and the duty cycle of the primary switch is shown as waveform 5903. Prior to time t=0, the converter operates at 50% duty cycle, the input voltage $V_{in}$ is at 8 volts, and the output voltage $V_{out}$ is at 4 volts, and the load current $I_{load}$ and the inductor current are both zero. At time t=0, a load is connected to the output terminals of the power converter, causing an increase of load current by 2 amperes. At this time, a dip in the output voltage is detected, leading to a non-zero estimate of a change in inductor current of 0.059 amperes over the inductor current of the last DPC frame (i.e., the converter deviates from equilibrium). This change in inductor current results in an estimated non-zero load current $I_{load}$ of 1.022 amperes, and an output capacitor voltage $V_c$ of 3.850 volts. In this instance, $I_{LSAT}$ is 3 amperes. To restore the converter back to equilibrium, control algorithm 5800 estimates $\Delta I_{L(target)}$, $\Delta I_{L(100\%)}$, $\Delta I_{L\text{-}max}$ and $\Delta I_{LSAT}$ to be 5.882, 0.879, 2.630 and 2.941 amperes, respectively. Thus, at time t=2 microseconds (us), 100% duty cycle is applied (corresponding to $\Delta I_{L(100\%)}=0.823$). As the estimate of the load current is low, and the correction applied is small, the sampled output voltage $V_{out}$ continues to drop.

At time t=2 us, the sampled output voltage dropped to 3.703 volts, but the estimated inductor current $I_L$ rises to 0.059+0.879=0.938 amperes, the load current is estimated to be 2.378 amperes, and the capacitor voltage is predicted to drop to 3.606 volts. As in the previous cycle, control algorithm 5800 selects a 100% duty cycle for a $\Delta I_{L(100\%)}$ of 0.870 amperes. In the next 2 cycles (t=4, 6 us), control algorithm maintains a 100% duty cycle operation to ramp the estimated inductor current $I_L$ to 2.651 amperes. At this inductor current, the sampled output voltage $V_{out}$ drops to 3.505 volts, but the inductor current $I_L$ is now sufficient to prevent further dropping.

At time t=6 us, control algorithm 5800 estimates $\Delta I_{L(target)}$, $\Delta I_{L(100\%)}$, $\Delta I_{L\text{-}max}$ and $\Delta I_{LSAT}$ to be 3.893, 0.802, 0.102, and 0.349, amperes, respectively. Thus, a duty cycle of 55.03% is selected for the next DPC frame (i.e., time t=6 us to t=8 us). At times t=8, 10, 12, and 14 us the control algorithm selects successive values of $\Delta I_{L\text{-}max}$, i.e., 0.020, 0.016, 0.017, and 0.016 amperes, respectively, corresponding to duty cycles of 51.03%, 51.79%, 52.93%, and 53.97%. At t=14 time, the sampled output voltage $V_{out}$ climbs back to 3.728 volts.

At time t=16 us, control algorithm 5800 calculates that the target voltage can be achieved with an incremental inductor current of −0.205 amperes, corresponding to a duty cycle of 40.76%. At time t=18 us, the sampled output voltage $V_{out}$ achieves 3.89 volts, and predicted to achieve 4.0 volts at the end of the DPC frame. A 14.70% duty cycle is selected to maintain the output voltage $V_{out}$ and remove inductor current to achieve the equilibrium condition that inductor current $\bar{I}_L$ equals load current $\bar{I}_{load}$. At time t=22 us, the sampled voltage $V_{out}$ achieves 4.00 volts and inductor current $\bar{I}_L$, equals load current $\bar{I}_{load}$, control algorithm 5800 selects a 52.68% duty cycle, which approaches the long term equilibrium duty cycle of 53.01%. The long term equilibrium duty cycle of 53.01% is achieved at time t=24 us. In one embodiment, a "dead band" is provided in the vicinity of the target output voltage $V_{target}$ within which the voltage output $V_{out}$ can drift uncorrected. Correction occurs when the output voltage $V_{out}$ drifts outside of the dead band. The dead band renders the regulation less susceptible to high frequency noise.

In another embodiment, a high voltage limit and a low voltage limit are provided on either side of the target voltage and the dead band. Should output voltage $V_{out}$ drift outside of the dead band, but within the band defined by the high limit and the low limit, a fixed correction amount is applied without taking regulation control module (REG) 1204 out of low power mode to restore output voltage $V_{out}$ to within the dead band. Algorithms requiring computation, such as control algorithm 5800 described above, are used only when the correction exceeds the band defined by the higher and lower limits. In this manner, power regulation can occur for a substantial amount of time under low power mode.

In another embodiment, the loop gain is made less than one (i.e., only a fraction of the value of error is corrected) and varies based upon the absolute value of error. For example, in one embodiment, for large output voltage excursions (e.g., error is greater than 0.5 volts), a higher loop gain is provided (e.g., 80%). For a smaller output deviation (e.g., less than 0.05 volts), a smaller (e.g., 20%) or zero loop gain could be used. Variable loop gain allows a quick response to large changes in the power requirements at the load, but provides higher immunity to high frequency noise for small deviations.

Section 1.2.2.4 Maximum/minimum Bounded Control Loop

In another embodiment, a minimum duty cycle, a maximum duty cycle, or both, can be provided. The minimum or maximum duty cycle limits the converter between a minimum power or a maximum power. In a system in which several converters draw power from the same power source, such as converters 2570 and 2571 shown in FIG. 25, limiting each converter to a maximum power prevents a large power excursion in one converter from interfering with the operation of another converter. For example, if a momentary large current is drawn from converter 2570 (FIG. 25), without a maximum duty cycle limit, a voltage dip may occur at power supply A (terminal 2508), which is also connected to converter 2571. A large voltage dip in power supply A may cause a transient response at converter 2571. A maximum duty cycle limit may prevent such interference. The prescribed minimum and maximum duty cycle limits can be stored in registers and made programmable by the users.

Section 1.2.2.5 Low Frequency Closed/high Frequency Predictive Control Loop

Figure 24:
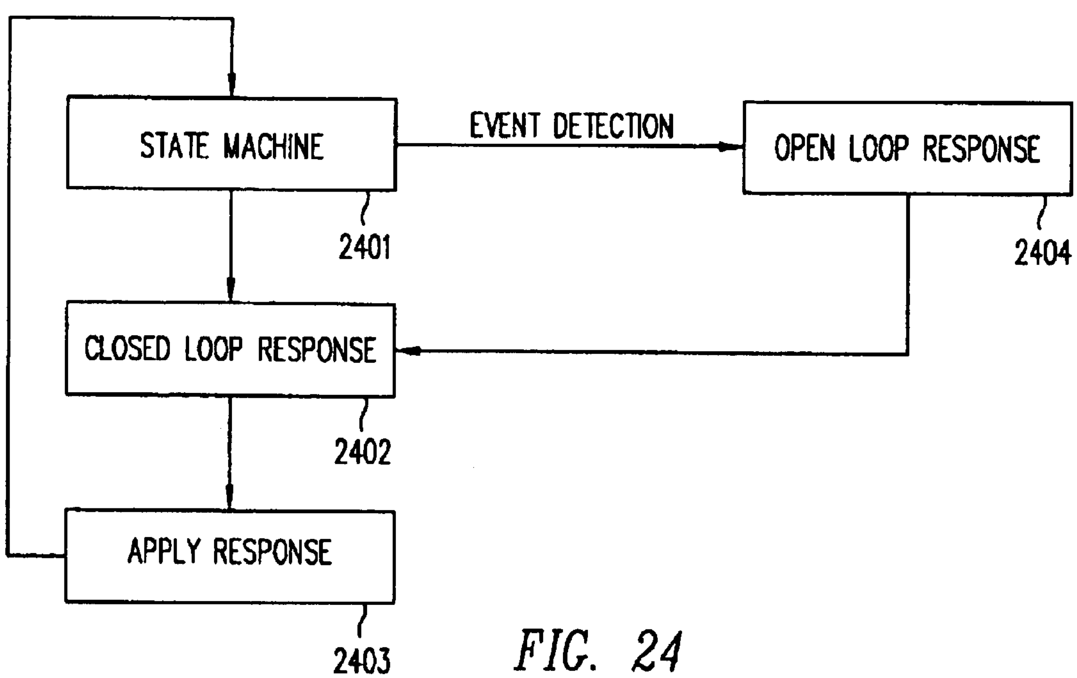
FIG. 24 illustrates a low-frequency closed loop and high-frequency open loop control method, according to one embodiment of the present invention.
Figure 27:
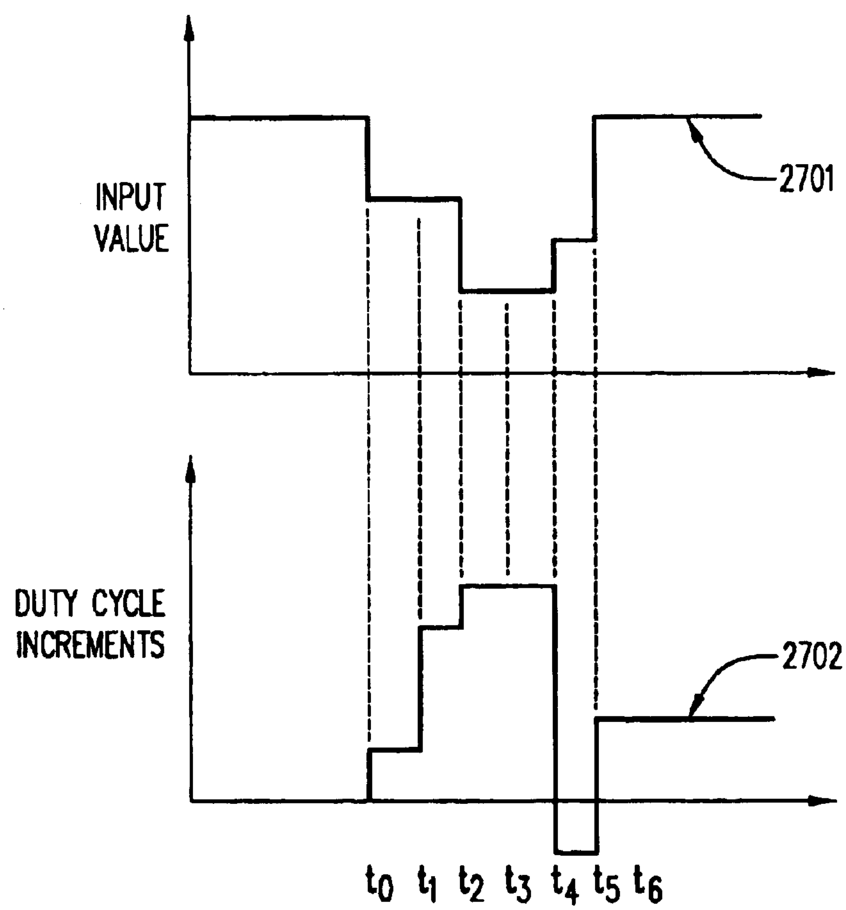
FIG. 27 illustrates the low-frequency closed loop and high-frequency open loop control method of FIG. 24, showing the signature input values of controlled variables and an open-loop response, according to one embodiment of the present invention.

As discussed above, for each cycle, sampling and digitizing input values; response computation; and response application must all be accomplished within the cycle. In one embodiment of the present invention, to allow an optimal response to be implemented without requiring an extension to the duration of the cycle to accommodate the additional computation required, a control method uses open-loop regulation for certain power events that are known and characterized a priori. For example, in a dynamic random access memory (DRAM) system, a refresh event—during which the storage cells of DRAM system are systematically read—occurs in approximately regular intervals'. For such a known power event, the power requirement ("signature") of the event and an appropriate response can be characterized and stored in memory. When the known power event occurs and is recognized, the pre-computed response can be applied in the current and subsequent cycle without recomputation (hence, "open-loop"). FIG. 24 and FIG. 27 illustrate a low-frequency closed loop and high-frequency open loop control method, according to one embodiment of the present invention.

As shown in FIG. 24, at step 2401, a state machine is provided to search for the signature of a recognized power event from the sampled input values of controlled variables. This state machine may search for a power event signature., for example, from a table of values of controlled variables stored over a moving window of several cycles. FIG. 27 shows waveform 2701, which represents a signature of a power event exhibited in the input values of a controlled variable (e.g., output voltage), occurring between time to and time $t_6$. Before a signature is recognized, the state machine selects at step 2402 a closed loop control method for power regulation, such as any of the controlled loops discussed above. For example, referring to FIG. 27, between cycle $t_0$ and cycle $t_1$, when the signature of the power event is recognized, the closed loop method is used to provide the response (in this case, an incremental change in duty cycle of the MOS switch drive signals). Thus, the portion of waveform 2702 between cycle to and cycle $t_1$—a period of perhaps several cycles—represents the response resulting from the operation of a closed loop control method. However, at cycle $t_1$, the state machine recognizes the power event, and switches the control method to the open loop control method at step 2404 for the time period between cycles $t_1$ and $t_6$. The open loop method is programmed to deliver the incremental duty cycles shown in waveform 2702 between frames $t_1$ and $t_6$, so long as the sampled values of the controlled variables during the same period match the stored expected values. Otherwise, i.e., if the input values of the controlled variables during operation of the open loop control method are not what are expected, the state machine reverts to the closed loop method at step 2402. In addition, as shown in FIG. 24, the closed loop method can also operate in concert with the open loop method to correct any residual error value that is not corrected by the open loop response.

A simplification of this embodiment may occur when a predictable, known power event (e.g., sounding an alarm buzzer or an excitation event by a CCFL supply) occurs wherein the event timing is known (since it is under program control) and the impact is known, hence appropriate power supply response is known ahead of time. Here one does not have to recognize the signature but simply impose the appropriate response. It can be viewed as this same control means but with the special case wherein the time to recognize the "signature" is zero.

In one embodiment, the closed loop response integrates an error value over multiple cycles and provides a corrective response only when the accumulated error exceeds a threshold or when a predetermined number of elapsed number of cycles is exceeded. Alternatively, the incremental duty cycle corrections can also be accumulated over multiple cycles and applied only when the accumulated corrections exceed a threshold or when a predetermined number of elapsed number of cycles is exceeded. In this manner, the closed loop method acquires immunity to high frequency noise and provides a dampened transient response.

Section 1.2.2.6A Sequential Transient Recovery Algorithm

Figure 28:
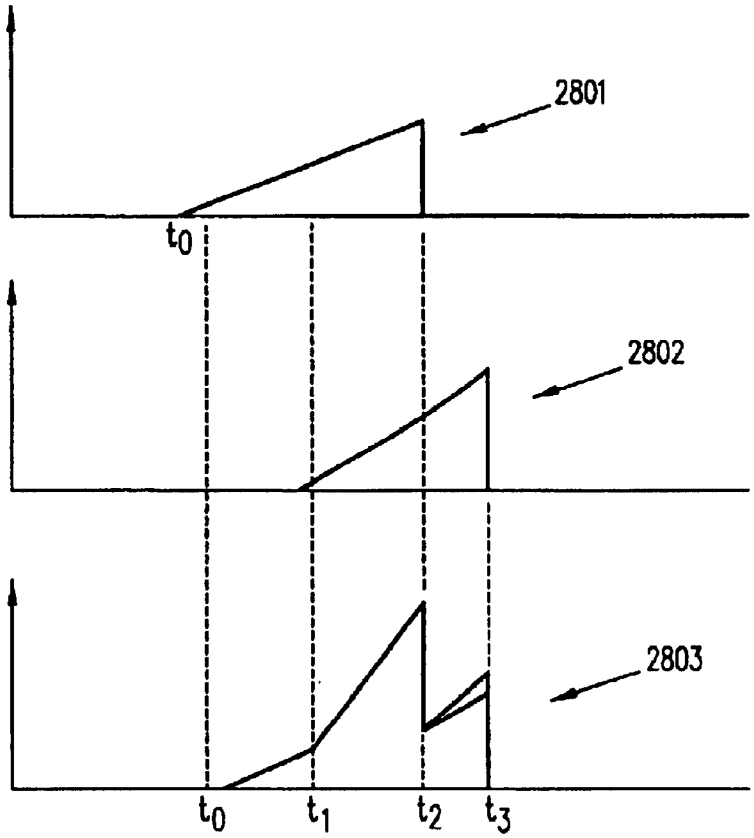
FIG. 28 illustrates a sequential transient recovery control method, in accordance with one embodiment of the present invention.

In one embodiment, multiple signatures can be searched simultaneously. To handle the case of a sequential occurrence of multiple transients, i.e., when a recognized power event occurs before another recognized power event completes, the state machine searches linear super-positions of two or more power event signatures offset in time to detect such an occurrence. FIG. 28 illustrates a sequential transient recovery control method, in accordance with one embodiment of the present invention. In FIG. 28, waveforms 2801 and 2802 represent the signatures of two power events occurring singly at times $t_0$ and $t_1$, respectively. After the occurrence of the power event of waveform 2801 is detected at time $t_0$, the state machine also searches composite signatures, such as waveform 2803, which is the linear super-position of waveforms 2801 and 2802 offset by time interval $(t_1=t_0)$. Should the power events of waveform 2801 and 2802 occur, the values of the controlled variables match one of the composite signatures. An appropriate response corresponding to a linear super-position of the corresponding programmed responses can be applied as an open loop correction.

Section 1.2.2.6 Adjacent Phase Sampling

In switching power converters, it is necessary to measure voltage and current being provided to make adjustments, if needed. In typical prior art solutions, the entire waveform is applied to an error amplifier and then subsequently to a comparator. The error amplifier, if nothing were done, would faithfully amplify the output voltage ripple. This would present a rippled signal to the comparator and result in unstable or unpredictable information being used by the comparator to set the pulse width modulation. This is unacceptable, so the typical prior art application using an error amplifier uses filtering sometimes called compensation in the error amplifier's feedback loop, to filter out the voltage ripple, resulting in an average value being applied to the comparator. There are at least two undesirable consequences to this. First of all, it is the average value of the ripple voltage that is regulated. Secondly, the frequency response of this error amplifier has been dramatically reduced over what it might have been, reducing the performance of the power supply.

An advantage is provided in the present invention by using synchronous sampling. By sampling the voltage at the same point in time relative to the switching waveform, the switching ripple itself is removed. More than that, it is possible to choose a point that corresponds to a critical parameter. A very common critical parameter in power converter design is to maintain a minimum voltage such that this voltage is above the minimum requirements of the load. Microprocessors and memories are very intolerant of voltage excursions below this minimum point. By sampling at the voltage minimum, then, a very stable non-rippling voltage measurement is developed over time for the voltage minimum produced by the regulator. This permits the regulator to deliver the minimum voltage required by the microprocessor. In a prior art solution, it is necessary to margin the regulation point to account for.the excursions above and below the average, which was derived when the error amplifier's frequency response was compensated and the voltage ripple averaged (filtered). Similarly, on current, by taking measurements of the current not just synchronously with a switching waveform to remove the current ripple effect in the measurement, but also at a point where the current might be at a maximum and other advantage is achieved. The maximum current is of interest because it is needed to prevent the coil from saturating; that is, when the current goes above the maximum rating for a coil, it no longer is able to act as an inductor, with its coil inductance reduced, the very small resistance of the wire in the coil becomes the dominate parameter, and the current can increase rapidly, as well as creating serious noise problems in terms of radiated H and E field noise from the coil and associated circuitry. Minimizing the maximum of peak current also minimizes the amount of noise that can come in from an external supply. Controlling the maximum peak current can be used to regulate the rate at which a power converter turns on the ramp of its voltage. So the benefits of synchronously sampling voltage and current are twofold. First, the elimination of the switching noise, the ripple in the voltage and the current in the measurement are removed by definition and, secondly, it allows the circuit to precisely regulate the critical portion of the parameter, rather than an average of the parameter which would result in the circuit attempting to infer where that critical point occurs.

Figure 42:
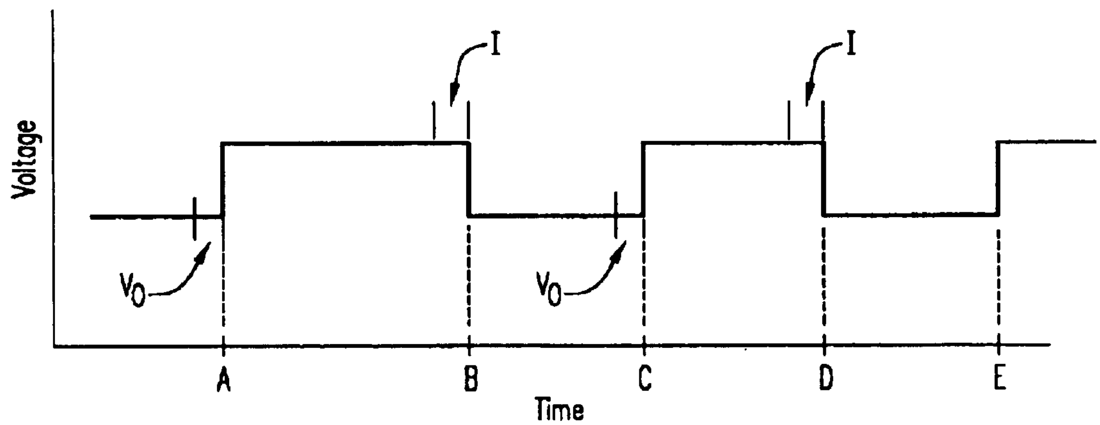
FIG. 42 shows a gate drive waveform with respect to time.

The switching power converter system according to the present invention uses sample data techniques to remove the switching noise of each individual switching power supply by, for example sampling the output voltage at an adjustable point or a fixed point immediately before the rising edge of the gate drive voltage to the upper transistor in a buck converter configuration. Consider buck converter 1301.2 in FIG. 46, and refer to FIG. 42. The signal shown in the latter figure is the gate drive signal to FET $QT_1$. The reference characters I and $V_o$, in FIG. 42 are provided to indicate the time at which output voltage $V_o$ and the current I are measured with respect to the gate drive voltage applied to transistor $QT_1$. That is, $V_o$ is measured before transistor $QT_1$ begins to conduct current into inductor L1. By measuring $V_o$ at this time, output voltage $V_o$ is at the lowest point in the switching waveform, and therefore it has stabilized from the prior switching cycle. By measuring the current through the inductor L1 just prior to FET $QT_1$ ceasing conduction, the peak current in the inductor L1 is measured on each switching cycle. Similarly, the current is measured at a point at which it has been allowed the most time to ramp towards its final value, i.e., just before FET QTI turns off.

As illustrated in FIG. 42, in the successive switching cycles, the first of which extends from A to C, and the second of which extends from C to E, $V_0$ and I are measured at the same relative position with respect to the gate drive voltage. Points A and C in the waveform indicate the leading edge of the gate drive voltage for transistor $QT_1$. Although in FIG. 42 the voltage measurement time and the current measurement time are illustrated as being immediately before the leading edge and trailing edge, respectively of the gate drive voltage to transistor $QT_1$, other locations may be used. By measuring at the same relative positions, ripple in the voltage and current are removed.

Figure 42A:
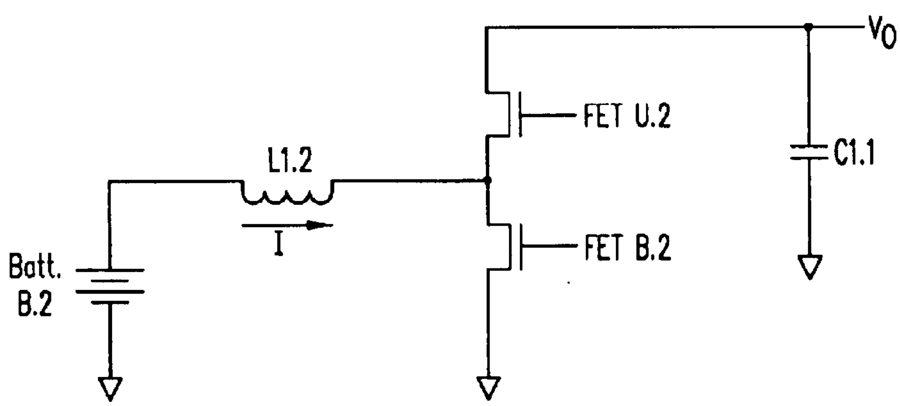
FIG. 42A shows a boost converter circuit.

FIG. 42A illustrates a typical boost switching power converter. In this circuit, FET B.2 is turned on for a first time period and FET U.2 is turned off during the first time period. The current I through inductor L1.2 flows in the direction indicated. During a second time period FET B.2 is turned off and FET U.2 is turned on, resulting in a voltage being stored in capacitor C1.1. In accordance with the present invention, in a boost circuit configuration such as that shown in FIG. 42A, control pulses are periodically applied to the gate of FET B.2, and the output voltage $V_o$ is measured immediately before FET B.2 begins to conduct. The current I may be measured immediately before the gate drive signal to FET B.2 is terminated. Following the foregoing procedure with a boost converter provides the same advantages as those pointed out above for a buck converter. In one embodiment of the present invention, the switching cycle is 2 usec, however other cycle times may be used. An exemplary sample time for measurement is 2 nseconds. Thus the sample time is a very small portion of the entire cycle, which is in contrast to the prior art in which the parameter of interest is measured continuously.

The operation of sample and hold circuit 1207 is described in detail in other portions hereof. Briefly, however, commands from digital pulse control wrapper 1201 instruct the sample and hold circuit 1207 when to take samples of the volt-age ($V_0$) and the current (I). Software in regulation control module (REG) 1204 determines, based on the measurements, what is needed to return the supply which is being regulated to equilibrium. This determination may be made by a computation, or by a look-up table. The process of returning the supply being regulated to equilibrium means bringing $V_o$ to the target voltage for the supply; making the average current in the inductor equal to the load current; and making the change in current over the switching cycle zero. Based on the determination of what is required to bring the regulated supply to equilibrium, output signals from regulation control module (REG) 1204 to digital pulse control wrapper 1201 instruct the digital pulse control wrapper 1201 the width of the gate drive pulses which should be sent to both transistors.

Figure 42B:
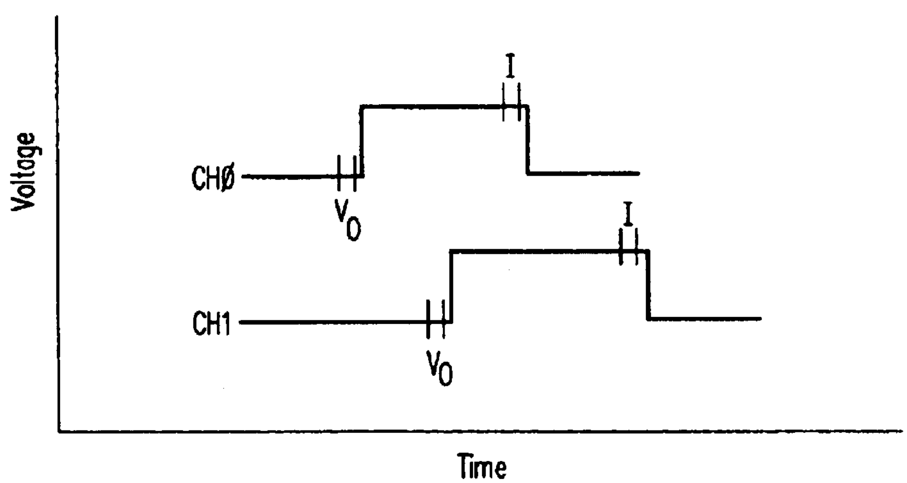
FIG. 42B shows two switching waveform in time off-set relationship.

If a single switching power converter is being controlled, the foregoing would be sufficient to remove the noise of that single switching power supply. That is, its own switching noise would not influence its voltage and current measurements being used to regulate its output voltage. In one embodiment of the present invention, there are seven power supplies. If the gate drive signals to the switching transistors were applied without reference to each other, it is probable that at some point channel-to-channel interference could occur. For example, if the sense lines of a first channel, which we'll call channel Ø, were close to the sense lines of a second channel, which we'll call channel 1, channel 1 might switch where channel Ø is attempting to take its voltage measurement and corrupt that voltage measurement. If no coordination between switching times were to be provided, because of the random nature of where the channel 1 switching might occur, this interference might be for a single cycle, or several, or random in fashion. In the present invention, all of the switching signals are derived internally, i.e., they're all running off of the same clock and they are all scheduled by logic. Channel-to-channel interference is avoided by carefully scheduling the switching points of each individual phase. In the above example, were channel 1 to have its gate drive signal applied at the time when the sample was being taken from channel Ø interference could affect the measurement. In accordance with the present invention, the switching times are rescheduled as shown in FIG. 42B. As will be appreciated by reference to FIG. 42B, by rescheduling the gate drive signal to the transistor in CH1 to a later time, the measurements of voltage and current in CH0 will not be affected by the switching in CH1. Similarly, the phase of each switching waveform for each power supply can be changed so that no phase interferes with any other channel. In this fashion, the switching noise is removed from the samples by sampling synchronously within each channel with its own switching and then across channels by scheduling the phase of each adjacent channel. The scheduling of the gate drive waveform is performed by the edge scheduler portion of regulation control module (REG) 1204 which is described above.

Section 1.2.2.7 Stored External Component Parameters

Central processing module (SYS) 1205 may be programmed by a host with the operating parameters of the switching power converters to be controlled. For example, the desired voltage levels, expected powers drawn by loads, and circuit values such as the inductance and capacitance values of components and the operating characteristics of the transistors associated with the switching power supplies may all be stored in non-volatile memory. As described with respect to regulation control module (REG) 1204, central processing module (SYS) 1205 may use these external parameters to calculate an expected pulse width for each switching power supply prior to normal operation. Using these expected pulse widths, central processing module (SYS) 1205 schedules the corresponding pulse edges across a DPC cycle and provides the pulse edge schedule to regulation control module (REG) 1204. By beginning normal operation with this pulse edge schedule, the rescheduling of pulse edges required of regulation control module (REG) 1204 during normal operation may be reduced.

Section 1.2.2.11 Dynamic Synchronous and Non-Synchronous Operation

Figure 29:
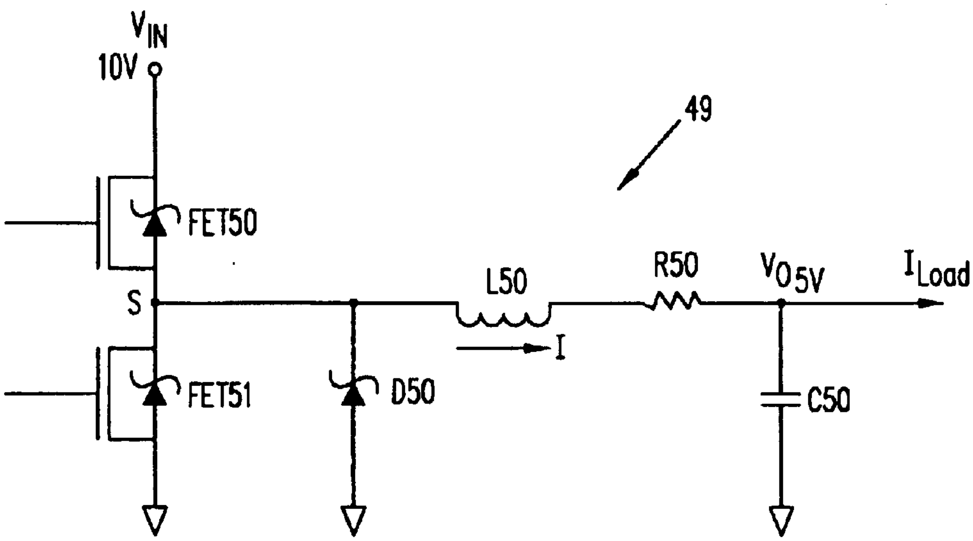
FIG. 29 illustrates a buck converter.
Figure 43:
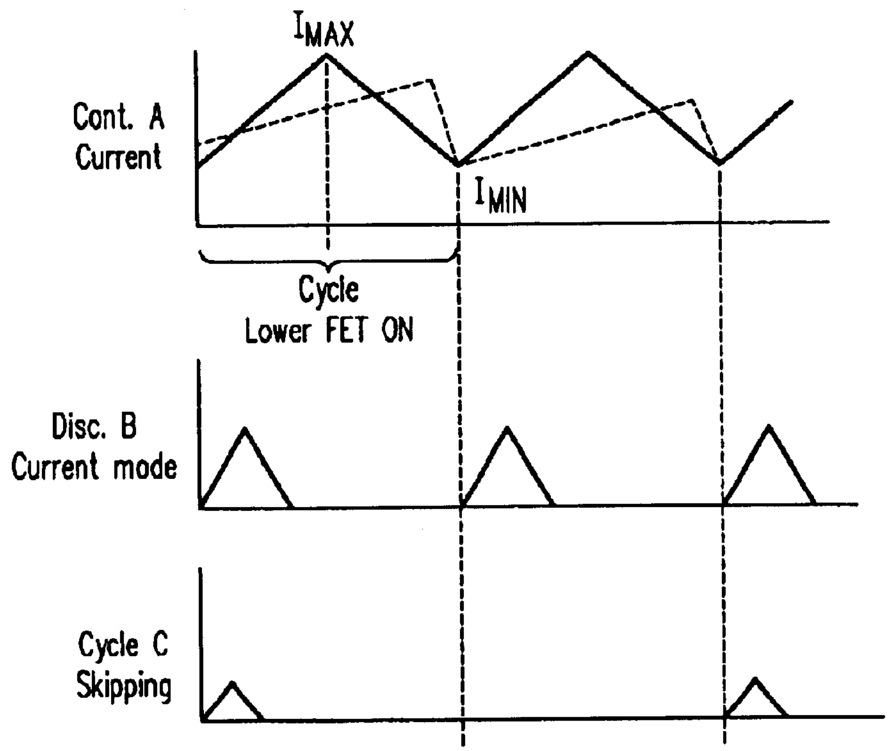
FIG. 43 shows waveform A, B and C illustrating the current which is output for three gate drive scenarios of a switching power supply.

Referring to FIG. 29, buck converter 49 is illustrated and should be referred to in connection with the following operational explanation. As illustrated in FIG. 29, a 10V input is provided and the transistors are switched appropriately to provide a 5V output $V_0$. If it is desired to provide an output voltage which is closer to the input voltage, then a current curve such as that illustrated in waveform A in FIG. 43 would be seen through inductor L50. More particularly, a current $I_{max}$ is reached during a period when FET 50 is conducting, and the current upon the cessation of conduction FET 50 falls during the conduction of PET 51, moving during the operational cycle to $I_{min}$. This cycle is indicated in waveform A by the reference character CYCLE.

Figure 43A:
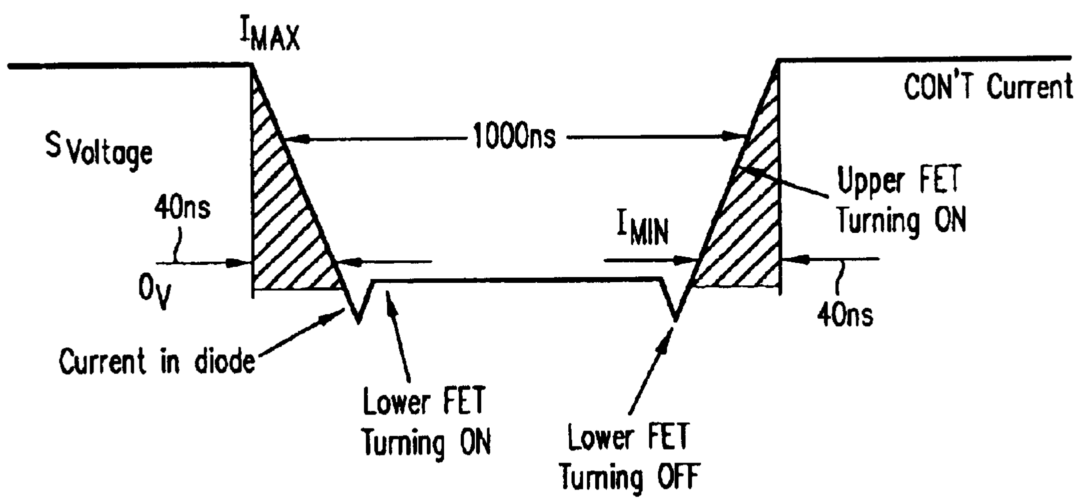
FIG. 43A shows a plot of the voltage with respect to time at a terminal S intermediate the upper and lower transistors in buck converter 49 of FIG. 29.

Curve A shows that current is always flowing in the inductor LSO, never going to 0 hence the term continuous current is used herein to describe this mode. FIG. 43A illustrates the voltage waveform for the continuous current mode at terminal S in FIG. 29. FIG. FIG. 43A illustrates the voltage waveform resulting from parasitic effects in the devices. It will be observed that from the $I_{max}$ point as transistor FET 50 is switching off, that the transition time, indicated in FIG. 43A by the dashed line area to its S low voltage state is not zero. It takes a certain amount of time for FET 50 to turn off. The amount of time is based on the physics of FET 50 and various parasitic capacitance effects. Prior to the time that the voltage at terminal S is transitioning from high to low, it will be appreciated that at the high state when FET 50 is fully on, there is $I_{max}$ current flowing through FET 50, but of course since FET 50 is fully on, there is no voltage drop, therefore there is no appreciable power dissipated by FET 50. At the other extreme, $I_{max}$ may still be flowing, but it's flowing at a different circuit because FET 51 transistor is completely switched off. Since no current is flowing through FET 50 even though there is a voltage across it, no power is dissipated, therefore the power that is being dissipated by FET 50 is actually occurring during the time when FET 50 is turning off, at which point $I_{max}$ is continuing to flow and the voltage across transistor FET 50 is declining in more or less a straight line fashion towards its off state. Thus power is going to be dissipated in FET 50 and it's wasted because it is not delivered to the load. It will be noted that at a point after FET 50 is switched off, the voltage waveform continues to fall below zero volts. Inductor L50 is attempting to continue to conduct at $I_{max}$, but neither transistor FET 50 nor FET 51 are on at this point, so the voltage continues to fall until it reaches the switching threshold of diode D50, at which time diode D50 conducts and $I_{max}$ flows through it. If nothing were done, then for the entire time that the. S signal is low , current would be flowing in diode D50 with its intrinsic voltage drop. These currents can be quite substantial (many amperes) so the power dissipated in this example can be considerable if allowed to continue for a significant portion of a switching cycle. For a diode voltage drop of 0.6V a current of 2A and a duty cycle of 50% some 600 mW would be dissipated by the diode. If the power supply were designed to produce 3V at 2A then 10% of the power would be consumed by the diode. A synchronous rectifier, where the voltage drop of the diode is reduced for most of the time of each cycle is implemented by FET 51. By reducing the voltage drop across diode D50 and conducting the current at a lower voltage, less power is wasted. As illustrated in FIG. 45C, FET 51 (indicated in the figure by gate drive waveform LF) is not turned on coincident with FET 50 turning off (indicated in the figure by gate drive waveform UF), because at some time during that falling waveform, both field effect transistors would be on, thus conducting excessive current and wasting even more power than we were attempting to preserve. Therefore, there is a delay, that is FET 50 must switch completely off, the signal to its gate to turn off is asserted, then sufficient time must elapse for it to actually switch off. Then the gate control signal to FET 51 is switched on, and then it also has a lag time in responding until FET 51 is completely switched on. At the right hand side of the waveform in FIG. 43A, the S voltage waveform is in the low state indicated in the figure by $I_{min}$. At this point, FET 51 turns off, and again there is current in diode D50. This current will be lower, in fact it's at the $I_{min}$ point on the constant current diagram in FIG. 43, however still enough voltage for the diode D50 to conduct and the transistor FET 50 is turned on. This lag time again is necessary in order to prevent the possibility of both transistors being on simultaneously. When FET 50 is turned on, we have the same situation we had at the falling edge; as the voltage across the FET 50 rises, indicating that FET 50 is turning on, there is a time at which current is flowing in upper FET 50, that is $I_{min}$, when FET 50 has not yet been fully turned on, and therefore power is dissipated in that FET 50 and not delivered to the load. There is power loss therefore at both ends of the switching cycle; however, obviously more power is lost at the $I_{max}$ point than at the $I_{min}$ point. The foregoing represents a conventional waveform for a synchronous buck switching power supply, synchronous meaning that both FETs are turned on during at least part of the cycle.

Discontinuous Operation

Figure 30:
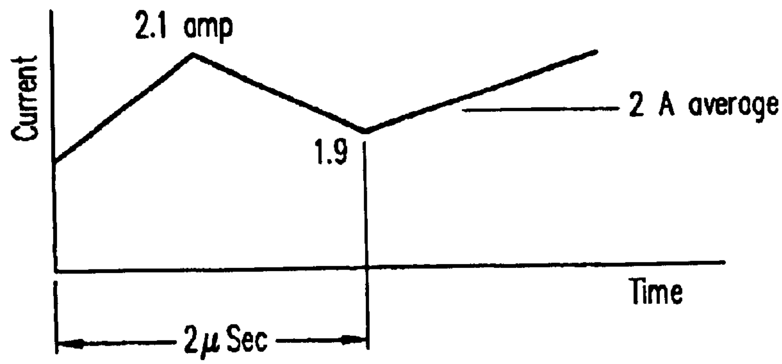
FIG. 30 through FIG. 33 show curves of current with respect to time for a supply circuit such as circuit 49, based on the application of different gate drive voltages to the transistors.
Figure 31:
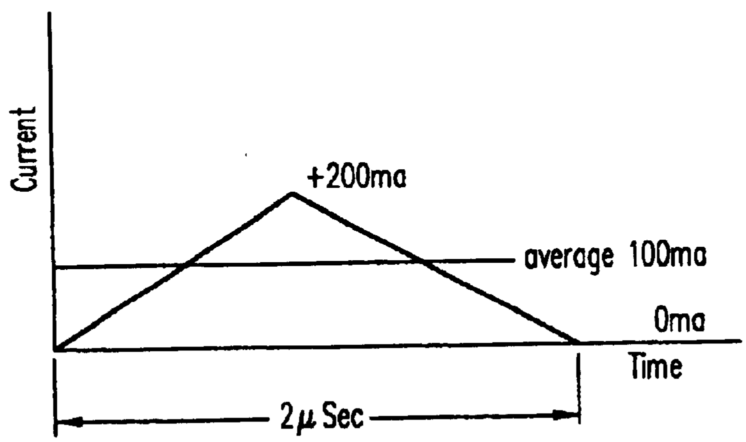
Figure 32:
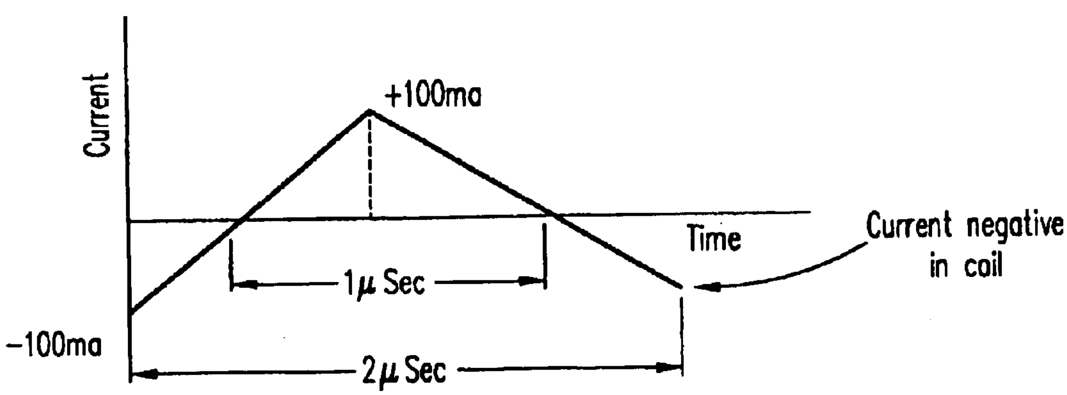
Figure 33:
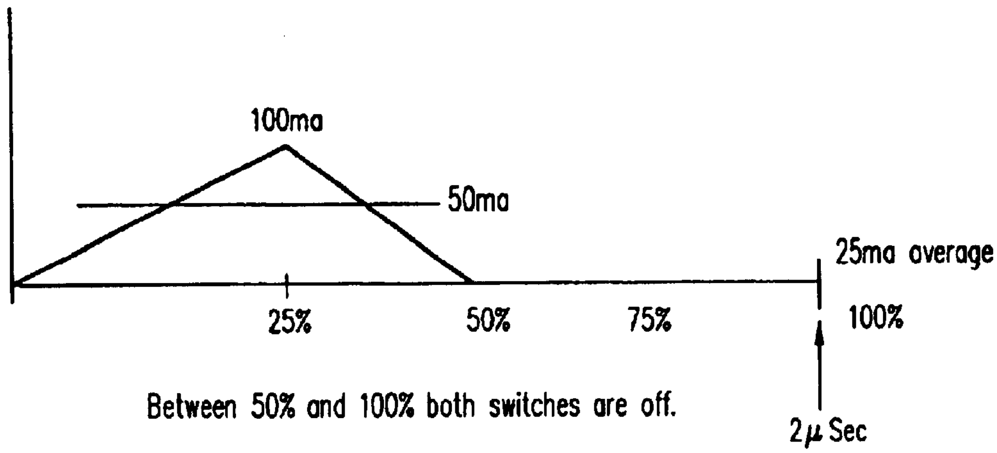

Assume that in circuit 49 of FIG. 29, our load current was for example 2 amps, and our period was 2 microseconds. If we drew a map of what the ripple would look like, we get 10 volts in and 5 volts out, so we know the duty cycle is going to be approximately 50%. The output voltage being given by the approximate equation of input voltage times duty cycle equals the output voltage, duty cycle for the FET 50. Then we would see a waveform as shown in FIG. 30 in terms of the current in inductor L50, which goes from high 2.1 amps down to a low of 1.9 amps, yielding an average current of 2 amps. Capacitor C50 is there to integrate this current and that is really what you see. This is the so called "continuous mode". In this example of continuous mode, FET 50 and FET 51 are each on for one-half of the 2 usec time period. Since the load current is greater than ½ the ripple current, current is always flowing in the inductor and is never allowed to go to zero. Note that the current always goes in the same direction, but reverses its slope. Sometimes it's increasing, sometimes it's decreasing, but the current never goes to zero. Now, consider that same circuit used to supply exactly 100 milliamps. As illustrated in FIG. 31, we would have the same ripple and the same 2 microsecond period, the current would go from a high +200 milliamps down to 0, with an average of 100 ma. What if we want less? Well, there are a couple of things you could do. Let us examine one simple example, suppose we want zero. If we were to run FET 50 and FET 51 out of a phase with each other, then if we wanted 0 milliampers, and because alternately we have 5 volts supply across coil L50 when FET 50 is on (10 v−5 v), and 5 volts supply across the coil when the FET 51 is on (0 v−5 v), its ripple current still must be 200 milliamps so how can you get 0? Well, you get 0 because the ripple would look like that illustrated in FIG. 32. There is −100 ma at time 0 and at 2 usec. Then +100 ma at 1 usec resulting in the current delivered to the load is 0. In order for the current to be negative in inductor LSO, it means that at the points where the current crosses the time axis, the current actually reversed direction in inductor L50. FET 51 is on for example during this phase and inductor L50 was completely discharged, then charged in the opposite direction. Now, the current flows in the other direction, the negative direction. It's flowing out of the load instead of into the load. When we turn off FET 51, inductor L50 flies positive. Current flows first through the intrinsic diode in FET 50 and the now closed FET 50 closes, actually sending energy back into the power supply from before, and around and around it goes. This is a really poor way to make 0 milliamps because 200 milliamps are being shipped through all of the parasitic losses in the circuit two ways to make no current. The right answer for making no current is not to do anything, leave both PETs off. Discontinuous mode, which is illustrated in FIG. 33, is more efficient at low currents. Using the same duty cycle, and slope, we turn off FET 50 and turn on FET 51 when the current gets to . . . for example, 100 milliamps, which is 25% of the cycle time, then the current ramps down to 0 by 50% of the cycle time. This means an average of 50 mA of current was flowing for the first 50% of the cycle. During the second half of the cycle, 0 mA is flowing in the coil and with both FETs off zero volts are across the inductor and 0 mA continues to flow for the second 50% of the cycle. Considering these percentages, what results is 25 mA over the full 2 microseconds, the total switching cycle in our example. The current was not continuously flowing in inductor L50, hence the term discontinuous current. Between 50% and 100% of the 2 usec time period both FET 50 and FET 51 are turned off.

If we need to reduce this current still further, then the pulses driving the gates of FET 50 and FET 51 would be made shorter and shorter until at some point because of the dynamic that turns the transistors on and off, the pulse required would become so short that it would be impractical to make. In other words, the time of the pulse would be entirely consumed by the rise and fall time of the FET. In this condition, you actually put a pulse out and wait a number of cycles and then put another pulse out. This is called cycle skipping which is just a more extreme case of the discontinuous mode of operation. Cycle skipping is illustrated in waveform C of FIG. 43.

As an example of how much of a problem this is, consider power supplies of the present invention which are designed to provide the standby power for a PDA which is asleep. The current consumed by the SDRAMS in the PDA when it's asleep is on the order of 2 ma. With a 10 uf filter capacitor such as C50, it would take 150 microseconds for the voltage to decay the 30 millivolts that may be typically used in the dead band of a control loop. That is 75, 2 usec cycles skipped between each pulse used to drive the FETs. For some power supplies in this mode only 150 uA may be consumed. Under these conditions many seconds may elapse between individual pulses.

In continuous current mode the steady state duty cycle changes a very limited amount as the current is changed. Once the current fails below ½ the ripple current, the desire to maintain efficiency suggests that the current be allowed to become discontinuous. In discontinuous mode, the current delivered is scaled by the amount of time both FETs are off and therefore the timing of the pulses delivered to the FETs must change rapidly with current. A different regulation algorithm may be used depending on which mode is required by the load current. Mode changes can represent a significant challenge in prior art implementations based on analog comparators and amplifiers. On a digital basis, the circuitry of the present invention, can detect that the load current is less than ½ our calculated ripple and simply solve for the correct FET timing based on discontinuous mode. This change effects only the calculation but has no effect on the structures utilized for the output drivers, the A to Ds, or the sample and hold circuitry. Accordingly, during the discontinuous operation, we don't have the inductor feeding current back to our supply. So we avoid the so-called negative current, negative current meaning the current flowing from the coil back out to the power supply. In discontinuous mode, a major objective is to prevent the current in the coil from becoming negative. In this example the output voltage is ½ the input voltage implying that FET51 would need to be on for exactly the same length of time as FET50. There is more subtlety than this because of the intrinsic diode D50, which exists across FET 51 from terminal "S", which is the point where the inductor L50 intersects FETs 50 and 51. The purpose of the synchronous transistor FET 51 is to reduce the voltage drop across the FET when there is current flowing. There is a hazard in waiting too long to turn off FET 51 because this would cause the current in the diode to be reversed creating a large ringing waveform at terminal S when FET 51 eventually opens. This ringing is undesirable because of the interference it produces as well as a small negative impact on efficiency. One way to mitigate this potential problem is to turn FET 51 off slightly before the point at which the current in inductor L50 would cross 0 current. Since the current is quite low at this point, there is very little penalty in terms of power In our implementation, we utilize algorithms in regulation control module (REG) 1204 to control the conduction/non conduction of the FETs.

In the prior art, the current in the inductor is measured continuously and an attempt is made to detect the instant where the current in the inductor crosses 0, and then release the drive to the inductor. A problem that is encountered is that the zero current point is often detected late because there is a propagation delay time in the comparator and on the switching transistor. In an attempt to solve this problem, "a ring killer circuit" may be used, which is another transistor placed across the inductor, after the lower transistor is off, the transistor is turned on across the coil to discharge it.

Figure 43B:
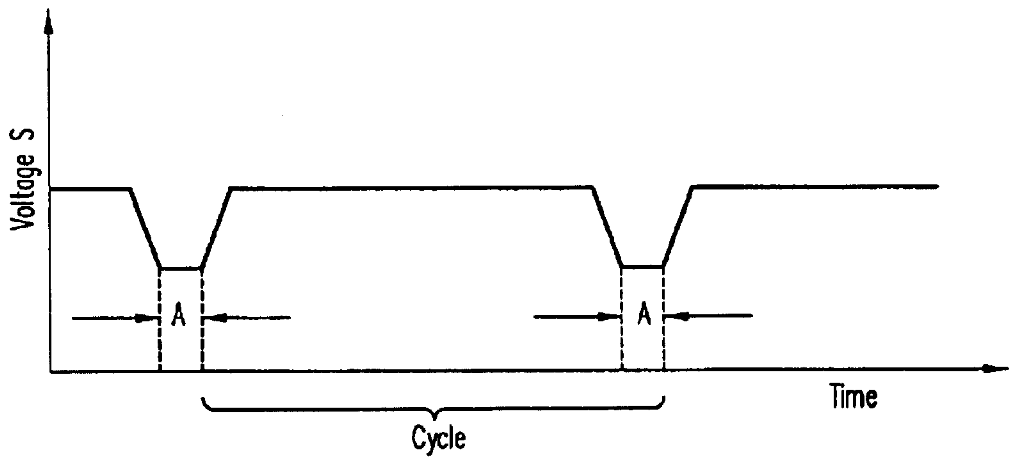
FIG. 43B and FIG. 43C show plots of the voltage at terminal S for two different duty cycles of FET 50 in circuit 49.
Figure 43C:
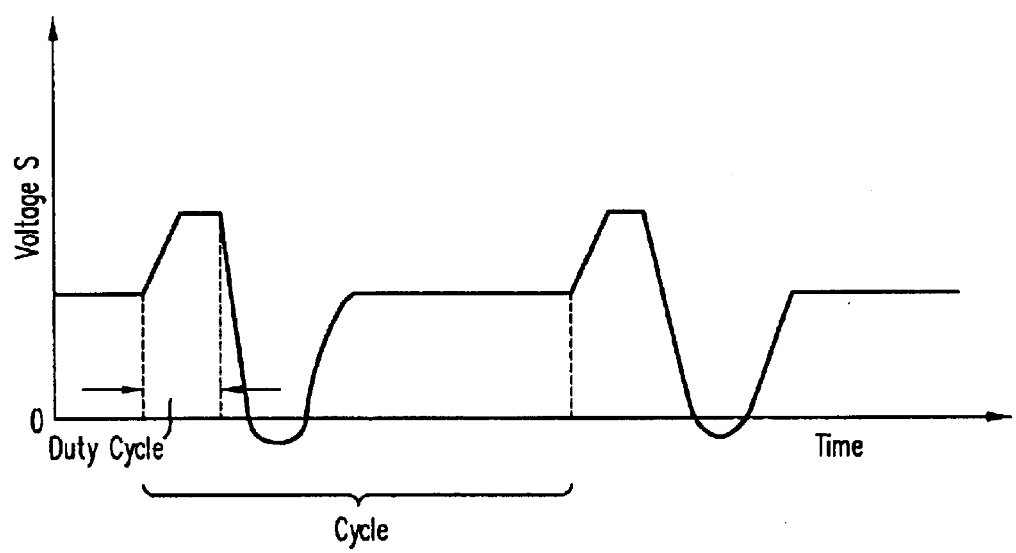

Reference to FIG. 43B and FIG. 43C in connection with the following description illustrates that the synchronous mode of operation is not desirable in some load situations. First consider FIG. 43B which shows a very long duty cycle, that is the time that the S signal is low (indicated by A in the figure) is very short. This can occur when the input voltage is very close to the output voltage. Coincidentally, this is also a time when switching power supplies may be their most efficient at least in the buck converter configuration. If we assume, for example, that time A is equal to 100 ns, there is not sufficient time to turn on FET 51, and if one tried to do that, it would have to be turned off almost immediately risking an overlap with the conduction of FET 50. Thus for a very long duty cycle, that is FET 50 conducting for a high percentage of the total cycle, it is not desirable to use FET 51. This limitation will typically define the maximum duty cycle that a synchronous buck switching power supply can attain, that is it can attain a duty cycle that is so long that there is insufficient time to turn FET 51 on and off. In accordance with one aspect of the present invention, the duty cycle of FET 50 is monitored by regulation control module (REG) 1204, and if the duty cycle is sufficiently long, then dynamically the system is configured such that no gate drive signal is applied to FET 51 so that is never conducts. This dynamic operation is described fully below.

FIG. 43C illustrates a plot of the voltage at S as a function of time in a mode of operation that is the other extreme of operation, that is at extremely low load currents. The S waveform of this figure corresponds to the discontinuous current mode such as that illustrated in waveform B of FIG. 43. The initial voltage at terminal S is between the input voltage $V_{in}$ and ground, that is the initial voltage would be at the output voltage $V_0$, that is if the current in inductor L50 is zero, then the voltage across inductor L50 must also be zero. From FIG. 43C, it will be noted that transistor FET 50 is switching on before generating a short on pulse. The duty cycle of FET 50 is indicated in FIG. 43C and it will be appreciated that FET 50 is on for a very short time. When FET 50 is off, inductor L50 forces the S term down to ground and then below ground, in which case diode D50 conducts as before. Then the current in diode D50 decays as the very small amount of current in inductor L50 decays until eventually the current in inductor L50 is no longer sufficient for diode D50 to conduct. The voltage on inductor L50 rises against the various parasitics, that is the voltage at terminal S rises against the various parasitic capacitances in the circuit until again it reaches the output voltage $V_0$ where it remains until the next pulse is delivered, that is when FET 50 is turned on at the beginning of the next cycle. In this mode, it is not advisable to use FET 51, not because of insufficient switching time to turn FET 51 on, but because there is insufficient current to sustain inductor L50 below ground for long enough for FET 51 to be turned on. An attempt to turn FET 51 on would likely result in it being on too long, and the current in inductor L50 would actually reverse direction, that is flow from the load to ground, resulting in a ring effect when FET 51 is turned off. Thus in this mode, to avoid the inefficiency resulting from current flowing out of the load, and also the interference caused by this ring effect, it is desirable to operate in a non-synchronous mode in which FET 51 would not be turned on during an operational cycle. Thus for extremely short duty cycles, the system dynamically changes from synchronous to non-synchronous operation based on the duty cycle of FET 50 falling below a predetermined minimum value. It should also be noted that for longer duty cycles in a discontinuous current mode, FET 51 should be turned on for a part of the cycle, but not the entire cycle. The above-described discontinuous current in waveform C in FIG. 43 for terminal S is one that would be typical of what would be seen in cycle skipping. In the case of discontinuous current where a pulse is generated on every cycle as shown in waveform B of FIG. 43, there may be a time long enough that the FET 51 could be turned on for a time which is calculated to be less than the time required to discharge inductor L50, and then FET 51 would be turned off so the inductor L50 can complete its discharge through diode D50, which would automatically turn off when its current became zero thus avoiding the ring effect.

Switching power supply controller 1200 calculates when a power supply circuit such as circuit 49 should be changed from a synchronous to nonsynchronous mode based on a number of factors. For example, assume that FET50 is required to be on for a relatively long portion of the cycle time in order to produce $V_0$ having a magnitude near the magnitude of $V_{in}$. In one mode of operation, the manufacturer's operational characteristics of FET51 are stored in nonvolatile memory 1216. Of particular relevance to this operation is the turn-on/turn-off time for FET51. As noted above, if the portion of the duty cycle that FET50 must be on is relatively large, then the time available to turn FET51 on and then off before the next cycle may not be sufficient. Regulation control module (REG) 1204 in conjunction with system hardware central processing module (SYS) 1205 perform a computation, based on the pulse width needed to drive FET50 and the remaining time in a cycle for a pulse to turn FET51 on and then off, of whether a gate pulse should be generated to turn FET51 on and then off during the remaining portion of a cycle. In addition to the required on-off transition time of FET51, the propagation delay in driving the gate of FETS1 is also considered in the computation. If the time remaining in a cycle is insufficient to turn FET51 on and off, then regulation control module (REG) 1204 does not send a command to digital pulse control wrapper 1201 to generate a drive pulse to the gate of FET51, thus providing dynamic change from synchronous to non-synchronous operation of the power supply being regulated by switching power supply controller 1200. In an alternate mode of determining whether FET51 should be turned on at all in a cycle, switching power supply controller 1200 examines the power loss consideration. Even if the time remaining in a cycle is sufficient to burn FET51 on and off before the beginning of the next cycle, from a power loss standpoint it may be preferable not to do so. For example, if the system calculates based on the current flowing in inductor L50 that the power consumed by the conduction of FET51 will be greater than the power that would be consumed by intrinsic diode D50, then no gate drive is applied to FET51 and the regulated power supply is operated in the nonsynchronous mode.

At the other extreme, where FET50 needs to be on for a relatively short portion of an operational cycle, then it may not be appropriate to turn FET51 on. The system calculates, based on the current through inductor L50, the amount of time it would take for the current in L50 to drop to zero after FET50 is turned off. This computation is possible because the characteristics of FET51 and the other components of supply 49 are stored in NVM1216. If the computed time for the current to fall to zero is less than the time it would take to turn FET51 on and off, it is preferable not to utilize FET51. Instead, the current is permitted to decay to zero through intrinsic diode D50. In an alternative mode, the power consumption can be computed to determine the advisability of turning FET51 on and off. Based on the results of a comparison of power consumed if FET51 is used and letting the current decay through diode D50, the system determines if the operation should be synchronous or non-synchronous.

The above analysis considers the synchronous versus nonsynchronous operation of a buck circuit. Similar analysis of the operation and the decision to operate it in a synchronous or nonsynchronous mode is made by switching power supply controller 1200 for a boost circuit or SEPIC. Consider the circuit shown in FIG. 46, and assume that $QT_{Ø}$, $QB_{Ø}$, LØ, RØ and CØ are being controlled as a boost circuit by switching power supply controller 1200.

Further assume that the Batt. Ø has an output voltage which is slightly below that needed for Supply A. Switching power supply controller 1200, based on the voltage of Supply A, sensed over lead F1, and the battery voltage sensed over lead S2, configures the circuit to a boost configuration based on the sequence of gate drive pulses to the gates of $QT_{Ø}$ and $QB_{Ø}$. Because the difference between the battery voltage and the required voltage of Supply A is small, the gate pulse provided to $QB_{Ø}$ will have a relatively short duration. If the circuit were to be operated in a synchronous mode, after $QB_{Ø}$. was turned off, $QT_{Ø}$. would be turned on to deliver current, and hence power, to charge capacitor $C_E$ to the slightly higher voltage required. The magnitude of the current through RØ is computed by switching power supply controller 1200 since the resistance of RØ is known to the system, having been prestored in nonvolatile memory 1216. Similarly, the characteristics of the transistors are also prestored in non-volatile memory 1216. Knowing the foregoing parameters, switching power supply controller 1200 computes and compares the power losses for the scenarios (i) in which $QT_{Ø}$ is turned on and (ii) where $QT_{Ø}$ is not turned on. As will be recognized by those skilled in the art, even if $QT_{Ø}$ is not turned on, current will flow through it because of the intrinsic diode (not shown) of $QT_{Ø}$. If the result of this computation and comparison shows that less power will be consumed by not turning on $QT_{Ø}$, then switching power supply controller 1200 will not provide a gate pulse to $QT_{Ø}$, resulting in nonsynchronous operation. It will, of course, be appreciated from the above that the decision to operate either synchronously or nonsynchronously is made dynamically by the system, unlike the prior art in which typically the user sets the circuit to mode of operation to one or the other, and any change must be made manually by the user.

It will be appreciated that in above we have described an architecture where a synchronous rectifier is used in a switching power supply only for the operating regimes where it improves efficiency, while in other regimes of very long and very short duty cycles, the synchronous switching feature is dynamically eliminated to avoid inefficiency.

Section 1.2.2.12 Digital Resonance Control Loop

Figure 44:
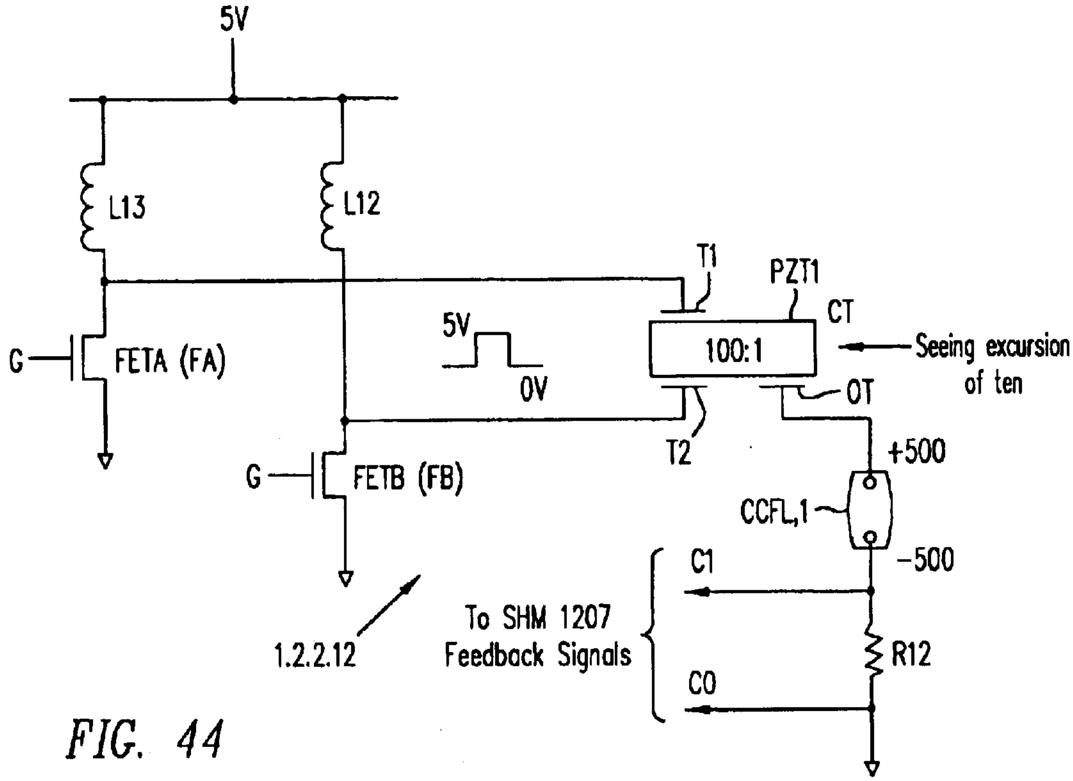
FIG. 44 shows a circuit for generating a high voltage to drive a cold cathode fluorescent light bulb.

FIG. 44 illustrates a half-bridge high voltage power supply circuit, indicated by reference character 1.2.2.12, which can be used to power a cold cathode fluorescent light bulb CCFL1. In a half-bridge architecture, energy is applied first to one side, then to the other. Inductors L12 and L13 replace the upper two transistors that what would comprise a full bridge, Half-bridge circuit,1.2.2.12 illustrated in the above-named figure includes in a first leg inductor L13 which is connected in series with FET A between a 5V supply and ground. Similarly, in the second leg, inductor L12 is connected in series with FET B between the 5V supply and ground. The gates of FET A and FET B are driven, for example, with waveforms WF1 and WF2 respectively or WF3 and WF4 are respectively shown in FIG. 44A. The drive control signals for the gates of these transistors are provided, for example, by NFET drivers module 1202 illustrated in FIG. 12. Feedback signals from sense resistor R12 are provided over lines C1 and CØ to the sample and hold module 1207 also illustrated in FIG. 12. The duty cycle of gate drive signals are adjusted as a function of the changes required to provide an appropriate voltage for CCFL1. Piezoelectric transformer PZT1 may be implemented, for example using a transformer KPN 6003A from CTS Wireless Components located at 4800 Alameda Blvd., Nebr. Albuquerque, N.Mex. Similar devices may be, of course, substituted. As illustrated in FIG. 44, the input to terminal T1 of PZT1 is provided from the common connection between inductor L13 and the drain of FET A, and the input to terminal T2 is provided by the common connection between inductor L12 and the drain of FET B. The output of piezoelectric transformer PZT1 is coupled to one side of CCFL1. The other terminal of CCFL1 is connected to the upper terminal of sense resistor R12, the lower terminal of which is coupled to ground.

Figure 44A:
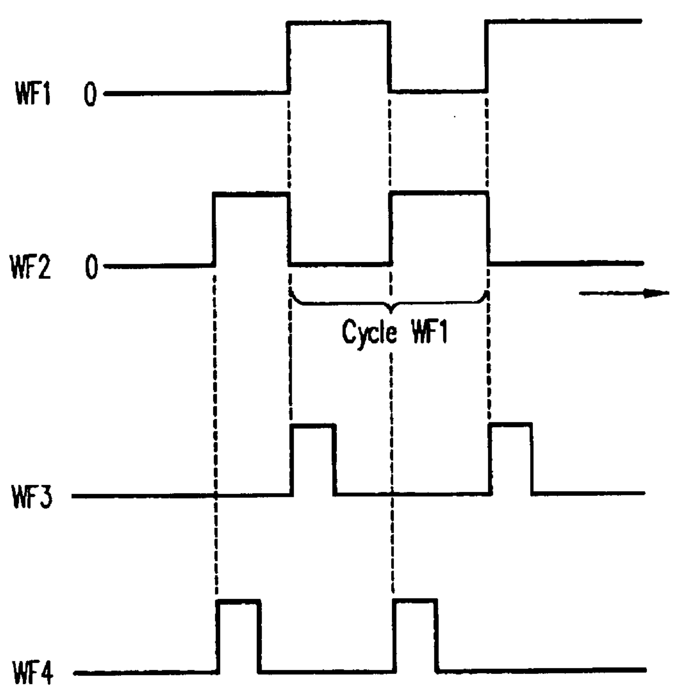
FIG. 44A shows two exemplary sets of gate drive waveforms of the type which could be applied to the gates of the transistors of circuit 1.2.2.12.

Although circuit 1.2.2.12 is driving a piezoelectric transformer, it could be used to drive a conventional magnetic transformer. Piezoelectric transformers differ from magnetic transformers in that the method of converting from a lower voltage to a higher one, with a proportionate decrease in current, is electromechanical in nature, but otherwise they have similar characteristics, that is, they come in voltage in to voltage out ratios. In one embodiment of the present invention, PZT1 has a mechanical advantage of 100 to 1. This means that for every volt impressed across the input terminals T1/T2, 100 volts would be provided at output terminal OT. Piezoelectric transformers, since they are electromechanical in nature, have a natural resonant frequency and they will not tend to operate outside of a relatively narrow band of frequencies that are determined by the mechanical characteristics of the device. This frequency can vary from device to device. That is, it's not completely process controlled in the manufacture, and although the device specification provides a value for the expected resonant frequency, the actual resonant frequency can vary many percentage points one way or the other. The optimal efficiency is obtained at the resonant frequency and operation far enough away,from the resonant frequency will actually cause the device to fail to oscillate. FIG. 44A shows several examples of driving waveforms. Waveforms WF1 and WF2 are applied to the gates of transistors FET A and FET B, respectively. These waveforms show the maximum drive amplitude that would be possible which would be each of these waveforms at 50% duty cycle, 180° out-of-phase. A cycle for WF1 is indicated in FIG. 44A. A cycle for WF2 is the same length of time; however the start time is offset. This would result in a driving waveform of approximately 5 volts to piezoelectric transformer PZT1 and when operated within resonance, this would result in approximately 500 volts AC being applied to CCFL1. As will be appreciated by reference to FIG. 44A, waveforms WF3, WF4 have the same frequency as waveforms WF1 and WF2, however they have shorter duty cycles. Applying these shorter duty cycles reduces the energy delivered to PZT1 and correspondingly provides essentially a function of controlling the voltage and current output of the piezoelectric transformer. With this circuit, it is important to discover the resonant frequency of PZT1 and remain on the resonant frequency. Several algorithms are possible. One example of a resonance algorithm is to change the frequency of the drive signals to terminals T1 and T2 while observing the feedback signals C1 and CØ. At frequencies which are far away from the resonant frequency, there would be no feedback seen, as no voltage should be applied across the CCFL1. Starting from a frequency below the minimum listed by the manufacturer of PZT1, as the frequency of the input drives to the gates of FET A and FET B is increased, CCFL1 will begin to ignite, and a signal will be detected at C1, CØ. As the frequency is increased, the phase relationship between the signal C1, CØ and signals WF1, WF2 will begin to shift, and resonance is indicated at the point where a 900 phase shift is observed. A second way to determine when the resonant frequency of PZT1 has been reached is to examine the amplitude of the signal at C1, CØ, knowing that PZT1 has a maximum output at its resonant frequency. The frequency of the gate drive signals is swept until a voltage appears at CØ, C1 indicating that the current is flowing through CCFL1, and then the frequency can be further ramped and the voltage at C1, CØ monitored until a peak is arrived at, again indicating resonant operation. It should be noted that the topology could be supported in combination with the other topologies such as buck, boost, and SEPIC. When using synchronous sampling, also sometimes referred to herein as adjacent phase sampling, as the frequency of drive signals WF1, WF2 is changed, scheduling electronics in regulation control module (REG) 1204 may need to vary the edges slightly for WF1, WF2, so that the voltage and current samples being taken for the other supplies being controlled by switching power supply controller 1200 are not corrupted, and such that the samples taken from CØ, C1 on this supply will not be corrupted by the gate drive signals for the other supplies.

Section 1.2.2.13 Linear or Fold Back Current Limiting from the Same Structure

Power supplies can be designed to regulate voltage, current or power. Constant voltage power supplies are used for things like microprocessors and memory devices and other voltage operated devices. In the case of a power supply which is designed to regulate voltage, the power supply may have a maximum current which is specified for safety or for noise reasons or other reasons and the power supply will regulate in voltage until such time as the current exceeds a preset limit. This limit is typically set by external components like resistors or similar components. At that point, a fault condition exists in the power supply and the power supply will go back to a very low current. This technique is known as fold back current limiting. This provides protection in the case of a short circuit condition presented to the power supply, by having the power supply limit the maximum current to a very small number so that neither the power supply nor whatever element that caused the temporary short circuit would be damaged. The power supply in the fold back mode does not regulate the current, but rather limits it to a very small number, and its main operational mode is in voltage. An alternate application for a power supply is in constant current. Constant current power supplies power devices that rely on current for their function, an example of this kind of a device being an LED (light emitting diode) which produces light in proportion to the amount of current that is flowing in it. The voltage applied to the LED is not particularly important and in fact it varies depending on temperature and other factors, but the current will always produce a similar proportional amount of light fairly independently of other parameters. A constant current power supply does not examine the voltage in its control loop; it examines the current and attempts to regulate the current through the load to be a constant number, essentially supplying whatever voltage is necessary to maintain that constant current. It can be seen from this that a constant voltage power supply with fold back current limiting has a control loop which regulates the voltage and watches the voltage, treats an over-current condition as a fault and then takes protective action to make the current very small until the short is removed and the voltage is allowed to rise. A constant current power supply regulates the current and a fault condition for a constant current supply can be that the voltage has risen to too high a level, thus indicating typically that the load has open circuited. In one implementation of the invention, all of the feedback terms, current and voltage are derived from analog to digital converter analog to digital converter 1206 (FIG. 12). Thus the feedback is turned into numbers at this point before any control is attempted to be applied. Similarly the control output pulse width modulated signals are also digitally controlled. In between these is a processing element in regulation control module (REG) 1204, which can run a variety of algorithms for any channel controlling a power supply. The algorithms can, for example, regulate voltage producing a constant voltage power supply with fold back current limiting characteristics for error, or regulate for constant current where excessive voltage would be a fault, all without altering the sampling structures such as sample and hold SHM 1207 (FIG. 12), analog to digital converter 1206 (FIG. 12), or the DPC 1201 (FIG. 12). An example of an application for this general purpose capability is in battery charging. For a battery using lithium ion chemistry, a constant current should be provided for the first part of the charge cycle, and then a constant voltage should be applied until the current has fallen below a minimum level. In this operation, the same power supply circuit can be controlled by switching power supply controller 1200 (FIG. 12) and the operational control mode for the power supply circuit changed from constant current to constant voltage. The hardware for implementing the foregoing includes regulation control module (REG) 1204, the SHM 1207, analog to digital converter 1206, and DPC 1201. This hardware and the control loops are described in other portions of the application.

Section 1.3 Converter Topology/topology Equivalents Supported

Figure 45:
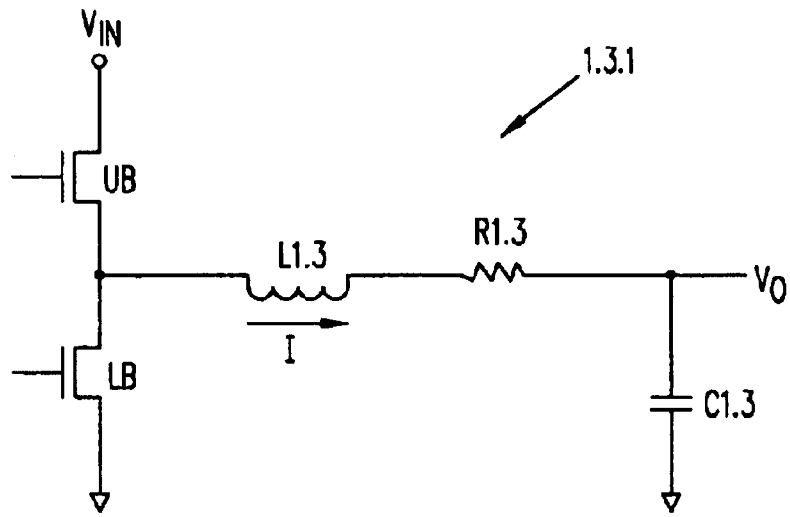
FIG. 45 shows a buck converter circuit.

Section 1.3.1 Buck, Boost, Sepic, Sync, Half-bridge, Multi-phase etc. from a Single Controller Structure The buck converter illustrated in FIG. 45 derives its output voltage, neglecting parasitic effects, by the following straight forward equation:

$$V_o = V_{in} \cdot DC_{UB}$$

Figure 45A:
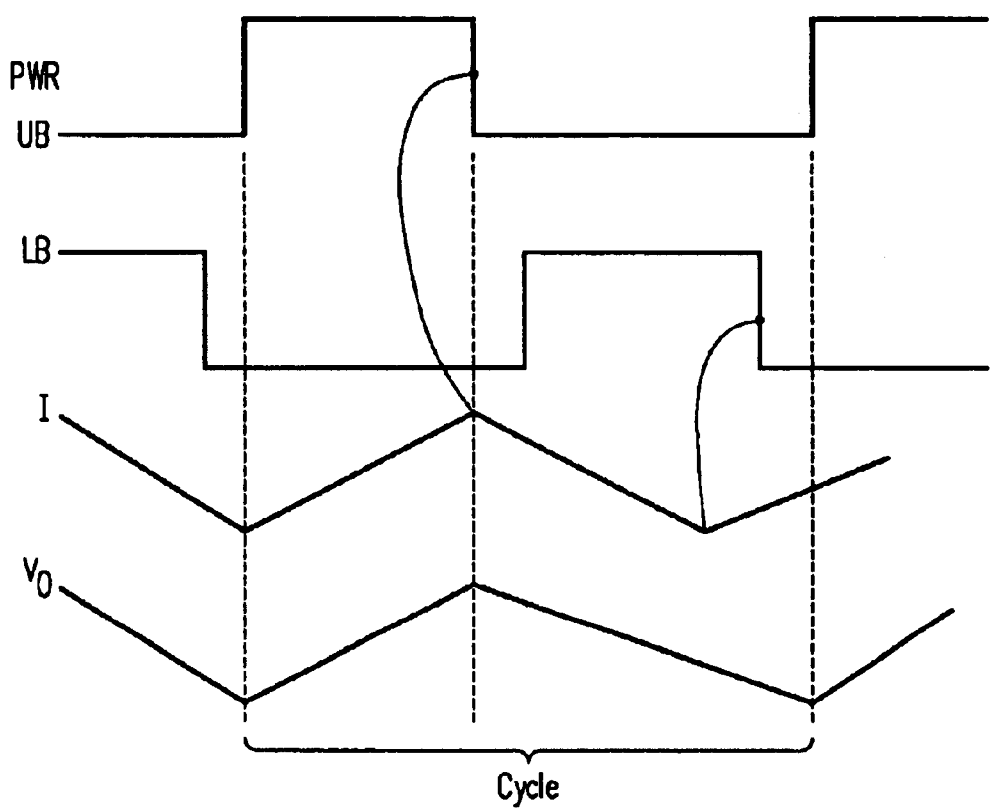
FIG. 45A shows gate drive waveforms for the transistors in FIG. 45 and corresponding current and output voltage waveforms.

Where: $V_o$ is the output voltage $V_{in}$ is the input voltage, and $DC_{UB}$ is the duty cycle of transistor UB In the above equation, duty cycle (DC) is the percentage of the total cycle that transistor UB is on expressed as a decimal number. For example, if the duty cycle (DC) is 50%, then $V_o$ is one-half of $V_{in}$. FIG. 45A illustrates the current I and output voltage $V_o$ as a function of the conduction of transistors UB and LB in FIG. 45. As will be noted in that figure, the voltage and current cycle is indicated by Cycle in the figure and spans the time elapsed between the leading edges of the gate drive signal to transistor UB. This means that there's a direct proportional relationship between the duty cycle in the upper FET (UB) with the output voltage and the duty cycle is the proportion of input voltage to output voltage. So this means that if the output voltage were to fall below a preset value that a small increase in duty cycle could correct the error. If the voltage were to be higher than it should be, then a small reduction in duty cycle would put the voltage back where it was supposed to be.

Figure 45B:
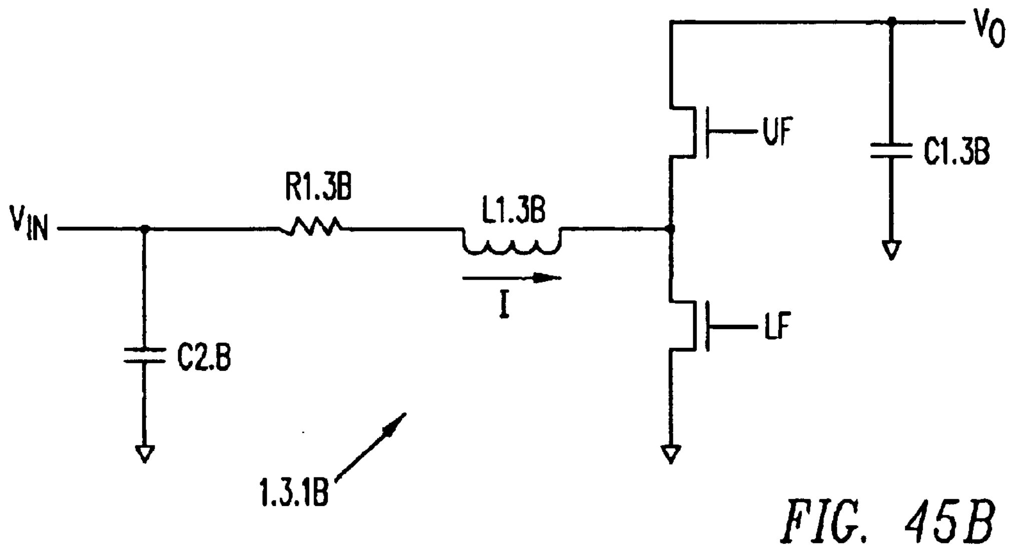
FIG. 45B shows a boost circuit.
Figure 45C:
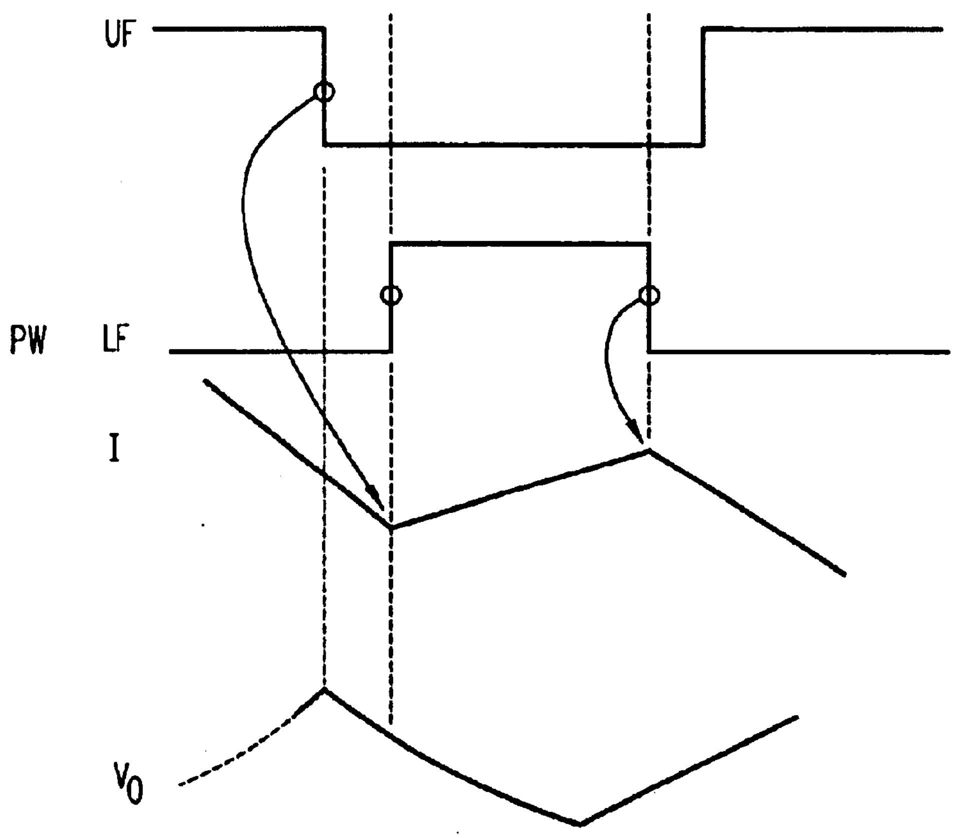
FIG. 45C shows gate drive waveforms for the circuit of FIG. 45B and corresponding current and output voltage waveforms.

FIG. 45B illustrates boost supply 1.3.1B. In the boost supply, the action is quite different. More particularly, as pointed out above, power is sent to the inductor L1.3 by transistor UB in the buck supply of FIG. 45. In contrast, in the-boost supply illustrated in FIG. 45B, the conduction of transistor LF energizes the inductor L1.3B. Referring to the timing diagrams in FIG. 45C, it will be appreciated that the current ramp in inductor L1.3B is started by the transistor LF, here as in the buck converter of FIG. 45, the current ramp is started by the upper transistor UB. The output voltage $V_o$ may be expressed by the following formula:

$$V_o = V_{in} \cdot \frac{1}{1 - \mathrm{DC}_{LF}}$$

Where $DC_{LF}$ is the duty cycle of transistor LF.

In the buck converter of FIG. 45, a fifty percent duty cycle results in an output voltage $V_o$ that's one half the input voltage $V_{in}$. In the boost converter of FIG. 45B, a fifty percent duty cycle results in an output voltage $V_o$ that is twice the input voltage $V_{in}$. In addition, as the duty cycle of transistor LF increases, the output voltage $V_o$ increases for the boost supply. For the buck supply, as the duty cycle of transistor UB increases, the output voltage $V_o$ increases. So it will be seen from the above that if one were to construct a feedback loop for the buck supply, wherein a change in the output voltage would result in a proportional change in the opposite direction for transistor UB, if one then took that same feedback network and applied it to the boost supply, the control would be reversed. That is, for the boost circuit (FIG. 45B), an increase in the output voltage is desired, and the duty cycle of UF was increased, thereby reducing the duty cycle of transistor LF, output voltage $V_o$ would actually go the wrong way, so the control loop would have to be reversed. In addition to that, if one were to attempt to use the absolute values of the duty cycles, that would not work because of the inverse proportionality in the case of the boost supply, so it should be clear that these two switching power supplies need a reversed sense of feedback and they need different feedback mechanisms and a different sequence of control. As an example, in the buck converter, it will be noted from FIG. 45A that transistor LB turns off before transistor UB turns on during a power cycle. But in the boost circuit (FIG. 45B), the transistor LF turns on after transistor UF turns off in a power cycle. So, again, the sequence of events, which signal provides the power, which signal is the leading signal, is actually reversed.

Switching power supply controller 1200 (FIG. 12) is adapted to also control what is referred to in the art as a single-ended primary-inductance-converter (SEPIC) circuit. A typical SEPIC circuit is illustrated in FIG. 46, and indicated by reference character 1301.3. In this circuit, Batt. 3.3, which provides Supply B voltage, drives one end of the primary (indicated by reference character P) of transformer T3.3. The other end of the primary is connected to FET 3.3. Input capacitor C3.4 is connected across Batt. 3.3. Capacitor C3.3 is connected between one terminal of FET 3.3 and one terminal of the secondary (indicated by reference character S) at transformer T3.3 as well as to one terminal at FET 3.4. Transistor FET 3.4 is coupled between one terminal of the secondary S and one terminal of sense resistor R3.3, the other terminal of which provides $V_{out}$. Although intrinsic diodes are only illustrated across FETs $QB_1$, 3.4 and 3.3, they are inherent in all of the field effect transistors. Capacitor C3.4 is connected between the $V_{out}$ terminal and the common ground for the circuit. Feedbacks to switching power supply controller 1200 are provided over lines S6, S7, S8 and S9. The gate drive signals to FET 3.3 and FET 3.4 are provided by switching power supply controller 1200. The operation of the SEPIC circuit will not be described here since it is well known to those skilled in the art. However, with regard to the switching signals to the gates of the transistors, it will be recalled that in a first phase FET 3.3 conducts and in a second phase FET 3.3 is turned off and FET 3.4 conducts. The timing and duration of the control signals to the gates of the transistors is determined by the signals from switching power supply controller 1200. Here again, as in the above-described buck and boost circuits, the order of and duration of the gate control signals is controlled by switching power supply controller 1200 to provide the desired output voltage $V_{out}$ at a target constant value or alternatively at a constant current. The operation of circuit 1301.3 is, as with the other circuits which are controlled by switching power supply controller 1200, is determined by a system configuration which is described elsewhere herein. The configuration is programmed at the outset of the operation of the power supply circuits connected to switching power supply controller 1200. As described in more detail below, the operation of the circuits can be changed dynamically by switching power supply controller 1200 as a function of the feedback from the power supply circuit being controlled, the application of external power, and among other things the voltage of batteries used in connection with the circuit.

Switching power supply controller 1200 may also support other power supply configurations such as the half-bridge which is illustrated in FIG. 25 and FIG. 44. As explained more fully below, regulation control module (REG) 1204 includes transfer functions and is programmed to provide the appropriate signals for controlling power supplies connected to the system. In one embodiment, DPC 1201 and NFET driver module 1202 are utilized to generate the control signals which are provided to the gates of the power supplies connected to the system.

In switching power supply controller 1200 (FIG. 12), because the sampling function performed by SHM 1207 and the driving functions are merely controlled by analog to digital converters in the case of sampling functions, and digital logic in the case of the drive functions, it's a software task, or one method of implementation is to simply apply the correct transfer function and sequence of control in order to change topology. In this way, with the same internal structures, drivers for the external FETs, sample and holds and multiplexers, analog to digital converters for reading the input voltage, a variety of control loops supporting a variety of different external topologies can be implemented without change in the external or internal structure of the chip except with regard to the software that runs within it.

We've demonstrated above three different topologies that are very different, but it should be seen from this that actually any number of different topologies could be implemented so long as their transfer functions are known and the circuit itself has been informed of the external topology and the interconnect of the external components.

Section 1.3.2 Buck, Boost, Sepic, Sync, Half-bridge, Multi-phase etc. from a Single Controller Structure Referring to FIG. 12, it can be seen that in this implementation, there is a single regulation control module (REG) 1204 which controls a variety of outputs. By providing programmable information to the software data set for each instance of the regulation software associated with each output, different topologies (i.e., buck, boost) can be achieved on different outputs simultaneously. For example, one set of outputs might be described to the regulation hardware block as being connected in the configuration of a buck converter. An adjacent set of outputs could be defined to the regulation hardware block as a boost converter or a half bridge, a sepic, or other topology. Regulation control module (REG) 1204 then can dynamically by processing first one feedback and then the next, switch between different topologies all operating on different pads from the point of view of the external system all operating simultaneously, but due to the sample nature of the data and the digital nature of the pulse width modulation control, in fact, a single regulation engine is processing each topology and feedback strategy in time one after the other to maintain regulation on all pads simultaneously.

Section 1.3.3 on the Fly Topology Reconfiguration

In one implementation of the present invention, dynamic reconfiguration of a controlled power-supply is provided. In one mode, the controlled power supply may operate as a buck supply, in another mode as a battery charger and in another a battery boost circuit. Referring to FIG. 46, an embodiment is illustrated in which the topology of circuit 1300.2 can be changed by appropriate application of control signals to the gates of the transistors. For example, assume that no external power is being supplied and that Batt. Ø is at 3.1 volts. Further assume that circuit 1300.2 is running as a boost converter off of Batt. Ø and providing 3.5 volts to Supply A, which is driving Load I through Supply 1. In this example, we further assume that Batt. Ø when fully charged has an output of 4.2 volts. If external power (indicated in the figure by Ext Pwr) is applied, of for example 12 volts, this is detected by switching power supply controller 1200. Upon detecting that external power is present, switching power supply controller 1200 provides drive control signals to the gates of transistors $QT_Ø$ and $QB_Ø$ to operate circuit 1300.2 as a buck power supply, allowing current to flow from the external power and be regulated through circuit 1300.2 and then delivered to Batt. Ø at the correct current and voltage to affect charging of Batt. Ø. If Batt. Ø becomes fully charged, then the circuit 1300.2 could be switched off, or maintained in a trickle charge mode to maintain the charge on Batt. Ø. The external power also supplies power to circuit 1301.2, which for illustration purposes, is supplying Load I at 3.3 volts via the bus called Supply A. In another mode, assume that the external power is removed and that Batt. Ø is either fully charged to 4.2 volts or charged to a voltage sufficiently high to drive circuit 1301.2 directly from Batt. Ø. Switching power supply controller 1200 detects that the external power has been removed by observing the drop in voltage of Supply A. Under these conditions, switching power supply controller 1200 will turn transistor $QT_Ø$ on continuously and transistor $QB_Ø$ will not be provided with gate drive signals. Switching power supply controller 1200 operates in this mode because it detects that Batt. Ø is providing an output voltage of 4.2 volts or a lower voltage which is sufficient to supply voltage to circuit 1301.2 in excess of the 3.5 volts which it needs to maintain regulation output to Load I at 3.3 volts. This state is maintained as the battery is discharged through transistor $QT_Ø$, through Supply A into circuit 1301.2. When switching power supply controller 1200 detects that Supply A has declined to 3.5 volts, which would represent a duty cycle of about 95% for circuit 1301.2, at this point it's clear that without additional voltage at Supply A, it would not be possible to maintain load regulation for $V_o$ being provided by circuit 1301.2. Accordingly, switching power supply controller 1200 transitions circuit 1300.2 to a third state, that is the state where the battery is less than 3.5 volts and switching power supply controller 1200 begins to operate circuit 1300.2 as a boost converter, whose source is Batt. Ø and switching power supply controller 1200 regulates boost operation to regulate Supply A at 3.5 volts. Switching power supply controller 1200 can now maintain Supply A at 3.5 volts meeting the minimum requirements of circuit 1301.2 until the battery is discharged or until external power is again available. This allows the system to provide output voltages which may be higher or lower than the input battery voltage and allows switching power supply controller 1200 to utilize circuit 1300.2 in one of three modes: (i) as a buck converter to charge the battery; (ii) as a switch to supply battery voltage directly to Supply A through $QT_{Ø}$; or (iii) as a synchronous boost converter to allow operation of circuit 1301.2 to provide output voltages above the voltage available from the Batt. Ø. The hardware for implementing the foregoing is shown in FIG. 12, and comprises central processing module (SYS) 1205, regulation control module (REG) 1204, sample and hold module SHM 1207, the output of which feeds analog to digital converter 1206. Also, NFET drivers module 1202 are utilized to drive the gates of the transistors.

Section 1.3.4 Programable Topology on a Multi-output Controller

In order to provide support for different topologies in prior art solutions, the same internal structures would actually have to change their sense of feedback, the way the pulse width modulation signal was fed to the external FETs would have to be reversed, dead times reinterpreted to mean something different that does not overlap, etc. The foregoing discussion on supporting multiple topologies from the same structure indicates that if the fundamental elements were digital, that is, the feedback information monitored from the outside were converted to a digital signal and the control of the pulse width modulator outputs were also done digitally, that all of this could be accomplished in software; that is, the single structure could support multiple topologies. In order to make that a practical production product, it is necessary for such a switching power supply to know at the instant of activation what sort of a supply it is supposed to be. This can be accomplished in a variety of ways. In one implementation, this could be accomplished with external mode control pins, which could be soldered in one state or the other. A disadvantage to that strategy is that it wouldn't be possible to change the topology dynamically, which may be desirable. For example, the circuit of FIG. 45 could be a battery charger circuit, which is a buck topology for the purposes of charging the batteries which would be connected to $V_o$, but later, under different circumstances, when external power is no longer available and the batteries are the source of power, that same external connection could actually represent a boost topology, where the input and output voltage samples are reversed in their significance and the duty cycle is reversed in its significance and new regulation is applied. More particularly, circuit 1.3.1 would be converted to a boost circuit in which the battery connected to $V_o$ becomes the $V_{in}$ and the $V_{in}$ would become $V_o$. In this scenario, the direction of the current indicated in FIG. 45 would, of course, be reversed. So it's desirable to be able to change the topology on the fly and this can be accomplished by providing mode control bits within the switching power supply itself that could be stored, for example, in a non-volatile memory 1216 (FIG. 12), or could be changed under program control, for example, to go from the battery charging operating to boost operation.

Section 1.4 Discussion of Coulombmetric Measurement in a Switching Power Supply

Section 1.4.1 Cycle-by-cycle Energy Extrapolation from Current/voltage Pulse Data The current invention offers a significant improvement in a system designer's ability to accurately measure, control, and predict the energy available to the system from it's rechargeable battery or batteries. Importantly, this is accomplished without additional components beyond those already provided for the buck/boost regulation system described. Many of the component parasitic values, described in conjunction with the regulation algorithms, are also reused. Finally, the current invention is more energy efficient and enables much improved accuracy in determining the remaining battery energy at any given moment, which system designers may translate into longer battery life, smaller batteries, lower weight, smaller form factor, lower cost, or a combination of these.

The prior art does not provide a satisfactory method of accurately measuring the remaining energy capacity of a battery. For example, cellular phones typically rely upon measured voltage to indicate state of charge. However, if a low battery is recharged, even for a brief period of time, it will falsely indicate a full charge when removed from the charger. Since this is simply a measure of surface charge, not energy available, the user will experience the equivalent of short battery lifetime, perhaps even believing the battery is worn out and needs replacement.

Using coulombmetrics, one measures the actual energy delivered to and taken from a battery. Energy available can be influenced by such factors as the number of past charge/discharge cycles, cell temperature, charge/discharge rates and such. Fortunately, these factors do not have to be precisely known if one knows how much net energy has been put into the battery. The approach is to determine how much energy is put into the battery, hence available for delivery, then measure said delivery accurately and alert the system monitor when certain conditions are reached. This is important for personal digital assistants ("PDAs"), notebook computers, and other devices which hold certain information in volatile memory devices but can move the data to a nonvolatile media if the. unreliability or failure of the volatile memory device is imminent.

For example, PDAs which utilize the WIN CE operating system ("OS") must faithfully save the context of all open files and certain system variables before a complete shutdown with attendant loss of volatile memory. In fact, failure to save this data before loss of adequate power may corrupt the OS, such that the product is rendered irrecoverably nonfunctional. For this reason, such products are not designed solely with user-removable batteries but rather with at least one non-removable battery for memory keep-alive. The system design cannot just recognize when the energy is depleted, but must anticipate depletion far enough ahead of time to allow adequate energy to save off the critical data to a nonvolatile media.

Since determining battery energy from voltage alone is very inaccurate, designers must allow a large margin. This causes the user to experience a short battery life, since it is when the product ceases operation, not when the battery is actually depleted, that the user perceives the battery to be exhausted.

Another, better approach of the prior art is to use a measuring device associated with the battery. In notebook computers this device is often inside the battery case itself. In PDAs it is an additional, costly device, external to the battery. As with the current invention, these schemes measure the power delivered to and removed from the battery, as well as measure battery temperature to calculate the energy available. However both approaches suffer from a serious shortcoming: the sensing resistor needed to create a voltage drop sufficient to measure during low current draw (say, 2 millamperes in standby operation) must be relatively large, which then causes it to consume a significant amount of power during high current operation.

A unique technique utilized in the present invention is to instead accurately measure the power delivered from and provided to the power supply/regulation system. An important aspect of the present invention is to indirectly measure current draw during low power operation without using a sense resistor. This resistor, which is needed for regulation, may then be a low value such that there is little loss during high power operation.

Referring to FIG. 46, one topology is illustrated showing a single, multipurpose stage 1300.2 which can be used as battery charger stage, and a single output stage 1301.2. In this configuration, assume no power is externally supplied. The voltage of battery Batt. Ø may range from 4.2 to 2.7 volts. If, for example, the target value for $V_o$ is 3.3 volts and we connect the Supply A rail directly to a 2.7 volt battery, a buck converter will not work. In the present invention, when the battery voltage is 4.2 volts, we turn on FET $QT_Ø$ and leave it on continuously, which supplies 4.2 volts to Supply A. Stage 1301.2 then operates as a buck converter. When the voltage of the battery approaches the required output voltage $V_o$ of the buck converter, we begin operating stage 1300.2 as a boost converter. More specifically we turn on transistor $QB_Ø$, causing inductor LØ to charge, then discharge inductor LØ into capacitor $C_E$ via transistor $QT_Ø$ with transistor $QB_Ø$ turned off. This allows operation all the way down to a battery voltage of 2.7 volts while maintaining a regulated 3.3 volts at $V_o$. The typical battery voltages will depend upon the technology of the battery selected for the system.

Figure 46A:
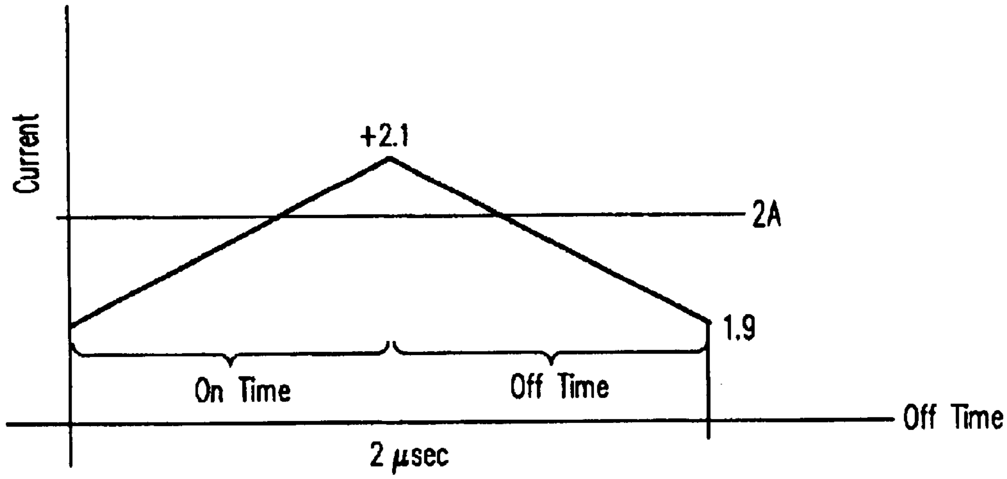
FIG. 46A shows a plot of current with respect to time for one cycle of a switching power supply.
Figure 46B:
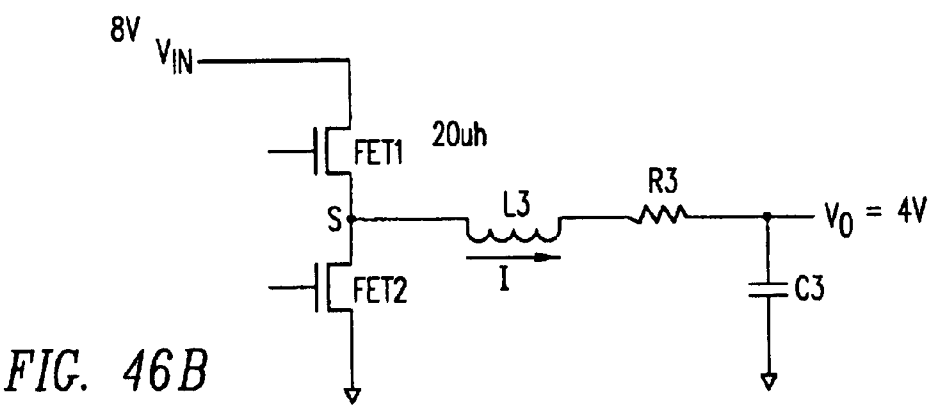
FIG. 46B shows a buck power supply circuit.

There are two distinct techniques employed by the invention to measure power removed from the battery. One is appropriate for very low current drain conditions. During low current discharge and when circuit 1300.2 is operated as a buck circuit, the time between gate pulses to transistor $QT_Ø$ is typically very long. This is typical of applications in low power, wherein power is only needed due to leakage and supervisory circuits; usually a few milliamps or less. Referring to FIG. 46B, the higher current method is used when the inductor L3 is driven during some portion of each cycle time. Note that continuous and discontinuous modes (defined elsewhere) utilize the same methodology. All of these techniques have the benefit of utilizing only the components already employed for accomplishing regulation.

First let's examine the measurement of the power taken from the battery during low current operation. One can monitor the power delivered by the battery Batt. Ø by measuring the voltage drop across sense resistor RØ. As discussed earlier, however, this would have the same problem as the prior art, namely the necessity of a large resistance to enable an adequate voltage drop for analog-to-digital conversion (ADC), which would then cause a significant power loss during high current operation. The present invention avoids this issue entirely by instead monitoring the voltage across the Supply A capacitor CE. Since switching power supply controller 1200, FIG. 25) has an accurate time base from the crystal oscillator, the power may be precisely determined by the formula I=C(dV/dt), where C is the value of capacitor $C_E$. The change in Supply A voltage (measured by analog to digital converter 1206 shown in FIG. 12 relative to ground) is determined by measuring and recording the voltage at precisely known time intervals, which are under program control. The advantages of this method are numerous, for example: (i) the value of resistor RØ, may be kept very small; (ii) all of the power removed from the battery is measured; and (iii) no additional components are needed. By measuring ΔV over a relatively long time period one eliminates noise or transient factors from introducing errors. Although in FIG. 46 only two stages are shown, switching power supply controller 1200 may be controlling a plurality of circuits which are powered by Batt. Ø. It will be understood that this method of measurement is only appropriate when all power outputs being driven by Batt. Ø are in low current mode. If one output were in a high-current mode and others in low power (e.g., sleep) mode, the outputs in low power mode would simply be ignored, a very small error compared with the energy utilized by the high power stage or stages.

In the above technique, the charge removed from the capacitor is measured over time. As described elsewhere, the system is informed about the characteristics of the external components connected to it. The system uses these values of the external components and utilizes them in the coulombmetric calculation. This is important because since the exact capacity of the battery is unknown, we measure how much goes in, we measure how much goes out, then correct for temperature and other factors which affect battery capacity.

Battery capacity varies from unit to unit, so there is no way to know the capacity in one cycle. Products that utilize coulombmetrics are typically inaccurate until they go through a charge/discharge cycle. In the method of the present invention, in low current mode, we measure very, very low current without any efficiency loss which is suffered in the prior art by having to use large values of resistance for the sense resistor. We also avoid the use of a very high resolution A to D converter because we are resolving time in our implementation. Time is the factor where we have the most precision of all. The value of resistors R1 and RØ depend upon the supply design, not the coulombmetric needs. They would typically be in the range of 20 to 100 milliohms.

In accordance with the present invention for coulombmetric measurement in conditions of high and medium power delivery, a measure is made of the power delivered to the load. This will be equal to the power removed from the battery, scaled by efficiency. This technique is also useful for measuring the energy put into the battery during charging; the same technique is used, the battery simply being the load. The advantage is that what is measured is the net energy delivered to the battery by the external supply, allowing the designer to ignore power delivered during that time to the other loads. Thus the estimate of total power available from the battery remains one of keeping a running total of net energy stored in the battery, considering temperature and other factors previously discussed.

Consider now the high current usage case. Current must be measured on a cycle by cycle basis. This is because power is delivered to the load in some portion of every 2 μsec cycle, with the duty cycle being continuously recalculated and set to hold the voltage $V_0$ within the desired controlled interval. Referring again to FIG. 46, one solution would be to measure the total current delivered by the battery Batt. Ø by measuring the voltage across resistor RØ. However, to sample out transients and noise would require frequent sampling throughout each cycle, especially in systems with multiple outputs active. This would create a computing burden that would be equal to that of regulation itself. Instead, according to one technique of the present invention, a determination is made of the power removed from the battery for each cycle, using only one summing the power over many cycles.

A simplified implementation is described below using FIG. 46B in the explanation. This scenario has a baseline current of 2 amps with a ripple current of 200 milliamps, as depicted in FIG. 46A. That is, the total current swings from 1.9 to 2.1 amps. The technique of the invention is to sample the current at its peak, which is known to occur just before FET1 switches off and FET2 switches on. This is done by sampling the voltage across the output stage via sense lines S3 and S4 using sense resistor R3. Although sense resistor R3 has a low value (as discussed in the low current mode description), current I is now high enough to cause an adequate voltage drop for A to D conversion.

The on time is known, the off time is known, therefore dt is known for this stage. We know the output voltage ($V_o$) which is measured using sense line S4 and the input voltage ($V_{in}$=SupplyA), thus we know the voltage across the inductor L3 ($V_{in}-V_{out}$) and we know the characteristics of inductor L3. This tells us how much energy is being delivered to the load on a 2 microsecond basis. Typically, the system reports coulombmetric information out ten times per second, a very fast update rate for coulombmetrics. By keeping a running total of power delivered to the load and knowing the efficiency and other characteristics of the battery, we have a very precise measure of the power available from the battery at any moment. So for high currents cases, coulombmetric measurements are available from the method that we use to perform regulation. No additional circuitry is required, only a calculations. In the prior art, one of the major jobs is to filter out noise. The system of the present invention synchronously samples with the noise source so there is no noise to filter since it is not seen at sampling time.

Figure 46C:
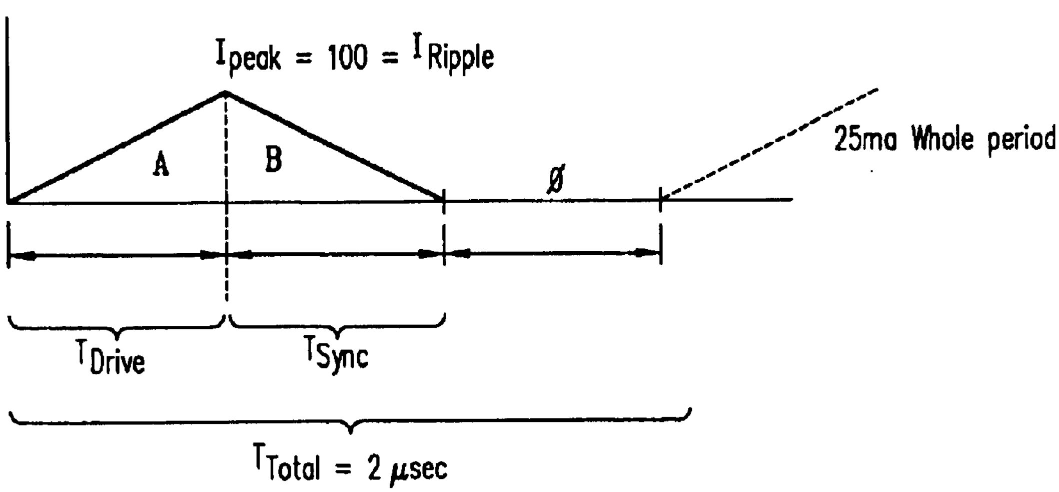
FIG. 46C shows a plot of current with respect to time for one cycle of a switching power supply circuit.
Figure 46D:
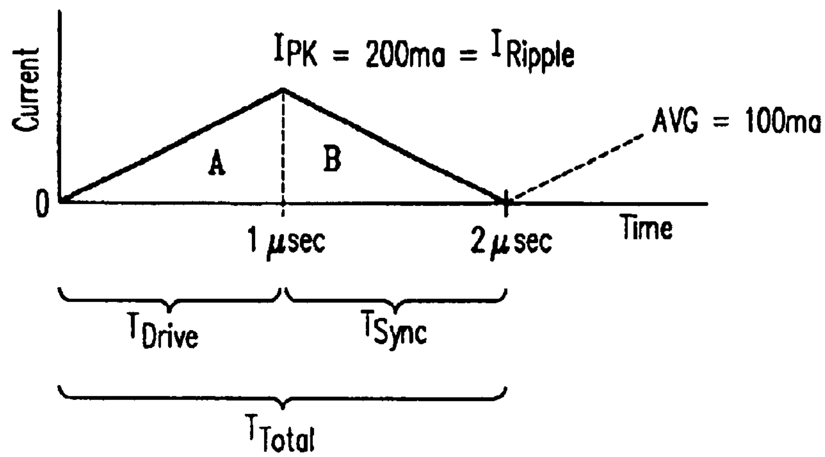
FIG. 46D shows a plot of current with respect to time for one cycle of a switching power supply.

In the continuous mode, which is illustrated in FIG.46D, ($T_{Drive}+T_{sync}$)=$T_{Total}$2 μSec. As used herein, the phrase "continuous mode" means that current is flowing through the inductor for the entire switching cycle. In a discontinuous mode, which is illustrated in FIG. 46C, the relationship is: ($T_{Drive}+T_{sync}$)<$T_{Total}$.

Referring to FIG. 46D, an example is illustrated of the current I through inductor L3 as a function of time over a 2 microsecond period, illustrative of continuous mode. In this example, a peak current of 200 milliamps, indicated by $_{IPk}$, is achieved in one microsecond. During the second microsecond of the period the current declines to zero. During the first half of the period, FET1 is conducting and FET2 is non-conducting. During the second half of this period the conduction reverses. In this example, in the second half of this period the current through inductor L3 has declined to zero, but has not-reversed, as is the case in some instances described herein. The period during which FET1 is conducting is indicated in FIG. 46D as $T_{Drive}$ and the period during which FET2 is conducting as indicated by $T_{sync}$. The total time for the measurement period is indicated by $T_{Total}$.

Now assume the system to be operating in the discontinuous mode as illustrated in FIG. 46C. The load requires an intermediate current, for example 25 ma. The time that it takes for capacitor C3 to decay is immaterial because a pulse is being supplied in every cycle we want a peak current of 100 ma and an average current during the first phase, from time 0 to 1 μsecond, of 50 ma and a total output current of 25 ma for the 2 μsec period. Calculating 100 ma using R3 is difficult because the value of R3 is low, typically 0.05 ohms, and accordingly we have very little resolution. However, in the circuit, we know that the value of inductor L3 is 20 μh in this example. We know precisely what the input voltage is ($V_{in}$=8V), what the output voltage is ($V_{out}$=4V), the time it was on (1 μsec) and that gives us the current that went into inductor L3, the time that it was discharged and this gives us the current that was flowing out of inductor L3 and we know the time it was off. Again, we can precisely calculate the load on a cycle by cycle basis.

If the output voltage $V_{out}$ were lower, it would take much less time to charge inductor L3 than to discharge it. If ($V_{out}$) were, for example, 2 volts, we would have 6 volts across inductor L3 and the current would ramp up more rapidly than down. From the foregoing, it will be appreciated that all the numbers required to calculate the current are available without actually directly measuring it. We provide below a general equation for calculating the current going into the load. Instead of measuring current as is done in the prior art, only time and voltage measurements are required. The system takes these measurements at a rate of 500,000 times per second, however, culombmetric data is only updated 10 times per second by taking these numbers continually and averaging them.

Figure 46E:
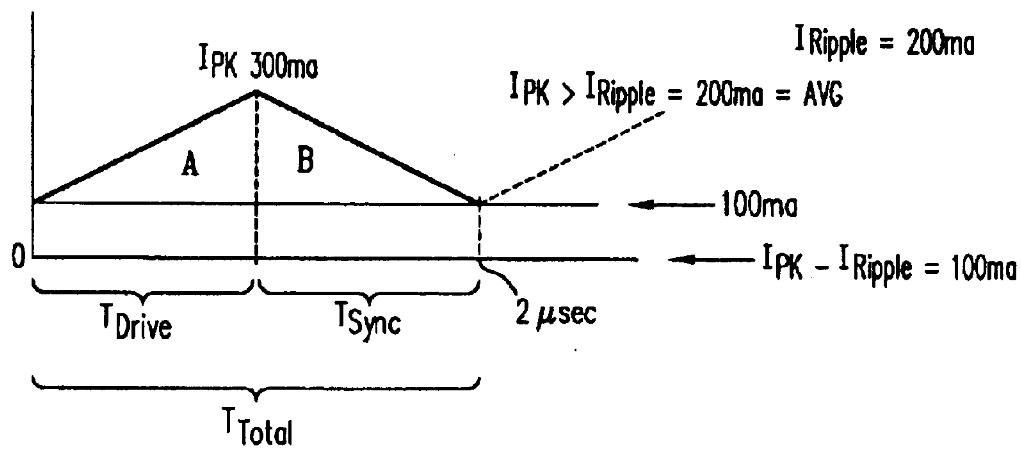
FIG. 46E shows a plot of current with respect to time for a switching power supply circuit.

FIG. 46E illustrates an example in which the coil current of inductor L3 is 100 milliamps at the beginning of the drive period and at the end of the drive period with the current flow in the direction of L3 to R3. During time $T_{Drive}$, FET1 is conducting and FET2 is non-conducting and during the $T_{sync}$ period the conduction of the FETs is reversed. The total time period is indicated by $T_{TOTAL}$. In this example, peak current $I_{Pk}$ is greater than ripple current $I_{Ripple}$. As will be appreciated, $I_{Ripple}$ is equal to 200 milliamps and $I_{Pk}$ is 300 milliamps. This, of course, results in($I_{Pk}-I_{Rippple}$)=100 milliamps.

The average current per second flowing during the time periods illustrated in the above examples may be determined by the formula:

$$I_{Avg/sec} = \frac{V_{in} - V_{out}}{L} \cdot \frac{1}{2} \cdot \frac{T_{DRIVE}}{T_{TOTAL}} + \frac{\emptyset - V_{out}}{L} \cdot \frac{1}{2} \cdot \frac{T_{SYNC}}{T_{TOTAL}} + I_{Pk} - I_{Ripple}$$

where $T_{SYNC}$ is the time required for the inductor current to reach zero in the discontinuous mode, or ($T_{Total}-T_{Drive}$) in continuous mode. Also, for the calculation above, it is assumed that the current through inductor L3 is not allowed to go negative (i.e., flow from $V_{out}$ toward terminal S); and that the peak current, $I_{Pk}$, through inductor L3 is less than its saturation current.

The first term in the above equation represents'the A portion of the current contribution indicated on the figures, the second term of the equation represents the B portion of the current indicated in the figures and the final term is indicated by C which is the continuing current that flows in inductor L3. It will be appreciated from the above that the current being delivered can be calculated using information available in the system rather than being measured as is the case-in the prior art. This greatly simplifies the task, as well as reducing the circuitry required.

Note now an optional variant of discontinuous mode. As power demand from a stage is reduced, the duty cycle, hence $T_{DRIVE}$ time, is reduced. When this time becomes small the switching losses of the FETs can become a significant loss of energy in the system. The same duty cycle may be achieved with less loss, hence better efficiency, by not turning on FET1 for one or more cycle times, thus averaging $T_{DRIVE}$ and $T_{SYNC}$ over this time which is now longer than (but a multiple of) 2 sec. This mode is called "the cycle skipping mode." Note, then, that the above formula still applies, with $T_{TOTAL}$ equal to the time interval between $T_{DRIVE}$ pulses. It will be recognized, then, that continuous and discontinuous modes are simply a special case wherein $T_{TOTAL}$=2 μsec.

Section 1.4.2 Total Energy Calculation from Multiple Channel Data

Figure 47:
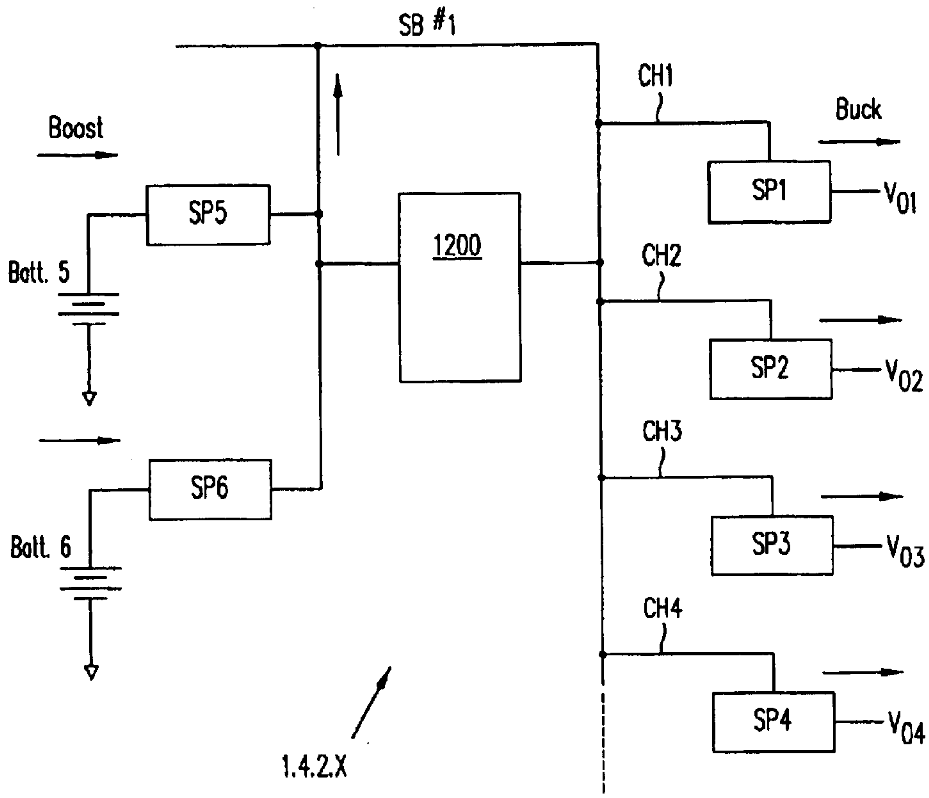
FIG. 47 shows switching power supply controller 1200 connected to a plurality of power supplies.

Consider an array of switching power converters as shown in FIG. 47. This is an exemplary arrangement; there could be many other architectures. As stated earlier, any output stage may be freely configured as a buck converter (for example, stages SP1, SP2, SP3, SP4), or as a boost converter (for example, stages SP5, SP6). Stages SP5 or SP6, then, when connected to a battery, may simply connect the battery to a supply bus SB #1 if the battery voltage is above what is needed for the buck converters SP1–SP4. Alternately, switching power supply controller 1200 can configure converters SP5 and SP6 as boost converters when the voltage of the batteries are below what is required to meet the needs of the buck converters, but above the minimum useable energy of the battery. Additionally, switching power supply controller 1200 controls the charging of the batteries if charging is needed and an external supply is connected to bus SB1, Switching power supply controller 1200 selects between BATS and BAT6, depending upon the needs of the system and the energy available in each battery. For ease of illustration, less than all of the control connections between switching power supply controller 1200 and converters SP1–SP6 are illustrated. A full set of connections between switching power supply controller 1200 and controlled converters are illustrated in other portions of this specification.

In this multiple-output system the energy state of BAT5 and BAT6 (and of the two collectively) is determined by employing the coulombmetric measurement techniques discussed herein, that is, determining the energy delivered by each of the converters SP1, SP2, SP3, and SP4, factoring in the efficiency of the system, as well as certain battery parameters as detailed elsewhere. Then the power profile of the whole system is the sum of these elements. This information is reported to switching power supply controller 1200 for purposes of load balancing, load shedding, tuning an individual channel or system for optimal efficiency, or identification of a problem or even failure.

Once this is understood, it will be appreciated that an array of systems such as that in FIG. 47 may be utilized and the information/control managed by a higher level control system. One example is a telephone central office, where the system can detect a problem in an area (e.g., cooling suddenly blocked to a specific area) or an individual card or supply channel (e.g., a short or open in one of it's loads). As before, no additional hardware is needed, simply reuse of known data for another purpose.

Section 1.4.3 Battery Life-time Estimate in an SPS

The above details the invention's determination of energy removed from a battery. To complete the system description, refer to FIG. 48. The system includes a battery source indicated as Batt. 1.4.3; a charger boost circuit CB1, which can function as a charger when external voltage is provided, that is the battery can be a load to the CB1 supply and the energy provided to battery 1.4.3 measured per the above descriptions; and a buck converter CB2. As explained more fully elsewhere in the specification, circuit CB1 can operate as a switch when the battery voltage is above the voltage required by the buck converter CB2, or as a boost supply when the battery voltage is below the voltage required for the buck supply CB2. Both of these power supplies are monitoring the energy that is flowing through them and provide that information to the processing element 1.5 which can be part of switching power supply controller 1200. Processing element 1.5 also receives temperature data from temperature sensor element T.

Temperature sensor T may be a thermocouple, a thermal variable resistor, or it could be a Kelvin temperature sensor. In one implementation of the invention, a Kelvin temperature sensor is used. The integrated circuit also has pins to support an external Kelvin temperature sensor, depending upon the proximity of the integrated circuit to the battery. Data from one or the other of the sensors, or both, can be used. During charge cycles, the total amount of energy that is provided to the battery is monitored, scaled with the battery temperature using data provided by the battery manufacturer, and the total charge that the battery absorbs is computed. Batteries absorb more charge when they are hot than they do when they are cold. Also, they have more energy available when they are discharged hot than when they are cold. The worst possible combination is to charge it cold and use it cold. By using capacity degrade data to first compute how much energy is actually delivered to the battery, then monitoring the temperature and the rate at which the charge is being removed from the battery by the buck converter CB2, which reports its power information to processing element 1.5, the time remaining until battery exhaustion is calculated.

Figure 48A:
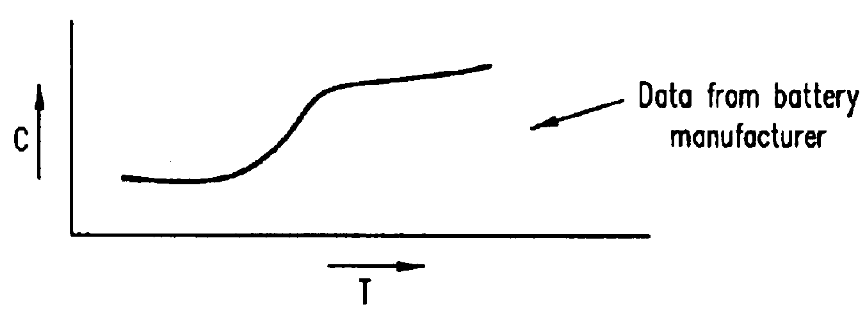
FIG. 48A shows a curve of battery capacity with respect to temperature for a typical battery.
Figure 48:
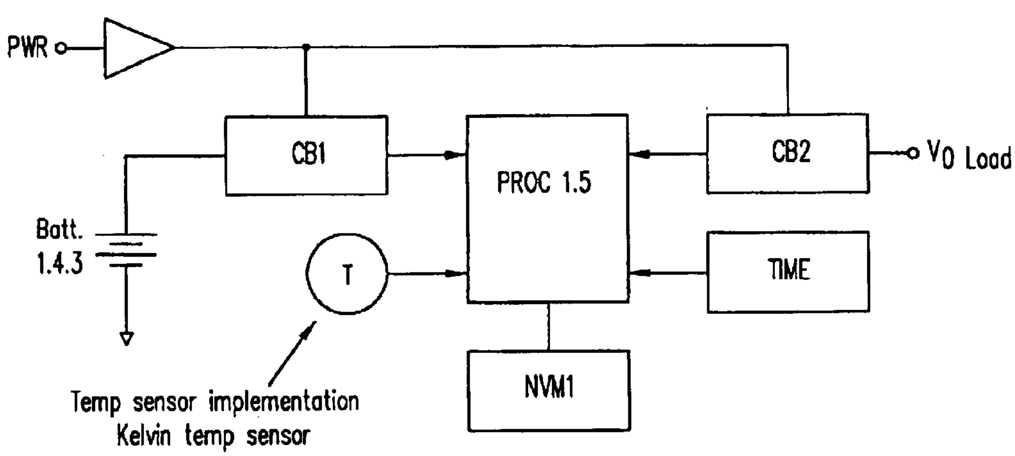
FIG. 48 shows in block diagram form a processor coupled to two switching supplies, a nonvolatile memory and a Kelvin temperature sensor, with a battery connected to one of the switching power supplies.

FIG. 48A illustrates a typical battery degrade curve which plots capacity (C) versus temperature (T). This information is published by battery manufacturers. The battery degrade curve information may be programmed into processor 1.5.

In these applications the battery is known to the system. It is either part of the system, or the power supply system is built into the battery module. The battery degrade information about the battery capacity can be stored in nonvolatile memory indicated by NVM1 in the figure. It's also true that for families of battery chemistries there are similar characteristics. So although the given capacity for some manufacturers are better or worse, the decay rates, for example for nickel metal hydride batteries, are similar even if one does not know the data for that specific brand of battery. Clearly, the more stable the temperature is, the less important the degradation data is.

Section 1.4.4 SPS Current•voltage (Power) Regulation Based on Coulombmetric Data In the previously described embodiment the coulombmetric methodology may be used to accumulate and report energy consumption or input.

An alternative implementation is for the coulombmetric data to be used as an input for regulation. With cycle by cycle energy as the regulated parameter in a control loop constant energy could be delivered to a load or consumed from a source. This regulation could be accomplished by adjustment on a cycle by cycle basis of the duty cycle of the FETs based on maintaining a constant coulombmetric (energy) value. One application of this technique would be to regulate the input energy to a radio frequency power amplifier for the purpose of power level control. Another would be to regulate the power delivered by a photovoltaic cell.

In the previously described embodiment the coulombmetric methodology made use of certain voltage measurement obtained for use by the regulation control program. That is, the coulombmetric algorithm program reuses voltage measurements (for example, the voltage across sense resistor R1 in FIG. 46) taken by the voltage regulation program and stored into a predetermined memory location.

An alternative implementation is for the coulombmetric program loop to take this data instead, and the regulation algorithm program can then make use of the stored data. An advantage of the current invention is the ability to take data only once, then make the data available for other purposes. By using the program control, the data of interest is taken during each cycle frame, and that the data is saved for reuse by other program(s).

The voltage control program (if that is the preferred method of control for a given output channel), then, would make use of said data measured within the coulombmetric loop to control voltage as previously described. That is, adjustment on a cycle by cycle basis of the duty cycle of the FETs.

Section 1.4.5 SPS Constant Energy Output Regulation Mode

Previous descriptions of the application of the invention have focused on voltage, controlled to remain within a certain target range. Having the capability to collect and utilize coulombmetric data permits its use to instead control power directly. That is, the combination of voltage and current, not simply one or the other. This is beneficial for applications where power must be kept within a target range, such as the RF output of a cell phone, or where control of the power level can lead to optimized efficiency, such as with a solar panel array. Recall that the invention develops this information with fine granularity and accuracy on a cycle by cycle basis. This information may then be used to manage the control loop.

Figure 49:
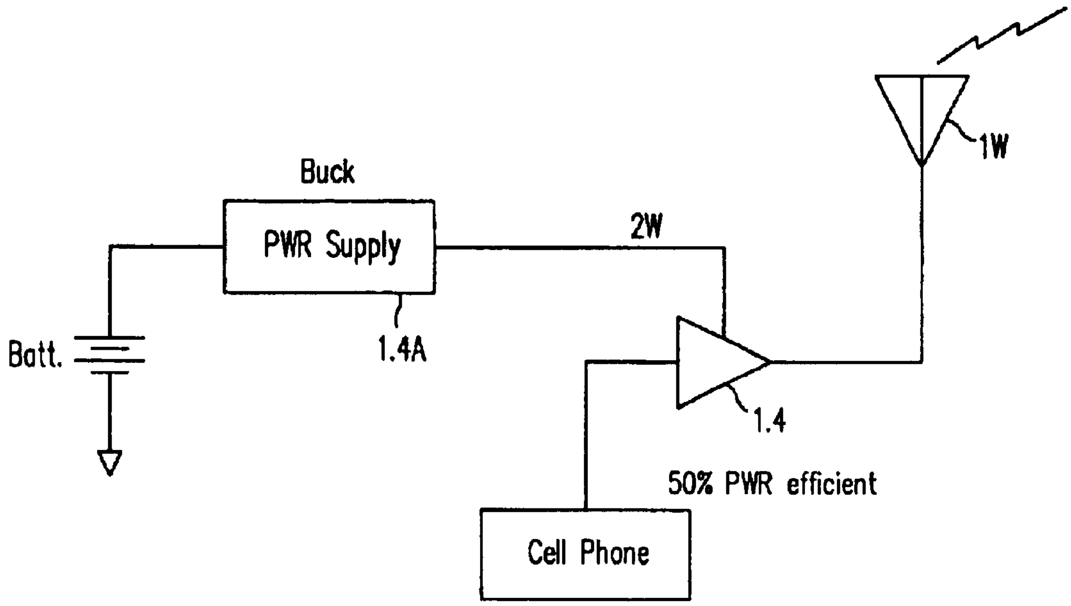
FIG. 49 shows a block diagram of a power supply system for use in conjunction with a cellular telephone.

A highly simplified example of a typical cell phone is shown in FIG. 49. The desire for best performance while keeping output below an agency-imposed maximum suggests the value of controlling to a specific power level, say, 1 watt. Power supply 1.4A may be a buck or boost topology, and typically the power amplifier 1.4 would have an efficiency of 50%. The strategy then is to control the output of Supply 1.4A to provide a constant 2 watts into power amplifier 1.4, compensating for changes in voltage or current, depending upon temperature, and unit to unit variations. This is accomplished by using switching power supply controller 1200 to regulate power-supply 1.4A.

Figure 49A:
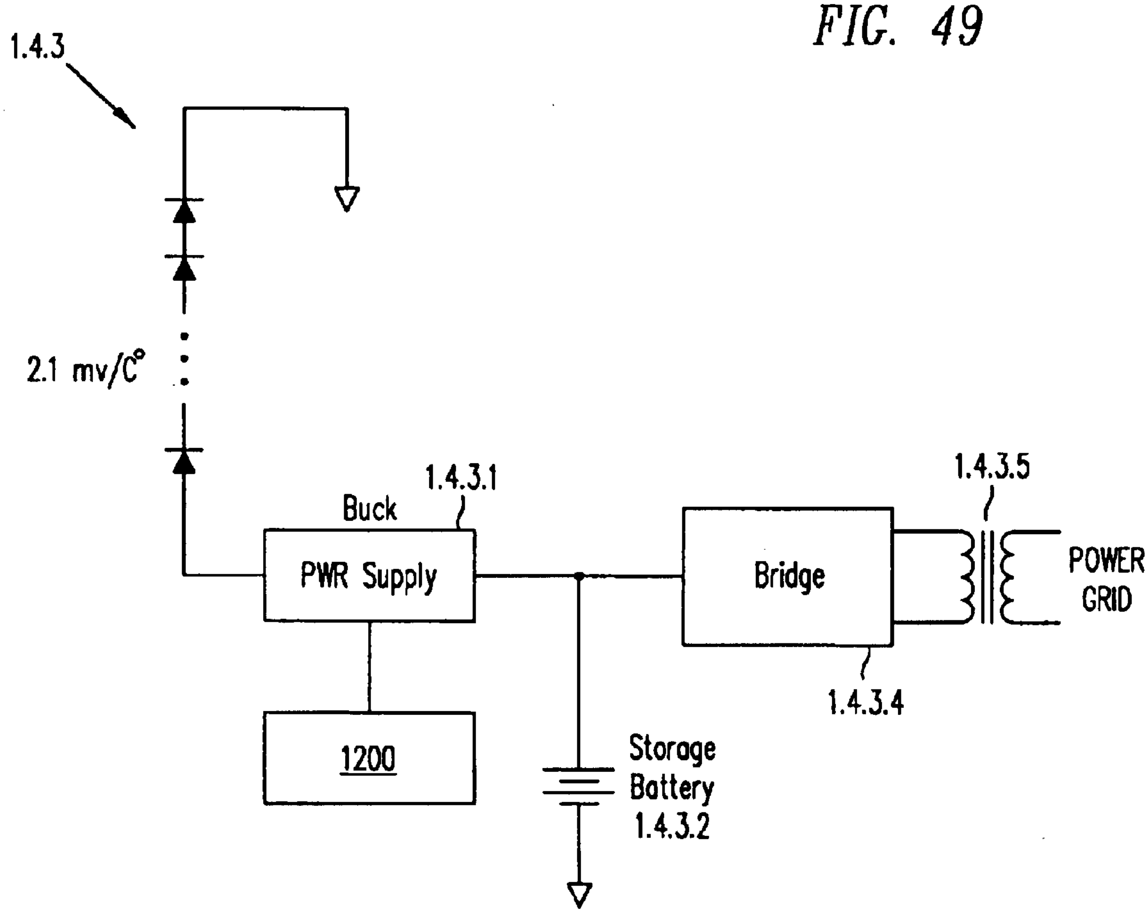
FIG. 49A shows a block diagram for a solar cell array coupled to a power supply being controlled by switching power supply controller 1200 of the present invention.

For another example, consider FIG. 49A. The system includes an array of photovoltaic cells 1.4.3, which are essentially large silicon diodes. These diodes produce current at a voltage that is dependant upon temperature, influenced by approximately −2.1 mV per degree C. There would typically be one hundred such diodes in series, making the effect of temperature significant. The system may be arbitrarily operated at any of a range of voltage/current combinations, but only one combination produces the maximum power and that specific combination changes with temperature. The maximum power is that combination that maximizes the area under the V-I characteristic curve. Importantly, the need is to match the power delivered from the (solar array) source at the conditions that optimize the optional battery's charge acceptance rate and/or tuning for maximum power delivery to the grid.

One technique for determining the optimal set point is to make small changes in the output of buck converter 1.4.3.1 via switching power supply controller 1200, examining the resulting power using culombmetric methods already discussed, then comparing the result to the previous power level and selecting that which is highest. The process is repeated, maintaining the array at its peak. As before, no new hardware is required for this procedure.

Section 1.4.6 Charge Decay Time Energy Extrapolation

Referring to FIG. 41, regulation control module (REG) 1204 includes a coulombmetric and temperature module 600.1. Because regulation control module (REG) 1204 receives voltage and current feedback information from the switching power converter, it can count the number of coulombs of charge transferred from supply batteries to the loads powered by the switching power converters. This provides a more accurate estimate of remaining battery life than by merely using the current battery voltage to estimate remaining battery life. As described further with respect to central processing module (SYS) 1205, the circuit parameters such as inductance values and capacitance values for each of the switching power converters may be stored in memory within central processing module (SYS) 1205. By processing the feedback information in light of these circuit parameters, coulombmetric and temperature module 600.1 may determine the amount of coulombs supplied by a battery. For example, if the feedback voltage from a switching power converter measures the voltage across a load capacitor, the amount of charge drawn through the capacitor is:

$$\Delta Q = C^{*}\Delta V$$

Where C is the capacitance of the load capacitor, ΔV is the change in voltage as determined from the voltage feedback samples, and ΔQ is the amount of charge transferred to the load. It will be appreciated that the above example is illustrative only and that coulombmetric and temperature module 600.1 may determine the amount of charge transferred from a supply battery in other ways.

Coulombmetric and temperature module 600.1 may store the resulting charge measurements for central processing module (SYS) 1205 to access through bus interface 525.1.

Section 1.5 Cyclic Switching Frequency Modulation

As described herein in section 1.1.4 and referring to FIG. 37 and FIG. 37B, a CAM 2486.4 illustrated may generate signals indicating pulse rising and falling edges for a number of independent pulse channels as specified by data from Regulation control module (REG). Each pulse channel includes a number of pulses for controlling a corresponding external pulse-width-modulated (PWM) switching power converter. During standard operation, CAM 2486.4 receives a read command in the form of a count from a counter, for example, a Grey counter 2484.4, that commands CAM 2486.4 to check each possible data storage location to see if regulation control module (REG) 1204 has written a data word in a given data storage location matching the current count.

In one embodiment, CAM 2486.4 has storage for 64 data words. These 64 data words correspond to 8 pulse channels, wherein each pulse channel defines 4 pulses. Seven of the pulse channels are used for external PWM-switching power conversion and the eighth pulse channel is used to generate auxiliary pulses For the seven pulse channels, 56 data words need be specified. The remaining eight data words correspond to the 4 auxiliary pulses edges of an auxiliary signal AUX 2446.4 used for example to synchronize external circuitry.

As Grey counter 2484.4 counts through a complete cycle, it causes CAM 2486.4 to check its stored data words for any matches. Each cycle of Grey counter 2484.4 defines a single DPC frame as shown in FIG. 37. In turn, it can be seen that the clocking of Grey counter 24B4.4 controls the minimum distance between possible pulse rising and falling edges.

For example, suppose Grey counter 2484.4 is a 10-bit counter and receives a 268.4 KHz clock signal. If Grey counter 2484.4 is configured to count at both the rising and falling edges of the clock signal, Grey counter 2484 4 will then count at a 536.9 MHz rate. The resulting DPC frame rate, which equals the count rate divided by the maximum count, will be 524.3 KHz (536.9 MHz/1024), wherein each DPC frame is divided into 1024 possible pulse rising and falling edge locations separated by a duration of approximately 2 nanoseconds. The division of each DPC frame into these possible rising and falling edge locations determines the minimum pulse-width-modulation (PWM) resolution for any PWM switching power converter being controlled by a given pulse channel. Thus, the count rate for Grey counter 2484.4 determines the minimum PWM resolution as given by the inverse of the count rate.

As can be seen in FIG. 37B, the count rate for Grey counter 2484.4 will ultimately depend on DPLL clock signal PLLCK 2460.4 from DPLL 2480.4. Because DPLL clock signal PLLCK 2460.4 is used for multiple purposes throughout switching power supply controller 1200, such as a relatively fast clock necessary for analog to digital converter 1206, PLLCK 2460.4 having a frequency of 536 MHz may be divided in spreader divider 2482.4 to clock Grey counter 2484.4 at a lower clock frequency of, e.g., 268 MHz.

Regardless of the specific frequency Grey counter 2484.4 is clocked at, the count rate and the number of bits used in Grey counter 2484.4 determines the DPC frame rate and the minimum PWM resolution. The rising and falling pulse edges for a plurality of external PWM-switching power converters are determined with respect to this minimum PWM resolution. The FET switches in each PWM-switching power converter will switch on and off at the DPC frame rate. Accordingly, each PWM-switching power converter will produce RF noise at the DPC frame rate frequency.

Figure 50A:
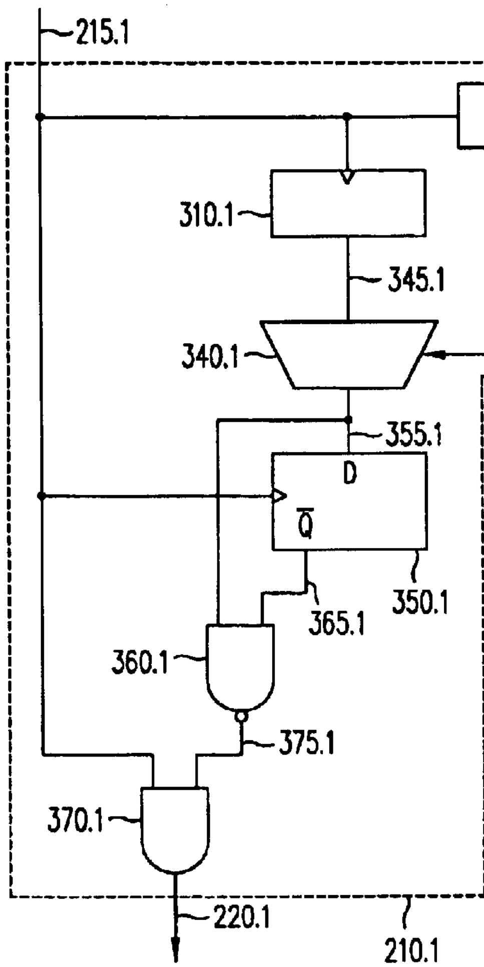
FIG. 50A is a circuit diagram of a spectral spreader 210.1 for the spreader divider unit 2482.4 of FIG. 50 according to one embodiment of the invention.
Figure 50:
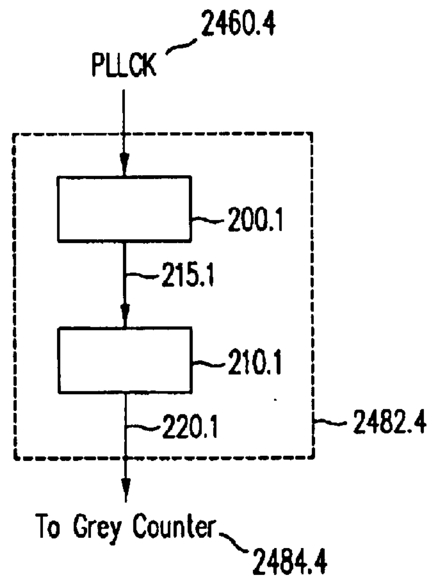
FIG. 50 is a block diagram of a spreader divider unit 2482.4 according to one embodiment of the invention.

To assist in the reduction of this RF switching noise, spreader divider 2482.4 includes a divider 200.1 and a spectral spreader 210.1 as shown in FIG. 50. Divider 200.1 receives DPLL clock signal PLLCK 2460.4 from DPLL 2480.4 and provides a divided clock signal 215.1 to spectral spreader 210.1. Spectral spreader 210.1 dithers the frame rate so as to spread the RF switching noise in a spread spectrum fashion. By skipping or "swallowing" various clock cycles received from divider 200.1, spectral spreader 210.1 may achieve this dithering. In turn, spectral spreader 210.1 will skip clock cycles in divided clock signal 215.1 to produce a desired amount of dithering to the DPC frame rate by providing an adjusted clock signal 220.1 to Grey counter 2484.4.

An exemplary embodiment for spectral spreader 210.1 is shown in FIG. 50A. A divider 300.1 and a counter 310.1 receive divided clock signal 215.1. Divider 300.1 provides a secondary divided clock signal 320.1 to an up/down counter 330.1, which in turn provides an up/down count 335.1 to control a multiplexer 340.1. Multiplexer 340.1 selects bits from a count 345.1 produced by counter 310.1 As controlled by up/down count 335.1, multiplexer 340.1 chooses either the most significant bit or successively less significant bits from count 345.1 to provide a selected bit 355.1 to the D input of a D-type flip-flop 350.1 that is clocked by divided clock signal 215.1. A NAND gate 360.1 receives both selected bit 355.1 and a $\overline{Q}$ output 365.1 of flip-flop 350.1. Finally, an AND gate 370.1 receives an output 375.1 from NAND gate 360.1 and divided clock signal 215.1 and outputs adjusted clock signal 220.1.

Accordingly, if NAND output 375.1 is true, the cycles of adjusted clock signal 220.1 will correspond to the cycles of divided clock signal 215.1, that is, no skipping occurs. However, if NAND output is false during a given cycle in divided clock signal 215.1, this cycle will be skipped in divided clock signal 215.1. It will be appreciated that the number of skipped cycles, and hence the amount of spectral spreading depends upon the sizes of counter 310.1 and up/down counter 330.1 and the division provided by divider 300.1. For example, suppose divided clock signal is 268 MHz, divider 300.1 divides by 1024, up/down counter 330.1 is a 3-bit counter, and counter 310.1 is a 15 bit counter (corresponding to the 2 nanosecond PWM resolution discussed previously). Secondary divided clock signal 320.1 thus cycles according to the DPC frame rate. Initially, up/down count will be at zero-such that multiplexer 340.1 selects the most significant bit in count 345.1. When up/down count 335.1 increments, multiplexer 340.1 will then select the next-most significant bit and so on. It follows that the following pulse skipping schedule will be followed:

1 pulse in 32 frames skipped (in a duration of 32 frames)
1 pulse in 16 frames skipped (during the next 16 frames)
1 pulse in 8 frames skipped (during the next 8 frames)
1 pulse in 4 frames skipped (during the next 4 frames)
1 pulse in 2 frames skipped (during the next 2 frames)
2 pulses in 1 frame skipped (during the next frame)
4 pulses in 1 frame skipped (during the next frame)
2 pulses in 1 frame skipped (during the next frame)
1 pulse in 2 frames skipped (during the next 2 frames)
1 pulse in 4 frames skipped (during the next 4 frames)
1 pulse in 8 frames skipped (during the next 8 frames)
1 pulse in 16 frames skipped (during the next 16 frames)
1 pulse in 32 frames skipped (in a duration of 32 frames)

whereupon the entire pulse-skipping schedule would be repeated. As a result, the DPC frame rate will vary in a nonlinear fashion. It will be appreciated that numerous other pulse skipping schedules could be implemented using alternative embodiments of spectral spreader 210.1. For example, the DPC frame rate could be varied in a linear fashion.

Section 1.6 PS/PM/Fault Management Integration—see Disclosure in Data Sheet

Section 1.6.1 Load Shedding in an SPS

Central processing module (SYS) 1205 may be initialized by a host processor with the operating parameters and topology for a plurality of switching power converters under the control of switching power supply controller 1200. These operating parameters may include operating thresholds such that central processing module (SYS) 1205 will cause the operation of a given switching power converter to cease if the corresponding thresholds are not satisfied. These operating thresholds may comprise a minimum supply voltage required for a given switching power converter or the minimum amount of charge remaining in a battery or set of batteries used to power the switching power converter.

Microprocessor core 400.1 (FIG. 56) in central processing module (SYS) 1205 monitors these operating thresholds and responds accordingly. For example, microprocessor core 400.1 receives an interrupt periodically to update coulombmetric measurements and battery temperature readings with respect to the power supplies powering the various switching power converters under control of switching power supply controller 1200. In conjunction with these coulombmetric updates, microprocessor core 400.1 may check that the amount of charge remaining in the battery or set of batteries is sufficient to sustain the respective supplies until the next checking interval. In conjunction with the coulombmetric updates, microprocessor core 400.1 may also check that the associated supply voltages satisfy the voltage minimums for the various switching power converters.

Should the amount of charge remaining/or the supply voltage not satisfy the specified minimum for a given switching power converter, microprocessor core 400.1 uses a configured deterministic algorithm and commands regulation control module (REG) 1204 to cease operation of the appropriate switching power converter. At the same time, microprocessor core 400.1 notifies the host processor (not illustrated) that the particular switching power converter is being brought down. In this fashion, a "load shedding" is accomplished with respect to the loads powered by the switching power converters being brought down. It will be appreciated that this manner of load shedding is efficient as compared to a conventional method of using the host processor to monitor various switching power converters and directly commanding them to turn off should an operating threshold be exceeded because a host processor will typically demand far more power than microprocessor 400.1 would in responding to interrupts to check the operating thresholds.

Section 1.6.2 Power Cycling in an SPS

Figure 53:
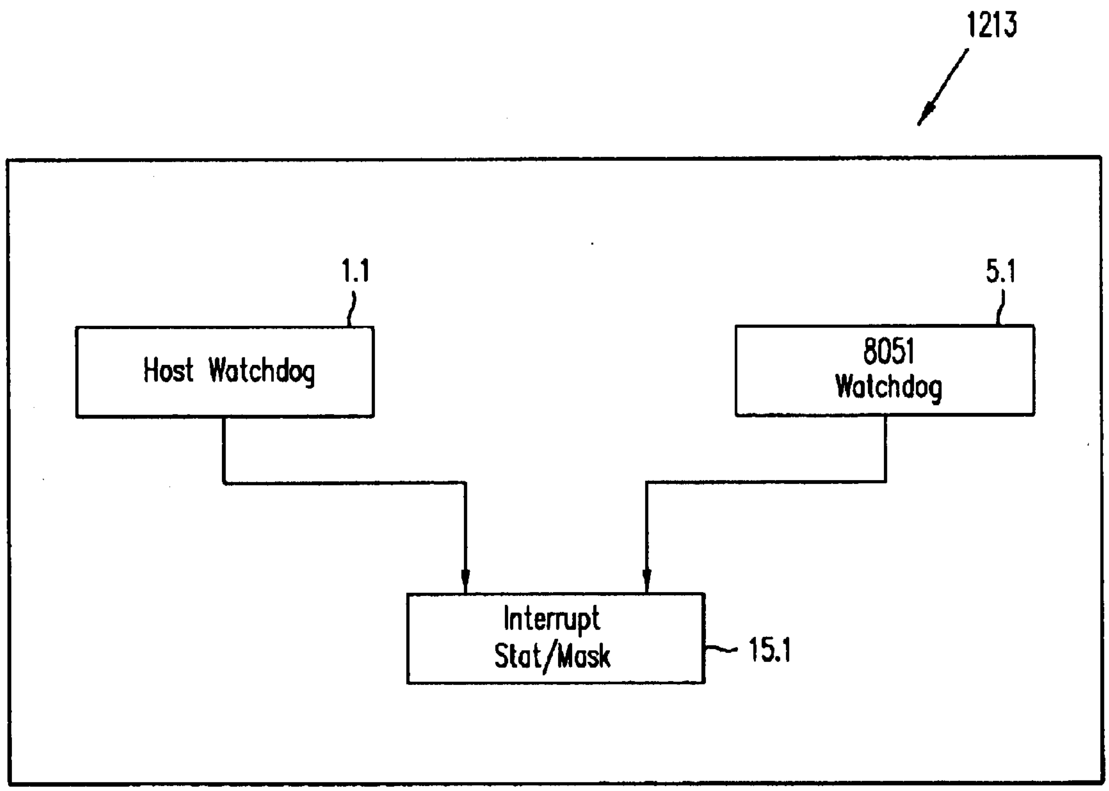
FIG. 53 is a block diagram for the watchdog module of FIG. 12 according to one embodiment of the invention.

Upon expiration of Host watchdog timer 1.1 shown in FIG. 53, a reset signal/command is issued to a host microprocessor (not illustrated). However, in certain malfunctions such as latch-up, a host microprocessor will not respond to a reset status notification or physical reset signal assertion. Instead, a latched-up host microprocessor will continue to draw current until its power source is exhausted or shut off.

Assuming that its transistors have not been damaged by the latch-up, the host microprocessor may then be reset.

Central processing module (SYS) 1205 has the ability to provide an intelligent response to such malfunctions. Once a host watchdog expires the host is notified by either a physical reset assertion or a reset status notification (via an Interrupt and command response). The Central processing module then restarts the host watchdog and if the host does not attempt to enable(kick) the watchdog within a configurable number of watchdog expirations the power supplies associated with the host (configurable) is cycled off for a configurable time duration and restarted. For example, a certain voltage level may be needed for the host CPU's memory, another for its input/output circuitry, and other levels for the CPU itself, where each voltage level is provided by a switching power converter under the control of switching power supply controller 1200. Stored in the Non Volatile Memory are the correct power sequencing for the host CPU's switching power converters for both a power up and a power down sequence. After power down has been completed, central processing module (SYS) 1205 may then power up the host CPU by appropriately sequencing the involved power converters.

Upon expiration of 8051 watchdog timer 5.1 shown in FIG. 53, a reset may be issued to the internal microprocessor (not illustrated) causing a warm boot of the internal microprocessor. This reset may not cause the regulation of power to be interrupted rather it merely restarts the internal microprocessor. Additionally there may be a status bit indicating a watchdog event occurred for the internal microprocessor to read upon rebooting to allow it to ascertain the reason for booting.

Section 1.6.3 Reset Conditioning in an SPS

As described with respect to watchdog controller 1213 of FIG. 53, switching power supply controller 1200 may reset a host CPU (not illustrated) by asserting a reset signal if Host watchdog timer 1.1 expires. Because of the intelligent control provided by central processing module (SYS) 1205, the reset may be asserted until certain conditions are satisfied. For example, regulation control module (REG) 1204 may signal to central processing module (SYS) 1205 that certain switching power converters are producing voltage levels outside of a desired operating range. For example, the output voltage of a switching power supply providing power to the memory of the host CPU may be out of range causing the host to not provide the appropriate reset command/signal. In such a case, central processing module (SYS) 1205 could continue to assert the reset signal until all power supplies affecting operation of the host CPU are providing voltages within desired operating ranges.

Section 1.6.4 and x.3, Watch Dog Structure and Watch Dog Timer in an SPS

Because switching power supply controller 1200 may supply power to a host CPU-containing device such as a personal digital assistant (PDA), watchdog controller block 1213 (FIG. 12) may provide a watchdog feature for the host CPU. A common problem for operating systems running on CPUs is a "lock-up" condition resulting from conflicting program commands, invalid memory access requests, and related matters. Recovery from such problems may take an extended, unknown amount of time or may not occur. Accordingly, watchdog timers comprising a digital counter that counts down to zero from a predetermined starting number are often implemented in CPUs to avoid lock-ups. During normal operation, the CPU will periodically command the watchdog timer to reset the counter to avoid the timer's expiration. However, in a lock-up, the CPU will not command the watchdog timer to reset the counter whereby the timer expires. In response, a reset may then be initiated to remove the lock-up.

Because switching power supply controller 1200 includes central processing module (SYS) 1205, the watchdog controller block 1213 includes two types of watchdog timers as seen in FIG. 53: a host watchdog timer 1.1 for an external host CPU and a 8051 watchdog timer 5.1 for the internal mocroprocessor.

If host watchdog timer 1.1 expires, watchdog controller 1213 notifies central processing module (SYS) 1205 via an interrupt. In response to this interrupt, central processing module (SYS) 1205 either asserts a reset signal to the host or asserts an interrupt line to the host as is dictated by a configuration parameter.

If 8051 watchdog timer 1.1 expires, watchdog controller 1213 will assert the reset line central processing module (SYS) 1205. This triggers a warm boot of the internal microprocessor.

Watchdog controller 1213 may have two modes of operation: normal mode and power save mode. In the normal mode, both host watchdog 1.1 timer and 8051 watchdog timer 5.1 are operative. In the power save mode, the host microprocessor is required to disable the host watchdog prior to issuing a power save command unless there is not a communications link between the host and the SPS upon which the Watchdog controller 1213 will rely on a configuration parameter that specifies automatic host watchdog enabling/disabling upon application of or removal of power associated with the host.

Each watchdog timer 1.1 and 5.1 may associate with its own service register (not illustrated) used to reset the timers. To reset its particular watchdog, central processing module (SYS) 1205 writes a predetermined code word and the inverse of that code word to a respective service register. An errant write to a service register does not reset the associated watchdog timer and generates an interrupt to central processing module (SYS) 1205. In addition, the host watchdog timer 1.1 may have its counter reset based upon a toggled binary signal received from the host microprocessor. This signal is processed by central processing module (SYS) 1205 which in turn resets the watchdog. However, resets using the kick watchdog command are more secure and less susceptible to runaway conditions in the host microprocessor.

To provide greater control flexibility to the host processor, Host watchdog timer 1.1 and 8051 watchdog timer 5.1 may be initialized according to data stored in associated configuration registers (not illustrated). By writing to these registers, the duration of the individual watchdog counter timeout periods can be configured. For example, this configuration could be 15 bits for the host watchdog to accommodate a range of 1 ms to –32 seconds while 6 bits could be used for the 8051 watchdog to provide a range of 100 ms to 3.2 seconds. If a given watchdog timer is not enabled, the watchdog timer will not be started until its configuration register is re-initialized To prevent errant access of the 8051 watchdog configuration register, this registers may be written to only once after a reset operation (until the subsequent reset operation, whereupon the configuration register may be re-initialized). The host watchdog register may not have this restriction.

As discussed above, the host watchdog may issue an interrupt to central processing module (SYS) 1205 should host watchdog timer 1.1 expire. A watchdog interrupt status register 15.1 may also store a bit to indicate that either watchdog's service register has been serviced with an errant codeword, potentially signaling an invalid memory access. A watchdog interrupt mask register 15.1 (shown combined with the watchdog interrupt status register in FIG. 53 for illustration clarity) may store bits indicating whether the host watchdog timer has been masked. In this fashion, central processing module (SYS) 1205 may prevent watchdog controller 1213 from generating interrupts during system critical periods. In addition, watchdog interrupt mask register 15.1 may store a bit indicating whether interrupts resulting from an errant codeword write to the service register for Host watchdog 1.1 should be masked.

Section 1.6.5 Programmable Reset and Watchdog Functions

As described with respect to watchdog controller 1213 of FIG. 53 switching power supply controller 1200 may reset a host microprocessor (not illustrated) if host watchdog timer 1.1 expires by asserting a reset signal. Because of the intelligent control provided by central processing module (SYS) 1205, the reset may be asserted until certain conditions are satisfied. For example, regulation control module (REG) 1204 may signal to central processing module (SYS) 1205 that certain switching power converters are producing voltage levels outside of a desired operating range. For example, the output voltage of a switching power supply providing power to the memory of the host microprocessor may be out of range. In such a case, central processing module (SYS) 1205 could continue to assert the reset signal until all power supplies affecting operation of the host microprocessor are providing voltages within desired operating ranges.

Once all conditions have been satisfied, central processing module (SYS) 1205 allows the reset to be de-asserted. However, even though all power supplies are operating correctly, a host device may still not have stabilized properly to justify release of the reset command. Accordingly, the duration of the reset command after all conditions have been satisfied may be programmable. The duration may be stored by central processing module (SYS) 1205 as programmed by a user.

Section 1.6.6 Resistive Digitizer in Combination with an SPS

Quad-Slope Analog to Digital Converter 1211*a* in one embodiment of the present invention measures the point of contact between two sheets of resistive material. Touch screens suitable for implementing the present invention are commercially available from manufacturers such as 3M. FIG. 18B is a highly simplified illustration of a four-contact touch-screen 18.8 having a first sheet 18.81 and a second sheet 18.82. These sheets are shown offset for ease of illustration, but are of course aligned for normal use. Each sheet has a uniform sheet resistance such that the physical point of contact along the surface of each sheet may be represented by the proportion of end to end resistance at that point. Using sheet 18.82 and applying an electrical potential to terminals TOP 18.83 and BOT 18.84 permits, using the other sheet as a contact sheet, a determination of the point of contact in the Y direction. Applying an electrical potential to terminals LFT 18.85 and RHT 18.86 using sheet 18.81 as a sensing sheet, permits, using sheet 18.82 as a contact sheet, a determination of the point of contact in the X direction. Thus in each case a voltage is applied across one of the two sheets (e.g., 18.81 or 18.82, the "sensing sheet") while it is electrically-isolated from QSADC 1211*a*, and simultaneously an ADC conversion is made of the voltage present at the point of contact on the other sheet (i.e., 18.82 or 18.81, the "contact sheet").

A voltage is applied to terminal LFT 18.85 and terminal RHT 18.86 of the X coordinate sheet 18.81, then the proportion of the applied voltage can be read at either the TOP terminal 18.83 or BOT terminal 18.84 of the Y coordinate sheet 18.82. The magnitude of the voltage read is representative of the physical horizontal position of the point of contact between the two sheets. Similarly, if a voltage is applied to terminal TOP 18.83 and BOT 18.84 of the Y coordinate sheet 18.82, then the proportion of the applied voltage read at either terminal LFT 18.85 or terminal RHT 18.86 of the X coordinate sheet 18.81 is representative of the physical vertical position of the point of contact between the two sheets.

In another embodiment, one resistive sheet is used for both X and Y sensing while the other sheet is used to transfer the proportional voltage to the QSADC. A highly simplified illustration of a five-contact touch screen 18.9 is shown in FIG. 18C. A highly simplified illustration of a five-contact touch screen 18.9 is shown in FIG. 18C, and includes sensing sheet 18.93 and contact sheet 18.92. Touching the front sheet 18.92 causes 18.92 and 18.93 to contact each other. As in the illustration above, the sheets are shown off-set for ease of illustration. In this embodiment where five connections are used, a voltage is imposed between the terminals LFT 18.94 and RHT 18.95 of sheet 18.91, then the proportion of the voltage read at terminal 18.96 of contact sheet 18.92 is proportional to the physical horizontal position of the point of contact between the two sheets. Similarly, a voltage is imposed between the TOP terminal 18.97 and BOT terminal 18.98 of sheet 18.93, then the proportion of the voltage read at terminal 18.96 of contact sheet 18.92 indicates the physical vertical position of the point of contact between the two sheets.

Quad-Slope Analog to Digital Converter (QSADC) module 1211*a* (FIG. 17) includes a custom low-power mixed-signal circuit that has both analog and digital input and output signals, including analog and digital power and ground reference voltages. QSADC module 1211*a* measures and digitizes, to 8 bits of resolution, the voltages at two separate external ports relative to a voltage reference VREFH. In one embodiment, a conversion rate for QSADC module 1211*a* is approximately 300 sps (samples per second).

Figure 16:
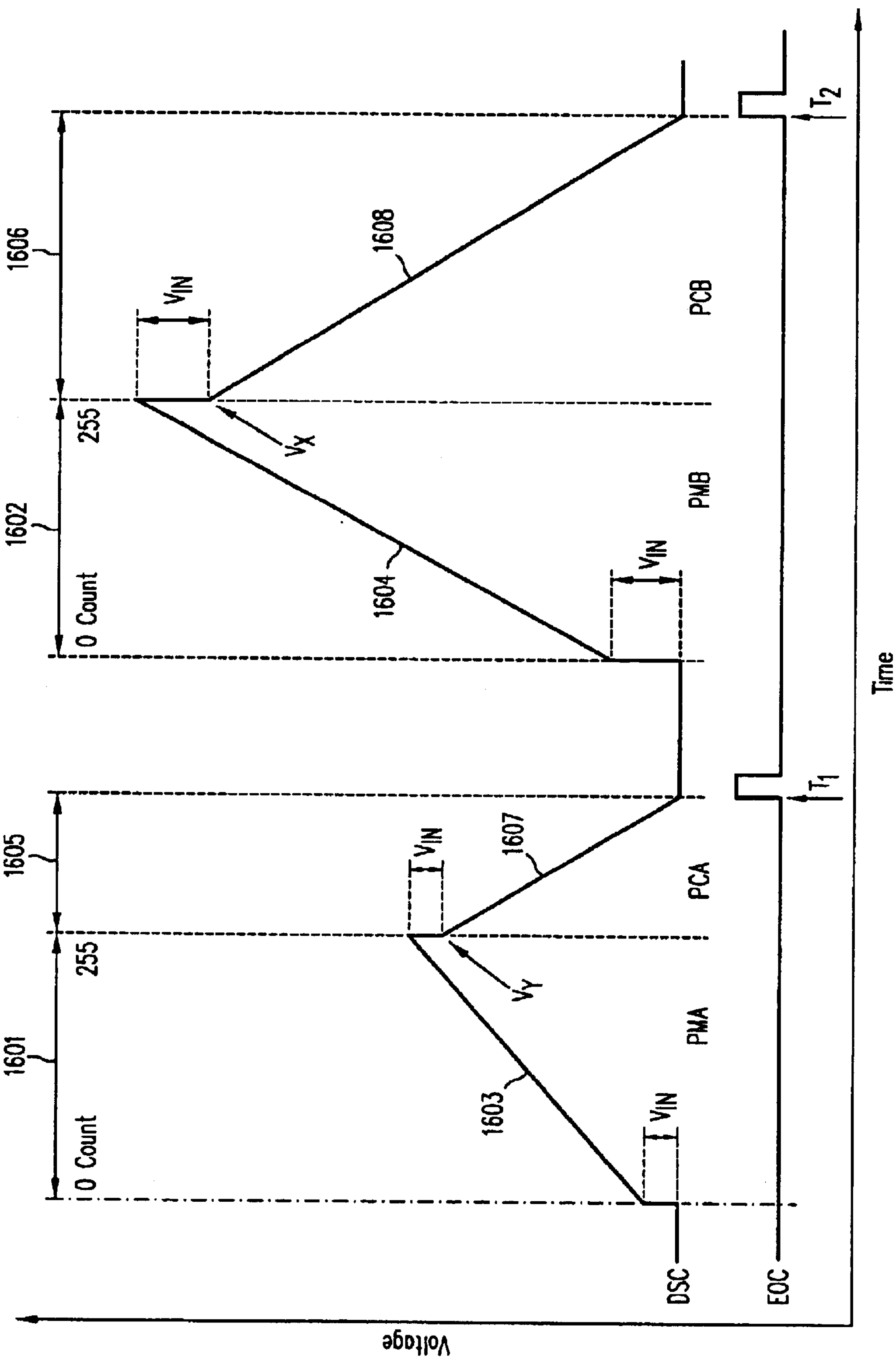
FIG. 16 is a timing diagram illustrating the quad-slope (i.e., dual conversion) analog to digital conversion (ADC) operations carried out in the QSADC module 1211*a*, which is contained within touch screen interface 1211.
Figure 17A:
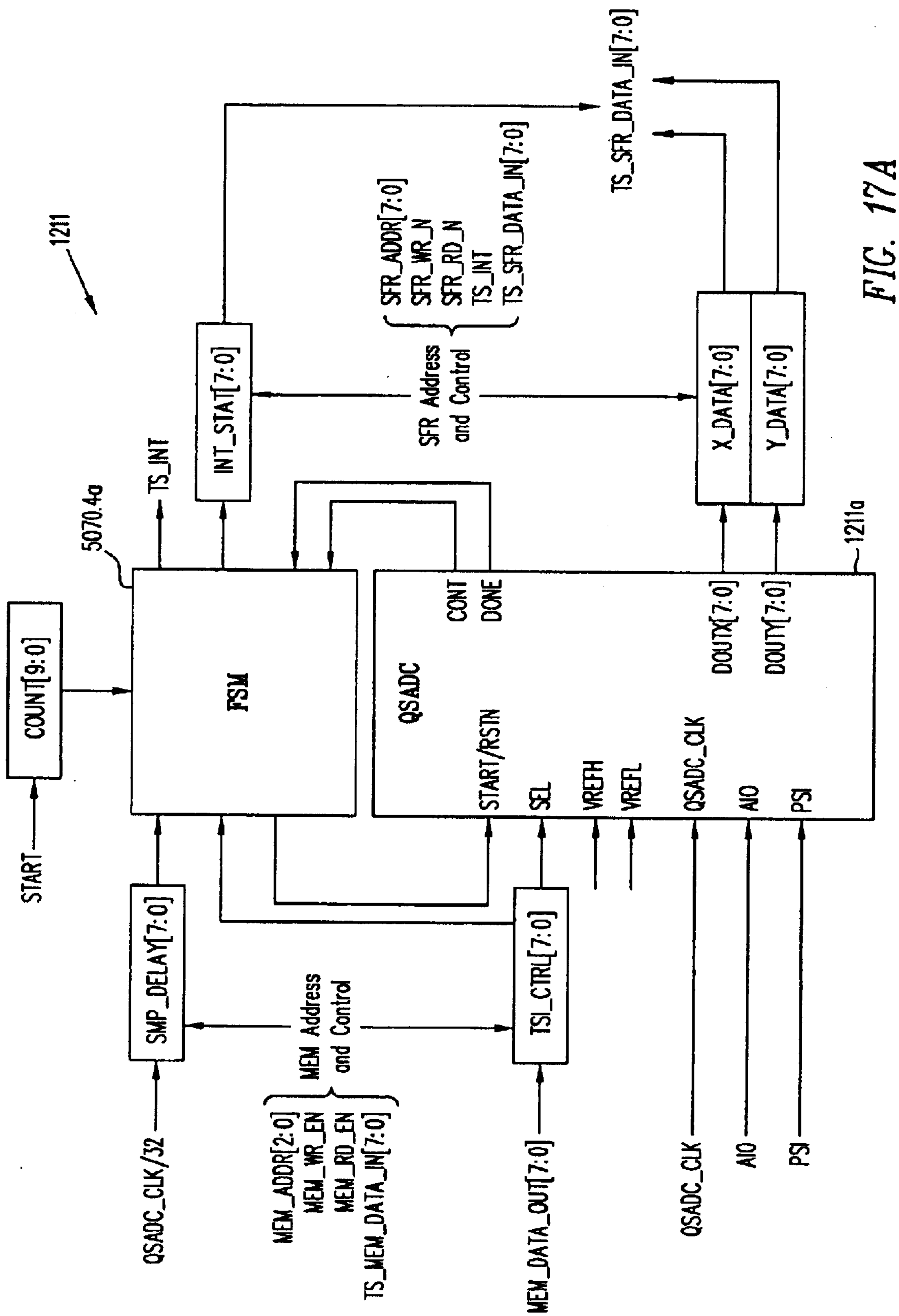
FIG. 17A is a block diagram showing the interface signals of QSADC 1211*a* with touch screen interface 1211 in one implementation.

FIG. 16 is a timing diagram illustrating the quad-slope (i.e., dual conversion) analog to digital conversion (ADC) operations carried out in the QSADC module 1211*a*. Time intervals 1601 and 1602 (i.e., "measurement periods" PMA and PMB) are equivalent fixed time durations corresponding to 256 counts of a reference timer or counter. During time periods 1601 and 1602, the positive slopes of signal trace segments 1603 and 1604 reach voltages $V_Y$ and $V_X$ plus the small initial voltage, which represent the integration of the signals being measured on the contact sheets by the QSADC module 1211*a* over time periods 1601 and 1602.

During time intervals 1605 and 1606 ("conversion periods" PCA and PCB), signal trace segments 1607 and 1608 have identical negative slopes, tracing the voltages as they decline from voltages $V_Y$ and $V_X$ to zero. During these conversion periods (PCA and PCB), the numerical counts represent direct analog to digital conversions of the measured voltages from contact sheets 18.82 and 18.81, respectively. At the completions of the conversion periods, end-of-conversion (EOC) pulses are generated (e.g., at times $t_1$ and $t_2$) to signal the end of each analog to digital conversion and to reset and zero the offsets of the analog circuitry in QSADC module 1211*a* to prepare for subsequent conversions.

Figure 17:
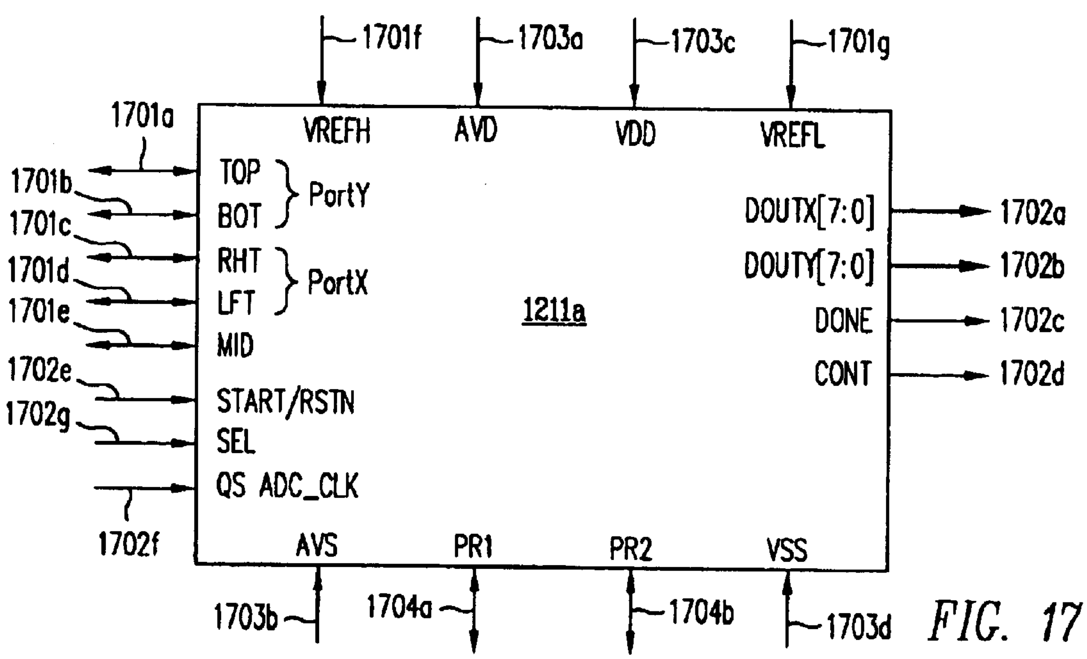
FIG. 17 is a block diagram showing the interface signals of QSADC module 1211*a* in one implementation.

FIG. 17 is a block diagram showing the interface signals of QSADC module 1211*a* in one implementation. As shown in FIG. 17, QSADC module 1211*a* includes: (a) Analog I/O interface (AIO) 1701, Digital Interface (DI) 1702, and the Power Supply Interface 1703. Analog I/O interface (AIO) comprises analog bi-directional measurement terminals 1702*a* and 1702*b* (i.e., terminals TOP and BOT), analog bi-directional measurement terminals 1701*c* and 1701*d* (i.e., terminals RHT and LFT), analog reference capacitor ports 1704*a* and 1704*b* (PR1 and PR2, respectively), analog bi-directional measurement port 1761*f* for the MID input, and Reference Voltage signal 1701*e* (i.e., reference voltage VREFH).

Analog I/O interface 1701 operates in two modes. In a first mode ("primary mode") a port (e.g., Port X or Port Y) measures voltage by the technique described herein. Port X is comprised of switches A0, A1, A2 and A3. (FIG. 18A). Port Y is comprised of B0, B1, B2 and B3 (FIG. 18A). In a second mode ("sleep mode") ports X and Y are configured to detect electrical continuity between them. A determination of continuity between Port X and Port Y indicates contact with the touch screen, which then causes the analog I/O interface 1701 to enter primary mode.

Digital interface 1702 comprises 8-bit output buses 1702*a* (DOUTX[7:0]) and 1702*b* (DOUTY[7:0]) for displaying digital results of the conversions at ports X and Y, respectively, completion-or "DONE" signal 1702*c*, Continuity Detection or "CONT" signal 1702*d*, Start Conversion or Reset "START/RSTN" signal 1702*e*, 128 KHz 50% duty cycle reference clock signal ("CLK") 1702*f*, and Mode Select signal SEL 1702*g*. START/RSTN is the start control pin used to initiate the analog to digital conversion processes. When the START/RSTN pin goes HIGH the processing starts and subsequent conversions will not be initiated until the START/RSTN pin toggles LOW then HIGH again. When START/RSTN is held LOW, all necessary circuits in the block are held in a low power reset state. Signal SEL 1702*g* is received from touch screen interface 1211, and is used to control the ADC conversion mode. When the SEL 1702*g* port is LOW the MID port is not used for ADC measurements. That is, a four-terminal arrangement for measurement of X-Y position is employed, as shown in FIG. 18C. When the SEL 1702*g* port is held HIGH the MID port is used for measuring the input voltage at the X and Y ports. That is, a five-terminal arrangement for measurement of the X-Y position is employed, as shown in FIG. 18C.

The DONE signal at terminal 1702*c* is asserted when the digital conversions at both ports X and Y are completed, to signal that results can be read from output buses 1702*a* and 1702*b* (i.e., DOUTX and DOUTY buses). The CONT signal indicates detection of continuity between ports X and Y.

Power supply interface 1703 comprises analog power and ground reference signals 1703*a* and 1703*b* (i.e., analog power and ground reference signals AVD and AVS, respectively), and digital power and ground reference signals 1703*c* and 1703*d* (i.e., digital power and ground reference signals VDD and VSS, respectively).

Figure 18:
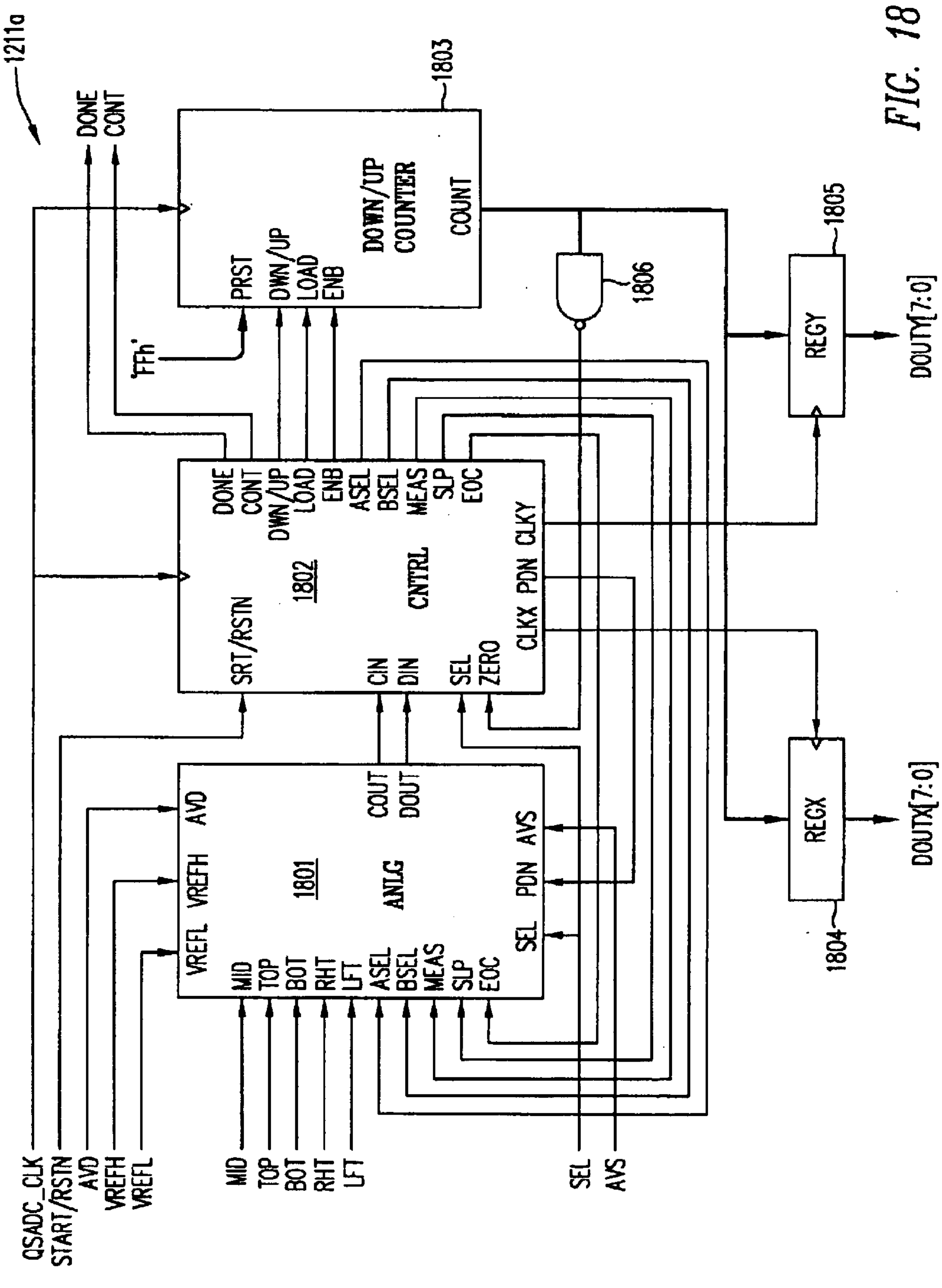
FIG. 18 is a top-level block diagram of QSADC module 1211*a*, including analog block ANLG 1801, control block CNTRL 1802 and DOWN/UP COUNTER block 1803, according to one embodiment of the present invention.
Figure 18A:
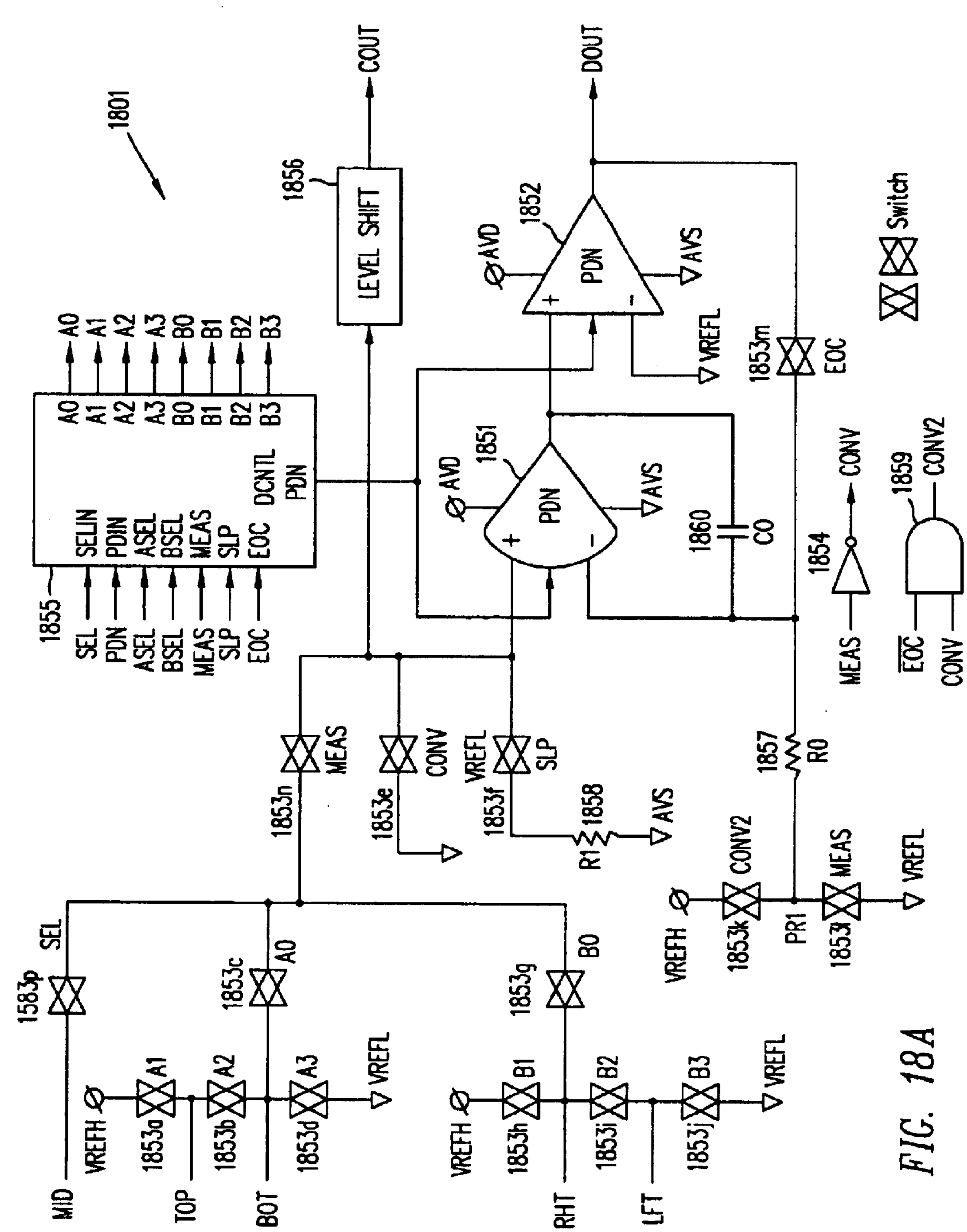
FIG. 18A shows one implementation of analog block 1801 of QSAD module 1211*a* shown in FIG. 18.
Figure 18B:
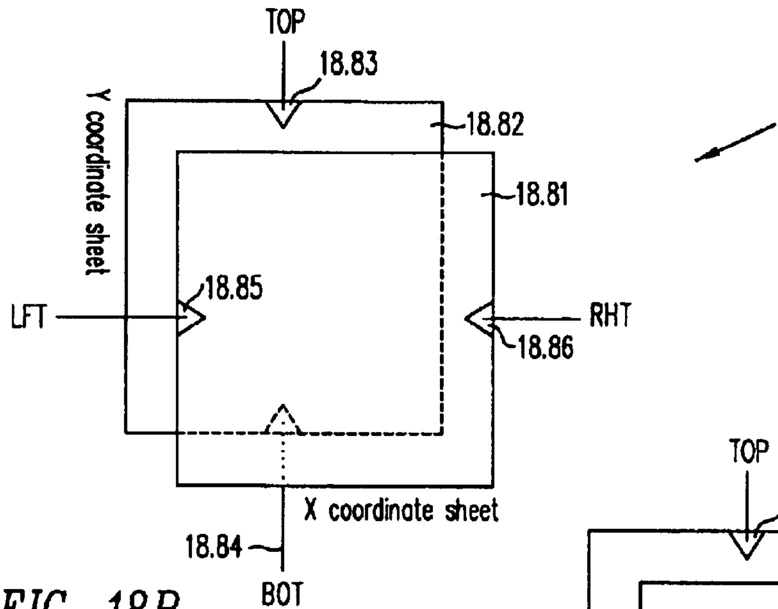
FIG. 18B shows one arrangement of a four-contact touch-screen application.
Figure 18C:
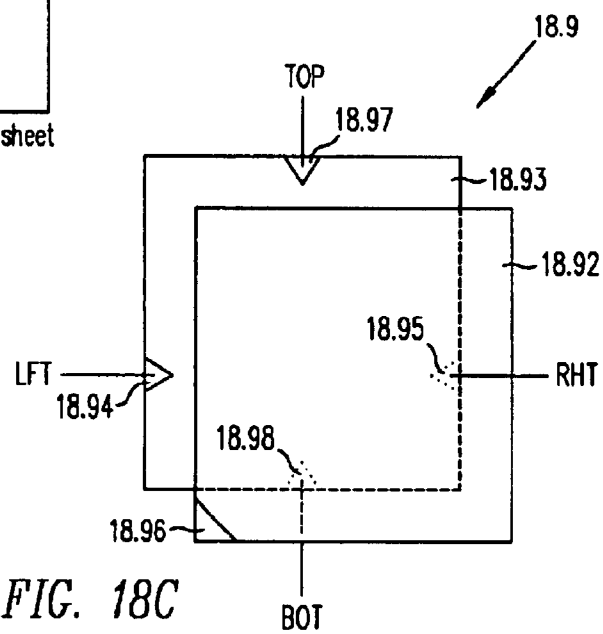
FIG. 18C shows one arrangement of a five-contact touch-screen application.

FIG. 18 and FIG. 18A show one implementation of QSADC module 1211*a*, in accordance with the present invention. FIG. 18 is a top-level block diagram of QSADC module 1211*a*, including analog (ANLG) block 1801, digital controller (CNTRL) block 1802, pre-settable up/down counter block 1803, 8-input NAND gate 1806, and 8-bit Registers 1804 and 1805 (i.e., registers REGX and REGY, respectively).

Table 2.6 provides a brief descriptive summary of the signals shown in FIG. 18.

TABLE 1.6.6a

| Port Name | Type | Description | Source | Destination |
|---|---|---|---|---|
| TOP | Analog | Max Analog Measurement Port | AIO | |
| BOT | Analog | Min Analog Measurement Port | AIO | |
| RHT | Analog | Max Analog Measurement Port | AIO | |
| LFT | Analog | Min Analog Measurement Port | AIO | |
| MID | Analog | Analog Measurement Port for the MID Input | AIO | |
| PR1 | Analog | External Reference Capacitor First Port | AIO | |
| PR2 | Analog | External Reference Capacitor Second Port | AIO | |
| START/RSTN | Input | Start Conversion Port Active HIGH | TSI | |
| SEL | Input | Mode Select Conversation Port | TSI | |
| QSADC_CLK | Input | Clock | CLK-GEN | |
| DOUTX [7.0] | Output | Digitized Bus For Measured Values A | | TSI |
| DOUTY [7:0] | Output | Digitized Bus For Measure Values B | | TSI |
| DONE | Output | Done Port Active HIGH | | TSI |
| CONT | Output | Continuity Detection Port Active HIGH | | TSI |
| VREFH | Input | High Analog Voltage Reference | IVS | |
| VREFL | Input | Low Analog Voltage Reference | IVS | |
| AVD | Power | Analog Power | IVS | |
| AVS | Power | Analog Ground | IVS | |
| VDD | Power | Digital Power | IVS | |
| VSS | Power | Digital Ground | IVS | |

FIG. 18A shows one implementation of ANLG 1801 of FIG. 18, which includes operational amplifier 1851 and analog comparator 1852, in addition to MOS transmission gates 1853*a* to 1853*p*, inverter 1854, AND gate 1856, Digital Control block (DCNTL) 1855, and Level Shifter 1856 . The common mode ranges of the operational amplifier 1851 and analog comparator 1852 are rail to rail (i.e., 0 to 3.3V).

DCNTL block 1855 generates the control signals necessary to control the MOS transmission gates 1853*a* to 1853*n*. For convenience, the MOS transmission gates 1853*a* to 1853*p* are referred to as "switches" and each switch is designated by its control input signal (i.e., A0–A3, B0–B3, MEAS, SLP, EOC, SEL, CONV, and CONV2).

Figure 51:
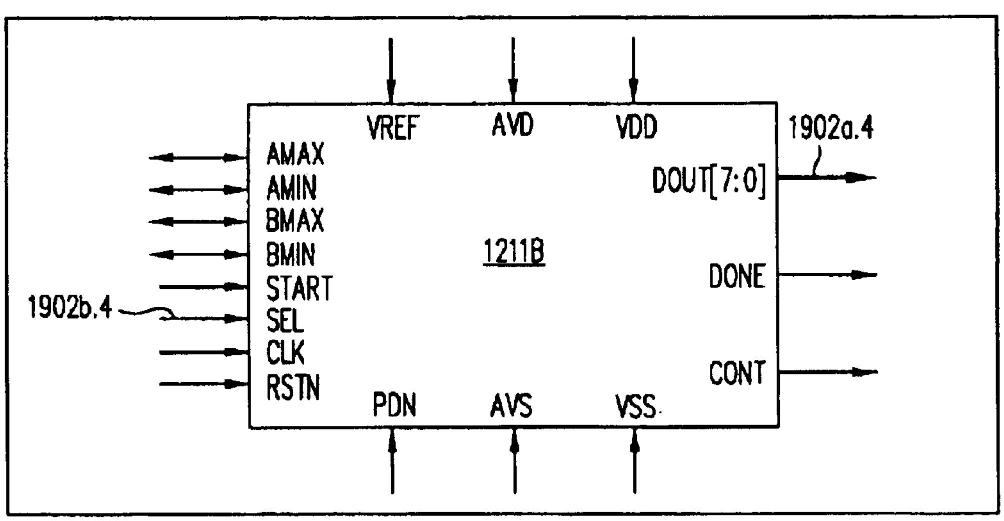
FIG. 51 is a block diagram showing the interface signals of QSADC module 1211*b* in another implementation.
Figure 51A:
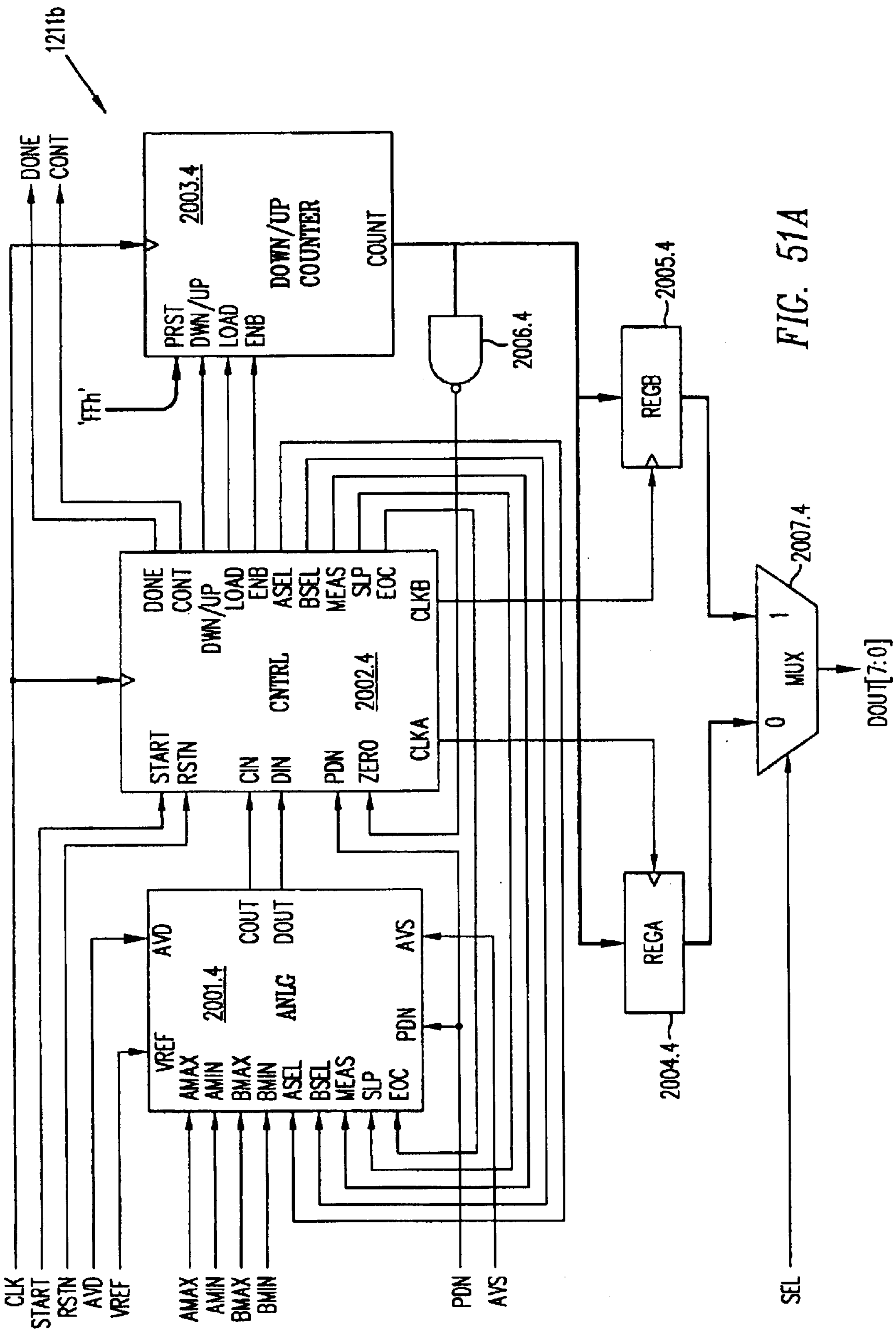
FIG. 51A is a top-level block diagram of QSADC module 1211*b*, including analog block 2001.4, control block 2002.4, and up/down counter block 2003.4, according to another embodiment of the present invention.
Figure 51B:
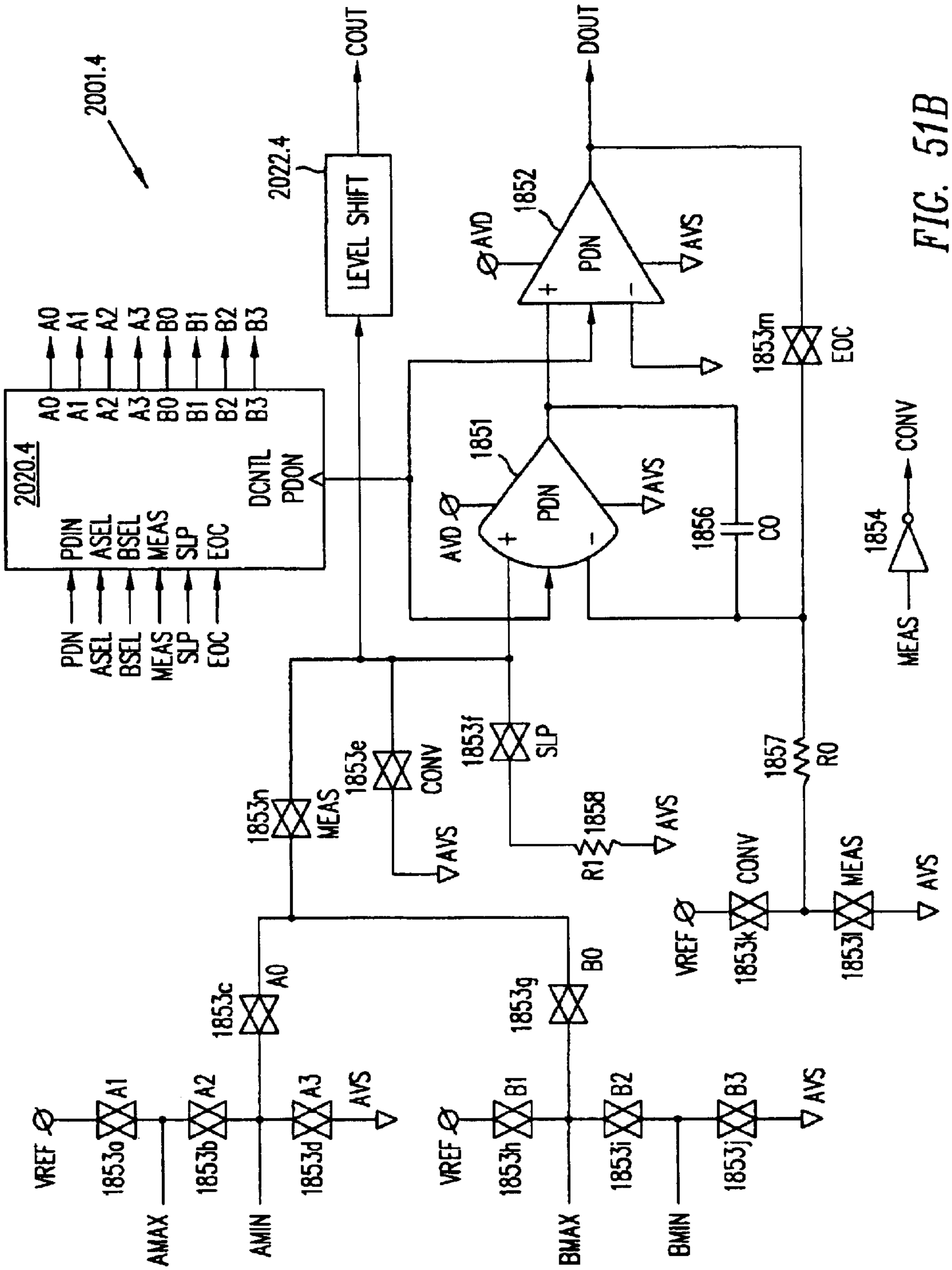
FIG. 51B shows one implementation of analog block 2001.4 of FIG. 51A.
Figure 51C:
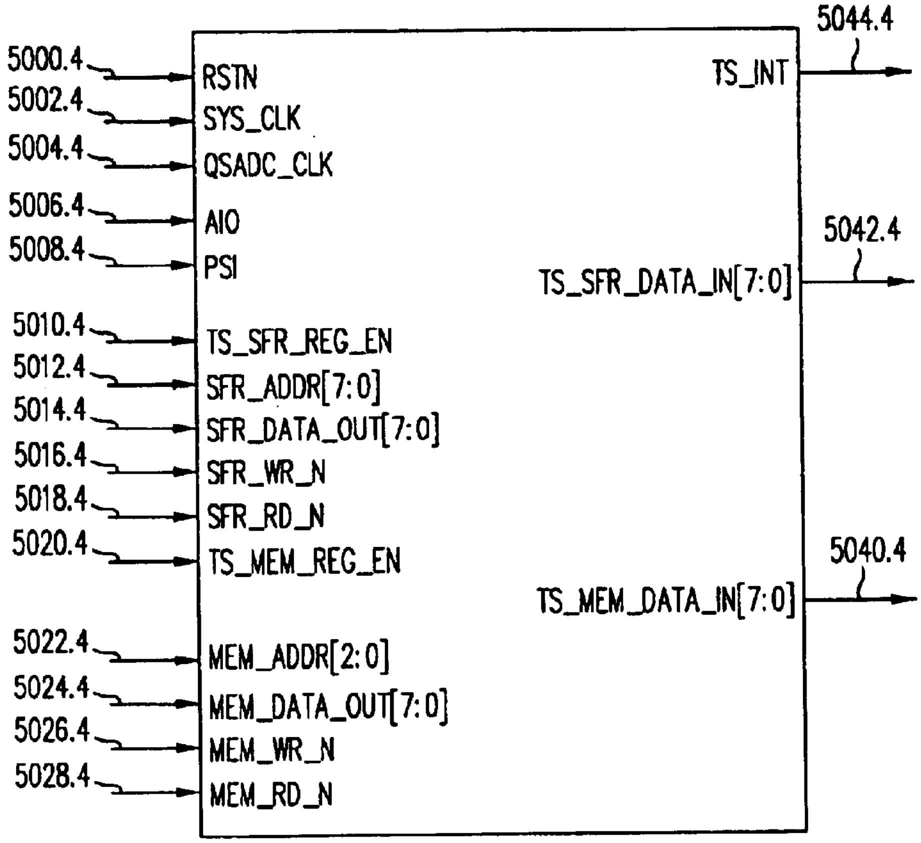
FIG. 51C illustrates a block diagram showing exemplary interface signals between touch screen interface 1211 and the other blocks of switching power supply controller 1200.
Figure 51D:
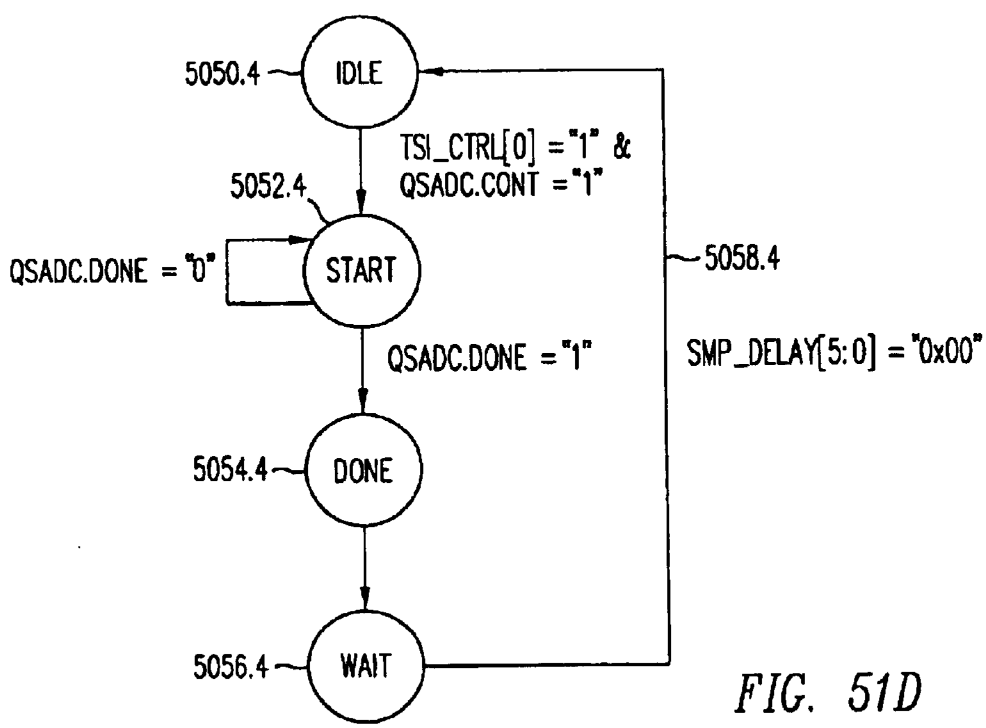
FIG. 51D shows a flowchart for performing diagnostics of QSADC module 1211*a*.
Figure 51E:
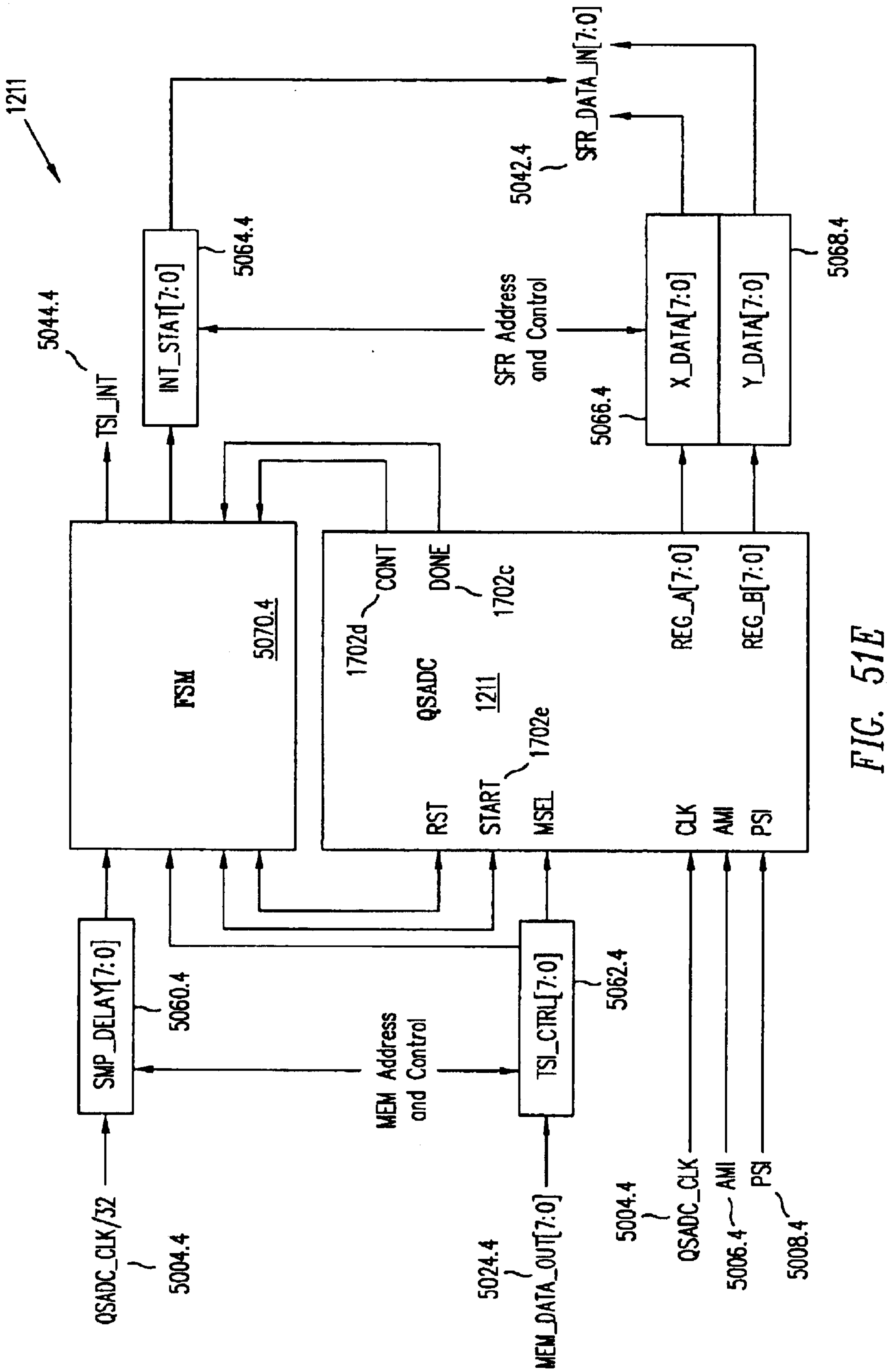
FIG. 51E shows a functional block diagram corresponding to the implementation of FIG. 51B.

Initially, QSADC module 1211*a* is in sleep mode, where electrical continuity is checked. A four-terminal arrangement is illustrated by FIG. 51O. Switches 1853*b*, 1853*c*, 1853*h*, 1853*i*, 1853*n*, 1853*l*, and 1853*f* (i.e., signals A0, A2, B1, B2, MEAS and SLP) are closed, while all other switches are open. When there is no electrical continuity between the two sheets, the output voltages of operational amplifier 1851, analog comparator 1852, and the DOUT signal are all low. A five-terminal implementation is illustrated in FIG. 51P. Switches 1853*p*, 1853*i*, 1853*n*, 1853*l* and 1853*f* (i.e., signals B1, B2, SEL, MEAS and SLP) are closed while all others are open. When there is no electrical continuity between the two sheets, the output voltages of operational amplifier 1851, analog comparator 1852, and the DOUT signal are all low.

When electrical continuity is established between ports Y and X, the output terminal of switch 1853*n* (i.e., the non-inverting input terminal of operational amplifier 1851) is pulled to a high voltage, so that the output terminal of analog comparator 1852 is at a high voltage. The output terminal of analog comparator 1852 is the "DOUT" terminal of analog block 1801 (FIG. 18), which is connected to the "DIN" terminal of digital control block 1802. In response to the high voltage at the output terminal of analog block 1801, the CONT terminal (i.e., terminal 1702*d* at FIG. 17) is driven to a high voltage, resulting in QSADC module 1211*a* exiting the sleep mode, and entering the primary mode.

In primary mode (entered when the CONT signal is at a high voltage), when an active START/RSTN signal at terminal 1702*e* is received from touch screen interface 1211, digital control block 1802 begins a measurement cycle of the voltage at Port Y by presetting up/down counter 1803 to hexadecimal FF (i.e., FFh), thereby resetting the CONT signal, and beginning the measurement and conversion process. Thereafter, each rising edge of the CLK signal at terminal 1702f decrements up/down counter 1803 until the count reaches zero (for a total of 256 counts), which is decoded by NAND gate 1806 to activate the ZERO signal received into digital control block 1802.

The operation of analog circuit 1801 is described below in connection with FIG. 51F through FIG. 51O. Por convenience of illustration, a dark line is shown on the figures to denote the conduction path of the transmission gates.

Figure 51F:
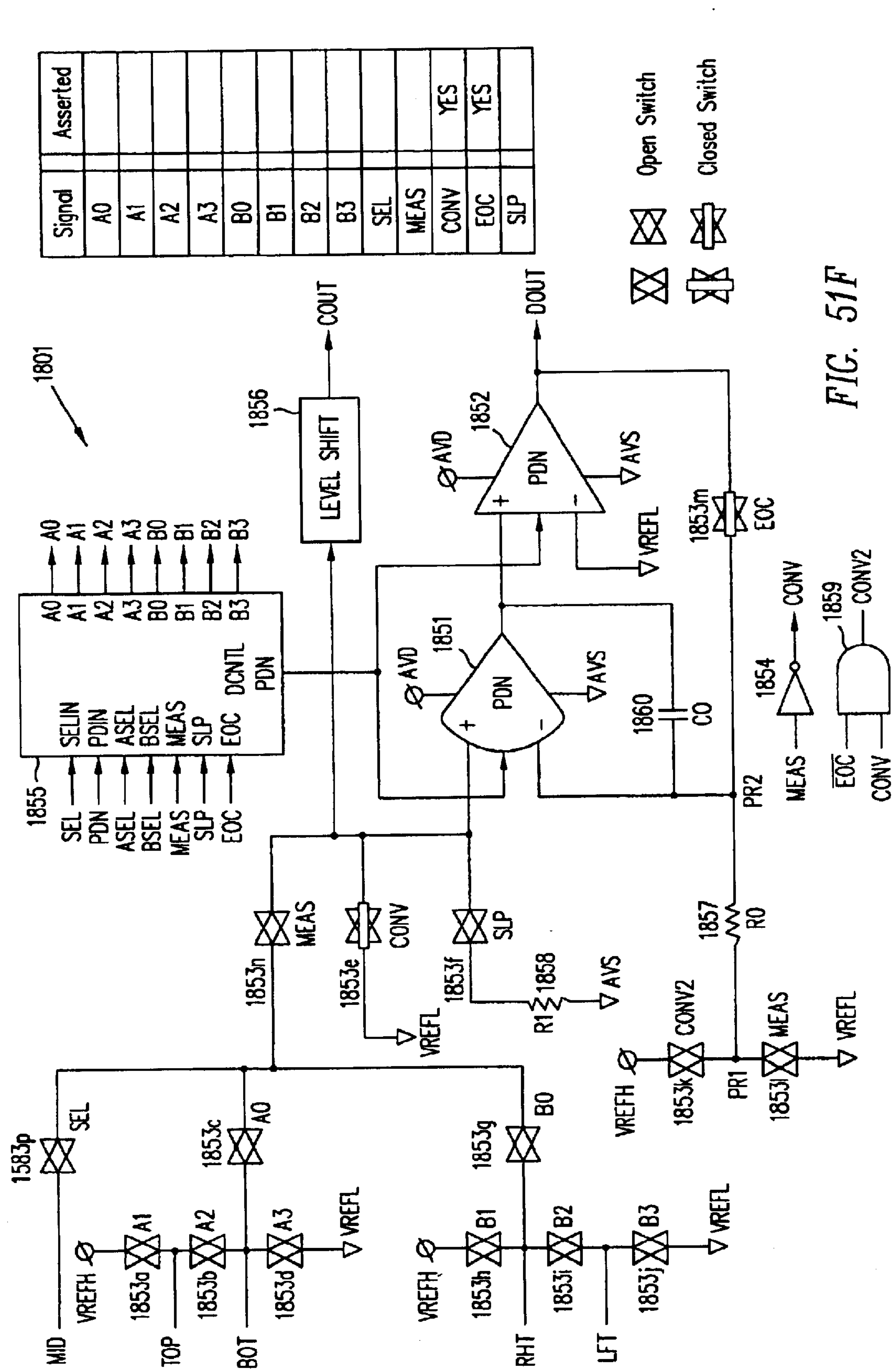
FIG. 51F illustrates the circuit connections of analog block 1801 for an initial measurement state.

The measurement initial state is shown in FIG. 51F. In the initial condition of the QSADC 1211*a* prior to a measurement cycle, CNTRL circuit 1802 drives EOC HIGH and MEAS LOW, thus asserting CONV from inverter 1854. Switch 1853*e* connects the non-inverting input to amplifier 1851 to VREFL. Amplifier 1851 is connected to the non-inverting input of amplifier 1852, which has its non-inverting input permanently connected to VREFL. The output of amplifier 1852 is connected to the inverting input of amplifier 1851, completing a negative feed back loop spanning both amplifiers. Amplifier 1851 brings its inverting input to the same potential as VREFL (the current value of its non-inverting input), plus any input offsets, by driving through the non-inverting input of amplifier 1852. Amplifier 1852 brings its non-inverting input to the same potential as VREFL (the value of its inverting input) plus any input offsets by driving through the inverting input of amplifier 1851. The output of amplifier 1851 will be at VREFL minus the offset of amplifier 1852. The output of amplifier 1852 will be at VREFL minus the offset of amplifier 1851. Therefore capacitor 1860 will have the difference of the offsets of the two amplifiers impressed across it, effectively zeroing the offsets of the circuit. This is the condition to which the circuit will return at the conclusion of each conversion. Note that this configuration is the same for both a four and five connection arrangement (i.e., FIG. 18A and FIG. 18B).

Figure 51G:
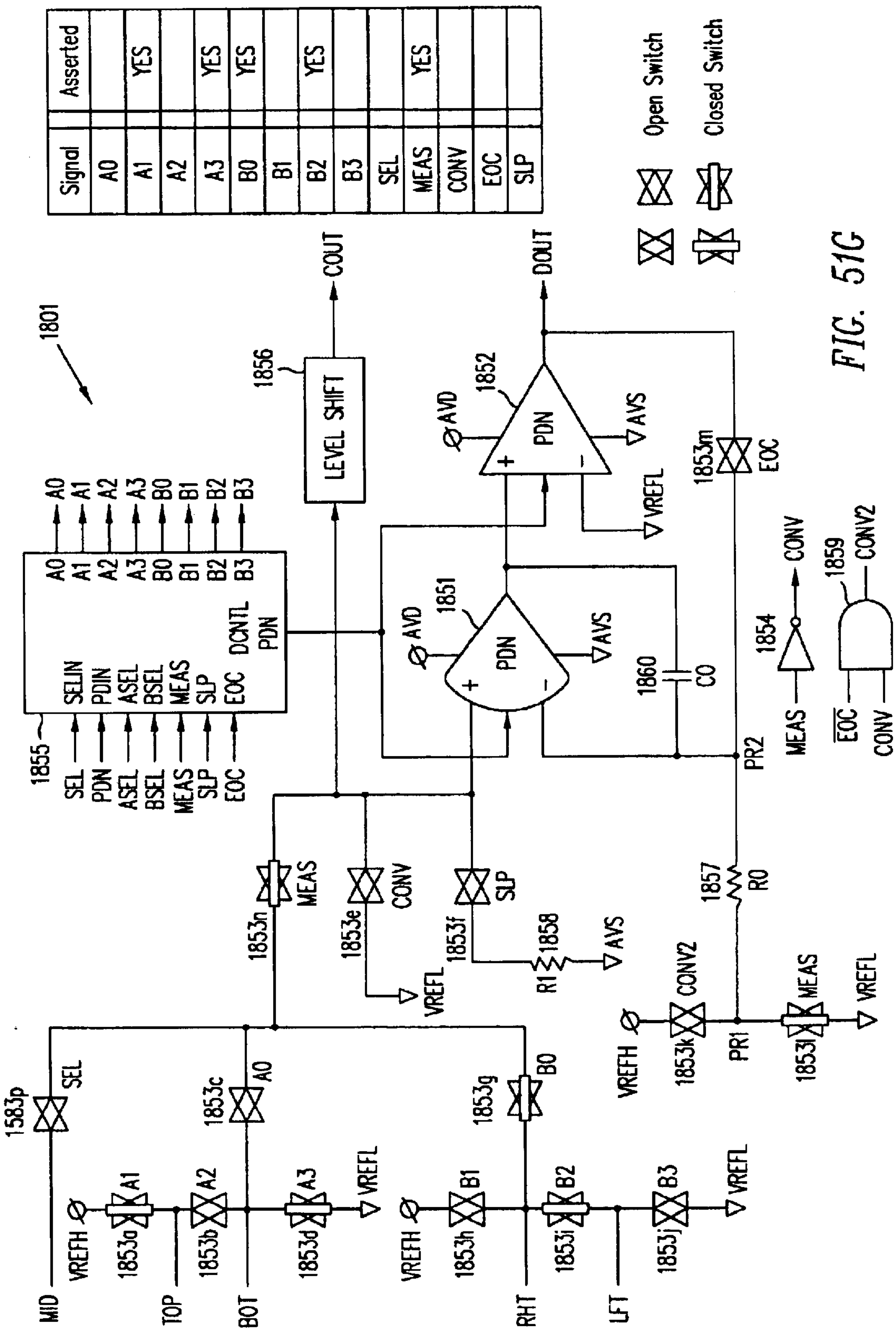
FIG. 51G illustrates the circuit connections of analog block 1801 to integrate the voltage due to contact with the Y coordinate sheet in a four-contact implementation.

Referring to FIG. 51G, a conversion to read the position of contact with the Y coordinate sheet (18.82 in a four-contact implementation) connects VREFH to TOP (18.83) of the Y coordinate sheet and VREFL to BOT (18.84) of the Y coordinate sheet. The SEL signal is LOW. At the point of contact with the X coordinate sheet a voltage is developed which is proportional to the Y coordinate of the point of contact. This voltage is applied to the non-inverting input of amplifier 1851. A high input impedance to amplifier 1851 is desirable to provide good accuracy in determining the contact point. Amplifier 1851 is constructed from field effect transistors which require very little bias current 80 the resistance of the X coordinate sheet 1881 will not contribute an appreciable error. Amplifier 1851 drives its inverting input to the potential of its non-inverting input through capacitor 1860. This causes its output initially to equal the voltage present at its non-inverting input. The level of signal DOUT at the output of amplifier 1852 goes to a high state because its non-inverting input, driven by amplifier 1851, will be above its inverting input which is connected to VREFL. Signal DOUT remains high until the conclusion of the PCA period (FIG. 16). The voltage present at the non-inverting input of amplifier 1851 will appear across resistor 1857 until the PMA period completes. This causes a current proportional to position of the contact with the Y coordinate sheet 18.B2 to flow into capacitor 1860. The output of amplifier 1851 ramps positively to maintain its inverting input at the same potential as its non-inverting input. At the conclusion of the PMA time, capacitor 1860 has a charge proportional to the position of contact with the Y coordinate sheet 18.82 and the length of time of the PMA phase.

When the active ZERO signal is received into digital controller block 1802, QSADC module 1211*a* switches into the conversion cycle (PCA) for the voltage at Port X. At the start of the conversion cycle, up/down counter 1803 switches to count increment mode (note that the counter value is already zero). The number of count increments required for the DOUT pin (i.e., output terminal of analog comparator 1852) to return to a low voltage is directly proportional to the ratio of the voltage measured at the Port Y to the reference voltage VREFH.

Figure 51H:
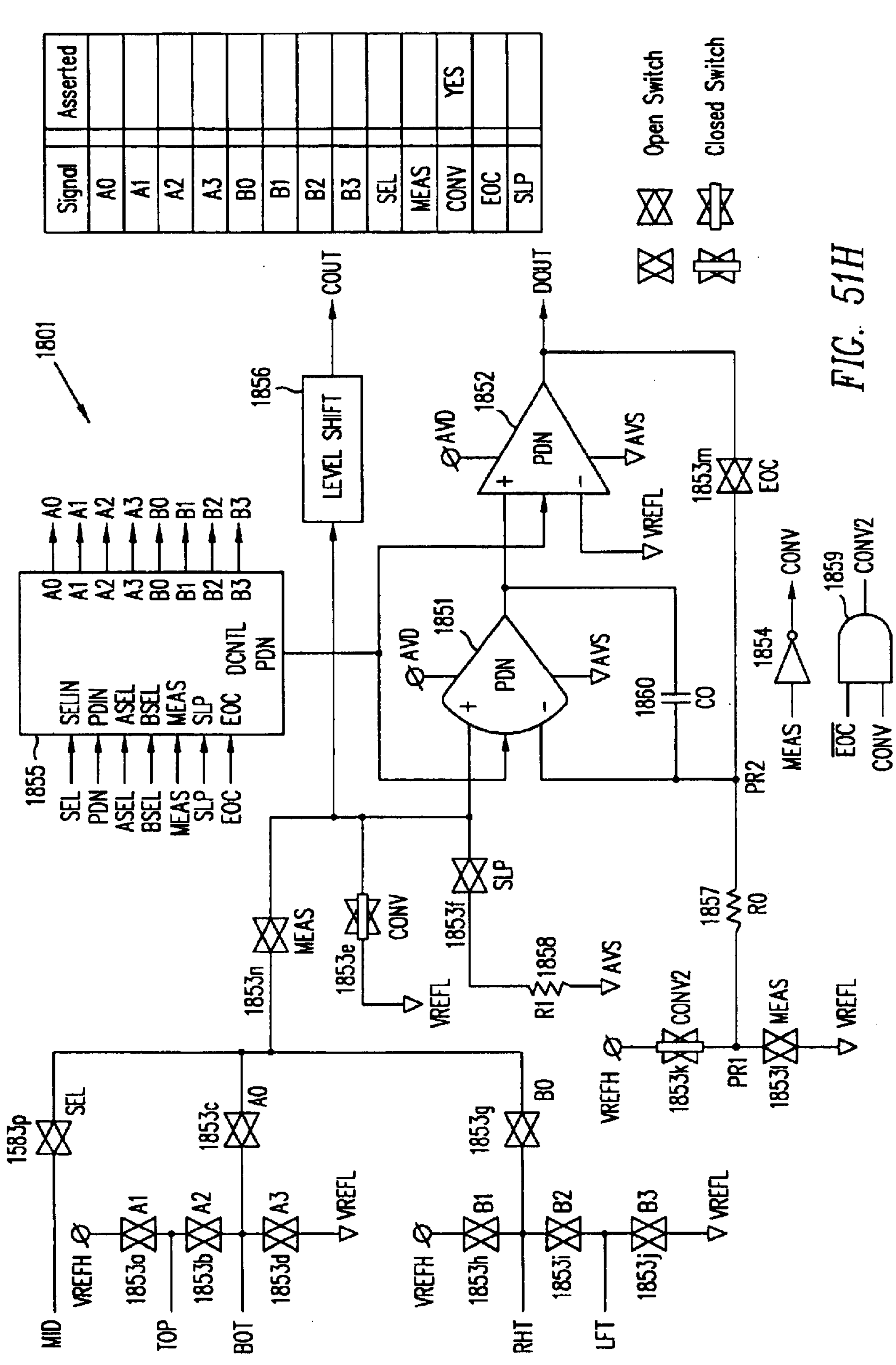
FIG. 51H illustrates the circuit connections of analog block 1801 to digitally convert the voltage due to contact with the Y coordinate sheet in a four-contact implementation.

Conversion is completed by setting switch positions as depicted in FIG. 51H. The non-inverting input of amplifier 1851 is connected to VREFL through switch 1853*e*. Amplifier 1851 will drive its inverting input to VREFL through capacitor 1860. This causes VREFL to be applied to one side of resistor 1857 with VREFH applied to the other through switch 1853*k*. This causes a current proportional to VREFL minus VREFH across resistor 1857 to flow out of capacitor 1860. It should be noted that the current flowing during the PCA phase is the same magnitude (but reversed in sign) as the current flowing during the PMA phase if the point of contact is at the end of the sheet connected to VREFH. To the extent that the point of contact is closer to the end connected to VREFL the PMA current will be proportionately less. The output of amplifier 1851 will ramp negatively to maintain its inverting input at the same potential as its non-inverting input. The PCA phase concludes when the output of amplifier 1851 crosses below VREFL, the potential present at the inverting input of amplifier 1852, at which time DOUT will fall to a low state. The transition of DOUT marks the termination of the PCA. The length of time in the PCA phase divided by the length of time in the previous state will be proportional to the point of contact. When the times are equal (i.e., the ratio is one), the point of contact was at the VREFH end of the sheet. If the ratio is one half, the point of contact is half way between the VREFH and VREFL ends of the sheet. If the ratio is zero (time in PCA phase is zero), the point of contact is at the VREFL end of the sheet. After the end of PCB phase has been recognized, digital controller block 1802 transfers the count in up/down counter 1803, which represents a digital value of the voltage at Port X, to register 1805 (REGY), and the circuit again enters the Measurement Initial State to prepare for the next measurement.

Figure 51I:
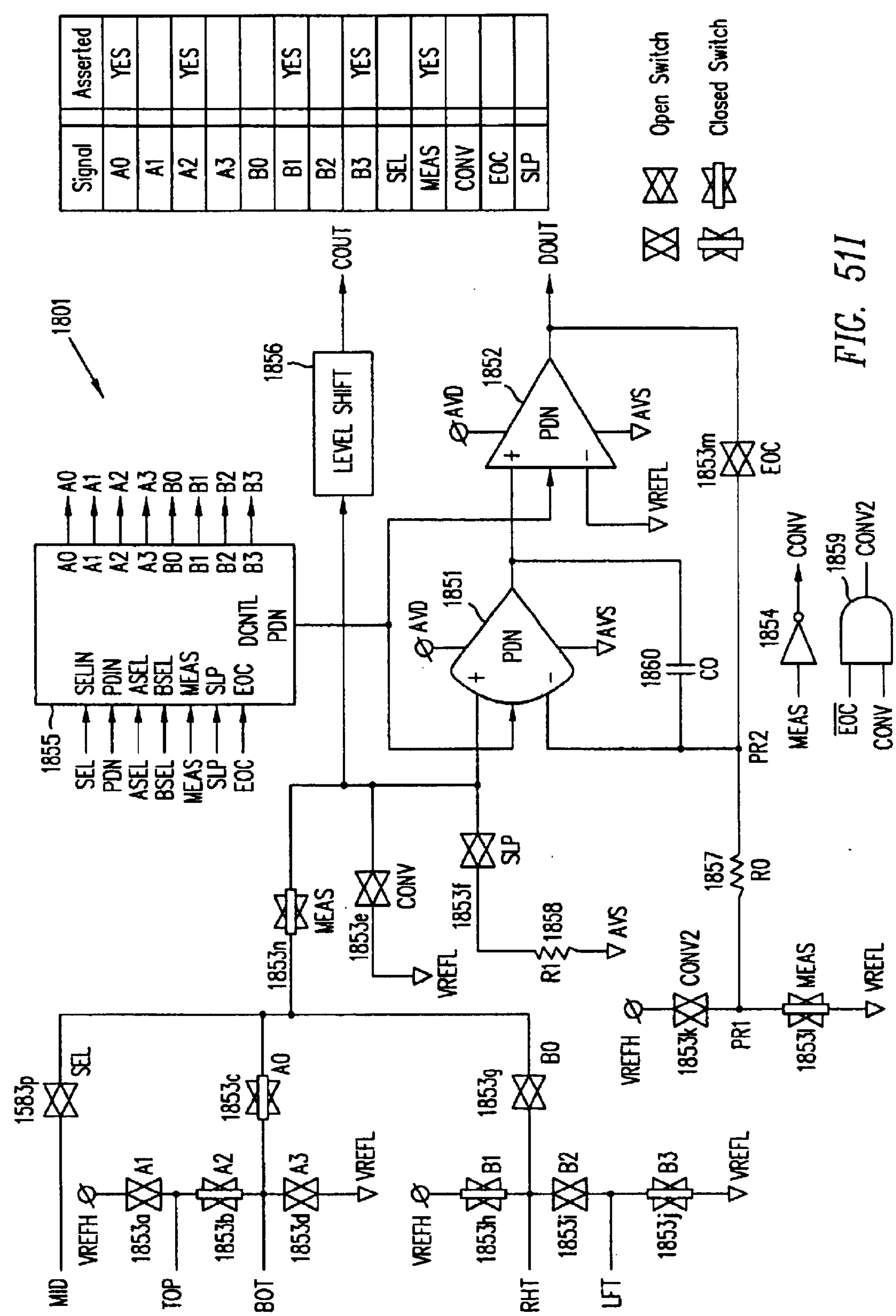
FIG. 51I illustrates the circuit connections of analog block 1801 to integrate the voltage due to contact with the X coordinate sheet in a four-contact implementation.

Similarly, referring to FIG. 51I, a conversion to read the position of contact with the X coordinate sheet (18.81 in a four-contact implementation) connects VREPH to RHT (18.86) of the X coordinate sheet and VREFL to LFT (18.85) of the X coordinate sheet. The SEL signal is LOW. At the point of contact with the Y coordinate sheet, a voltage is developed which is proportional to the X coordinate of the point of contact. This voltage is applied to the non-inverting input of amplifier 1851. The operation of amplifiers 1851 and 1852 is identical to that described previously for the PMA phase for the Y direction. At the conclusion of the PMB time, capacitor 1860 has a charge proportional to the position of contact with the X coordinate sheet and the length of time of the PMB phase.

Figure 51J:
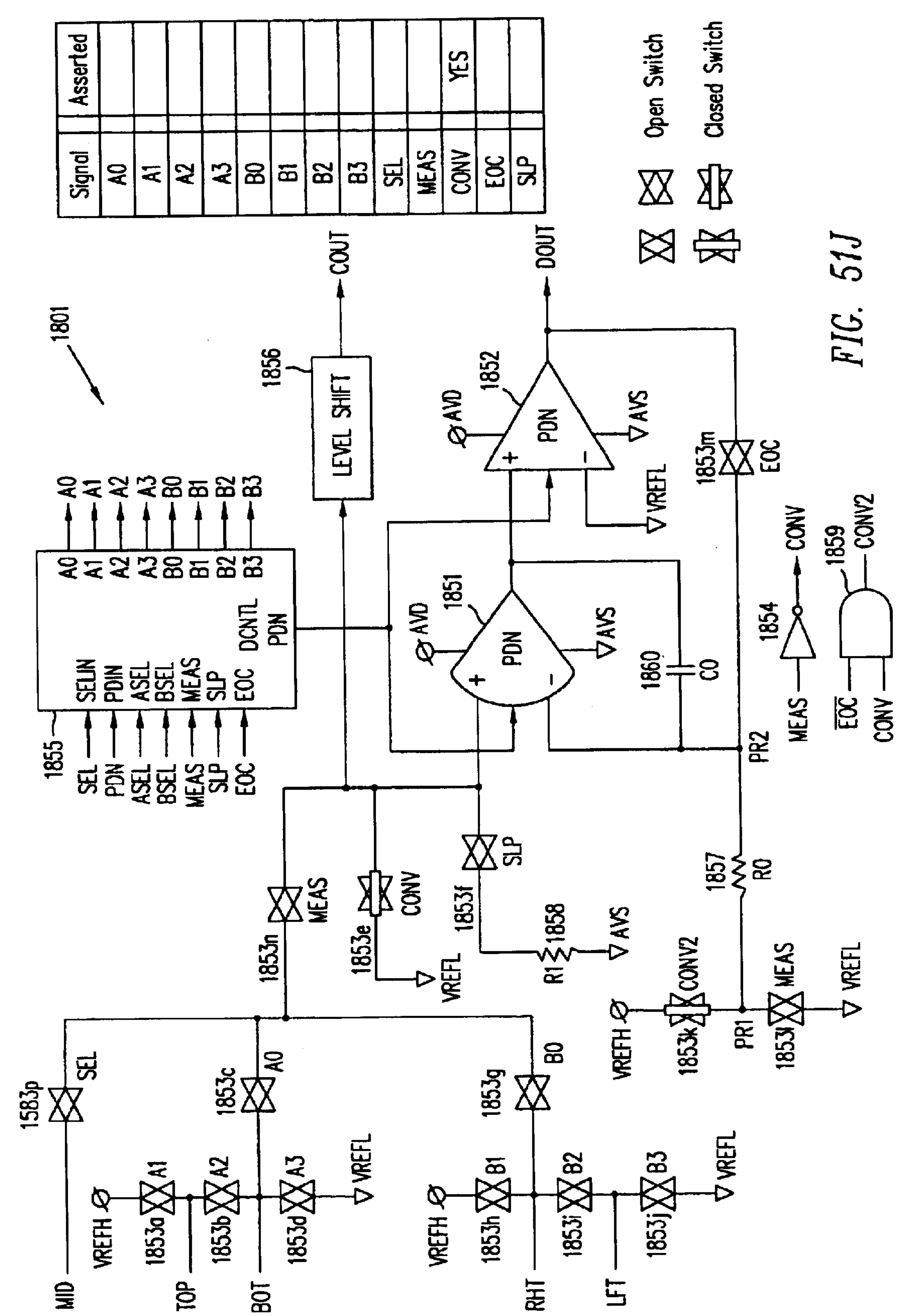
FIG. 51J illustrates the circuit connections of analog block 1801 to digitally convert the voltage due to contact with the X coordinate sheet in a four-contact implementation.

Similarly, conversion is completed by setting switch positions as depicted in FIG. 51J. The non-inverting input of amplifier 1851 is connected to VREFL through switch 1853*e*. The operation of amplifiers 1851 and 1852 is identical to that described previously for the PCA phase in the Y direction. After the end of PCB phase has been recognized, digital controller block 1802 transfers the count in up/down counter 1803, which represents a digital value of the voltage at Port Y, to register 1804 (REGX), and the circuit again enters the Measurement Initial State to prepare for the next measurement.

Figure 51K:
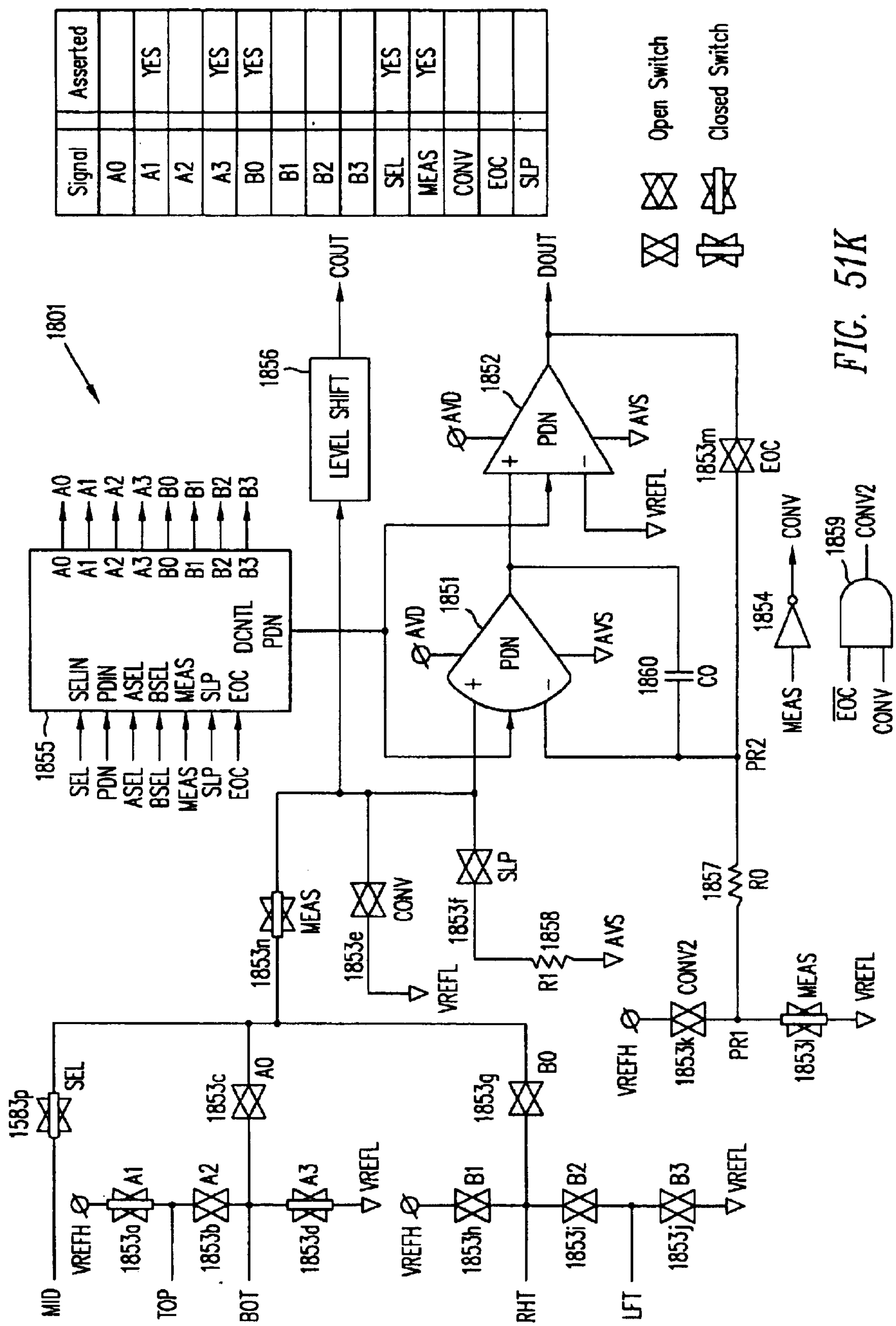
FIG. 51K illustrates the circuit connections of analog block 1801 to integrate the voltage due to contact with the X-Y coordinate sheet in a five-contact implementation due to horizontal position.
Figure 51L:
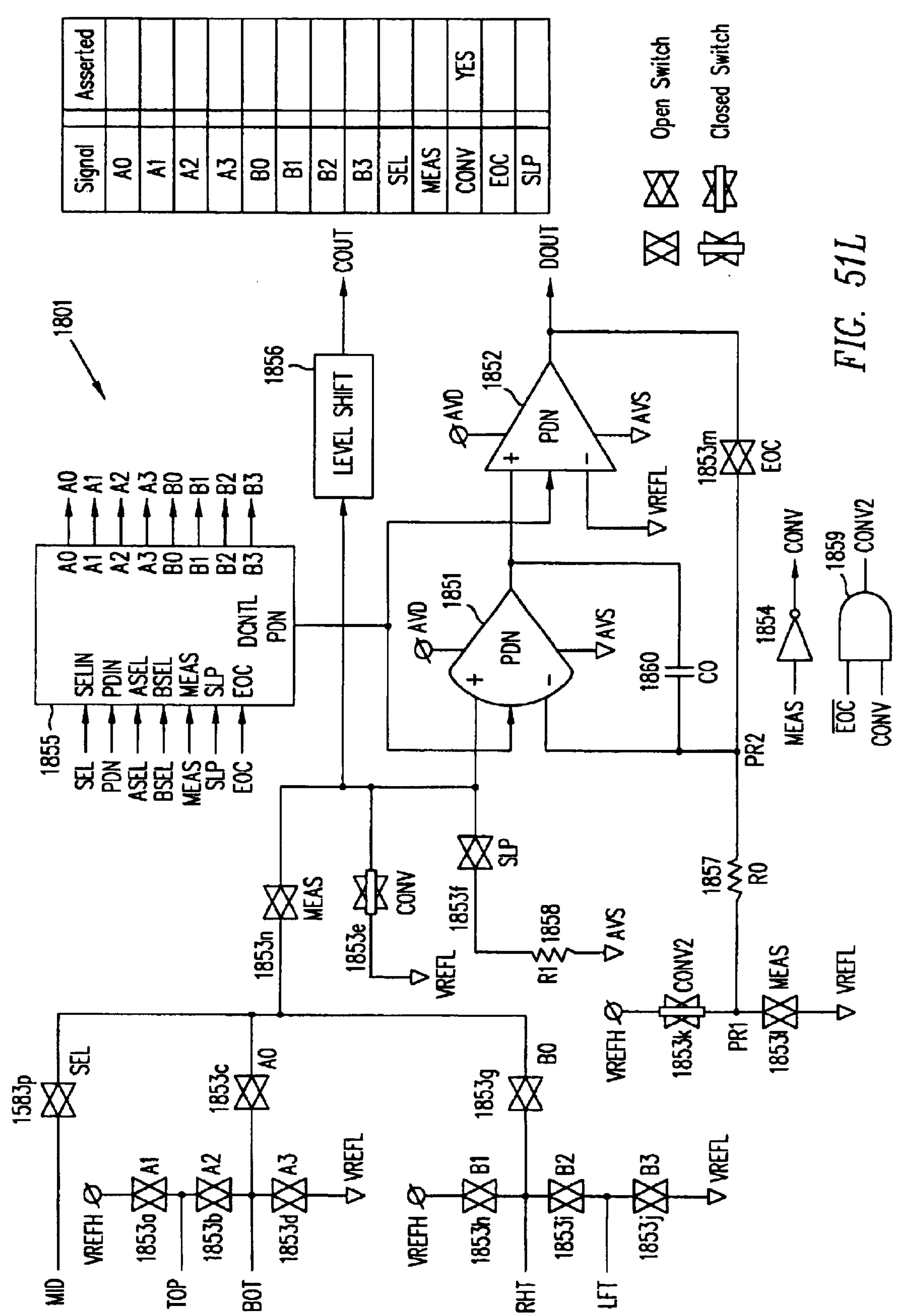
FIG. 51L illustrates the circuit connections of analog block 1801 to digitally convert the voltage due to contact with the X-Y coordinate sheet in a five-contact implementation due to vertical position.

Similarly, referring to FIG. 51K, a conversion to read the vertical position of contact with the X-Y coordinate sheet (in a five-contact implementation) connects VREFH to TOP (18.97) of the X-Y coordinate sheet 18.93 and VREFL to BOT (18.98) of the X-Y coordinate sheet (18.93). Note the SEL signal is HIGH. At the point of contact with the contact sheet 18.92 a voltage is developed which is proportional to the Y coordinate of the point of contact. This voltage is applied to the non-inverting input of amplifier 1851 through switches SEL 1853p and MEAS 1853n wherein the contact MID has been connected to connection 18.96 of contact sheet 18.92. The operation of amplifiers 1851 and 1852 is identical to that described previously for the PMA phase for the Y direction. At the conclusion of the PMA time, capacitor 1860 has a charge proportional to the position of contact with the Y coordinate sheet 18.93 and the length of time of the PMB phase Similarly, conversion is completed by setting switch positions as depicted in FIG. 51L. Note that SEL is now LOW. The non-inverting input of amplifier 1851 is connected to VREFL through switch 1853*e*. The operation of amplifiers 1851 and 1852 is identical to that described previously for the PCA phase in the Y direction. After the end of PCA phase has been recognized, digital controller block 1802 transfers the count in up/down counter 1803, which represents a digital value of the voltage at the MID port, to register 1805. (REGY), and the. circuit again enters the Measurement Initial State to prepare for the next measurement.

Figure 51M:
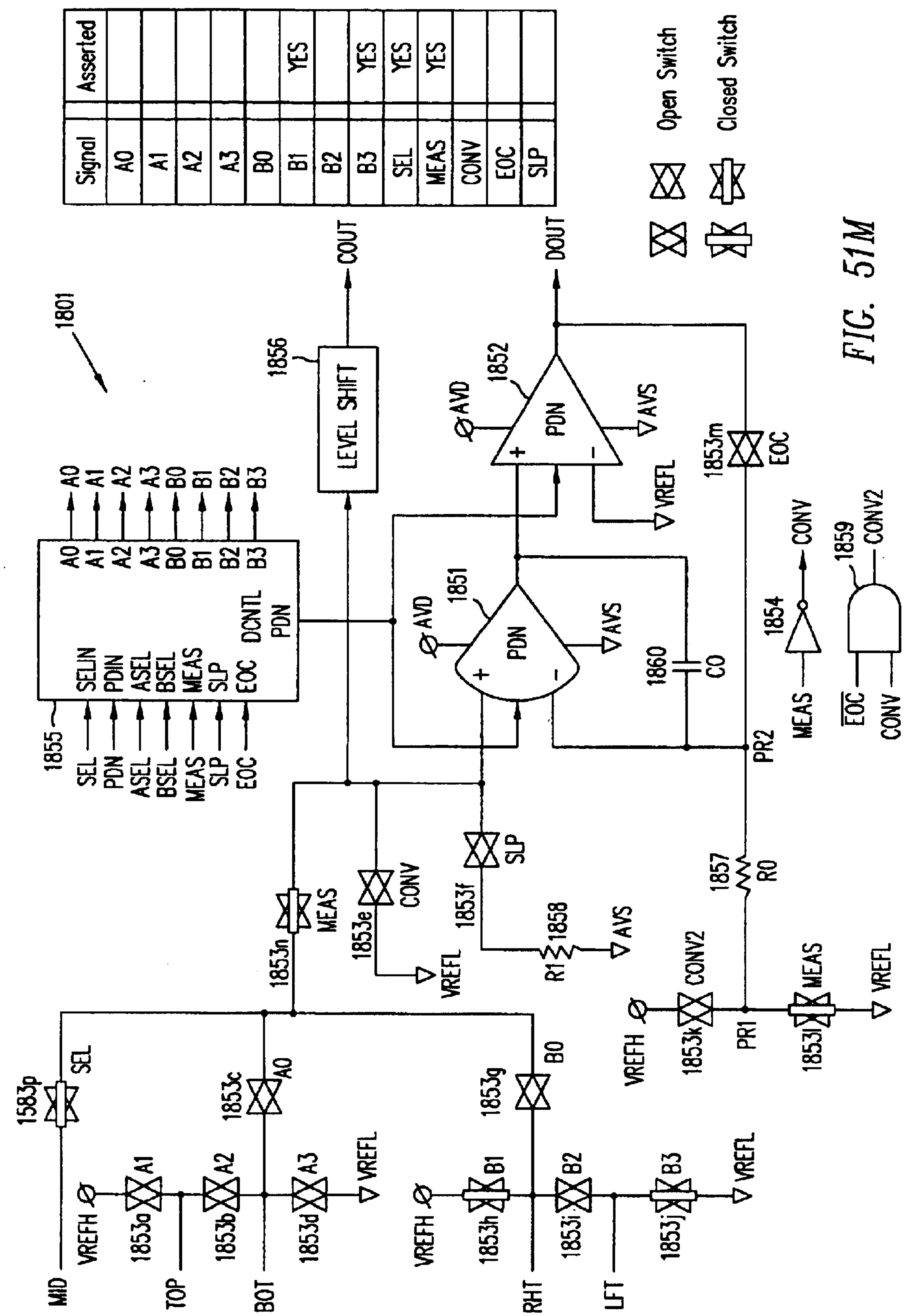
FIG. 51M illustrates the circuit connections of analog block 1801 to integrate the voltage due to contact with the X-Y coordinate sheet in a five-contact implementation due to horizontal position.
Figure 51N:
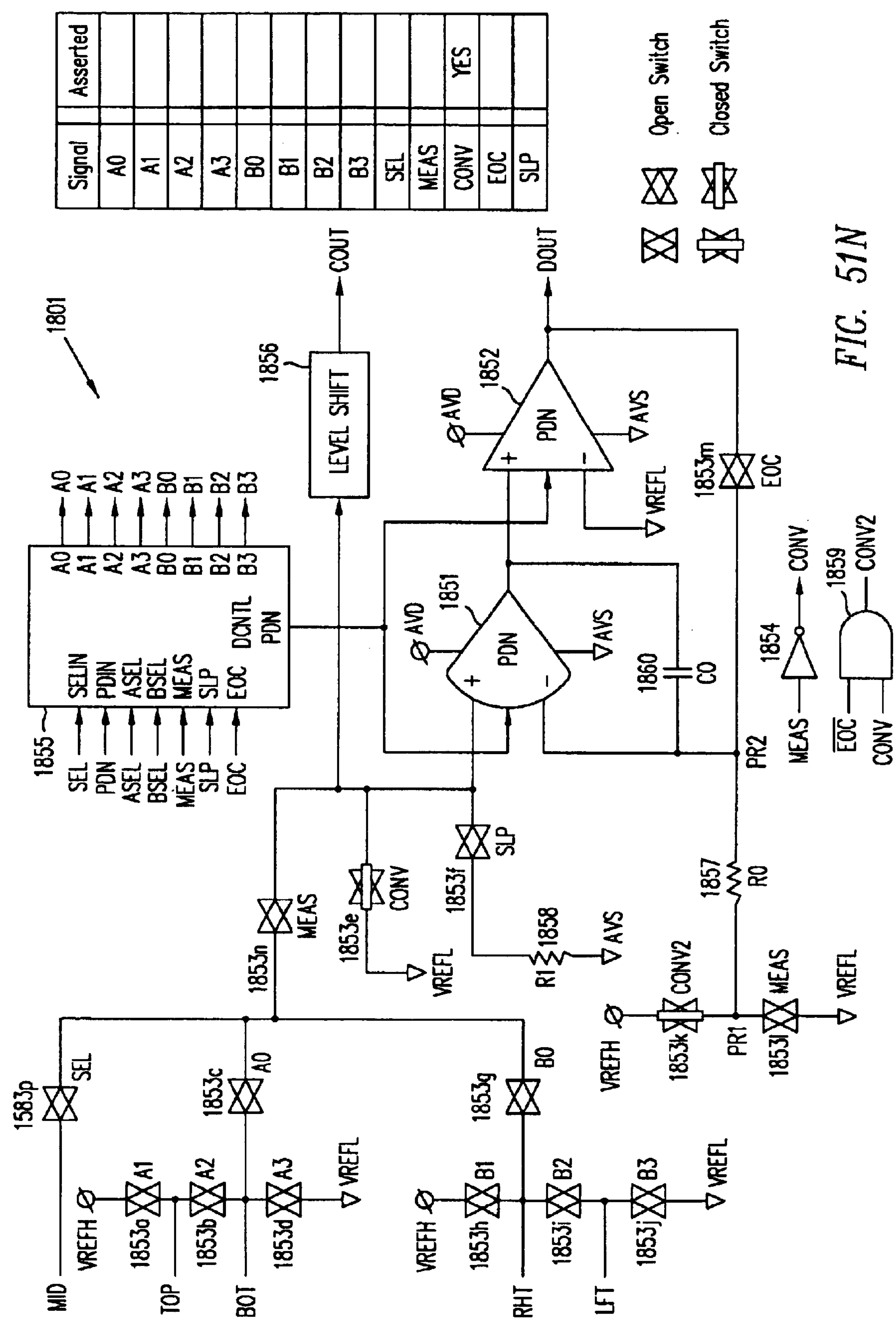
FIG. 51N illustrates the circuit connections of analog block 1801 to digitally convert the voltage due to contact with the X-Y coordinate sheet in a five-contact implementation due to horizontal position.
Figure 510:
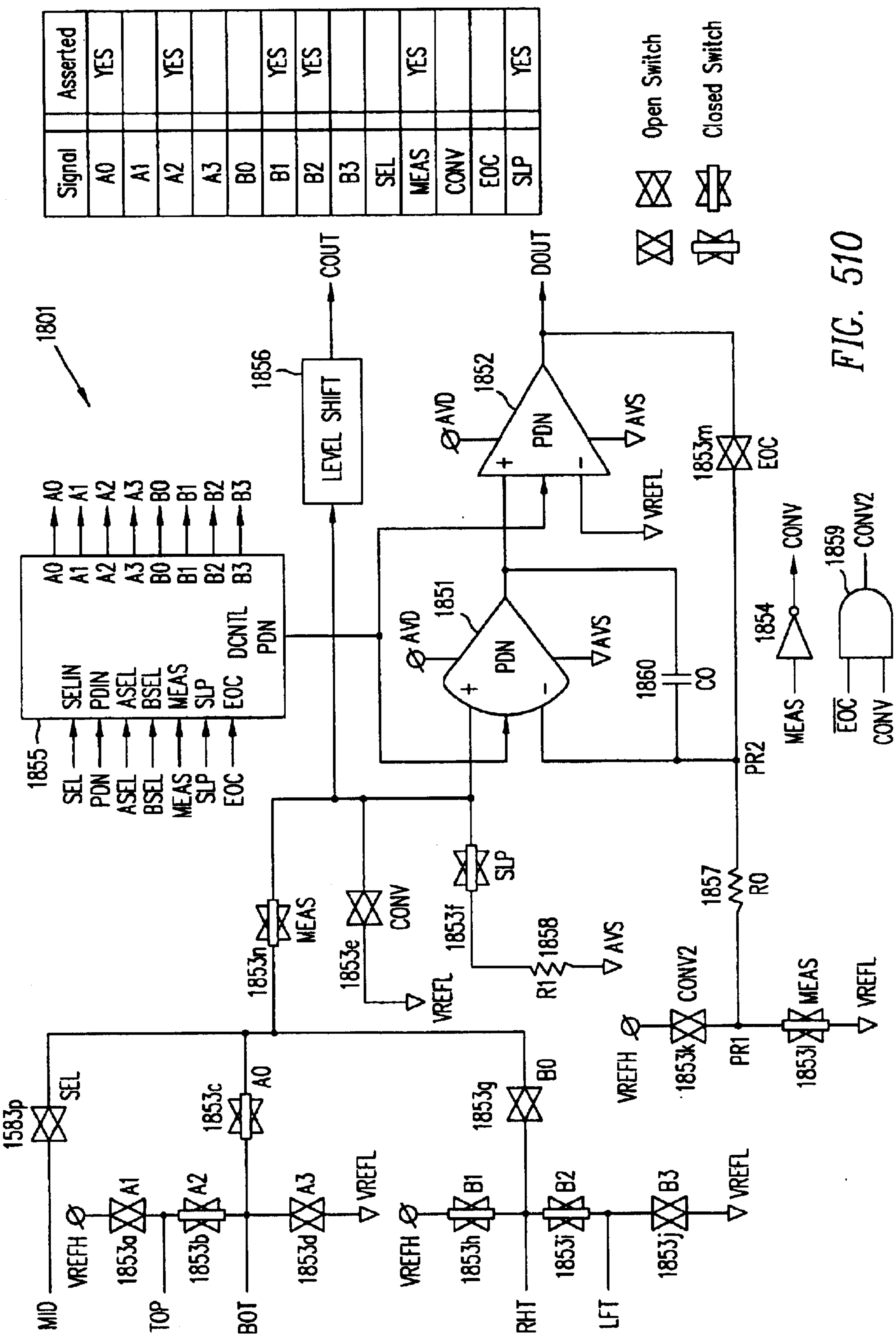
FIG. 510 illustrates the circuit connections of analog block 1801 to detect continuity between the resistive sheets in a four-contact implementation.
Figure 51P:
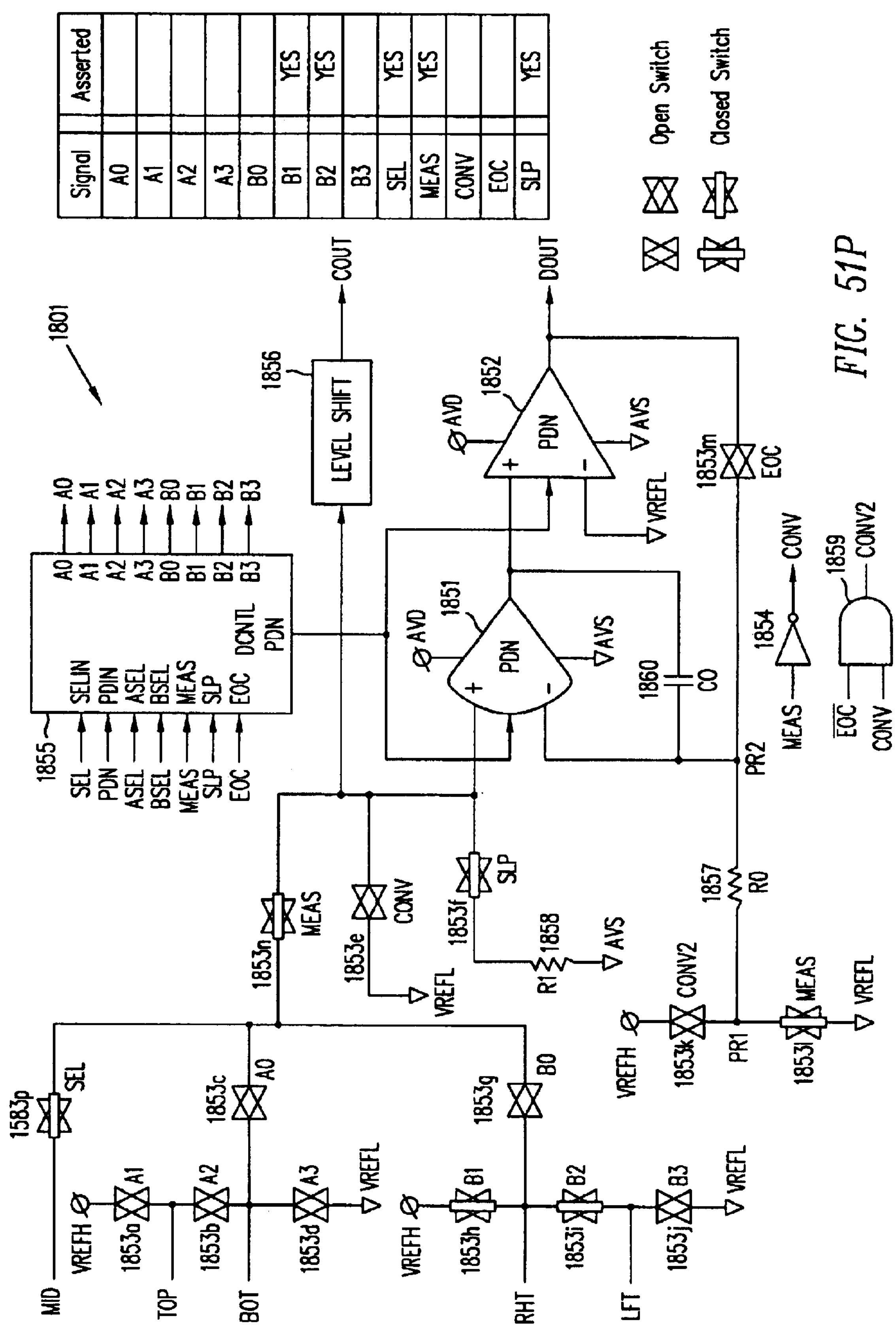
FIG. 51P illustrates the detection of contact for a five-contact implementation.

Referring to FIG. 51M, a conversion to read the horizontal position of contact with the X-Y coordinate sheet (in a five-contact implementation) connects VREFH to LHT (18.94) of the X-Y coordinate sheet and VREFL to RHT (18.95) of the X-Y coordinate sheet). Note the SEL signal is HIGH. At the point of contact with the contact sheet 18.92 a voltage is developed which is proportional to the X coordinate of the point of contact. This voltage is applied to the non-inverting input of amplifier 1851 through switches SEL 1853*p* and MEAS 1853*n* wherein the contact MID has been connected to connection 18.96 of contact sheet 18.92. The operation of amplifiers 1851 and 1852 is identical to that described previously for the PMA phase for the Y direction. At the conclusion of the PMA time, capacitor 1860 has a charge proportional to the position of contact with the X coordinate sheet and the length of time of the PMB phase Similarly, conversion is completed by setting switch positions as depicted in FIG. 51N. Signal SEL is now LOW. The non-inverting input of amplifier 1851 is connected to VREFL through switch 1853*e*. The operation of amplifiers 1851 and 1852 is identical to that described previously for the PCA phase in the Y direction. After the end of PCB phase has been recognized, digital controller block 1802 transfers the count in up/down counter 1803, which represents a digital value of the voltage at the MID port, to register 1804 (REGX), and the circuit again enters the Measurement Initial State to prepare for the next measurement FIG. 51 is a block diagram showing interface signals of QSADC module 1211*b* in another implementation. The implementation of FIG. 51 is similar to the implementation in FIG. 17 and therefore the discussion for similar features will not be repeated. Table 1 provides a brief descriptive summary of the signals shown in FIG. 51.

The implementation of FIG. 51 includes a digital interface 1902.4 that is different than digital interface 1702 (FIG. 17). Specifically, digital interface 1902.4 comprises one 8-bit output bus 1902*a*.4 (labeled DOUT[7:0]) and a Select signal 1902*b*.4 (labeled SEL), rather than output buses 1702*a* and 1702*b* as described in reference to FIG. 17. Output bus 1902*a*.4 provides the results of the analog-to-digital conversion (ADC) process of the voltage at the port A or the port B with respect to the voltage reference VREF.

Select signal 1902*b*.4 is the output select signal that selects whether to present the results from the port A or the port B after the DONE signal is asserted. For example, if SEL 1902*b*.4 is a logical LOW level, then the ADC result of the voltage at the port A is presented on output bus 1902*a*.4. Otherwise, if select signal 1902*b*.4 is a logical high level, then the ADC result of the voltage at the port B is presented on output bus 1902*a*.4.

TABLE 1

| Signal/Pin Description | | |
|---|---|---|
| Pin Name | Type | Description |
| AMAX | Bidirectional | Maximum Analog Measurement Pin for the A Port |
| AMIN | Bidirectional | Minimum Analog Measurement Pin for the A Port |
| BMAX | Bidirectional | Maximum Analog Measurement Pin for the B Port |
| BMIN | Bidirectional | Minimum Analog Measurement Pin for the B Port |
| START | Input | Start Conversion Pin Active HIGH |
| CLK | Input | Clock |
| RSTN | Input | Reset Active LOW |
| PDN | Input | Power Down Control Active LOW |
| DOUT[7:0] | Output | Digitized Bus for Measured Value |
| DONE | Output | Done Pin Active HIGH |
| CONT | Output | Continuity Detection Pin Active HIGH |
| VREF | Input | Analog Voltage Reference |
| AVD | Power | Analog Power |
| AVS | Power | Analog Ground |
| VDD | Power | Digital Power |
| VSS | Power | Digital Ground |

FIG. 51A and FIG. 51B show another implementation of QSADC module 1211*b*, in accordance with the present invention. FIG. 51A and FIG. 51B are similar to FIG. 18 and FIG. 18A and operate in a similar fashion and, therefore, only basic operational differences between the embodiments will be specifically noted.

FIG. 51A is a top-level block diagram of QSADC module 1211*b*, including an analog block 2001.4, a digital controller block 2002.4, a pre-settable up/down counter block 2003.4, registers 2004.4 and 2005.4, a NAND gate 2006.4, and a multiplexer 2007.4. FIG. 51A differs from FIG. 18 due mainly to the addition of select signal 1902*b*.4 (labeled SEL) in FIG. 51A. Select signal 1902*b*.4 employs multiplexer 2007.4 to select the data stored in register 2004.4 or register 2005.4 to be provided on output bus 1902*a*.4 (DOUT[7:0]). For example, the digital conversion results of the voltages at the port A and the port B are stored in register 2004.4 and register 2005.4, respectively. If SEL 1902*b*.4 is at a logical low level, the conversion results of the port A (stored in register 2004.4) are provided on output bus 1902*a*.4 via multiplexer 2007.4. If SEL 1902*b*.4 is at a logical high level, the conversion results of the port B (stored in register 2005.4) are provided on output bus 1902*a*.4 (DOUT[7:0]) via multiplexer 2007.4.

FIG. 51B shows an implementation of analog block 2001.4 of FIG. 51A. The operation of the implementation shown in FIG. 51B is similar to the operation of the implementation shown in FIG. 18A and, therefore, the discussion will not be repeated except for noting general differences.

As shown in FIG. 51B, analog block 2001.4 includes a digital control block (DCNTL) 2020.4 and a level shift circuit 2022.4. Initially, QSADC module 1211*b* is in sleep mode, but checking for electrical continuity between the ports A (AMAX and AMIN) and B (BMAX and BMIN), with a sleep control signal (SLP) at a logic high, a power down signal (PDON) at a logic low, and operational amplifier 1851 and analog comparator 1852 powered down to conserve power. In this mode of operation, switches 1853*c*, 1853*b*, 1853*h*, 1853*i*, 1853*l*, 1853*n*, and 1853*f* (i.e., signals A0, A2, B1, B2, MEAS, and SLP) are closed, while all other switches are open.

When there is no electrical continuity between the ports Y and X, a continuity out (CONT) signal is at a logical low level. When electrical continuity is established, the input to level shift circuit 2002.4 is pulled to a high voltage (i.e., to a voltage level of the voltage reference) and the continuity out signal transitions,to a logical high level. The logical high on the continuity out signal is detected (and de-bounced) by a flip flop (not shown) in digital controller block 2002.4, resulting in digital controller block 2002.4 asserting a logical high signal on the CONT terminal. QSADC module 1211*b* then exits the sleep mode and proceeds to power up operational amplifier 1851 and analog comparator 1852 to begin the primary mode of operation (as discussed above). During the primary mode, the circuitry associated with the continuity checking in digital controller block 2002.4 may be disabled.

FIG. 51C illustrates a block diagram showing exemplary interface signals for another implementation. The block diagram illustrates a digital logic wrapper mixed-signal macro (also referred to as a touch screen interface or TSI) that encapsulates QSADC 1211*a*. The wrapper provides an interface to the 8051 micro-controller in central processing module (SYS) 1205 for reading the touch screen coordinate data from QSADC 1211*a*.

The wrapper contains data, control, and status registers, as described in further detail below, that allow the software driver to work more efficiently by presenting the necessary information in specific locations. An internal state machine in the wrapper will manage the operation of QSADC 1211*a* and its interaction with touch screen interface 1211.

Touch screen interface 1211 uses the three interfaces AIO 1701, power supply interface (PSI) 1703, and DI 1702. AIO 1701 and power supply interface 1703 are as described above, while DI 1702:.also includes signals required by central processing module (SYS) 1205 to control the operation of QSADC 1211*a* and access the sampled data. These signals include a SYS_CLK signal 5002.4, a TS_SFR_REG_EN signal 5010.4, a SFR_ADDR[7:0] signal 5012.4, a SFR_DATA_OUT[7:0] signal 5014.4, a SFR_WR_N signal 5016.4, a SFR_RD_N signal 5018.4, a TS_SFR_DATA_IN[7:0] signal 5042.4, a TS_MEM_REG_EN signal 5020.4, a MEM_ADDR[2:0] signal 5022.4, a MEM_DATA_OUT[7:0] signal 5024.4, a MEM_WR_N signal 5026.4, a MEM_RD_N signal 5028.4, a TS_MEM_DATA_IN[7:0] signal 5040.4, a TS_INT signal 5044.4, and a QSADC_CLK signal 5004.4.

RSTN signal 5000.4 is the chip-level reset used to initialize the internal logic of the TSI. SYS_CLK signal 5002.4 is the clock used to synchronize the TSI's internal logic to central processing module (SYS) 1205. QSADC_CLK signal 5004.4 is the clock used to control touch screen interface 1211 state machine and QSADC 1211*a*. TS_SFR_REG_EN signal 5010.4 indicates that touch screen interface 1211 register on the SFR bus, a component of central processing module (SYS) 1205, is about to be accessed. The SFR bus enables access to non-memory mapped registers, as described elsewhere herein.

SFR_ADDR[7:0] signal 5012.4 is the address received from the 8051 used to access one of the SFR registers. SFR_DATA_OUT[7:0] signal 5014.4 contains the data (i.e. control word) to be written into the registers. SFR_WR N signal 5016.4 is used in conjunction with TS_SFR_REG_EN signal 5010.4 to write TS SFR_DATA_IN[7:0] signal 5042.4 to one of the registers addressed by SFR_ADDR[7:0] signal 5012.4. SFR_RD_N signal 5018.4 is used in conjunction with TS_SFR_REG_EN signal 5010.4 to read SFR DATA_OUT[7:0] signal 5014.4 from one of the registers addressed by SFR_ADDR[7:0] signal 5012.4. TS_SFR_DATA_IN[7:0] signal 5042.4 contains the data (i.e. data/status words) to be read from the registers.

TS_MEM_REG_EN signal 5020.4 indicates that a TSI register on the Memory Mapped I/O (MMIO) bus, a component of central processing module (SYS) 1205 is about to be accessed. MEM_ADDR[2:0] signal 5022.4 is the address coming from the 8051 used to access one of the MMIO registers. This address bus is a partial decode of the 16-bit MEM_ADDR[2:0] signal 5022.4 on the 8051 (specifically bits [2:0]). All MMIO register transactions are qualified with the TS_MEM_REG_EN signal 5020.4. Using a partial decode reduces routing congestion and eliminates the need for a full decode.

MEM_DATA_OUT[7:0] signal 5024.4 contains the data (i.e. control word) to be written into the registers. MEM_WR_N signal 5026.4 is used in conjunction with TS_MEM_REG_EN signal 5020.4 to write TS_MEM_DATA_IN[7:0] signal 5040.4 data to one of the registers addressed by MEM_ADDR[2:0] signal 5022.4. MEM_RD_N signal 5028.4 is used in conjunction with TS_MEM_REG_EN signal 5020.4 to read MEM_DATA_OUT[7:0] signal 5024.4 from one of the registers addressed by MEM_ADDR[2:0] signal 5022.4. TS_MEM_DATA_IN[7.:0] signal 5040.4 contains the data (i.e. data/status words) to be read from the registers.

TS_INT signal 5044.4 is an interrupt line sent to the 8051 contained within central processing module (SYS) 1205 to indicate that an (X, Y) coordinate pair has been converted to a digital value by QSADC 1211*a* and is ready for use. The 8051 treats this line as an edge-sensitive interrupt, with the line remaining high until the 8051 clears it.

TABLE 1.6.6a

| Signal | Type | Description | Source | Destination |
|---|---|---|---|---|
| RSTN | Input | Global chip reset | | |
| QSADC_CLK | Input | QSADC 1211a macro clock | CLKGEN | |
| SYS_CLK | Input | SYS 1205 module clock | CLKGEN | |
| AIO | | Interface | AIO | |
| PSI | | Interface | AIO | |
| TS_SFR_REG_EN | Input | Enables touch screen SFR register | SYS 1205 | |
| SFR_ADDR [7:0] | Input | SFR address from 8051 | SYS 1205 | |
| SFR_DATA_OUT[7:0] | Input | SFR data from 8051 | SYS 1205 | |
| SFR_WR_N | Input | SFR data write enable | SYS 1205 | |
| SFR_RD_N | Input | SFR data read enable | SYS 1205 | |
| TS_SFR_DATA_IN [7:0] | Output | SFR data to 8051 | | SYS 1205 |
| TS_MEM_REG_EN | Input | Enable touch screen MEM register | SYS 1205 | |
| MEM_ADDR [2:0] | Input | MMIO address from 8051 | SYS 1205 | |
| MEM_DATA_OUT [7:0] | Input | MMIO data from 8051 | SYS 1205 | |
| MEM_WR_N | Input | MMIO data write enable | SYS 1205 | |
| MEM_RD_N | Input | MMIO data read enable | SYS 1205 | |
| TS_MEM_DATA_IN[7:0] | Output | MMIO data to 8051 | | SYS 1205 |
| TS_INT | Output | Interrupt to 8051 indicating an (X, Y) coordinate pair is ready for reading. | | SYS 1205 |

FIG. 51D shows a flowchart for performing diagnostics for the TSI and FIG. 51E shows a functional block diagram corresponding to the TSI. In FIG. 51E, besides QSADC 1211*a*, various registers are shown, including a TSI_CTRL [7:0] register 5062.4, an SMP_DELAY[7:0] register 5060.4, an INT_STAT[7:0] register 5064.4, an X_DATA [7:0] register 5066.4, and a Y_DATA[7:0]register 5068.4.

Specifically, TSI_CTRL[7:0] 5062.4 controls the operation of touch screen interface 1211 and QSADC 1211*a*. Bit 0 of TSI_CTRL[7:0] 5062.4 enables or disables the TSI. If this register bit is '0', an internal state machine (FSM) 5070.4 stays in IDLE and QSADC 1211*a* is in low-power mode. If this register bit is '1', the state machine starts collecting samples as soon as it detects activity on the touch screen. Bit 1 of TSI_CTRL[7:0] 50.62.4 indicates the type of touch screen that is attached to the Power Meister (E.G., 4-pin or 5-pin).

SMP_DELAY[7:0] register 5060.4 controls the time between samples. For example, QSADC 1211*a* is capable of collecting a pair of (X, Y) coordinate samples every 3.9 ms given a 262.144 kHz clock. However, this rate may be too fast for certain operating systems to handle, so SMP_DELAY[7:0] register 5060.4 allows the TSI to vary the waiting time between successive samples from 0 ms to 6.4 ms. The maximum sample collection rate would then be 3.9 ms to 10.3 ms respectively.

INT_STAT(7:0] register 5064.4 is the interrupt status register. When an interrupt is detected, TSI_INT signal 5044.4 is held high until the 8051 clears the particular interrupt.

A DIAG_CTRL[7:0] register (not shown) controls the diagnostic logic and is routed directly to the QSADC 1211*a* block via the MMIO bus. In this mode, internal state machine 5070.4 is bypassed and QSADC 1211*a* is directly under software control. The 8051 will set the DIAG_CTRL [1] bit to '1' to reset the logic and the TSI will then clear this bit. When the 8051 sets the DIAG_CTRL[2] bit to '1', QSADC 1211*a* retrieves 1 sample pair. The 8051 polls the DIAG_CTRL[5] bit to determine when a sample is available for reading.

X_DATA[7:0] register 5066.4 contains X coordinate data from the touch screen. QSADC 1211*a* latches X coordinate data into this register and asserts DONE signal 1702*c*, which is then sent as an interrupt line to central processing module (SYS) 1205 to allow the software driver to read the data.

Y_DATA[7:0] register 5068.4 contains Y coordinate data from the touch screen. QSADC 1211*a* latches Y coordinate data into this register and asserts DONE signal 1702*c*, which is then sent as an interrupt line to central processing module (SYS) 1205 to allow the software driver to read the data. Table 1.6.6b summarizes information for the various registers.

TABLE 1.6.6b

| Register Name | Address | Type | Addressing | Description |
|---|---|---|---|---|
| TSI_CTRL [7:0] | | R/W | MMIO | Controls the operation of the TSI [7:6] - undefined<br>[1] - touch screen mode select<br>0 = 4-pin<br>1 = 5-pin<br>[0] - TSI enable (0 - disable, 1 - enable) |
| SMP_DELAY [7:0] | | R/W | MMIO | Sample delay<br>[7:6] - undefined<br>[5:0] - sample delay in increments of 100 us (0x00 = no delay, 0x3F = 6.4 ms) |
| INT_STAT [7:0] | | R/W | SFR | Interrupt Status Register<br>[7:6] - undefined<br>[5] - conversion underrun error |

TABLE 1.6.6b-continued

| Register Name | Address | Type | Addressing | Description |
|---|---|---|---|---|
| | | | | [4] - conversion overrun error<br>[3] - undefined<br>[2] - data ready<br>[1] - pen down<br>[0] - pen up |
| DIAG_CTRL [7:0] | | R/W | MMIO | Diagnostic Control and Status<br>[7:6] - undefined<br>[5] - data ready<br>[4] - QSADC ready<br>[3] - undefined<br>[2] - start single conversion,<br>[1] - reset TSI (set by 8051, cleared by TSI)<br>[0] - diagnostic mode enable |
| X_DATA [7:0] | | R | SFR | 8-bit X coordinate data from the touch screen |
| Y_DATA [7:0] | | R | SFR | 8-bit Y coordinate data from the touch screen |

In terms of general operation, the 8051 will set bit 0 (i.e., TSI_CTRL[0]) of TSI_CTRL[7:0] register 5062.4 to '1' to enable the TSI after the chip (i.e., switching power supply controller 1200) has been powered up and the global chip reset has been asserted. When touch screen interface 1211 is enabled, internal state machine 5070.4 will retrieve (X, Y) sample pairs as long as QSADC 1211*a* has detected continuity (i.e. a pen-down condition exists). After QSADC 1211*a* has collected a sample pair, it will wait for a specified amount of time, as indicated by SMP_DELAY[7.0] register 5060.4, before starting over and collecting the next sample pair. This cycle continues as long as continuity is detected by QSADC 1211*a*.

Internal state machine (FSM) 5070.4 schedules the conversion of touch screen data by toggling START/RSTN signal 1702*e* of QSADC 1211*a* and then sampling DONE signal 1702*c* to load X/Y data registers 5066.4 and 5068.4. The sampling will occur periodically as long as CONT signal 1702*d* of QSADC 1211*a* is asserted.

Every time a sample is collected or a pen-down/pen-up condition is detected (as seen by a toggling of the CONT 1702*d* signal), an interrupt is sent to the 8051. This interrupt line is held high until the 8051 clears the corresponding bit in INT_STAT[7:0] register 5064.4. An interrupt is also sent if a buffer overrun/underrun condition occurs. The TSI double-buffers the X/Y coordinate samples and the activity on these buffers is tracked to generate the appropriate interrupt.

Referring to FIG. 51D and FIG. 51E, when the TSI is placed in diagnostic mode by setting DIAG_CTRL[4] of DIAG_CTRL[7:0] register 5062.4 to '1', FSM 5070.4 is bypassed and START/RSTN signal 1702*e* of QSADC 1211*a* is directly controlled by setting bit 5 of DIAG CTRL[7:0] register 5062.4. This mode of operation is intended for use as a debug mechanism to verify the operation of the TSI and QSADC 1211*a*. Interrupts to the 8051 are disabled and a polling mechanism is used where bit 1 (i.e., INT_STAT[1]) of INT_STAT[7:0] register 5064.4 acts as DONE signal 1702*c*.

The test routine shown in FIG. 51D is as follows. The 8051 (step 5050.4) reads DIAG_CTRL[4] to ensure QSADC 1211*a* is ready. If QSADC 1211*a* is not ready, the 8051 must first assert DIAG_CTRL[1] to reset touch screen interface 1211 and QSADC 1211*a*. The 8051 sets DIAG.CTRL[2]0 to '1', then the 8051 polls DIAG_CTRL [5] until TRUE. When TRUE, 8051 reads the values (5054.4) in X_DATA[7:0] register 5066.4 and Y_DATA [7:0] register 5068.4. Following a WAIT period (5056.4), the flow returns to IDLE (step 5058.4) and repeats as necessary.

Several advantages compared to the prior art may be seen. The invention eliminates sensitivity to noise. The most difficult noise source in a PDA application is the high voltage, high frequency a.c. signal that drives the CCFL or other type of backlight. By arranging clock frequencies such that there is always an even number of backlight pulses during a conversion period (e.g., 1601+1602 of FIG. 16) any noise that is picked up from one backlight half cycle is subtracted back out by the next half cycle. Since all clocks are controlled by switching power supply controller 1200, this may be arranged. In addition, the system does not drift due to component aging or thermal effects nor does it require calibration, either at the time of manufacture or later. Also, the invention does not require precision components (typically resistors and capacitors) in that the same resistor and capacitor are used during the measurement and the conversion phases. Thus any "errors" in component value during 1601 or 1602 times (FIG. 16) are reversed during 1605 and 1606 times.

Quad-Slope Analog to Digital Converter (QSADC) module 1211 includes a custom low-power mixed-signal circuit that has both analog and digital input and output signals, including analog and digital power and ground reference voltages. QSADC module 1211 measures and digitizes, to 8 bits of resolution, the voltages at two separate external ports relative to a voltage reference VREF. The maximum conversion rate at QSADC module 1211 is approximately 300 sps (samples per second). FIG. 16 is a timing diagram illustrating the quad-slope (i.e., dual conversion) analog to digital conversion (ADC) operations carried out in the QSADC module 1211.

As shown in FIG. 16, time intervals 1601 and 1602 (i.e., "measurement periods" PMA and PMB) are equivalent fixed time durations corresponding to 256 counts of a reference timer or counter. During time periods 1601 and 1602, the positive slopes if signal trace segments 1603 and 1604 reaches voltages $V_A$ and $V_B$, represent signals being measured at the analog A and B ports of the QSADC module 1211 over time periods 1601 and 1602. During time intervals 1605 and 1606 ("conversion periods" PCA and PCB), signal trace segment 1607 and 1608 have identical negative slopes, tracing in voltage declines from voltages $V_A$ and $V_B$ to zero. During these conversion periods, the numerical counts represent direct analog to digital conversions of the measured voltages $V_A$ and $V_B$. At the completions of the conversion periods, end-of-conversion (EOC) pulses are provided (e.g., at times $t_1$ and $t_2$) to signal the end of each analog to digital conversion and to reset and calibrate the analog circuitry in QSADC module 1211 for subsequent conversions.

FIG. 17 is a block diagram showing the interface signals of QSADC module 1211 in one implementation. As shown in FIG. 17, QSADC module 1211 includes: (a) analog measurement interface (AMI) 1701, digital interface (DI) 1702, and the power supply interface 1703. Analog measurement interface (AMI) comprises analog bi-directional measurement terminals 1702*a* and 1702*b* of port A (i.e., terminals AMAX and AMIN), analog bi-directional measurement terminals 1701*c* and 1701*d* of port B (i.e., terminals BMAX and BMIN) and reference voltage signal 1701*e* (i.e., reference voltage VREF).

Analog measurement interface 1701 operates in two modes in each terminal of each port. In a first mode ("primary mode"), terminal 1702*a* (AMAX) measures two independent external voltages relative to voltage reference VREF at terminal 1701*e*. The primary mode includes two phases. During the first phase, terminals 1702*a* and 1702*b* (i.e., AMAX and AMIN terminals) are shorted to allow port A to float and to complete the first digital voltage conversion (at the port A). During the second-phase, terminal 1702*a* (i.e., terminal AMAX) is connected to terminal 1701*e*, which carries reference voltage VREF, to facilitate the second digital voltage conversion (at port B). In a second mode ("low power") terminals 1702*a* and 1702*b* (i.e., AMAX and AMIN terminals) are again shorted to allow port A to float. During low power, port A and port B operate to check for electrical continuity between these ports.

In the primary mode, terminal 1702*b* measures two independent external voltages with respect to a voltage reference, VREF. In the primary mode, the first phase for terminal 1702*b* is shared with the corresponding first phase for terminal 1702*a*, as described above. In the second phase of the primary mode, terminal 1702*b* connects to analog ground reference (AVS) at terminal 1703*d* to facilitate the second digital voltage conversion (at port B). The operations of terminal 1702*b* 's low power are the same as those of terminal 1702*a* under low power.

Similarly, in the primary mode, terminal 1701*c* (BMAX) measures two independent external voltages relative to voltage reference VREF at terminal 1701*e*. During a first phase, terminals 1701*c* and 1701*d* (i.e., BMAX and BMIN terminals) are shorted to allow port B to float and to complete the second digital voltage conversion (at the port B). During the second phase, terminal 1701*c* (i.e., terminal BMAX) is connected to terminal 1701*e*, which carries reference voltage VREF, to facilitate the second digital voltage conversion (at port A). In a second mode ("low power") terminals 1701*c* and 1701*d* (i.e., BMAX and BMIN terminals) are again shorted to allow port B to float. During low power, port A and port B operate to check for electrical continuity between these ports.

In the primary mode, terminal 1701*d* measures two independent external voltages with respect to a voltage reference, VREF. In the primary mode, the first phase for terminal 1701*d* is shared with the corresponding first phase for terminal 1701*c*, as described above. In the second phase of the primary mode, terminal 1701*d* connects to analog ground reference (AVS) at terminal 1703*d* to facilitate the first digital voltage conversion (at port A). The operations of terminal 1701*d* 's low power are the same as those of terminal 1701*c* under low power.

Digital interface 1702 comprises B-bit output buses 1702*a* (AOUT[7:0]) and 1702*b* (BOUT[7:0]) for displaying digital results of the conversions at ports A and B, respectively, completion or "DONE" signal 1702*c*, continuation detection or "CONT" signal 1702*d*, start conversion or "START" signal 1702*e*, 128 KHz 50% duty cycle reference clock signal ("CLK") 1702*f*, asynchronous reset signal ("RSTN") 1702*g*, and power-down signal ("PDN") 1702h. START is the start control pin used to initiate the analog to digital conversion processes. When the START pin goes HIGH the processing starts and subsequent conversions will not be initiated until the START pin toggles LOW then HIGH again.

The DONE signal at terminal 1702*c* is asserted when the digital conversions at both ports A and B are completed, to signal that results can be read from output buses 1702*a* and 1702*b* (i.e., AOUT and BOUT buses). The CONT signal indicates detection of continuity at ports A and B.

Power supply interface 1703 comprises analog power and ground reference signals 1703*a* and 1703*b* (i.e., analog power and ground reference signals AVD and AVS), and digital power and ground reference signals 1703*c* and 1703*d* (i.e., digital power and ground reference signals VDD and VSS).

FIG. 18 and FIG. 18A show one implementation of QSADC module 1211, in accordance with the present invention. FIG. 18 is a top-level block diagram of QSADC module 1211, including analog block 1801, digital controller block 1802, presettable up/down counter block 1803, 8-input NAND gate 1806, and 8-bit Registers 1804 and 1805 (i.e., registers REGA and REGB). FIG. 18A shows one implementation of analog block 1801 of FIG. 18. As shown in FIG. 18A, analog block 1801 includes operational amplifier 1851 and analog comparator 1852, in addition to MOS transmission gates 1853*a* to 1853*m*, inverter 1854 and digital control block (DCNTL) 1855. DCNTL block 1855 generates the control signals necessary to control the MOS transmission gates 1853*a* to 1853*m*. The common mode ranges of the operational amplifier 1851 and analog comparator 1852 are rail to rail (i.e., 0 to 3.3V). For convenience the MOS transmission gates 1853*a* to 1853*m* are referred to as "switches" and each switch is designated by its control input signal (i.e., A0–A3, B0–B3, MEAS, SLP, EOC, CONV). Initially, QSADC module 1211 is in low power, where electrical continuity between port A (i.e., terminals 1702*a* (AMAX) and 1702*b* (AMIN)) and port B (i.e., terminals 1701*c* (BMAX) and 1701*d* (BMIN)) is checked. Under low power, switches 1853*b*, 1853*c*, 1853*h* and 1853*i*, 1853*d*, 1853*l*, and 1853*f* (i.e., signals A0, A2, B1, B2, MEAS and SLP) are closed, while all other switches are open. When there is no electrical continuity between ports A and B, the output voltage of operational amplifier 1851 is a low voltage, and the output voltage of analog comparator 1852 is also a low voltage. When electrical continuity is established between ports A and B, the output terminal of switch 1853*d* (i.e., the non-inverting input terminal of operational amplifier 1851) is pulled to a high voltage, so that the output terminal of analog comparator 1852 is at a high voltage. The output terminal of analog comparator 1852 is the "DOUT" terminal of analog block 1801 (FIG. 18), which is connected to the "DIN" terminal of digital control block 1802. In response to the high voltage at the output terminal of analog block 1801, the CONT terminal (i.e., terminal 1702*d* at FIG. 17) is driven to a high voltage, resulting in QSADC module 1211 exiting the low power, and entering the primary mode.

In primary mode, entered when the CONT signal is at a high voltage, when an active START signal at terminal 1702*e* is received, digital control block 1802 begins a measurement cycle of the voltage at port A by presetting up/down counter 1803 to hexadecimal FF (i.e., FFh), thereby resetting the CONT signal, and beginning the measurement and conversion process. Thereafter, each rising edge of the CLK signal at terminal 1702f decrements up/down counter 1803 until the count reaches zero (for a total of 256 counts), which is decoded by NAND gate 1806 to activate the ZERO signal received into digital control block 1802.

During the measurement cycle of port A, switches 1853*b*, 1853*c*, 1853*h* and 1853*i*, 1853*d*, 1853*l*, and 1853*f* (i.e., signals A0, A2, B1, B2, MEAS) are closed, and all other switches are open. As operational amplifier 1851 is configured as an integrator with capacitor 1856, a specific charge approximately proportional to the voltage at port A is accumulated across capacitor 1856 over the time interval corresponding to 256 count decrements of up/down counter 1803.

When the active ZERO signal is received into digital controller block 1802, QSADC module 1211 switches into the conversion cycle for the voltage at port A. At the start of the conversion cycle, up/down counter 1803 switches to count increment mode. During the conversion cycle, the switches 1853*e* and 1853k controlled by the CONV signal are closed, while all other switches are open, so that the charge on capacitor 1856 discharges reference resistor 1857 (RO). Therefore, the number of count decrements required for the DOUT pin (i.e., output terminal of analog comparator 1852) to return to a low voltage is directly proportional to the ratio of the voltage measured at the port A to the reference voltage VREF. The conversion cycle terminates when the high to low voltage transition occurs at analog comparator 1852, and detected by digital controller block 1802 at the terminal carrying signal DIN. At this time, digital controller block 1852 transfers the count in up/down counter 1803, which represents a digital value of the voltage at port A, to register 1804. At this time, digital controller 1802 closes and opens switch.1853n via control signal EOC, to compensate any voltage offset across capacitor 1856, so as to ready QSADC module 1211 for a subsequent port B measurement and conversion cycle. The measurement and conversion cycles for port B are substantially the same as that described above for the port A. The result of a port B conversion cycle is stored in register 1805 (REGB). The DONE signal (terminal 1702*c*) is then asserted and QSADC module 1211 returns to sleep mode, until the next asserted START signal (terminal 1702*e*) is received, or when electrical continuity is detected across ports A and B.

While several embodiments of this invention have been shown, other embodiments of this invention will be obvious to those skilled in the switching power supply design arts.

We claim:

1. A switching power converter controller, wherein the switching power converter controller controls a plurality of switching power converters providing power to a host microprocessor, comprising:

a watchdog timer configured to countdown a timer unless it receives reset signals from the host microprocessor; and a microprocessor;

wherein the watchdog timer is configured to issue an interrupt to the microprocessor if the watchdog timer expires, and wherein the microprocessor is configured to provide a reset command to the host microprocessor in response to the interrupt received from the watchdog timer, and wherein the microprocessor is further configured to cause the switching power supply controller to power down the plurality of power converters if the host microprocessor does not respond to the reset command.

2. The switching power converter controller of claim 1, wherein the microprocessor includes a timer for determining that the host microprocessor does not respond to the reset command.

3. The switching power converter controller of claim 1, wherein the microprocessor is configured to cause the power down of the plurality of switching power converters in a predetermined sequence.

4. The switching power converter controller of claim 3, wherein the microprocessor is configured to cause the power up of the plurality of switching power converters subsequent to the power down sequence.

5. The switching power converter controller of claim 4, wherein the microprocessor is configured to cause the power up of the plurality of switching power converters in a predetermined sequence.

* * * * *